US012122053B2

(12) United States Patent
Chen et al.

(10) Patent No.: US 12,122,053 B2
(45) Date of Patent: Oct. 22, 2024

(54) GENERATING COMPUTER SIMULATIONS OF MANIPULATIONS OF MATERIALS BASED ON MACHINE LEARNING FROM MEASURED STATISTICS OF OBSERVED MANIPULATIONS

(71) Applicant: NVIDIA Corporation, Santa Clara, CA (US)

(72) Inventors: Carolyn Linjon Chen, El Cerrito, CA (US); Yashraj Shyam Narang, Seattle, WA (US); Fabio Tozeto Ramos, Seattle, WA (US); Dieter Fox, Seattle, WA (US)

(73) Assignee: NVIDIA CORPORATION, Santa Clara, CA (US)

( * ) Notice: Subject to any disclaimer, the term of this patent is extended or adjusted under 35 U.S.C. 154(b) by 399 days.

(21) Appl. No.: 16/916,017

(22) Filed: Jun. 29, 2020

(65) Prior Publication Data
US 2021/0110089 A1 Apr. 15, 2021

Related U.S. Application Data

(60) Provisional application No. 62/913,688, filed on Oct. 10, 2019.

(51) Int. Cl.
*B25J 9/16* (2006.01)
*B25J 11/00* (2006.01)
(Continued)

(52) U.S. Cl.
CPC .............. *B25J 9/1671* (2013.01); *B25J 9/163* (2013.01); *B25J 11/008* (2013.01); *G06F 17/18* (2013.01);
(Continued)

(58) Field of Classification Search
None
See application file for complete search history.

(56) References Cited

U.S. PATENT DOCUMENTS

| 5,940,177 A * | 8/1999 | Esser ................... G01N 33/343 356/73 |
| 7,933,757 B2 * | 4/2011 | Awwiller ............... G01V 11/00 703/2 |

(Continued)

FOREIGN PATENT DOCUMENTS

| JP | 2023034764 A * 3/2023 | |
| WO | WO-2016196005 A1 * 12/2016 | ........... G06K 9/6226 |

OTHER PUBLICATIONS

H. Cheng et al, "Probabilistic calibration of discrete element simulations using the sequential quasi-Monte Carlo filter," Granular Matter, vol. 20, (1), p. 11 (20 pp.), 2018. (Year: 2018).*

(Continued)

*Primary Examiner* — Akash Saxena
(74) *Attorney, Agent, or Firm* — Davis Wright Tremaine LLP

(57) ABSTRACT

Apparatuses, systems, and techniques to identify at least one physical characteristic of materials from computer simulations of manipulations of materials. In at least one embodiment, physical characteristics are determined by comparing measured statistics of observed manipulations to simulations of manipulations using a simulator trained with a likelihood-free inference engine.

27 Claims, 76 Drawing Sheets

(51) Int. Cl.
| | |
|---|---|
| G01N 15/00 | (2024.01) |
| G06F 17/18 | (2006.01) |
| G06F 18/214 | (2023.01) |
| G06F 30/27 | (2020.01) |
| G06N 3/08 | (2023.01) |
| G06N 7/01 | (2023.01) |
| G06T 7/00 | (2017.01) |
| G06T 7/77 | (2017.01) |
| G06V 10/764 | (2022.01) |
| G06V 10/82 | (2022.01) |
| G06V 20/56 | (2022.01) |
| G06V 20/64 | (2022.01) |

(52) U.S. Cl.
CPC ............ *G06F 18/214* (2023.01); *G06F 30/27* (2020.01); *G06N 3/08* (2013.01); *G06N 7/01* (2023.01); *G06T 7/0004* (2013.01); *G06T 7/77* (2017.01); *G06V 10/764* (2022.01); *G06V 10/82* (2022.01); *G06V 20/56* (2022.01); *G06V 20/64* (2022.01); *G01N 15/00* (2013.01); *G06T 2207/10028* (2013.01)

(56) References Cited

U.S. PATENT DOCUMENTS

| | | | | |
|---|---|---|---|---|
| 7,974,570 | B2* | 7/2011 | Stout | G09B 23/02 |
| | | | | 434/354 |
| 8,064,788 | B2* | 11/2011 | Zaretsky | G03G 15/221 |
| | | | | 399/67 |
| 8,102,394 | B2* | 1/2012 | Pantaleoni | G06T 15/55 |
| | | | | 345/426 |
| 8,542,898 | B2* | 9/2013 | Bathe | G06T 7/20 |
| | | | | 382/128 |
| 9,330,210 | B2* | 5/2016 | Chen | G06T 11/001 |
| 9,589,383 | B2* | 3/2017 | Mueller-Fischer | G06T 13/20 |
| 9,613,449 | B2* | 4/2017 | Mueller-Fischer | G06T 13/20 |
| 9,633,142 | B2* | 4/2017 | Cleary | G06F 30/20 |
| 9,672,193 | B2* | 6/2017 | Macaro | G06F 17/18 |
| 9,805,285 | B2* | 10/2017 | Ikoma | G06T 7/277 |
| 10,311,560 | B2* | 6/2019 | Sang | G06V 10/30 |
| 10,762,644 | B1* | 9/2020 | Mahadevan | G06T 7/251 |
| 2013/0332127 | A1* | 12/2013 | Favier | G06F 30/23 |
| | | | | 703/6 |
| 2014/0278239 | A1* | 9/2014 | Macaro | G06F 17/18 |
| | | | | 702/181 |
| 2016/0275407 | A1* | 9/2016 | Aisu | G06N 7/01 |
| 2017/0017737 | A1* | 1/2017 | Hirose | G06F 30/20 |
| 2020/0293010 | A1* | 9/2020 | Berntorp | G06N 7/01 |
| 2021/0366139 | A1* | 11/2021 | Kim | G06T 7/529 |
| 2022/0164499 | A1* | 5/2022 | Chen | G06F 30/25 |
| 2022/0299881 | A1* | 9/2022 | Zheng | G03F 7/705 |
| 2022/0301080 | A1* | 9/2022 | Catala Luque | G06N 3/043 |

OTHER PUBLICATIONS

C.J. Coetzee, Review: Calibration of the discrete element method, Powder Technology, vol. 310, 2017, pp. 104-142, ISSN 0032-5910, https://doi.org/10.1016/j.powtec.2017.01.015. (Year: 2017).*
P. E. Hadjidoukas et al., "Bayesian uncertainty quantification and propagation for discrete element simulations of granular materials," Comput. Methods Appl. Mech. Eng., vol. 282, pp. 218-238, 2014. (Year: 2014).*
Mihaljević, Bojan et al, Bayesian networks for interpretable machine learning and optimization, Neurocomputing, vol. 456, 2021, pp. 648-665, ISSN 0925-2312 (Year: 2021).*
C. Matl, Y. Narang, R. Bajcsy, F. Ramos and D. Fox, "Inferring the Material Properties of Granular Media for Robotic Tasks," 2020 IEEE International Conference on Robotics and Automation (ICRA), Paris, France, 2020, pp. 2770-2777, doi: 10.1109/ICRA40945.2020.9197063. (Year: 2020).*
Anand et al., "Granular Materials: Constitutive Equations and Strain Localization", Journal of the Mechanics and Physics of Solids, 48(8) 2000, 33 pages.
Benvenuti et al., "Identification of Dem Simulation Parameters by Artificial Neural Networks and Bulk Experiments", Powder Technology, vol. 291, 2016, 137 pages.
Brown et al., "Universal Robotic Gripper Based on the Jamming of Granular Material", Proceedings of the National Academy of Sciences, 107(44): 2010, 6 pages.
Chebotar et al., "Closing the Sim-to-Real Loop: Adapting Simulation Randomization with Real World Experience," 2019 IEEE International Conference on Robotics and Automation (ICRA), May 20, 2019, 9 pages.
Chen et al., "Learning to Identify Container Contents through Tactile Vibration Signatures," IEEE International Conference on Simulation, Modeling, and Programming for Autonomous Robots, 2016, 6 pages.
Cheng et al., "An Iterative Bayesian Filtering Framework for Fast and Automated Calibration of Dem Models," Computer Methods in Applied Mechanics and Engineering, vol. 350, 2019, 27 pages.
Cianchetti et al., "Soft Robotics Technologies to Address Shortcomings in Today's Minimally Invasive Surgery: The Stiff-Flop Approach," Soft Robotics, 1(2): 2014, 10 pages.
Clarke et al., "Learning Audio Feedback for Estimating Amount and Flow of Granular Material", Conference on Robot Learning, 2018, 22 pages.
Coetzee, "Calibration of the Discrete Element Method," Powder Technology, vol. 310, 2017, 39 pages.
Cundall et al., "A Discrete Numerical Model for Granular Assemblies", Geotechnique, 29(1): 1979, 19 pages.
Dierichs et al., "Robotic Pouring of Aggregate Structures," Springer, 2013, 10 pages.
Do et al., "Automated Discrete Element Method Calibration using Genetic and Optimization Algorithms," EPJ Web of Conferences, EDP Sciences, vol. 140, 2017, 4 pages.
Dunatunga et al., "Continuum Modelling and Simulation of Granular Flows through their Many Phases", Journal of Fluid Mechanics, 779, 2015, 31 pages.
Hu et al., "A Moving Least Squares Material Point Method with Displacement Discontinuity and Two-Way Rigid Body Coupling," ACM Transactions on Graphics, 37(4): 2018, 14 pages.
IEEE, "IEEE Standard 754-2008 (Revision of IEEE Standard 754-1985): IEEE Standard for Floating-Point Arithmetic," Aug. 29, 2008, 70 pages.
Jaegar et al., "Physics of the Granular State", Science, 255(5051): 1992, 9 pages.
Jop et al., "A Constitutive Law for Dense Granular Flows", Nature, 441(7094): 2006, 13 pages.
Kamrin et al., "Effect of Particle Surface Friction on Nonlocal Constitutive Behavior of Flowing Granular Media", Computational Particle Mechanics, 1(2): 2014, 8 pages.
Kamrin, "Non-Locality in Granular Flow: Phenomenology and Modeling Approaches", Frontiers in Physics, 7, 2019, 7 pages.
Kamrin, "Quantitative Rheological Model for Granular Materials: The Importance of Particle Size," Handbook of Materials Modeling: Applications: Current and Emerging Materials, 2018, 24 pages.
Knuth et al., "Discrete Element Modeling of a Mars Exploration Rover Wheel in Granular Material", Journal of Terramechanics, 49(1): 2012, 10 pages.
Li et al., "A Terradynamics of Legged Locomotion on Granular Media", Science, 339(6126) 2013, 32 pages.
Liang et al., "GPU-Accelerated Robotic Simulation for Distributed Reinforcement Learning," CoRL, Oct. 24, 2018, 14 pages.
Liu et al., "Granular and Jammed Materials," Soft Matter, 6(13): Jul. 7, 2010, 2 pages.
Macklin et al., "Non-Smooth Newton Methods for Deformable Multi-Body Dynamics," Jul. 10, 2019, 21 pages.
Macklin et al., "Position Based Fluids", ACM Transactions on Graphics, 32(4): 2013, 5 pages.
Macklin et al., "Unified Particle Physics for Real-Time Applications", ACM Transactions on Graphics, 33(4): 2014, 12 pages.

(56) References Cited

OTHER PUBLICATIONS

Maladen et al., "Undulatory Swimming in Sand: Experimental and Simulation Studies of a Robotic Sandfish", The International Journal of Robotics Research, 30(7): 2011, 13 pages.
Müller et al., "Position Based Dynamics", Journal of Visual Communication and Image Representation, 18(2): 2007, 10 pages.
Nemat-Nasser et al., "Constitutive Relations for Cohesionless Frictional Granular Materials", International Journal of Plasticity, 18(4): 2002, 17 pages.
Nvidia, "Nvidia Isaac: Virtual Simulator for Robots," retrieved from https://www.nvidia.com/en-us/deep- learning-ai/industries/robotics/, Sep. 11, 2019, 7 pages.
Podlozhnyuk et al., "Efficient Implementation of Superquadric Particles in Discrete Element Method within an Open-Source Framework", Computational Particle Mechanics, 4(1): 2017, 18 pages.
Rahimi et al., "Random Features for Largescale Kernel Machines," Advances in neural information Processing Systems, 2008, 8 pages.
Ramos et al., "BayesSim: adaptive domain randomization via probabilistic inference for robotics simulators," Jun. 4, 2019, retrieved Jan. 21, 2021 from https://arxiv.org/pdf/1906.01728.pdf, 10 pages.
Richard et al., "Slow Relaxation and Compaction of Granular Systems", Nature Materials, 4(2): 2005, 8 pages.
Schenck et al., "Learning Robotic Manipulation of Granular Media," Oct. 25, 2017, 10 pages.
Sinapov et al., "Learning Relational Object Categories using Behavioral Exploration and Multimodal Perception", IEEE International Conference on Robotics and Automation, 2014, 8 pages.
Society of Automotive Engineers On-Road Automated Vehicle Standards Committee, "Taxonomy and Definitions for Terms Related to Driving Automation Systems for On-Road Motor Vehicles," Standard No. J3016-201609, issued Jan. 2014, revised Sep. 2016, 30 pages.
Society of Automotive Engineers On-Road Automated Vehicle Standards Committee, "Taxonomy and Definitions for Terms Related to Driving Automation Systems for On-Road Motor Vehicles," Standard No. J3016-201806, issued Jan. 2014, revised Jun. 2018, 35 pages.
Thompson-Bean et al., "A Soft Robotic Exoskeleton Utilizing Granular Jamming", IEEE International Conference on Advanced Intelligent Mechatronics, 2015, 6 pages.
Zhang et al., "Ground Fluidization Promotes Rapid Running of a Lightweight Robot", The International Journal of Robotics Research, 32(7): 2013, 11 pages.
Zhang et al., "Microscopic Description of the Granular Fluidity Field in Nonlocal Flow Modeling", Physical Review Letters, 118(5): 2017, 6 pages.
Zhu et al., "A Data-Driven Approach for Fast Simulation of Robot Locomotion on Granular Media", International Conference on Robotics and Automation, 2019, 7 pages.

\* cited by examiner

| Problem | Parameter | Uniform prior | Rejection ABC | ε-Free | BayesSim RFF | BayesSim NN |
|---|---|---|---|---|---|---|
| CartPole | pole length | [0.1, 2.0] | -0.342±0.15 | -0.211±0.07 | -0.609±0.39 | -0.657±0.25 |
|  | pole mass | [0.1, 2.0] | 0.032±0.21 | 0.056±0.14 | 0.973±0.26 | 0.633±0.52 |
| Pendulum | dt | [0.01, 0.3] | 2.101±1.04 | 2.307±0.84 | 3.192±0.30 | 3.199±0.17 |
| Mountain Car | power | [0.0005, 0.1] | 3.69±1.21 | 3.800±1.06 | 3.863±0.52 | 3.901±0.2 |
| Acrobot | link mass 1 | [0.5, 2.0] | 1.704±0.82 | 1.883±0.79 | 2.046±0.37 | 1.331±0.22 |
|  | link mass 2 | [0.5, 2.0] | 1.832±0.93 | 2.237±0.76 | 0.321±1.85 | 1.513±0.39 |
|  | link length 1 | [0.1, 1.5] | 2.421±0.75 | 2.135±0.50 | 2.072±0.76 | 1.856±0.18 |
|  | link length 2 | [0.5, 1.5] | -0.521±0.36 | -0.703±0.16 | -0.148±0.19 | -0.672±0.09 |
| Hopper | lateral friction | [0.3, 0.5] | 3.032±0.43 | 3.154±0.81 | 2.2622±0.64 | 3.391±0.08 |
| Fetch Push | friction | [0.1, 1.0] | 1.332±0.54 | 2.013±0.09 | 2.423±0.07 | 2.404±0.05 |
| Fetch Slide | friction | [0.1, 1.0] | 1.014±0.38 | 1.614±0.12 | 2.391±0.06 | 2.111±0.03 |

FIG. 7

GENERATING COMPUTER SIMULATIONS OF MANIPULATIONS OF MATERIALS BASED ON MACHINE LEARNING FROM MEASURED STATISTICS OF OBSERVED MANIPULATIONS

CROSS REFERENCE TO RELATED APPLICATION

This application claims the benefit of U.S. Provisional Application No. 62/913,688, filed Oct. 10, 2019, titled "FRAMEWORK FOR INFERRING THE MATERIAL PARAMETERS OF GRANULAR MEDIA," the entire contents of which is incorporated herein by reference.

TECHNICAL FIELD

At least one embodiment pertains to processing resources used to facilitate simulations as might be used in robotics applications. For example, at least one embodiment, pertains to processors or computing systems used to simulate granular material from grain formations according to various novel techniques described herein.

BACKGROUND

Robotic systems and other systems can be used for manipulating materials and it might be desirable to train a robotic system to handle various materials based on the characteristics of those materials. Training of the system might involve physical characteristics of materials being handled. Determining those physical characteristics can consume significant memory, time, or computing resources and/or specialized equipment. The amount of memory, time, or computing resources used can be improved.

BRIEF DESCRIPTION OF DRAWINGS

FIG. 7 illustrates a variety of log-predicted probabilities for various methods and problems, in accordance with an embodiment;

DETAILED DESCRIPTION

Figure 1:
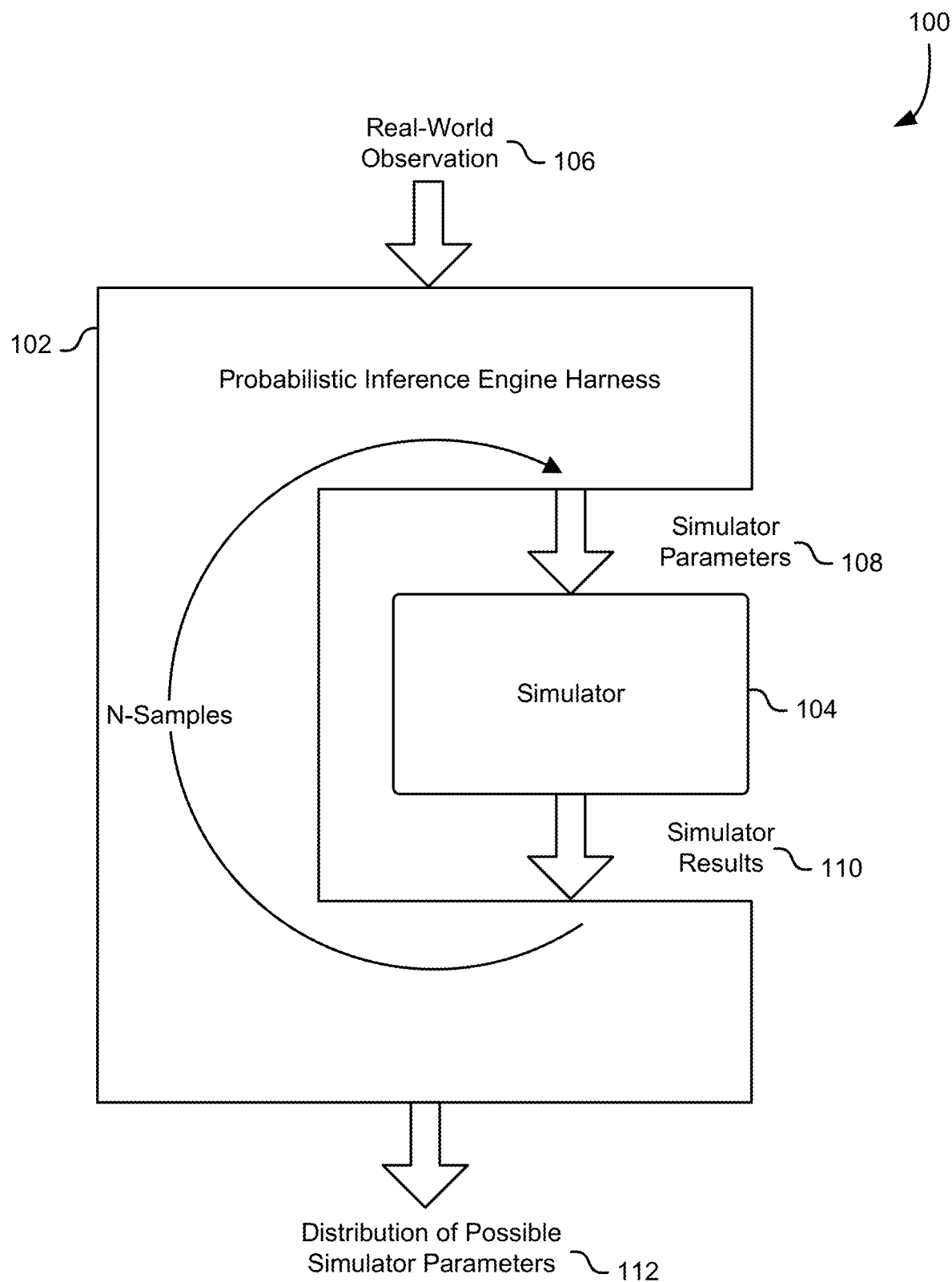
FIG. 1 illustrates an example of a probabilistic inference harness that determines a distribution of possible simulation parameters that reproduce a real-world observation, in accordance with an embodiment.

The present document describes a system and method to determine the parameters of a simulation that, when applied, cause the simulation to approximate an observed real-world result. In an embodiment, a parameter is a value that governs the operation of a simulation. For example, in an embodiment, the Bayesian inferencing techniques described herein can be used to estimate the parameters of a simulated cart-pole balancing problem where a wheeled cart is moved back and forth on a flat surface under computer control. In an embodiment, a pole is connected to the cart using a pivot, and the goal is for a control system to move the cart in a way that keeps the pole balanced in an upright position. In an embodiment, for the cart-pole problem, the simulation is governed by the length and mass of the pole and, in some examples, additional parameters for friction and air resistance. In another embodiment, parameters to be determined are material parameters of a granular material determined from comparisons of simulations of behaviors of an aggregation of the granular material and real-world observations of behaviors of the aggregation of the granular material.

In an embodiment, the system observes an attempt at the real-world task (such as the cart-pole problem), and attempts to determine a set of parameters that cause the simulation to approximately match the observation. In an embodiment, the system generates a statistical distribution of possible parameters which can, for example, indicate more than one solution if more than one solution exists. In an embodiment, in the cart-pole problem, for example, the Bayesian inferencing techniques described herein can identify a non-Gaussian posterior distribution of possible parameters that suggests that multiple combinations of pole length and pole mass may produce the observed result.

In an embodiment, producing the distribution of possible parameters is made more challenging because the internals of the simulator are not easily accessible. In an embodiment, the simulation produces results (observations) given a set of parameters, and not the inverse, but the Bayesian inferencing techniques described herein determine a distribution of possible parameters that produce a given output notwithstanding this restriction by sampling a plurality of parameter-output pairs from the simulator. In an embodiment, the samples are selected based at least in part on a "best guess" distribution of possible parameters sometimes called a prior. In an embodiment, for example, the prior may be a constant value, or a constant over a possible range. In an embodiment, the prior may be based on a previously determined distribution of simulation parameters.

In an embodiment, the samples are converted to a distribution that represents the relationship between a particular simulator output and the simulation parameters. In an embodiment, the Bayesian inferencing techniques described herein determine the distribution of parameters by modeling the posterior of the simulation parameters. In an embodiment, the density represents the desired distribution of the parameters. In an embodiment, the density is parametrized by a set of Fourier features, which is shown to provide a more accurate distribution of the parameter value, as illustrated by the experimental results provided in the present document.

In an embodiment, as simulators become more sophisticated and able to represent the dynamics of an environment more accurately, fundamental problems in robotics such as motion planning and perception may be solved in simulation and solutions transferred to a physical robot. However, in an embodiment, a simulator might still not be able to represent reality in some respects either due to inaccurate parametrization or simplistic assumptions in the dynamic models. In an embodiment, the system and methods described herein provide a statistical framework to reason about the uncertainty of simulation parameters. In an embodiment, given a black-box simulator (or generative model) that outputs trajectories of state and action pairs from unknown simulation parameters, followed by trajectories obtained with a physical robot the Bayesian inferencing techniques described herein are able to develop a likelihood-free inference method that computes the posterior distribution of simulation parameters. In an embodiment, the posterior is used in domain randomization to train a new policy that performs more consistently near the actual values.

In an embodiment, likelihood-free Bayesian inference is applied to estimating the parameters of a robotics simulator. In an embodiment the Bayesian inferencing techniques described herein provide a full distribution, therefore quantifying the uncertainty of the simulator with respect to reality. In an embodiment, as part of the methodology to perform Bayesian inference from robotics simulators, the Bayesian inferencing techniques described herein provide a regression model that uses random Fourier features and a mixture of distributions to capture multi-modal properties of a problem. In an embodiment, the Bayesian inferencing techniques train policies, aka controllers, by randomizing over the posterior distribution as opposed to the prior. In various embodiments, this provides policies that perform better in the actual environment.

As one skilled in the art will appreciate in light of this disclosure, certain embodiments may be capable of achieving certain advantages, including some or all of the following: (1) By providing a distribution over the simulation parameter, the Bayesian inferencing techniques described herein quantify the uncertainty of the simulator in representing reality, thereby allowing identification of components of a simulator that need to be further developed; (2) Through domain randomization where realizations of the simulation are generated from different parametrizations, deep learning models can be trained from data generated from the simulators, significantly reducing manual annotation; (3) Similarly, policies to control robots in complex environments can be trained in simulation and transferred to the physical system after reducing the chance of damage to the robot during training, and saving costs by reducing the amount of physical experiments that need to be performed.

In an embodiment, simulators are an important tool that enables efficient machine learning in robotics. In an embodiment, physically accurate and photo-realistic simulation, perception models, and control policies, can be trained more easily before being transferred to real robots, saving both time and costs of running complex experiments. However, in an embodiment, lack of knowledge about the correct simulation parameters, oversimplified simulation models, or insufficient numerical precision for differential equation solvers can produce a simulation that is not sufficiently similar to the real system being simulated. In an embodiment, to ameliorate this problem, domain randomization ("DR") is used. In domain randomization, different simulation parameters are sampled during training to produce a model that is robust to simulation uncertainty.

In an embodiment, one question regarding domain randomization is determining which simulation parameters to randomize over and from which distributions to sample their values. In one embodiment, these parameters and their distributions are determined in a manual process by iteratively testing whether a model learned in randomized simulation works well on the real system. In an embodiment, if the model does not work on the real robot, the randomization parameters are changed so that they better cover the conditions observed in the real world. In an embodiment, to overcome this manual tuning process, policy executions on a real robot can be used to automatically update a Gaussian distribution over the sampling parameters such that the simulator better matches reality. In an embodiment where sampling distributions are restricted to Gaussians, the approach is unable to model more complex uncertainties and dependencies among parameters.

FIG. 1 illustrates an example of a probabilistic inference harness 102 that determines a distribution of possible simulation parameters 112 that reproduce a real-world observation 106, in accordance with an embodiment. In an embodiment, the system 100 provides a principled Bayesian method that computes full posteriors over simulator parameters. In an embodiment, 100 leverages likelihood-free inference for Bayesian analysis methods to update posteriors over simulation parameters based on small sets of observations obtained on the real system. In an embodiment, one difficulty in computing such posteriors might be the evaluation of the likelihood function, which models the relationship between simulation parameters 108 and corresponding simulator results 110, or observations in the real world.

In an embodiment, while a simulator 104 implicitly defines this relationship, the likelihood function uses the inverse of the simulator model. For example, observed system behavior can be used to derive corresponding simulation parameters. In an embodiment, an iterative feedback loop between real-world data and the simulator might be used. In another embodiment, real-world data might be used to estimate posterior distributions of corresponding simulation parameters.

In an embodiment, while a simulator 104 implicitly defines this relationship, the likelihood function of the inverse of the simulator model, possibly representing how observed system behavior can be used to derive corresponding simulation parameters, and it is typically not defined analytically, not readily available, nor easy to compute." In an embodiment, the Bayesian inferencing techniques described herein do not assume access to the internal differential equations underlying the simulator 104 and treat the simulator 104 as a black box.

In an embodiment, observations of a real-world system are distilled down to a statistical vector that summarizes an observed state, which might be determined from one or more depth images of a real-world operation. In an embodiment, from the statistical vector, underlying parameters of the elements involved in the real-world operation are estimated by sampling outputs of a simulator that simulates an operation using simulated underlying parameters, possibly randomly sampled from a parameter space, and comparing those simulator outputs to the observed state. In an embodiment, comparing the outputs can be used to infer, via likelihood-free inferencing, what the underlying parameters of the elements involved in the real-world operation might have been.

In an embodiment, an observed state is represented by one or more images of an aggregation of granular material formed by a pouring the granular material onto a surface from a pour height, determining a range of models for underlying parameters of grains of the granular material, providing the models to a simulator, possibly as probability distributions of values, running the simulator to simulate a pouring, comparing an output of the simulator to the observed state of the actual pouring in the form of comparing depth images, images, and/or a set of feature values, and using a learning process, such as likelihood-free inference, to train the simulator. Once trained, when the simulator outputs results that are like what is actually observed, the inputs to the simulator can be used as an indication of the underlying parameters of the grains of the granular material. In an embodiment, once underlying parameters are determined from such simulator inputs, those determined parameters could be used for handling the granular material. In an embodiment, operation of a robot can be directed based on the determined underlying parameters, and this can be regardless of the actual underlying parameters, as those might not need to be measured if the simulation training converges.

In an embodiment, the Bayesian inferencing techniques described herein provide a generic framework for probabilistic inference with robotics simulators and provides a full space of simulation parameters that best fit observed data. In contrast, various alternative systems provide an approximate point solution. In an embodiment, the Bayesian inferencing techniques described herein provide a novel mixture density random Fourier network to approximate the conditional distribution $p(\theta|x^r)$ directly by learning from pairs $\{\omega^i, x_i^s\}_{i=1}^N$ generated from the proposal prior and the simulator. In an embodiment, by generating policies with domain randomization where the simulator parameters are randomized according to the posterior, the Bayesian inferencing techniques described herein generate policies that are significantly more robust and easier to train than randomization directly from the prior.

In an embodiment, the simulator 104 is a computer system configured with executable instructions that implement a model of a real-world environment, task, or scenario. In an embodiment, the computer system includes a processor and memory such as those illustrated in FIGS. 27A, 27B, 28, and 29, for example. In an embodiment, the simulator 104 models a system that includes a robot performing a task. In an embodiment, the robot is a self-driving vehicle, and the task is street navigation. In an embodiment, the simulator 104 takes a set of simulation parameters 108 as input, and the parameters influence the operation of the simulator. In an embodiment, the set of simulation parameters 108 may be adjusted so that the simulator 104 closely approximates a real-world environment or produces a desired result.

In an embodiment, the probabilistic inference harness 102 is a computer system configured with executable instructions that interfaces with the simulator 104. In an embodiment, the probabilistic inference harness 102 provides the simulator with a set of simulation parameters 108, and receives a corresponding simulator result 110. In an embodiment, the internals of the simulator 104 are not accessible to the probabilistic inference harness, and the probabilistic inference harness 102 invokes the simulator 104 multiple times to generate a plurality of samples. In an embodiment, each sample in the plurality of samples is a value pair comprising a set of input parameters and a corresponding simulator result produced by the set of input parameters. In an embodiment, the samples are processed by the probabilistic inference harness 102 to produce an estimated distribution of parameters that produce a given result from the simulator. In an embodiment, the probabilistic inference harness 102 takes a real-world observation as input. In an embodiment, the real-world observation is obtained by directing a task approximated by the simulation in the real world and measuring the result in the real world. In an embodiment, the real-world observation 106 is a target value or desired value for which the probabilistic inference harness 102 determines a corresponding set of parameters (or sets of parameters). In embodiment, the corresponding set of parameters is determined as a distribution that indicates the chance that a parameter will produce the desired result.

In an embodiment, simulators are used to accelerate machine learning impact by allowing faster, highly-scalable and low cost data collection. In an embodiment, the present system may be applied to fields such as economics, evolutionary biology, and cosmology, where simulators provide advancements in scientific discovery. In an embodiment, for example, a "reality gap" may be present in a control system of robots, and robotics vision is also affected by this problem. In an embodiment, algorithms trained on images from a simulation may fail in different real-world environments as the appearance of the real world can differ greatly from that replicated in a simulation.

In an embodiment, randomizing the dynamics of a simulator while training a control policy mitigates the reality gap problem. In an embodiment, simulation parameters vary from physical settings like damping, friction and object masses to visual parameters like objects textures, and shapes. In an embodiment, noise is added to the system parameters instead of sampling new parameters from a uniform prior distribution. In an embodiment, perturbation can also be seen on robot locomotion where planning is done through an ensemble of perturbed models. In an embodiment, interleaving policy rollouts between simulation and reality may also work well on swing-peg-in-hole and opening a cabinet drawer tasks.

In an embodiment, learning models from simulations of data leverage an understanding of the physical world, potentially helping to solve related problems. In an embodiment, Approximate Bayesian Computation ("ABC") is used to tackle this type of problem. In an embodiment, Rejection ABC is a method where parameter settings are accepted/rejected if they are within a certain specified range. In an embodiment, the set of accepted parameters approximates the posterior for the real parameters. In an embodiment, the Bayesian inferencing techniques described herein use Markov Chain Monte Carlo ABC ("MCMCABC") to perturb accepted parameters rather than independently proposing new parameters. In an embodiment, the Bayesian inferencing techniques described herein use Sequential Monte Carlo ABC ("SMC-ABC") to leverage sequential importance sampling to simulate slowly changing distributions where the successive distribution is an approximation of the true parameter posterior. In an embodiment, the Bayesian inferencing techniques described herein use an $\epsilon$-free approach for likelihood-free inference, where a Mixture of Density Random Fourier Network estimates the parameters of the true posterior through a Gaussian mixture.

In an embodiment, a wide range of complex robotics control problems may be solved using Deep Reinforcement Learning ("Deep RL") techniques. In an embodiment, control problems such as Pendulum, Mountain Car, Acrobot and Cart-pole may be successfully solved using policy search with algorithms such as Trust Region Policy Optimization ("TRPO") and Proximal Policy Optimization ("PPO"). In an embodiment, more complex tasks in robotics such as manipulation tasks are difficult to solve using traditional policy search. In an embodiment, the Bayesian inferencing techniques described herein may be used for policy search via domain randomization.

In an embodiment, the Bayesian inferencing techniques described herein take a prior $p(\theta)$ over simulation parameters $\theta$, a black box generative model or simulator $x^s = g(\theta)$ that generates simulated observations $x^s$ from these parameters, and observations from the physical world $x^r$ to compute the posterior $p(\theta|x^s, x^r)$. In an embodiment, the challenge in computing this posterior relates to the evaluation of the likelihood function $p(x|\theta)$ which is defined implicitly from the simulator. In an embodiment, the simulator is governed by a set of differential equations associated with a numerical or analytical solver which are typically intractable and expensive to evaluate. In an embodiment, the process that handles those equations might be isolated from the system and therefore the system treats the simulator as a black box. In an embodiment, this allows the system to be utilized with many robotics simulators (even closed-source ones) that create a requirement that the likelihood not be evaluated directly but instead from a sampled form, by performing forward simulations. In an embodiment, this is referred to as a likelihood-free inference. In an embodiment, one family of algorithms to determine likelihood-free inference is ABC.

In an embodiment implementing ABC, the simulator is used to generate synthetic observations from samples following the parameters prior. In an embodiment, the samples are accepted when features or sufficient statistics computed from the synthetic data are similar to those from real observations obtained from physical experiments. In an embodiment, as a sampling-based technique, ABC can be slow to converge, particularly when the dimensionality of the parameter space is large. In an embodiment, ABC approximates the posterior $p(\theta|x=x^r) \propto p(x=x^r|\theta)p(\theta)$ using the Bayes' rule. In an embodiment however, as the likelihood function $p(x=x^r|\theta)$ is not available, other methods for Bayesian inference cannot be applied. In an embodiment, ABC can solve this process by approximating $p(x=x^r|\theta)$ by $p(\|x=x^r\|<\epsilon|\theta)$, where E is a small value defining a sphere around real observations $x^r$, and using Monte Carlo techniques to estimate its value. In an embodiment, the quality of the approximation increases as $\epsilon$ decreases; however, the computational cost can become prohibitive as most simulations will not fall within the acceptable region.

In an embodiment, the Bayesian inferencing techniques described herein may be applied to reinforcement learning and policy search in robotics. In an embodiment, the Bayesian inferencing techniques described herein are applied to a default RL scenario where an agent interacts in discrete timesteps with an environment E. In an embodiment, at each step t the agent receives an observation $o^t$, takes an action $a^t$ and receives a real number reward $r^t$. In an embodiment, actions in robotics are real valued $a^t \in R^D$ and environments are usually partially observed so that the history of observation is represented by action pairs $\eta(\beta) = \{s_t, \alpha_t, o_t\}_{t=0}^{T-1}$. In an embodiment, the Bayesian inferencing techniques described herein attempt to maximize the expected sum of discounted future rewards by following a policy $\pi(a_t|s_t;\beta)$, parametrized by $\beta$, in Equation 1.

$$J(\beta) = \mathbb{E}_{\eta}[\Sigma_{t=0}^{T-1}\gamma^t r(s_t, a_t)|\beta] \quad (Eqn. 1)$$

In an embodiment, various approaches in reinforcement learning make use of the recursive relationship known as the Bellman equation where $Q^\pi$ is the action-value function describing the expected return after taking an action $a_t$, in state $s_t$ and thereafter following policy $\pi$, as in Equation 2.

$$Q^\pi(s_t, a_t) = \mathbb{E}_{r_t, s_{t+1}}[r(s_t, a_t) + \gamma \mathbb{E}_{a_{t+1}}[Q^\pi(s_{t+1}, a_{t+1})]] \quad (Eqn. 2)$$

In an embodiment, RL methods are applied to control tasks with continuous action spaces. In an embodiment, Deep Deterministic Policy Gradients ("DDPG") may be applied to a wide range of control problems. In an embodiment, one caveat is that DDPG algorithms rely on efficient experience sampling to perform well, therefore improving how experience is collected is an important topic. In an embodiment, Experience Replay and Prioritized Experience Replay performs poorly in a repertoire of robotics tasks where the reward signal is sparse. In an embodiment, Hindsight Experience Replay ("HER") performs well in this scenario as it breaks down single trajectories/goals into smaller ones and, thus, provides the policy optimization algorithm with better reward signals.

In an embodiment, a policy search algorithm is based on optimization through trust regions. In an embodiment, optimization through trust regions is less sensitive to the experience sampling problem mentioned above. In an embodiment, the maximum step size for exploration is determined by its trust region, and the optimal point is then evaluated progressively until convergence has been reached. In an embodiment, updates are limited by their own trust region, and, therefore, learning speed is better controlled.

In an embodiment, Proximal Policy Optimization and Trust Region Policy optimization apply these ideas providing state-of-the-art performance in a wide range of control problems. In an embodiment, both techniques differ on the way experiences are sampled. In an embodiment, the first is an off-policy algorithm where experiences are generated by a behavior policy, and the second is an on-policy algorithm where the policy used to generate experience is the same used to perform the control task. In an embodiment, these algorithms have comparable performance on different robotics control scenarios.

In an embodiment, the Bayesian inferencing techniques described herein approximate the intractable posterior $p(\theta|x=x^r)$ by directly learning a conditional density $q_\phi(\theta|x)$ parameterized by parameters $\phi$. In an embodiment, $q_\phi(\theta|x)$ can take the form of a mixture density random feature network. In an embodiment, to learn the parameters $\phi$ the system first generates a dataset with N pairs $(\theta^n, x^n)$ where $\theta^n$ is drawn independently from a distribution $\tilde{p}(\theta)$ referred to as the proposal prior. $x_n$ is obtained by running the simulator with parameter $\theta_n$ such that $x_n = g(\theta_n)$. In an embodiment, $q_\phi(\theta|x)$ is proportional to $$\frac{\tilde{p}(\theta)}{p(\theta)} p(\theta|x)$$

when the likelihood $\Pi_n q_\phi(\theta_n|x_n)$ is maximized w.r.t. $\phi$. In an embodiment, the log likelihood is maximized by the system illustrated by Equation 3 to determine $\phi$.

$$\mathcal{L}(\phi) = \frac{1}{N} \log q_\phi(\theta|x_n) \quad \text{(Eqn. 3)}$$

In an embodiment, after this is done, an estimate of the posterior is obtained as in Equation 4, where $p(\theta)$ is the desirable prior that might be different than the proposal prior. In an embodiment, when $\tilde{p}(\theta) = p(\theta)$, it follows that $\hat{p}(\theta|x=x^r) = q_\phi(\theta|x=x^r)$.

$$\hat{p}(\theta|x=x^r) \propto \frac{p(\theta)}{\tilde{p}(\theta)} q_\phi(\theta|x=x^r) \quad \text{(Eqn. 4)}$$

In an embodiment, when $\tilde{p}(\theta) \neq p(\theta)$ the system adjusts the posterior as described below. In an embodiment, the Bayesian inferencing techniques described herein model the conditional density $q_\phi(\theta|x)$ as a mixture of K Gaussians, illustrated by Equation 5, where $\alpha = (\alpha^1, \ldots, \alpha_k)$ are mixing coefficients, $\{\mu_k\}$ are means and $\{\Sigma_k\}$ are covariance matrices.

$$q_\phi(\theta|x) = \Sigma_k \alpha_k \mathcal{N}(\theta|_k, \Sigma_k) \quad \text{(Eqn. 5)}$$

In an embodiment, the Bayesian inferencing techniques described herein use Quasi Monte Carlo (QMC) random Fourier features when computing $\alpha$, $\mu$ and $\Sigma$ as described below. In an embodiment, $\Psi(x)$ is denoted as the feature vector, and the mixing coefficients can be computed as in Equation 6, although other variations are possible.

$$\alpha = \text{softmax}(W_\alpha \Phi(x) + b_\alpha) \quad \text{(Eqn. 6)}.$$

In an embodiment, the operator $$\text{softmax}(z)^i = \frac{\exp(z_i)}{\Sigma_{k=1}^K \exp z_k} \quad \text{for } i = 1; \ldots; K$$

enforces that the sum of coefficients is equal to 1 and each coefficient is between 0 and 1. In an embodiment, the means are defined as linear combinations of feature vectors. In an embodiment, each component of the mixture might be as indicated in Equation 7.

$$\mu_k = W_{\mu_k} \Phi(x) + b_{\mu_k} \quad \text{(Eqn. 7)}$$

In an embodiment, machine learning uses Bayesian inferencing techniques described herein parametrize the covariance matrices as diagonals matrices as in Equation 8, where mELU is a modified exponential linear unit defined as in Equation 9 to enforce positive values.

$$\text{diag}(\Sigma_k) = mELU(W_{\Sigma_k} \Phi(x) + b_{\Sigma_k}) \quad \text{(Eqn. 8)}$$

$$mELU(z) = \begin{cases} \alpha(e^z - 1) + 1 & \text{for } z \leq 0 \\ z + 1 & \text{for } z > 0 \end{cases} \quad \text{(Eqn. 9)}$$

In an embodiment, the diagonal parametrization assumes independence between the dimensions of the simulator parameters $\theta$. In an embodiment, this is not excessively restrictive if the number of components in the mixture is sufficiently large. In an embodiment, the full set of parameters for the mixture density network can be as shown in Equation 10.

$$\phi = (W_\alpha, b_\alpha, \{W_{\mu_k}, b_{\mu_k}, W_{\Sigma_k}, b_{\Sigma_k}\}_{k=1}^K) \quad \text{(Eqn. 10)}$$

In an embodiment, neural network features may be used to model the density. In an embodiment, the Bayesian inferencing techniques described herein can use neural network features creating a model similar to the mixture density network. In an embodiment, for a feedforward neural network with two fully connected layers, the features take the form shown in Equation 11, where $\sigma()$ is a sigmoid function. In at least one embodiment, $\sigma() = \tanh()$. In an embodiment, this network structure is used in the experiments and compared to the Quasi Monte Carlo random features described below.

$$\Phi(x) = \sigma(W_2(\sigma(W_1 x + b_1)) + b_2) \quad \text{(Eqn. 11)}$$

In an embodiment, Quasi Monte Carlo random features are used to model the density. In an embodiment, the Bayesian inferencing techniques described herein use random Fourier features instead of neural nets to parameterize the mixture density. In an embodiment, there are several reasons why this can be a good choice: 1) random Fourier features—of which QMC features are a particular type—approximate possibly infinite Hilbert spaces with properties defined by the choice of the associated kernel. In this way prior information about properties of the function space can be readily incorporated by selecting a suitable positive semidefinite kernel, in an embodiment; 2) in an embodiment, the approximation converges to the original Hilbert space with order $\mathcal{O}(1/\sqrt{s})$ where s is the number of features, therefore independent of the input dimensionality; 3) in an embodiment, we experimentally verified that mixture densities with random Fourier features are more stable to different initializations and converge to the same local maximum in most cases.

In an embodiment, Random Fourier features approximate a shift invariant kernel $k(\tau)$, where $\tau = \|x - x'\|$, by a dot product $k(\tau) \approx \Phi(x)^T \Phi(x')$ of finite dimensional features $\Phi(x)$. In an embodiment, this is possible by first applying the Bochner's Theorem, in which a shift invariant kernel $k(\tau)$, $\tau \in \mathbb{R}^D$, associated with a positive finite measure $d\mu(\omega)$ can be represented in terms of its Fourier transform as in Equation 12.

$$k(\tau) = \int_{\mathbb{R}^D} e^{-i\omega\tau} d\mu(\omega) \quad \text{(Eqn. 12)}$$

In an embodiment, when $\mu$ has density $(\omega)$, then $\mathcal{K}$ represents the spectral distribution for a positive semidefinite k, and in this case $k(\tau)$ and $\mathcal{K}(\omega)$ are Fourier duals as in Equation 13.

$$k(\tau) = \int \mathcal{K}(\omega) e^{-i\omega\tau} d\omega \quad \text{(Eqn. 13)}$$

In an embodiment, approximating the above equation with a Monte Carlo estimate with N samples, can yield the values in Equation 14, where ω is sampled from the density (ω).

$$k(\tau) = \frac{1}{N}\sum_{n=1}^{N} (e^{-i\omega_n x})(e^{-i\omega_n x'}) \quad \text{(Eqn. 14)}$$

In an embodiment, using Euler's formula ($e^{-ix}$=cos(x)−i sin(x)) the features are recovered as illustrated by Equation 15, where bias terms b' are introduced with the goal of rotating the projection and allowing for more flexibility in capturing the correct frequencies.

$$\Phi(x) = \frac{1}{\sqrt{N}}[\cos(\omega_1 x + b_1), ..., \cos(\omega_n x + b_n), \quad \text{(Eqn. 15)}$$
$$-i \cdot \sin(\omega_1 x + b_1), ..., -i \cdot \sin(\omega_n x + b_n)]$$

In an embodiment, this approximation is used with shift invariant kernels to provide flexibility in introducing prior knowledge by selecting a suitable kernel for the problem. In an embodiment, for example, the RBF kernel can be approximated using the features above with ω~(0,2σ$^{-2}$I) and b~$\mathcal{U}$ [−π, π]. The hyperparameter σ corresponds to the kernel length scale and can be usually determined by a cross-validation process.

In an embodiment, a quasi-Monte Carlo strategy is adopted to sample the frequencies. In an embodiment, Halton sequences are used which have a better convergence rate and lower approximation error than standard Monte Carlo techniques. In the present document, the term function of a frequency may be used to refer to selected Fourier features, including randomly selected Fourier features, Fourier features selected using Monte Carlo or quasi Monte Carlo techniques, and Fourier features selected based on Halton sequences.

In an embodiment, the posterior is recovered. In an embodiment, as can be inferred from the equations above, if the proposal prior is different from the desirable prior, the system adjusts the posterior by weighting it with the ratio p(θ)/p̃(θ).

In an embodiment, the prior is uniform, either with finite support—defined within a range and zero elsewhere—or improper, constant value everywhere, as in Equation 16.

$$\hat{p}(\theta | x = x^r) \propto \frac{q_\phi(\theta | x^r)}{\tilde{p}(\theta)} \quad \text{(Eqn. 16)}$$

In an embodiment, when the proposal prior is Gaussian, the Bayesian inferencing techniques described herein are able to compute the division between a mixture and a single Gaussian analytically. In an embodiment, since $q_\phi(\theta|x)$ is a mixture of Gaussians and $\tilde{p}(\theta) \sim \mathcal{N}(\theta|\mu^0, \Sigma^0)$ the solution is given by Equation 17, where the conditions of Equations 18, 19, and 20 are met and the coefficients $\lambda_k$ are given by Equation 21.

$$\hat{p}(\theta | x = x^r) = \sum_k \alpha'_k((\theta | \mu'_k, \sum_k')) \quad \text{(Eqn. 17)}$$

$$\sum_k' = (\sum_k^{-1} - \sum_0'^{-1})^{-1} \quad \text{(Eqn. 18)}$$

$$\mu'_k = \sum_k' (\sum_k^{-1} \mu_k - \sum_0^{-1} \mu_0) \quad \text{(Eqn. 19)}$$

$$\alpha'_k = \frac{\alpha_k \exp\left(-\frac{1}{2}\lambda_k\right)}{\alpha_{k'} \exp\left(-\frac{1}{2}\lambda_{k'}\right)} \quad \text{(Eqn. 20)}$$

$$\lambda_k = \text{logdet}\sum_k - \text{logdet}\sum_0 - \text{logdet}\sum_k' + \mu_k^T \sum_k^{-1} \mu_k - \quad \text{(Eqn. 21)}$$
$$\mu_0^T \sum_0^{-1} \mu_0 - \mu_k'^T \sum_k'^{-1} \mu_k'$$

In an embodiment, trajectories of state and action pairs in typical problems can be long sequences making the input dimensionality to the model prohibitive large and computationally expensive. In an embodiment, instead of inputting raw state and action sequences to the model, the system first computes sufficient statistics. In an embodiment, formally, x=ψ(S,A) where S={$s^t$}$_{t=1}^T$, and A={$a^t$}$_{t=1}^T$ are sequences of states and actions from t=1 to T. In an embodiment, there are many options for sufficient statistics for time series or trajectory data such as, the mean, log variance and autocorrelation for each time series as well as cross-correlation between two time series. In an embodiment, the system learns these from data, for example with an autoencoder. In an embodiment, the Bayesian inferencing techniques described herein use statistics often applied to stochastic dynamic systems such as the Lotka-Volterra model.

In an embodiment, defining τ={$s^t$−$s^{t-1}$}$_{t=1}^T$ as the difference between immediate future states and current states, the statistics as in Equation 22, wherein where Ds is the dimensionality of the state space, Da is the dimensionality of the action space, <•;•> denotes the dot product, Ell is the expectation, and Var[•] is the variance.

$$\psi(S,A)=(\{<\tau i, Aj>\}_{i=1}^{Ds,Da}, E[\tau], \text{Var}[\tau]) \quad \text{(Eqn. 22)}$$

In an embodiment, a Fetch robot available in OpenAI Gym is used to perform both push and slide tasks. In an embodiment, a closed loop scenario is used where the arm is always in range of the entire table and, hence, it can correct its trajectories according to the input it receives from the environment. In an embodiment, a more difficult open loop scenario is used, where the robot has usually only one shot at pushing the puck to its desired target. In an embodiment, for both tasks, the friction coefficient of the object and the surface plays a major role in the final result as they are strictly related to how far the object goes after each force is applied. In an embodiment, a very low friction coefficient infers that the object is harder to control as it slides more easily and a very high one means that more force needs to be applied in order to make the object move.

Figure 2:
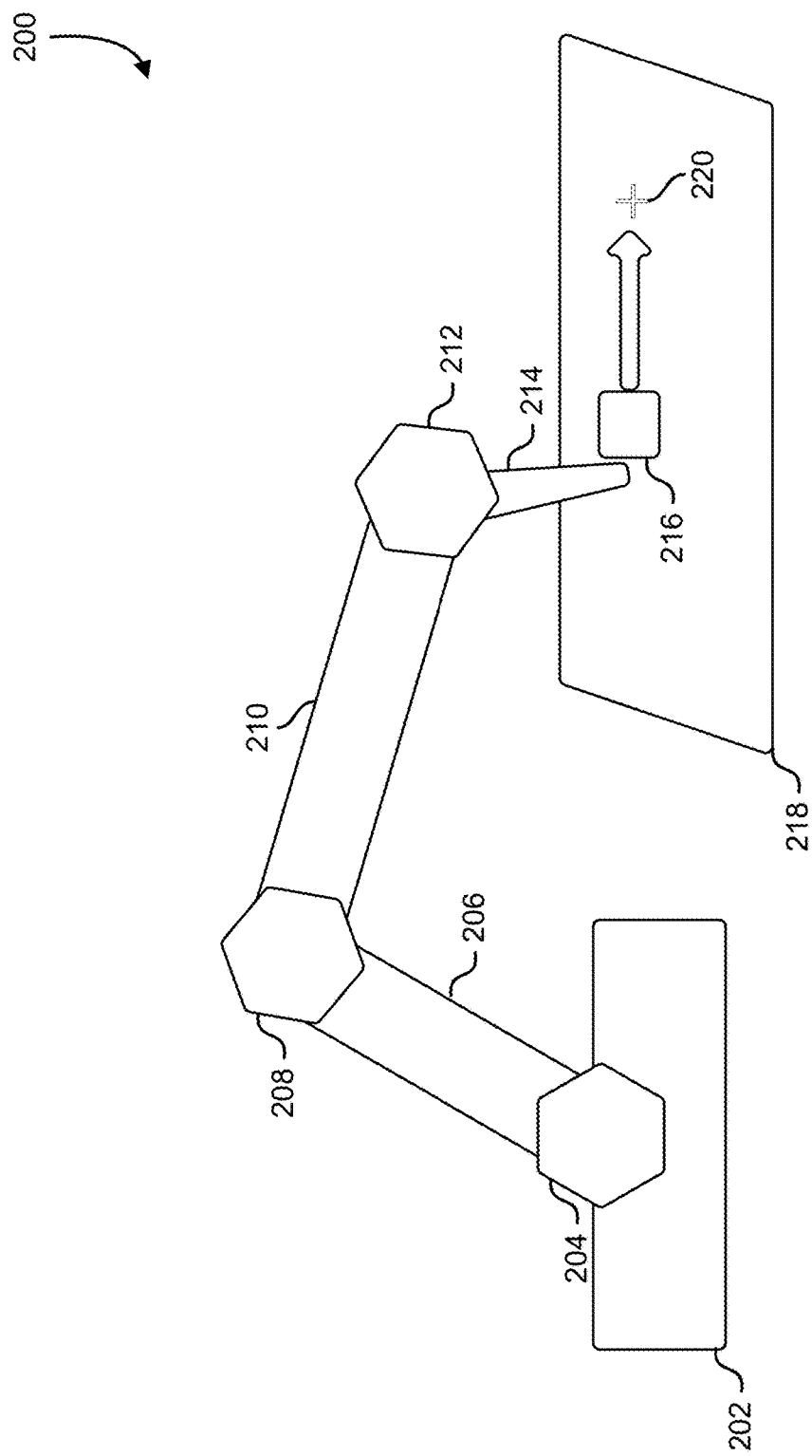
FIG. 2 illustrates an example of a robot that performs a fetch-slide task in which the robot has limited access to a table, in accordance with an embodiment.

FIG. 2 illustrates an example of a robot 200 that performs a fetch-slide task in which the robot has limited access to a table, in accordance with an embodiment. In an embodiment, the robot 200 is attached to a base 202. In an embodiment, a first articulated joint 204 connects the base 202 to a first arm 206. In an embodiment, the first arm 206 is connected to a second arm 210 via a second articulated joint 208. In an embodiment, the second arm 210 is connected to a probe 214 via a third articulated joint 212. In an embodiment, a controlling computer system directs the operation of servo motors, pneumatic actuators, or hydraulic actuators that control the motion of the articulated joints. In an embodiment, the controlling computer system implements a solution to a fetch-slide problem in which the robot 200 attempts to slide a puck 216 to a target 220. In an embodiment, the robot 200 does not have full access to a table 218, and, therefore, the robot may not be able to make repeated attempts at successfully completing the task because the puck may become unreachable.

Figure 3:
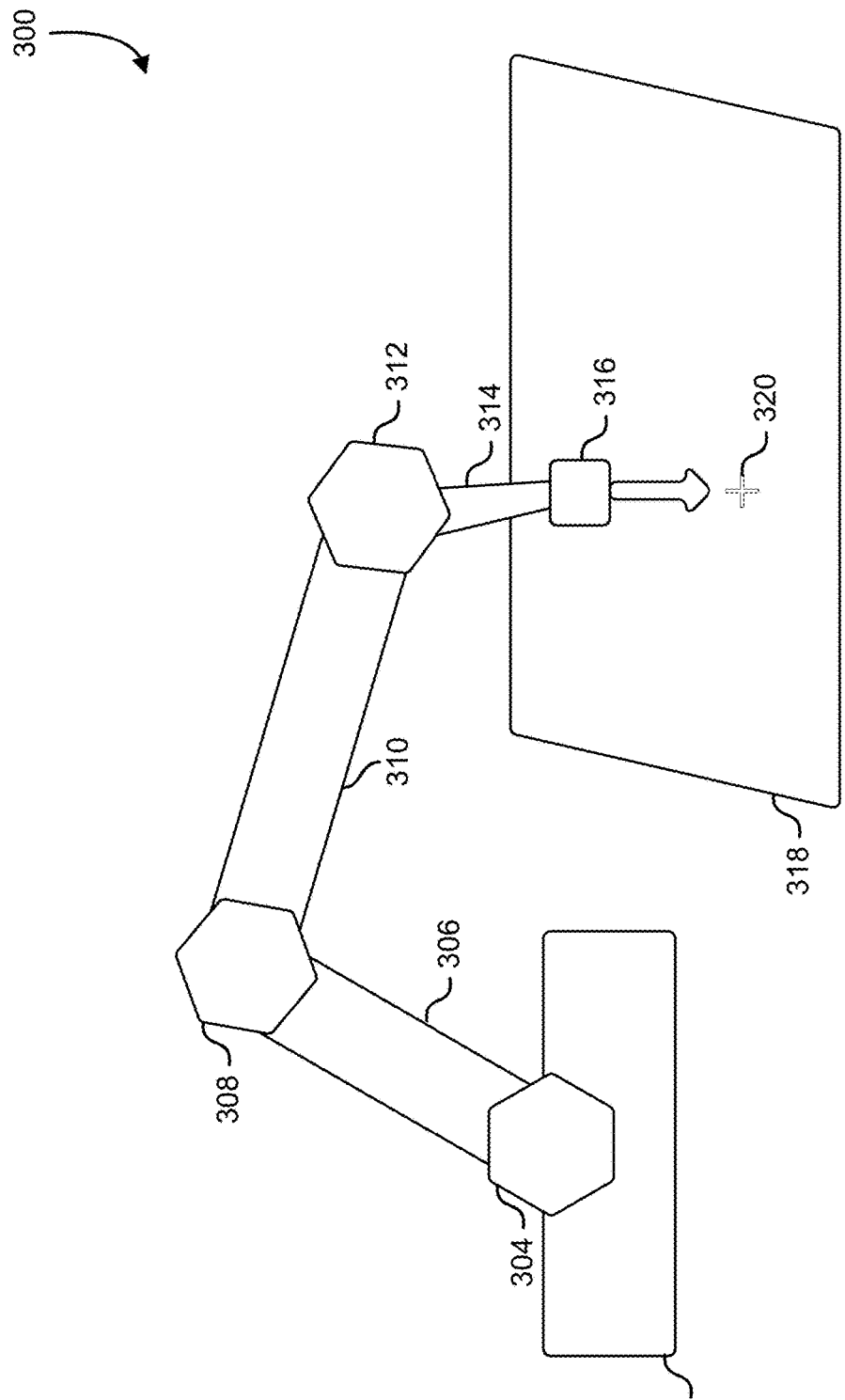
FIG. 3 illustrates an example of a robot that performs a fetch-push task in which the robot has limited access to a table, in accordance with an embodiment.

FIG. 3 illustrates an example of a robot 300 that performs a fetch-push task in which the robot has full access to a table 318, in accordance with an embodiment. In an embodiment, the robot 200 is attached to a base 302. In an embodiment, a first articulated joint 304 connects the base 302 to a first arm 306. In an embodiment, the first arm 306 is connected to a second arm 310 via a second articulated joint 308. In an embodiment, the second arm 310 is connected to a probe 314 via a third articulated joint 312. In an embodiment, a controlling computer system directs the operation of servo motors, pneumatic actuators, or hydraulic actuators that control the motion of the articulated joints. In an embodiment, the controlling computer system implements a solution to a fetch-slide problem in which the robot 300 attempts to push a puck 316 to a target 320. In an embodiment, the robot 300 has full access to a table 318, which allows the robot to reposition and make multiple attempts at successfully completing the task. In an embodiment, the Bayesian inferencing techniques described herein are demonstrated by estimating unknown simulation parameters for the Cart-Pole problem.

Figure 4:
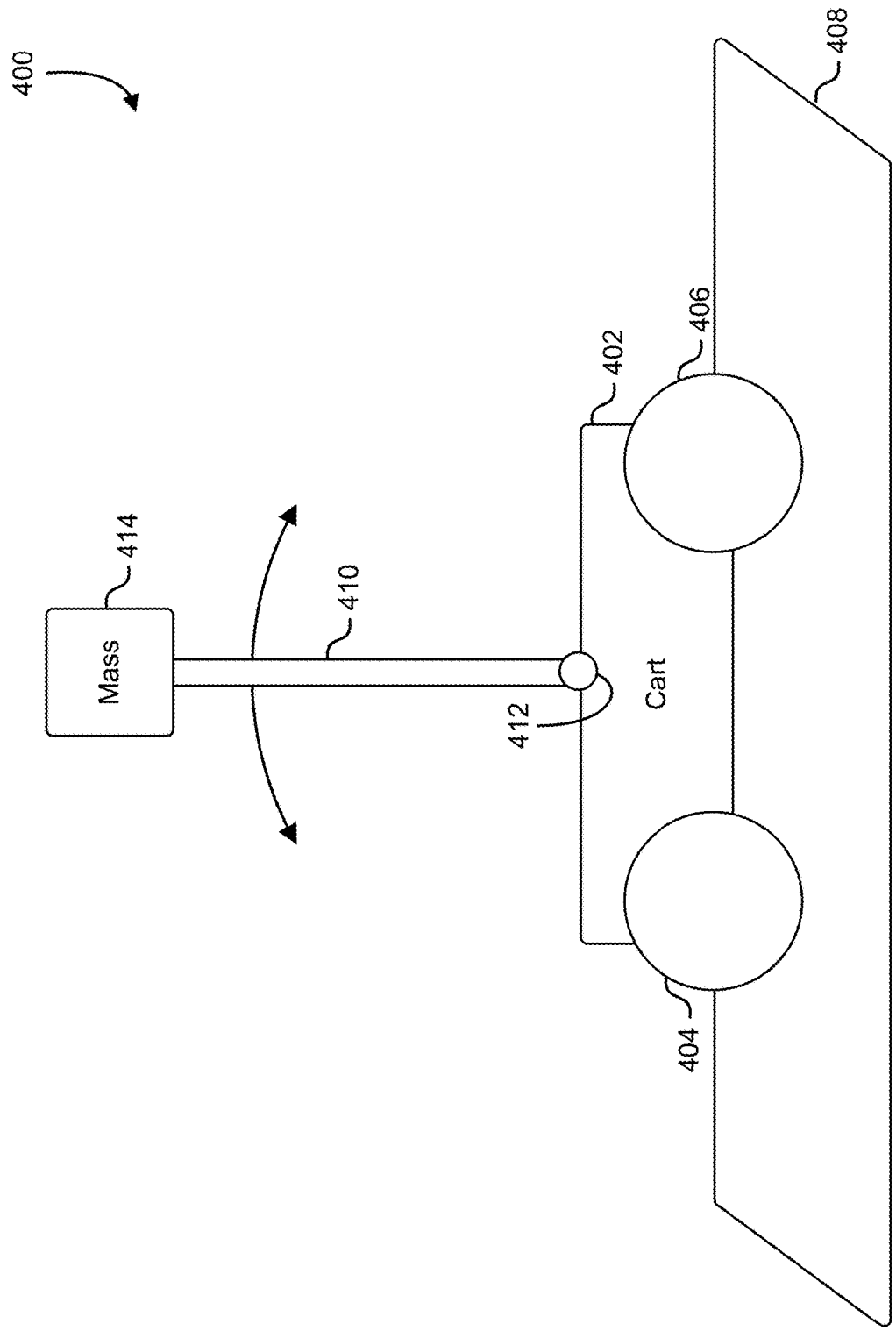
FIG. 4 illustrates an example of a robot that performs a cart-pole balancing task in which the robot controls the motion of a cart, in accordance with an embodiment.

FIG. 4 illustrates an example of a robot that performs a cart-pole balancing task in which the robot controls the motion of a cart, in accordance with an embodiment. In an embodiment, the system 400 includes a cart 402 with wheel 404 and wheel 406 that allow the cart to move along a surface 408. In an embodiment, a pole 410 is connected to the cart 402 using a pivot 412. In an embodiment, the pivot 412 allows the pole to fall on an axis perpendicular to the motion of the cart. In an embodiment, a computer control system is able to move the cart along a path (in FIG. 4, a path left and right on the page) to keep the pole upright. In an embodiment, a mass 414 is positioned at the top of the pole. In an embodiment, the control parameters used to keep the pole upright depend primarily on the mass 414 and the length of the pole 410.

In an embodiment, the pole 410 installed on a cart 402 is balanced by applying forces to the left or to the right of the cart 402. In an embodiment, both the mass 414 and the length of the pole 410 are not available, and we use the Bayesian inferencing techniques described herein to obtain the posterior for these parameters. In an embodiment, the system uses uniform priors for both parameters and collects 1000 simulations following a collection of pre-trained reinforcement learning policies to train the system. In an embodiment, with the model trained, the system may collect some number, such as ten, trajectories with the correct parameters to simulate real observations.

Figure 5:
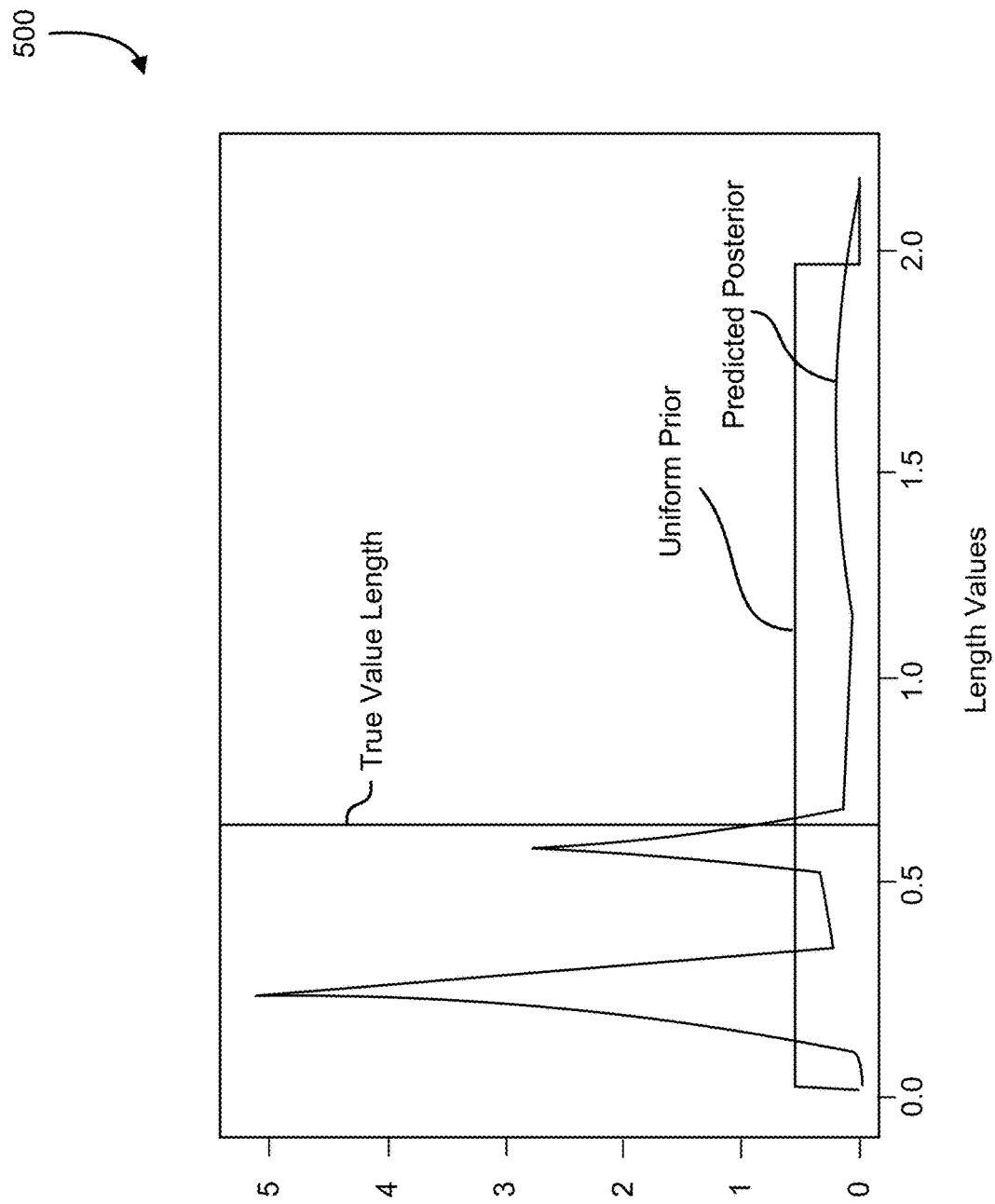
FIG. 5 illustrates an example of a posterior for the pole length of the cart-pole problem, in accordance with an embodiment.

FIG. 5 illustrates an example 500 of a posterior for the pole length of the cart-pole problem, in accordance with an embodiment.

Figure 6:
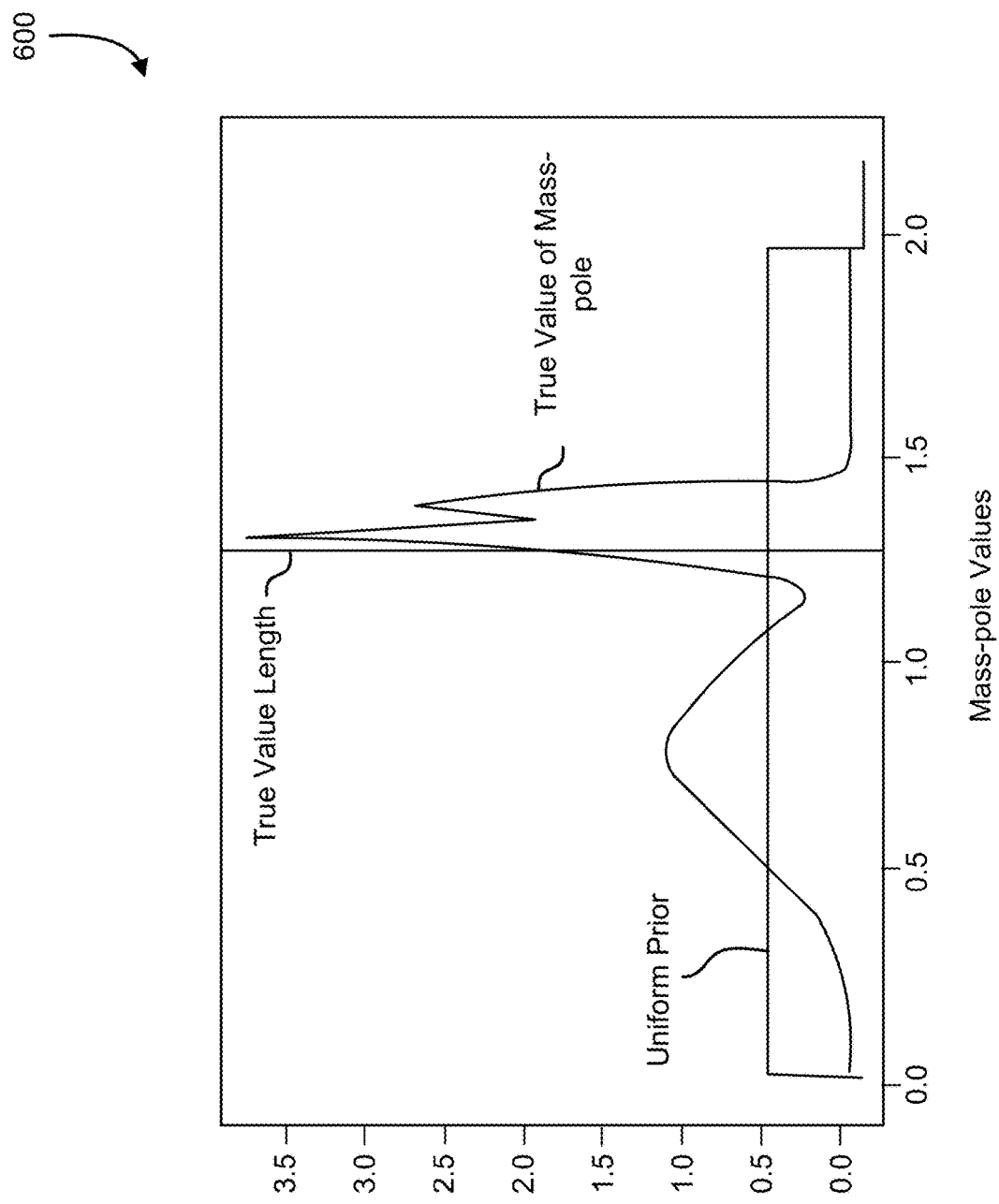
FIG. 6 illustrates an example of a posterior for the masspole of the cart-pole problem, in accordance with an embodiment.

FIG. 6 illustrates an example 600 of a posterior for the masspole of the cart-pole problem, in accordance with an embodiment. In an embodiment, mass and pole length exhibit statistical dependencies that generate multiple explanations for their values. In an embodiment, the pole may have lower mass and longer length, or a higher mass and a shorter length. In an embodiment, the system is able to recover the multi-modality nature of the posterior providing densities that represent the bi-modal uncertainty of the problem accurately.

In an embodiment, the system performs domain randomization using a strategy that takes advantage of the posterior obtained by the inference method. In an embodiment, given the posterior obtained from the simulation parameters $\hat{p}(\theta\|x=x^r)$ the system maximizes the objective as in Equation 23, where $\theta \sim \hat{p}(\theta|x=x^r)$ with respect to the policy parameters $\beta$.

$$J(\beta) = \mathbb{E}_\theta[\mathbb{E}_\eta[\Sigma_{t=0}^{T-1}\gamma^{(t)}r(s_t,a_t)|\beta]] \quad \text{(Eqn. 23)}$$

In an embodiment, the posterior is a mixture of Gaussians, and therefore the first expectation is approximated by sampling a mixture component following the distribution over a to obtain a component k, followed by sampling the corresponding Gaussian $\mathcal{N}(\theta|\mu_k,\Sigma_k)$. In an embodiment, the accuracy of the posterior recovered is verified as follows. In an embodiment, the first analysis we carry out is the quality of the posteriors obtained for different problems and methods. In an embodiment, the Bayesian inferencing techniques described herein use the log probability of the target under the mixture model as the measure, defined as $\log p(\theta^*\|x=x^r)$, where $\theta^*$ is the actual value for the parameter. In an embodiment, we compare Rejection-ABC as the baseline, ϵ-Free which provides a mixture model as the posterior, and the Bayesian inferencing techniques described herein using either a two layer neural network with 24 units in each layer, or the Bayesian inferencing techniques described herein with quasi-random Fourier Features.

In an embodiment, a Matern 5/2 kernel is used and the sampling precision a is set up by cross validation. In an embodiment, three different simulators were used for different problems; OpenAI Gym, PyBullet 2, and MuJoCo. In an embodiment, the following problems are presented; Cart-Pole (Gym), Pendulum (Gym), Mountain Car (Gym), Acrobot (Gym), Hopper (PyBullet), Fetch Push (MuJoCo) and Fetch Slide (MuJoCo). In an embodiment, for all configurations of methods and parameters, training and testing are performed five times with the log probabilities averaged and standard deviation computed. In an embodiment, to extract the real observations, the environments are simulated with the actual parameters ten times and an average of the results is used to obtain $x^r$. In an embodiment, sufficient statistics are collected by performing rollouts for either a maximum of 200 time steps or until the end of the episode.

FIG. 7 illustrates a variety of log-predicted probabilities for various methods and problems, in accordance with an embodiment. In an embodiment, a table 700 shows the results (means and standard deviations) for the log probabilities. In an embodiment, the Bayesian inferencing techniques described herein with either random Fourier features or neural network features provides generally higher log-probabilities and lower standard deviation than Rejection ABC. In an embodiment, this indicates that the posteriors provided by the Bayesian inferencing techniques described herein are more peaked and centered around the correct values for the parameters. In an embodiment, compared to ϵ-Free, the results are equivalent in terms of the means but the Bayesian inferencing techniques described herein generally provides lower standard deviation across multiple runs of the method, indicating it is more stable than ϵ-Free. Comparing an embodiment of the Bayesian inferencing techniques described herein with random Fourier features or with a neural network, the random Fourier features lead to higher log probabilities in most cases but the versions that use neural networks have lower standard deviation.

In an embodiment, the results suggest that the Bayesian inferencing techniques described herein with either random Fourier features or a neural network are superior when estimating the posterior distribution over the simulation parameters. In an embodiment, for the robotics problems analyzed below, however, the Bayesian inferencing techniques described herein with random Fourier features can, in some cases, provide significant superior results over other methods tested, and slightly better results than the Bayesian inferencing techniques described herein with a neural network.

Figure 8:
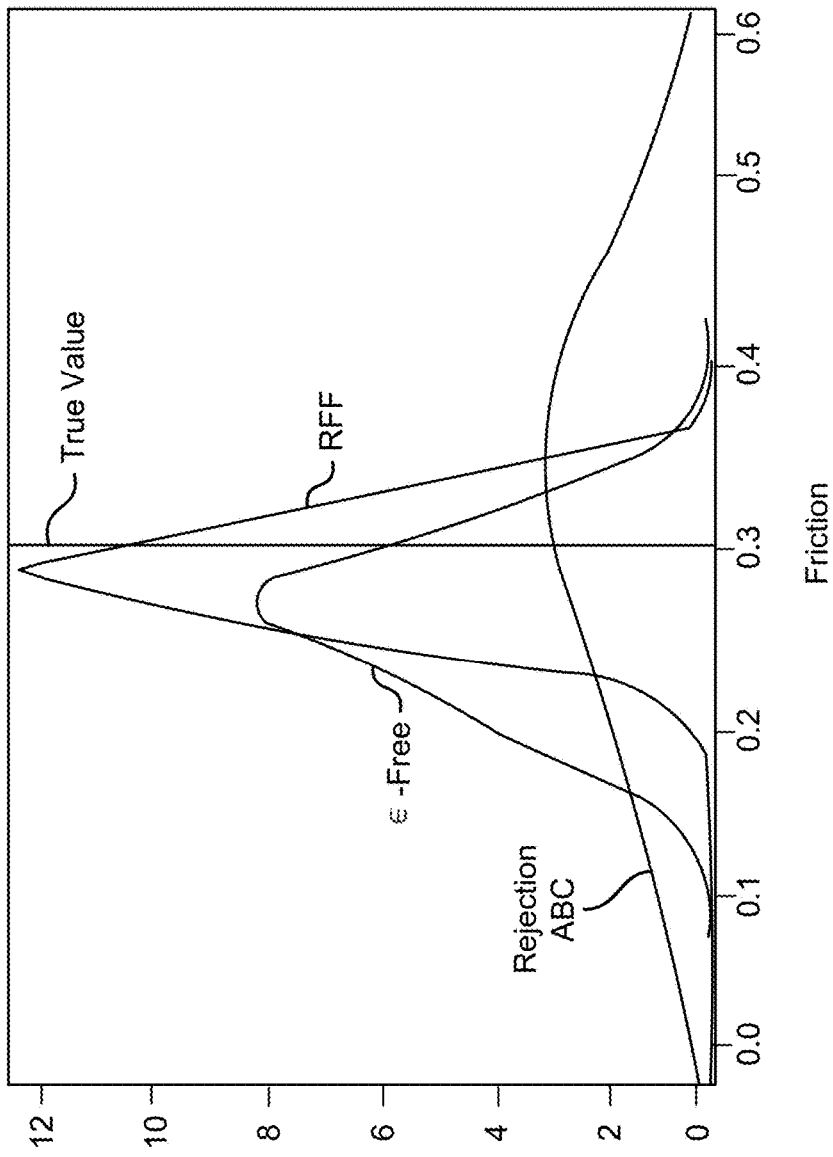
FIG. 8 illustrates an example of posteriors recovered by different methods for the fetch slide problem, in accordance with an embodiment.

FIG. 8 illustrates an example 800 of posteriors recovered by different methods for the fetch-slide problem, in accordance with an embodiment. In an embodiment, the Bayesian inferencing techniques described herein that uses random Fourier features might be significantly more peaked and centered around the true friction value.

Figure 9:
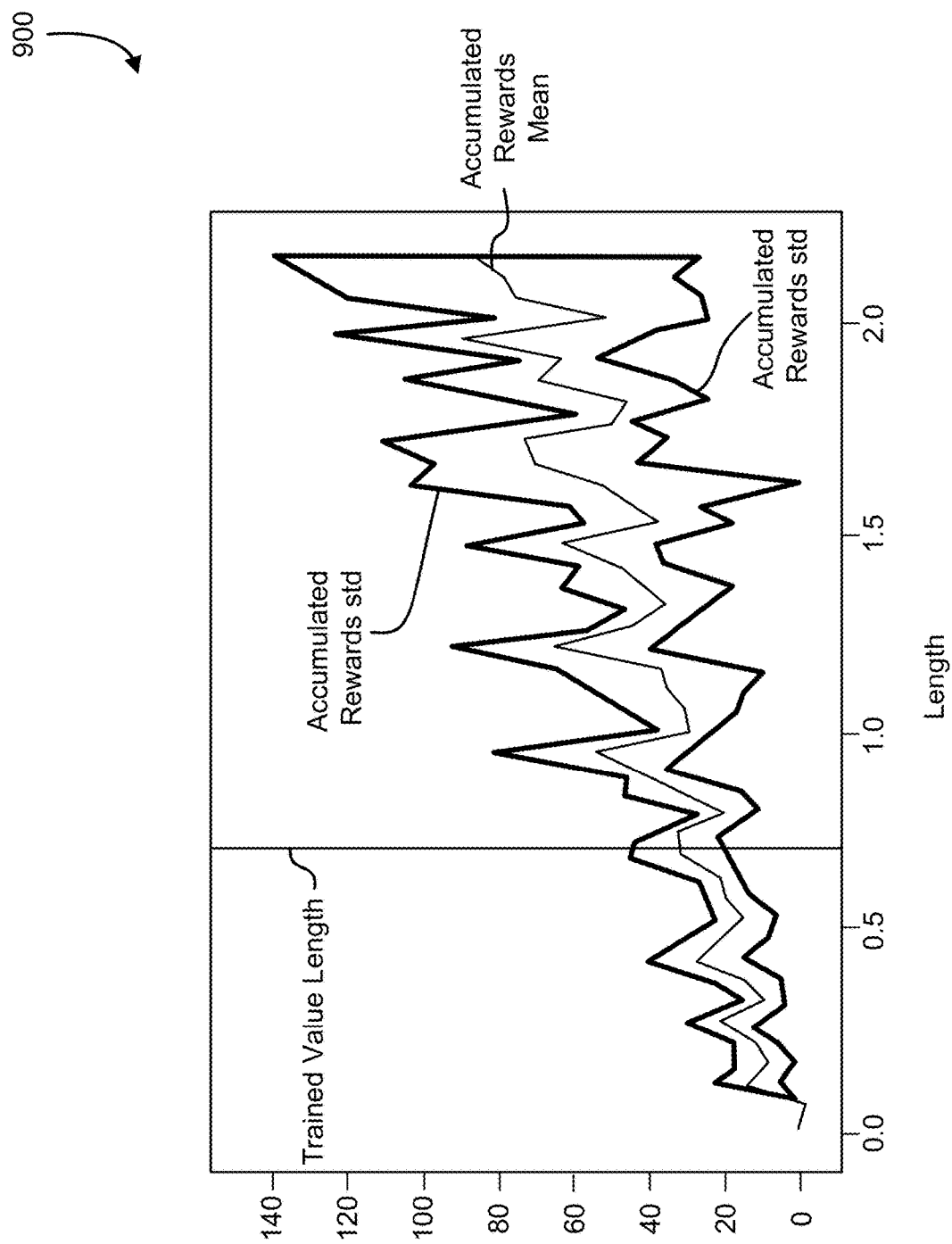
FIG. 9 illustrates an example of accumulated rewards for cart-pole policies trained by randomizing with a prior of the length parameter, in accordance with an embodiment.
Figure 10:
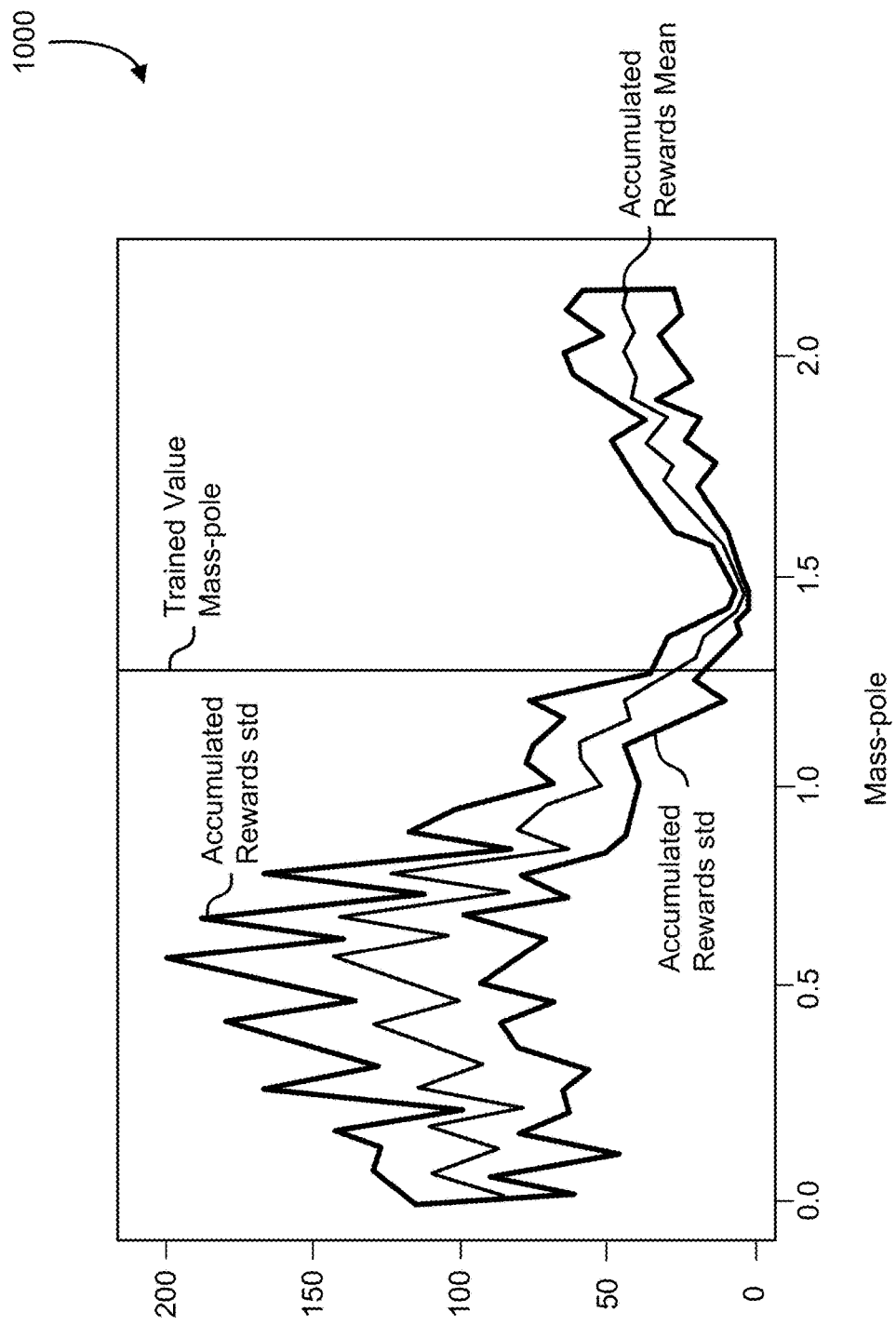
FIG. 10 illustrates an example of accumulated rewards for cart-pole policies trained by randomizing with a prior of the masspole parameter, in accordance with an embodiment.
Figure 11:
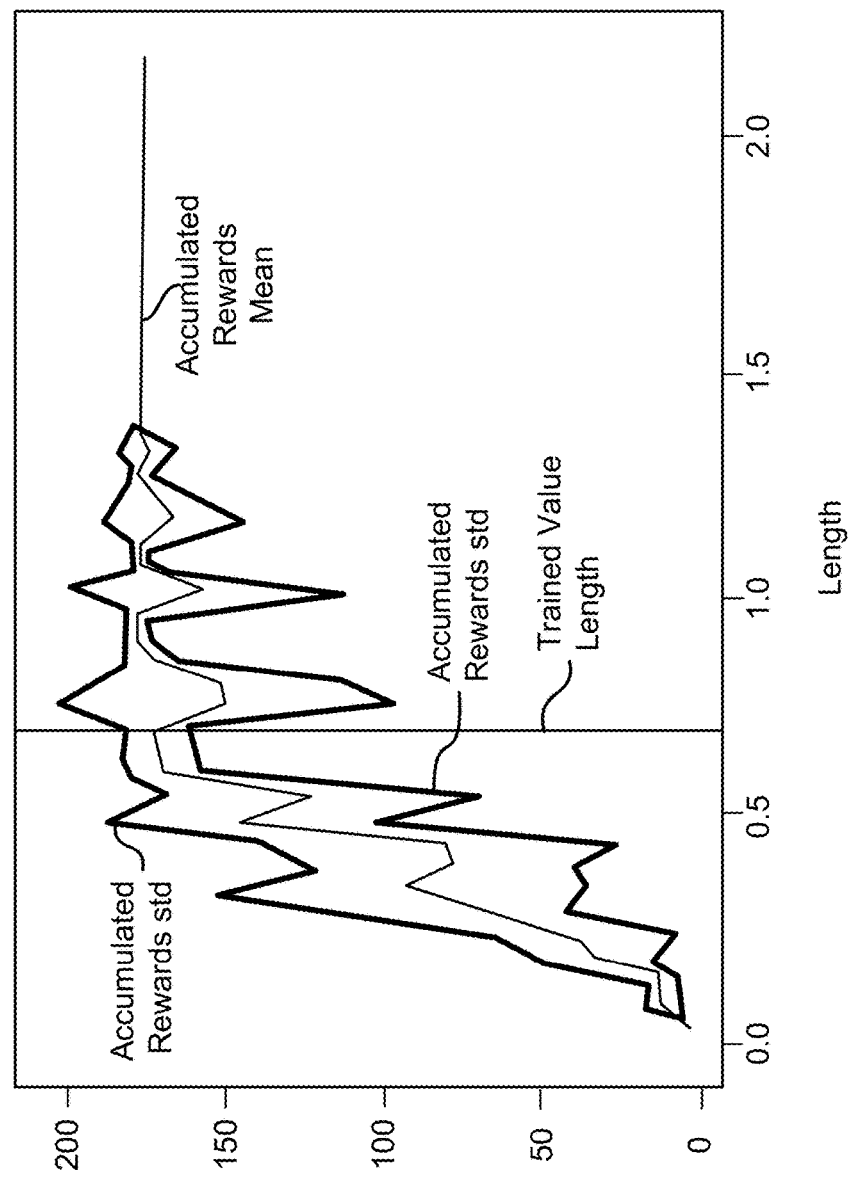
FIG. 11 illustrates an example of accumulated rewards for cart-pole policies trained by randomizing with a posterior of the length parameter, in accordance with an embodiment.
Figure 12:
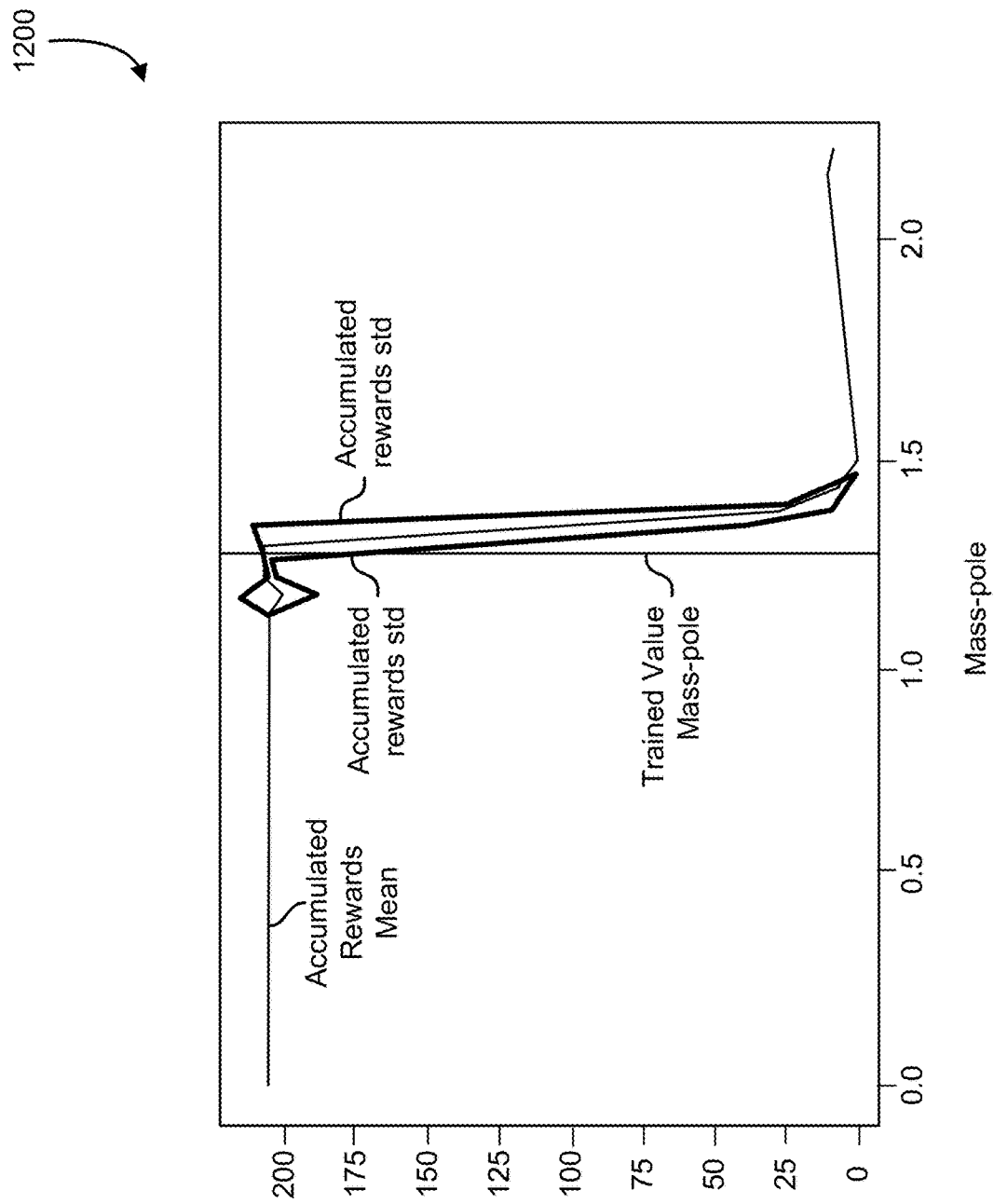
FIG. 12 illustrates an example of accumulated rewards for cart-pole policies trained by randomizing with a posterior of the masspole parameter, in accordance with an embodiment.

In an embodiment, the robustness of policies is evaluated by comparing their performance on the uniform prior and a learned posterior. In an embodiment, the evaluation is done over a pre-defined range of simulator settings and the average reward is shown for each parameter value in FIGS. 9-12. FIG. 9 illustrates an example 900 of accumulated rewards for cart-pole policies trained by randomizing with a prior for the length parameter, in accordance with an embodiment. FIG. 10 illustrates an example 1000 of accumulated rewards for cart-pole policies trained by randomizing with a prior for the masspole parameter, in accordance with an embodiment. FIG. 11 illustrates an example 1100 of accumulated rewards for cart-pole policies trained by randomizing with a posterior for the length parameter, in accordance with an embodiment. FIG. 12 illustrates an example 1200 of accumulated rewards for cart-pole policies trained by randomizing with a posterior for the masspole parameter, in accordance with an embodiment.

In an embodiment, in a set of experiments the Cart-Pole problem is used to illustrate the benefits of posterior randomization. In an embodiment two policies are trained, the first randomizing with a uniform prior for length and masspole as indicated in FIG. 7, and the second randomized based on the posterior provided by the Bayesian inferencing techniques described herein with random Fourier features. In an embodiment, both cases might use proximal policy optimization to train the policies with 100 samples from the prior and posterior, for 2,000,000 timesteps, or some other large number of timesteps. In an embodiment, the results are presented in FIGS. 9-12, averaged over several runs with the corresponding standard deviations. In an embodiment, randomization over the posterior yields a significantly more robust policy, in particular at the actual parameter value. In an embodiment, the reduction in performance for lower length values and higher masspole values is notable. In an embodiment, it is more difficult to control the pole position when the length is short due to the increased dynamics of the Bayesian inferencing techniques described herein. In an embodiment, when the mass increases substantially beyond the value it was actually trained on, the controller struggles to maintain the pole balanced. In an embodiment, the policy learned with the posterior seems much more stable across multiple runs as indicated by the lower variance in the plots.

In an embodiment, the goal is to recover a good approximation of the posterior over friction coefficients using the Bayesian inferencing techniques described herein. In an embodiment, a policy with a fixed friction coefficient that will be used for data generation purposes is trained using DDPG with experiences being sampled using Hindsight Experience Replay for 200 epochs with 100 episodes/rollouts per epoch. In an embodiment, Gradient updates are done using Adam with step size of 0.001. In an embodiment, the policy is run multiple times with different friction coefficients in order to approximate the likelihood function and recover the full posterior over simulation parameters. In an embodiment, using the dynamics model, the Bayesian inferencing techniques described herein recovers the desired posterior using some data sampled from the environment we want to learn the dynamics from. In an embodiment, training is carried out using the aforementioned settings but instead of using a fixed friction coefficient, a new one is sampled from its respective distribution when a new episode starts.

Figure 13:
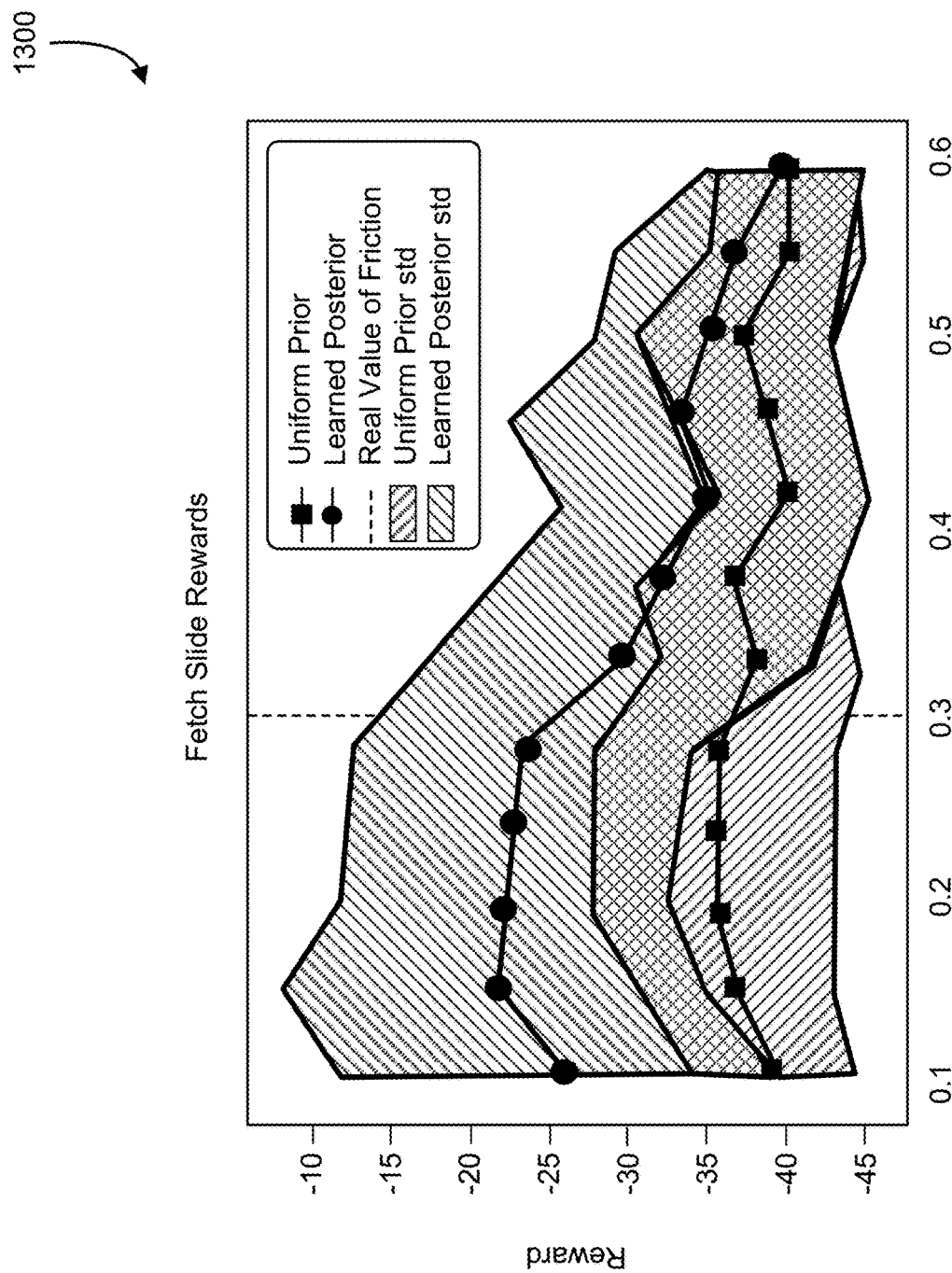
FIG. 13 illustrates an example of policies for the fetch-slide problem, in accordance with an embodiment.
Figure 14:
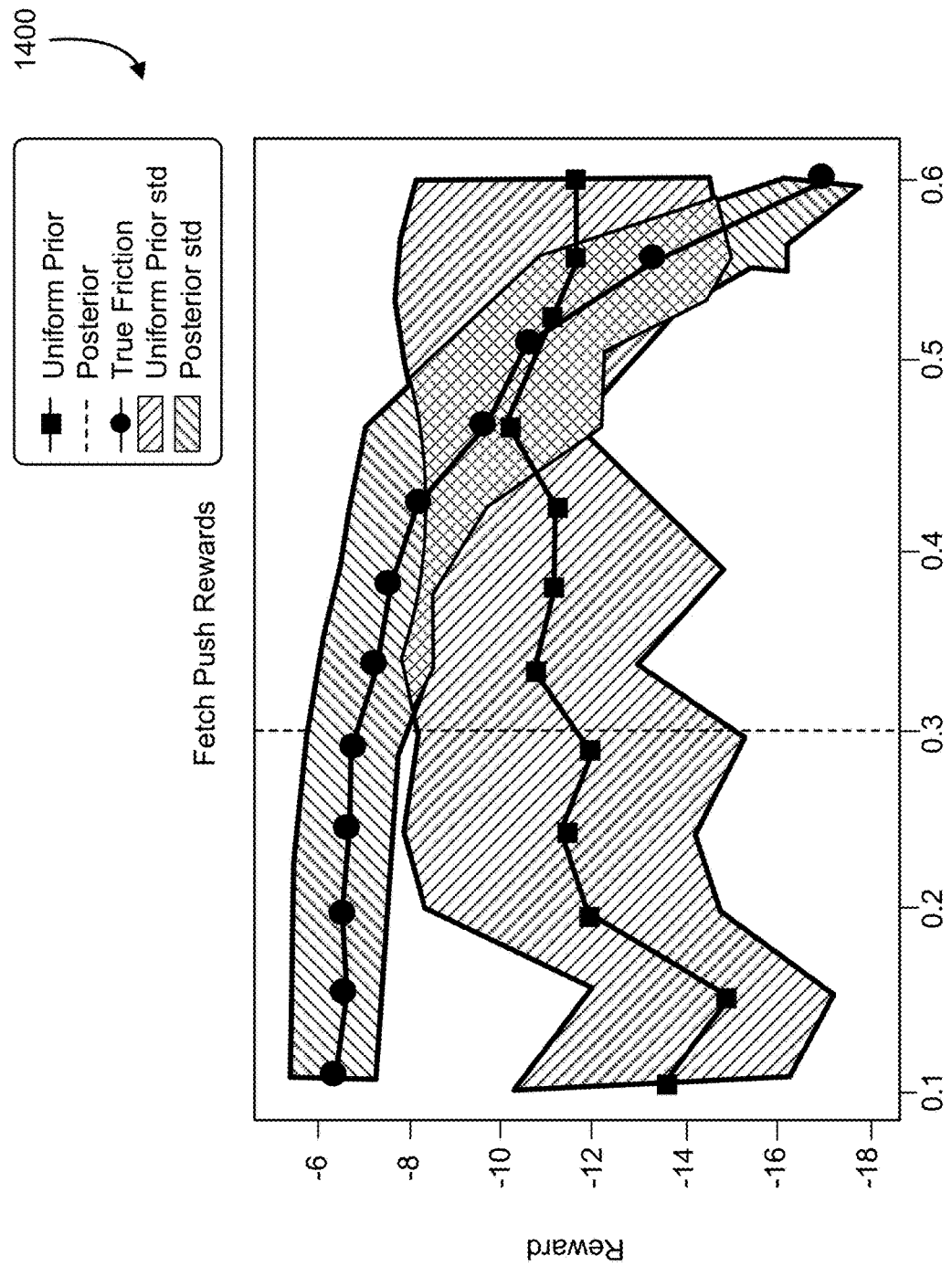
FIG. 14 illustrates an example of policies for the fetch-push problem, in accordance with an embodiment.

The results from both tasks, in accordance with an embodiment, are illustrated in FIGS. 13 and 14. FIG. 13 illustrates an example 1300 of policies for the fetch-slide problem. FIG. 14 illustrates an example 1400 of policies for the fetch-push problem, in accordance with an embodiment. In an embodiment, the uniform prior works remarkably well on the push task. In an embodiment, this happens because the robot has the opportunity to correct its trajectory if something goes wrong. In an embodiment, in the fetch-push problem, the robot is exposed to a wide range of scenarios involving different dynamics, and therefore the robot can then use the input of the environment to perform corrective actions and still be able to achieve the objective. In an embodiment, the slide task uses a uniform prior that causes the robot to achieve poor performance. In an embodiment, this happens because the robot has no option of correcting its trajectory. In an embodiment, the Bayesian inferencing techniques described herein are useful as they recover a distribution with very high density around the true parameter and, hence, lead to a better overall control policy.

In an embodiment, the present document presents a Bayesian treatment of robotics simulation parameters, combined with domain randomization for policy search. In an embodiment, the Bayesian inferencing techniques described herein uses a black-box generative model, or simulator, integrated into the framework. In an embodiment, prior distributions can also be provided and incorporated into the model to compute a multi-modal posterior over the parameters. In an embodiment, the method described herein performs comparably to other state-of-the-art likelihood-free approaches for Bayesian inference but is more stable to different initializations and is more stable across multiple runs when recovering the true posterior. In an embodiment, domain randomization with the posterior leads to more robust policies over multiple parameter values compared to policies trained on uniform prior randomization.

In an embodiment, the Bayesian inferencing techniques described herein can be applied to a large range of problems where simulators make use of a full set of parametrizations to represent reality. In an embodiment, the framework described herein can be integrated in many other problems involving simulators.

Figure 15:
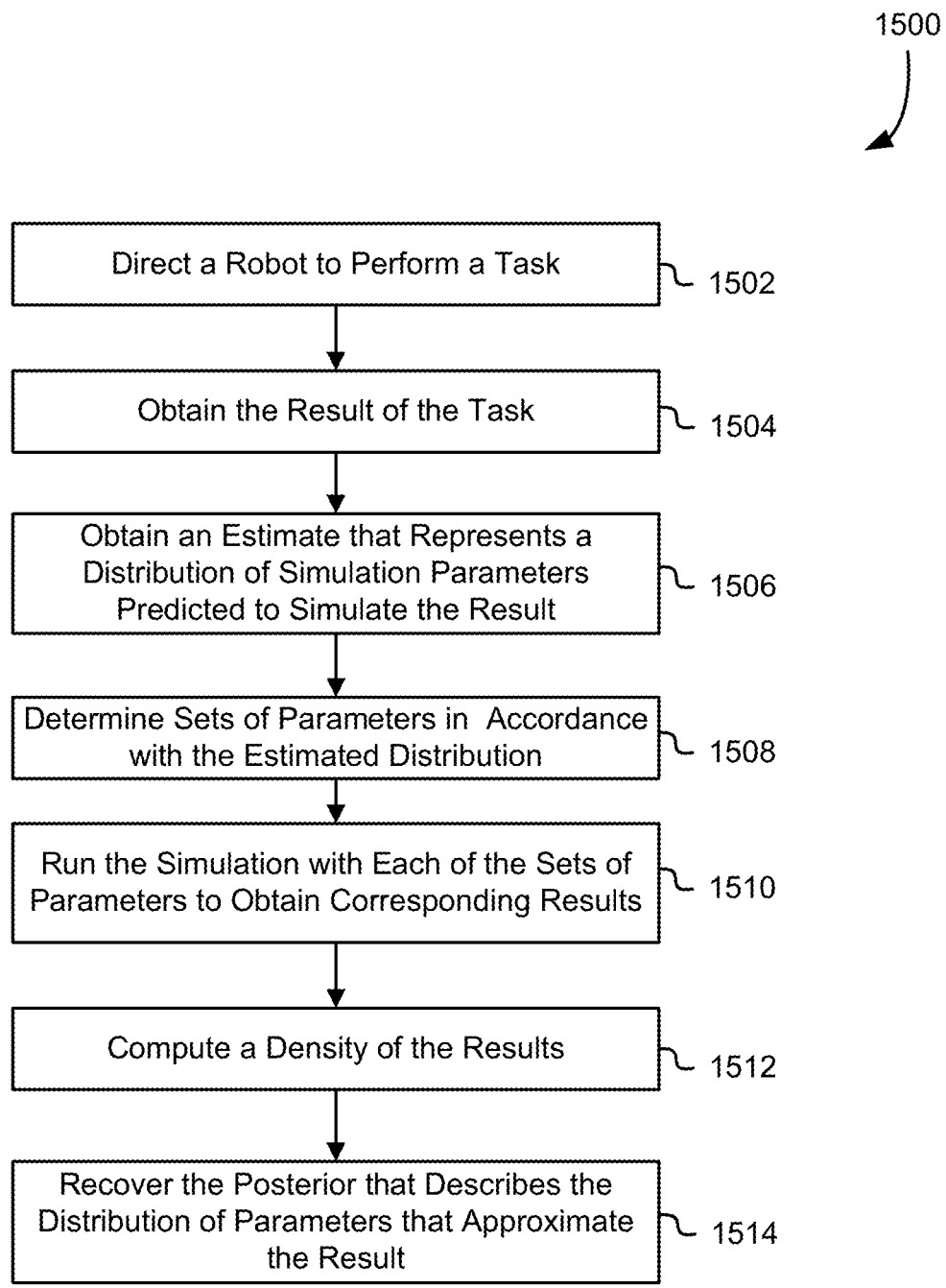
FIG. 15 illustrates an example of a process that, as a result of being performed by a processor of a computer system, causes the system to estimate a distribution of simulation parameters that, when applied to the simulation, cause the simulation to produce a desired result, in accordance with an embodiment.

FIG. 15 illustrates an example of a process 1500 that, as a result of being performed by a processor of a computer system, causes the Bayesian inferencing techniques described herein to estimate a distribution of simulation parameters that when applied to the simulation cause the simulation to produce a desired result, in accordance with an embodiment. In an embodiment, at block 1502, the computer system directs a robot such as a robotic arm to perform a task. In an embodiment, at block 1504, the computer system obtains the result of the task. In an embodiment, the result may be obtained via position sensors, cameras, motion detectors, or other sensors, and the result may represent the position or trajectory of an object or physical quantity or value. In an embodiment, at block 1506, the computer system obtains an estimate that represents a distribution of simulation parameters predicted to produce the obtained result. In an embodiment, the distribution is a constant value. In an embodiment, the distribution is a bounded constant value and zero everywhere else. In an embodiment, the distribution is obtained from a previous performance of the process 1500.

In an embodiment, at block 1508, the computer system generates sets of parameters for the simulator in accordance with the distribution obtained at 1506. In an embodiment, the simulator is run at block 1510 using each of the sets of determined parameters. In an embodiment, for each set of parameters, the simulator produces a corresponding result. In an embodiment, the resulting parameter-result pairs are used to estimate a density at block 1512. In an embodiment, the density is modeled using a set of Fourier Features as described above. In an embodiment, at block 1514, the computer system uses the estimated density to compute a distribution of parameters predicted to produce the result observed at block 1504.

In various embodiments, granular media (e.g., cereal grains, plastic resin pellets, and pills) may be present in robotics-integrated industries, such as agriculture, manufacturing, and pharmaceutical development. This prevalence may require the accurate and efficient simulation of these materials. In an embodiment, a computing system can automatically calibrate a fast physics simulator to accurately simulate granular material by inferring material properties of grains of such granular material, such as physical characteristics, from physical measurements of an aggregation of that granular material. In some embodiments, physical measurements include real-world depth images of granular formations such as piles and rings. In at least one embodiment, physical characteristics include a coefficient of sliding friction, a coefficient of rolling friction, and a restitution of grains.

In at least one embodiment, a computing system estimates physical characteristics from summary statistics of grain formations, which might be represented in computer memory as a vector with components corresponding to a derived set of features for an aggregation of granular material. In at least one embodiment, a computing system estimates those physical characteristics using an inference engine that operates with likelihood-free Bayesian inference using the derived set of features as an input. The calibrated simulator may accurately predict unseen granular formations in both simulations and experiments; furthermore, simulator predictions may be generalized to more complex tasks, such as using a robot to pour granular material from a height, perhaps from one container to another, while managing to pour to keep spillage below an acceptable threshold. Spillage might occur when energetic grains bounce out of a receiving container, such as a bowl, and as such spillage simulations might be useful for design and operation of a robotic assembly that performs pouring. Other tasks might be to create a desired pattern of piles and rings. In various embodiments, the system may be implemented by a system such as one or more systems as described in FIGS. 27-60.

In some examples, granular material may be a collection of discrete macroscopic particles that primarily experience inelastic collisions and are usually unaffected by temperature. Granular materials may span a wide variety of materials, from sand and stones to powders and pills to seeds and cereals. In various embodiments, granular materials are often considered their own category of matter (e.g., separate from solids, liquids, and gases). In various embodiments, a numerical technique for simulating granular materials may be the discrete element method (DEM). In DEM, each particle may be represented independently. In various embodiments, DEM calibration methods may involve a cycle of performing small-scale materials tests, manually tuning parameters, and iterating until the desired experimental behavior is captured.

In various embodiments, the system may integrate a framework for likelihood-free Bayesian inference with a fast and efficient physics simulation platform capable of DEM simulations, as well as experimental observations using off-the-shelf depth cameras. The framework, which may be a framework such as the BayesSim framework, may convey information about the uncertainty of these parameters, including predicting posteriors with multimodal distributions. The simulation platform, which may be a simulation platform such as the ISAAC platform, may be optimized for GPU computation, may generate granular simulations programmatically, and may simultaneously simulate interactions with multi-DOF robots.

In various embodiments, using the system, possible physical characteristics of granular materials may be inferred from simple, inexpensive observations of macroscale behavior in the real world. The calibrated simulator may then be leveraged to predict unseen granular formations in both simulations and experiments. The system may comprise a software and hardware framework that integrates likelihood-free Bayesian inference, an efficient physics simulator, and depth images of granular formations to estimate possible physical characteristics.

Figure 16:
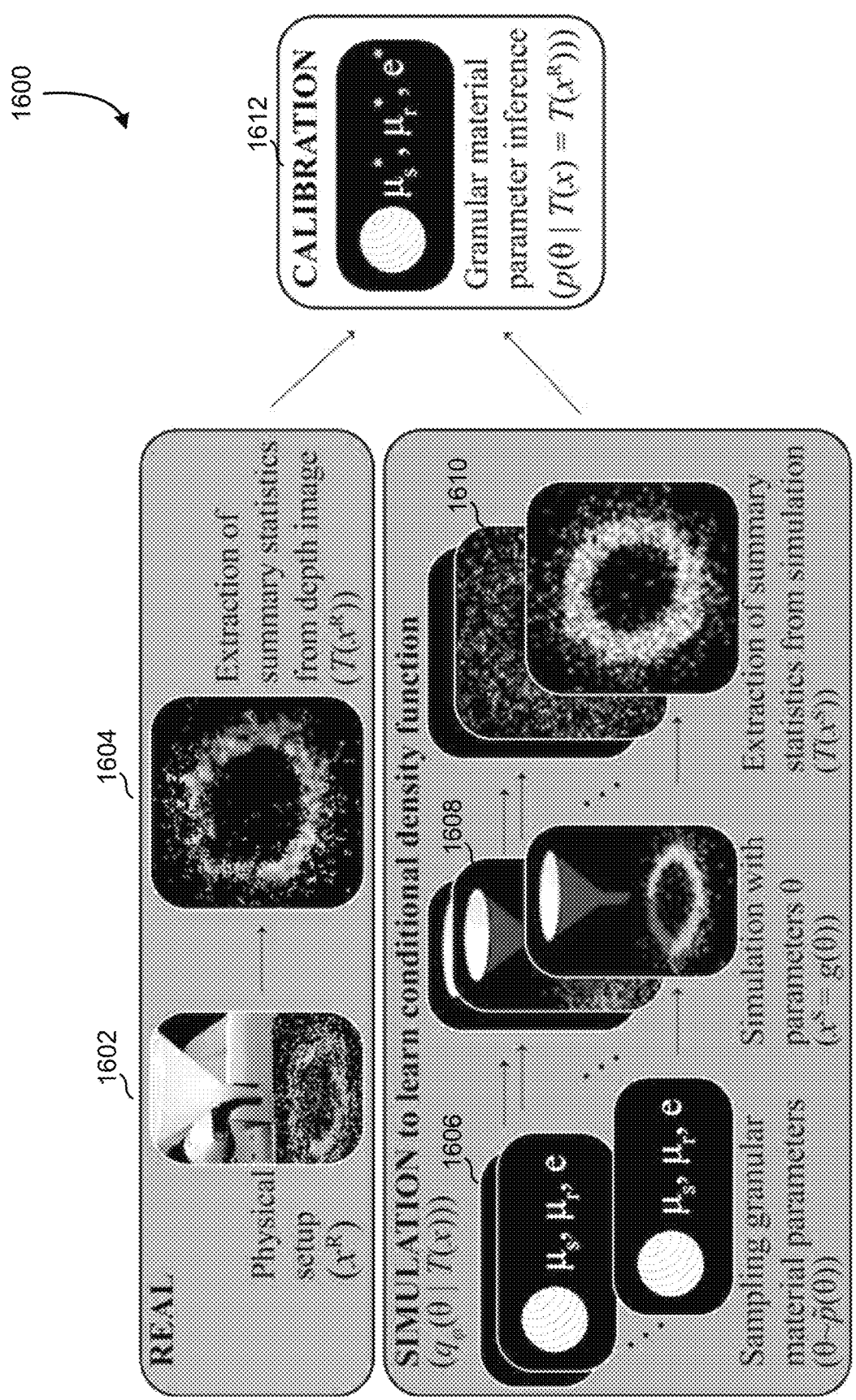
FIG. 16 illustrates elements and a process for determining underlying granular material parameters representing underlying properties of grains of the granular material, determined from observed values of characteristics of an aggregation of the granular material.

FIG. 16 illustrates elements and a process 1600 for determining underlying granular material parameters representing underlying properties of grains of the granular material, determined from observed values of characteristics of an aggregation of the granular material. In an embodiment, a physical setup 1602 is used to pour granular material onto a surface resulting in patterns that might depend on underlying properties of the grains being poured and conditions under which they are poured. Some underlying properties might be measured directly. For example, in some embodiments, a uniform grain diameter might be assumed and represented by one measurement, or a few measurements, of individual grains. Other underlying properties can be determined as described herein. Some of the conditions might include a pour height and a pour diameter (of a funnel or other device from which the grain is poured. Some of the observed values might be related to patterns formed, such as ring size, angle of repose, etc.

In an embodiment, determining underlying granular material parameters representing underlying properties of grains of the granular material comprises determining simulation parameters that can accurately produce real-world macroscopic behavior in a simulator, such as a fast and efficient simulator that might perform a trade-off of speed or efficiency for precision. In another embodiment, a high-performance simulator with accurate representation of equations and solution methods might be used specifically to estimate real-world parameters. Depending on the need, one or the other might be used. For example, where speed and adaptability are very important, perhaps a less precise or accurate, but faster, simulator might be used, such as in industrial robotics, but where higher precision or accuracy are more important than speed, the latter might be used, such as in physics and manufacturing.

In an embodiment, an image processor might extract summary statistics of an aggregate from depth camera images 1604, taken from directly above or at some other position. Some simulator inputs 1606 might be set initially to example values for the underlying parameter values.

Simulator inputs 1606 might be input to one or more simulators 1608 that would output simulated depth images 1610 and/or summary statistics of the simulated aggregate. In an embodiment, the simulated summary statistics are stored as a simulated set of features and are compared to derived set of features corresponding to underlying properties of grains.

In an embodiment, depth camera images 1604 and simulated depth images 1610 (or derived and simulated summary statistics) are compared and upon training the one or more simulators 1608 such that the compared elements are alike, underlying properties of the actually poured granular material can be inferred from revised values for simulator inputs 1606.

In general, the process described can be used to determine particle properties of grains without needing to model each individual grain or particle. In DEM, each particle may be represented independently, and particles may be assumed to interact with each other only when in direct contact during a given time step. Other numerical techniques to simulate granular materials may include the Material Point Method (MPM), which may construct a background mesh to compute gradients, and Position Based Dynamics (PBD), which may directly manipulate the positions of particles to enforce attachments and resolve collisions. The system may use a DEM solver on a simulation platform, which may enable both high accuracy and rapid simulation of a large number of spherical grains. Furthermore, the platform may allow for the direct input of possible physical characteristics such as geometry, frictional properties, and restitution, as well as a programmatic interface in which new testing scenarios can be rapidly created. Examples of physical characteristics might include grain shape, coefficients of friction, coefficient of restitution, and density, etc. Features of an aggregate might comprise shape of a ring or pile as the granular material is poured, time taken to pass through various hourglass shapes or funnels, etc.

In the system, a likelihood-free Bayesian inference framework may be utilized, which may allow the complexities of the simulator to be fully abstracted from the inference process, and furthermore, may use only a single iteration rather than multiple, which may be required by Bayesian filtering. The system may measure macroscopic behavior (e.g., the shapes of piles after granular material is poured through a funnel) using single images taken with inexpensive, off-the-shelf depth cameras.

In various examples, the simulator may utilize various simplifications. The simulator might be configured to consider only grains on the scale of about 1 mm or greater, thus excluding powders. The grain size and mass might be known and provided as an input, or not. The simulator may be configured to assume that all grains are of the same size and mass.

Figure 17:
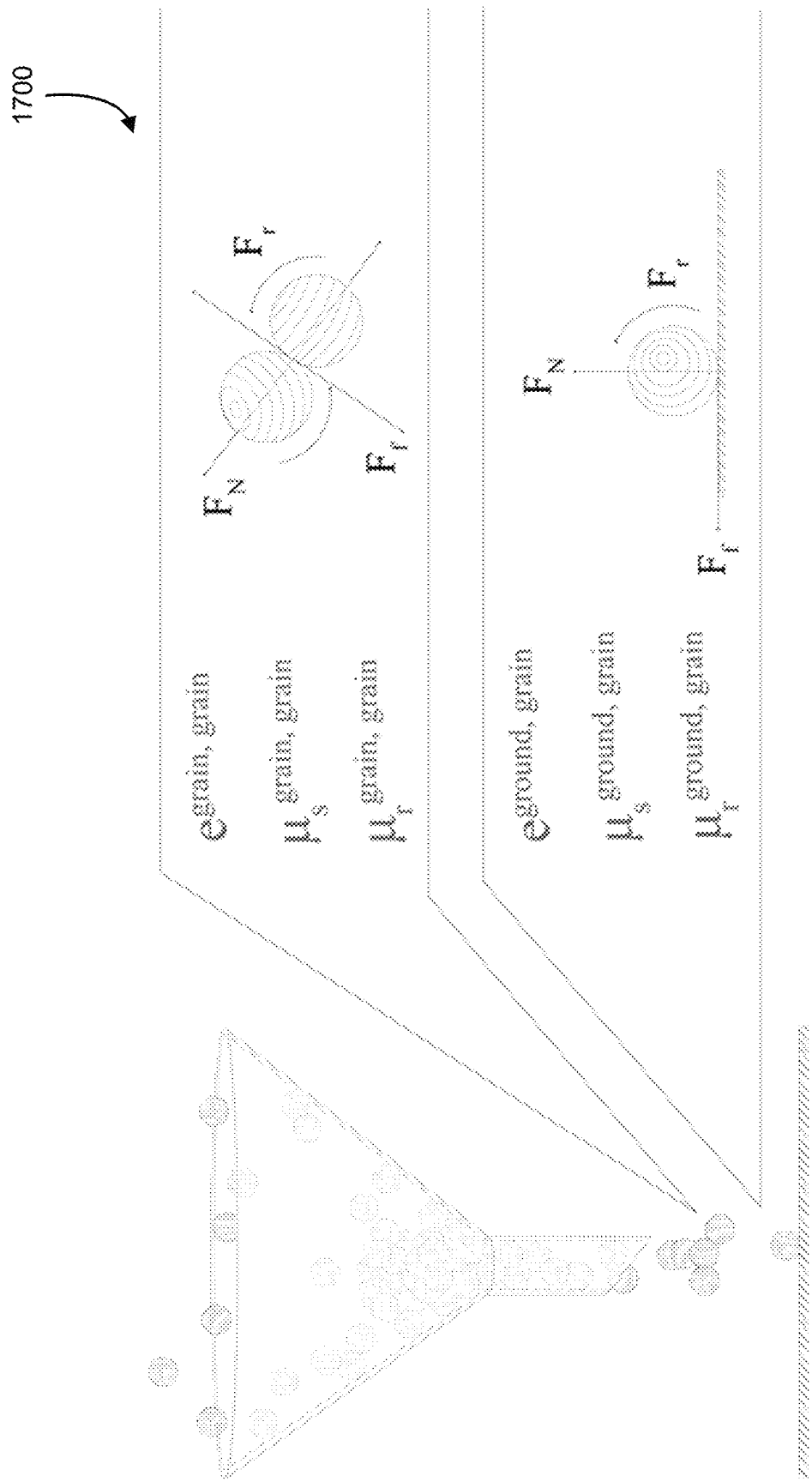
FIG. 17 illustrates a pouring process and how frictional forces might relate to a pouring process, in accordance with an embodiment.

FIG. 17 illustrates a pouring process and how frictional forces might relate to a pouring process. The simulator may be further configured to assume the grains are cohesion-less and perfectly rigid, and air resistance being negligible, so the only loss of energy the grains experience from frictional losses and collisions with each other and the ground surface need be considered. The forces depicted in FIG. 17 may be responsible for these inelastic collisions and may include functions of a coefficient of restitution e, a coefficient of sliding friction $\mu_s$, and a coefficient of rolling friction $\mu_r$, which may be defined by either grain-to-grain or grain-to-ground interactions 1700. The simulator may be configured to assume that the grain-to-grain and grain-to-ground coefficients are equivalent, but in other embodiments, distinct coefficients might be considered as the set of underlying parameters. In at least one embodiment, a simulator can determine at least approximate values for those physical characteristics. In at least one embodiment, other underlying physical characteristics of grains are what are determined using the simulator.

The simulator may be configured to model all grains as spheres or other shapes, such as ellipsoids, cubes, or cylinders. This simplification may make collisions easier and faster to compute, which may allow for an efficient and practical simulator that might find use in a near-real-time robotic application. In various embodiments, a simulator is trained to match overall bulk behavior of an aggregate of the granular material from inferred grain physical characteristics. In some uses, minor deviations in geometry of grains from spheres might be modeled with variances in values used for the inferred grain physical characteristics.

In various embodiments, a vector of parameters $\theta=[\mu_s, \mu_r, e]^T$ may represent a vector of the grain simulation parameters and/or physical characteristics of grains making up an aggregation of granular material. In some embodiments, vector components, and thus the underlying parameters that are measured, used, and/or form simulator inputs might be other than $\mu_s$, $\mu_r$, and e. These coefficients may be assumed to be equivalent for grain-to-grain and grain-to-ground interactions. Other components related to physical characteristics of grains might be used instead or as well, such as a geometry of grains, density, grain size, etc.

Where X represents observations of an aggregation of granular material, $X^r$ might represent what is observed in an actual physical aggregation of granular material and $X^s$ might represent what is observed in a simulated aggregation of granular material. An observation, X, might be represented in computer memory as a bird's-eye-view depth image of grains of an aggregation once the grains have been poured and have reached a steady state. In various embodiments, $X^s=g(\theta)$, where $g(\theta)$ may be a simulation function. A simulator might be programmed to output $X^s$ given $\theta$ as an input. In various embodiments, observation X, whether actually measured or simulated, relates to a result of pouring grains of the granular material into an aggregation such as a pile or a ring, which shape may depend on a height from which the granular material is poured, via a funnel or otherwise. An observation X might be informative of physical characteristics of grains making up the aggregation being observed.

In some embodiments, an observation X is represented by a function having fewer dimensions, such as a vector, T(X), comprising values for a set of features corresponding to summary statistics of the aggregation of granular material. Example components that might be represented in T(X) might be measurements of aspects of the aggregation, such as pile height, shape of a cross-section of a pile, average granular distance from a centroid, angle of repose of the aggregation, dispersion, shape or height distribution, and statistical dependence of grain locations imaged by a depth camera, etc. In some embodiments, an observation X might be represented by depth camera images, a derived feature set, possibly represented by a vector T(X), or some combination thereof.

In a specific embodiment, vector T(X) includes components corresponding to summary statistics such as quantities and functions of X, where X is an observation of a pile or ring of the granular material following a pour, which might have varying heights, z, relative to a landing surface of the granular material following the pour and varying radii, r, of radial distances in the horizontal plane corresponding to grain points from a centroid of the pile or ring. In a specific embodiment, vector T(X) might comprise components such as a maximum height of the aggregation relative to the landing surface, max(z), a mean height, $\mu(z)$, a standard deviation of heights, $\sigma(z)$, a maximum radius, max(r), a mean radius, $\mu(r)$, a standard deviation of radii, $\sigma(r)$, standard deviations in an x direction and in a y direction, $\sigma(x)$ and $\sigma(y)$, interquartile ranges, IQR(x), IQR(y), and IQR(r), kurtosis, KURT(r), and distance correlation dCor(r, z).

Figure 18:
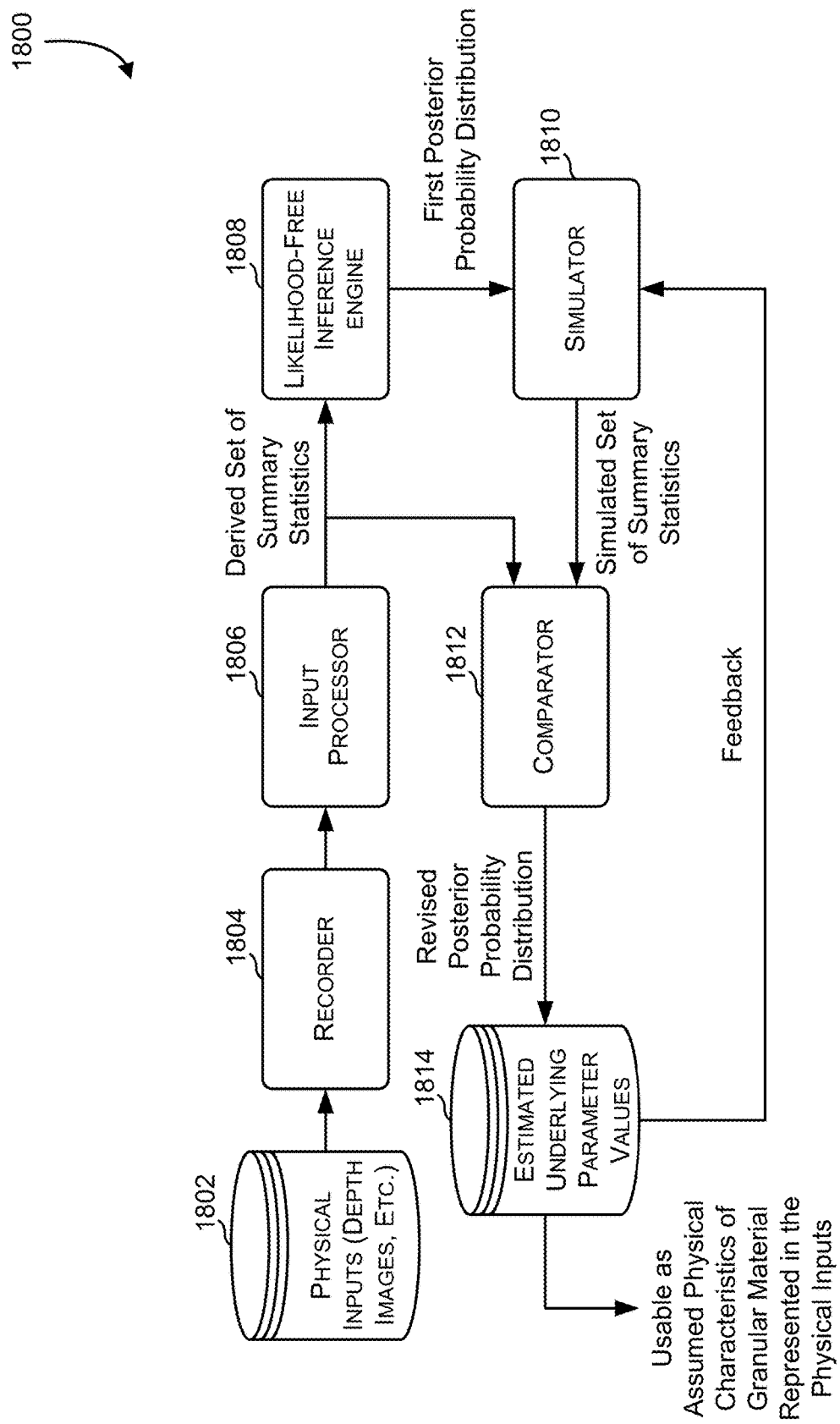
FIG. 18 illustrates an apparatus for training a simulator and using a simulator and a likelihood-free inference engine for determining parameters of grains of a granular material from physical inputs of an aggregation of the granular material, in accordance with an embodiment.

FIG. 18 illustrates an apparatus 1800 for training a simulator and using a simulator and a likelihood-free inference engine for determining parameters of grains of a granular material from physical inputs of an aggregation of the granular material. In an embodiment of an operation, physical inputs 1802 are provided to a recorder 1804. Physical inputs 1802 might be in the form of depth images, measurements of a small number of grains, and/or other observables of the aggregation of the granular material, perhaps after being poured using a pouring mechanism pouring the granular material onto a surface. In an embodiment, an input processor 1806 receives recorded data and distills it into a derived set of summary statistics. The derived set of summary statistics can be provided from the input processor to a likelihood-free inference engine 1808 that can output a first posterior probability distribution for the underlying characteristics to a simulator 1810. In an embodiment, simulator 1810 performs comparable summary operations as input processor 1806 and outputs a simulated set of summary statistics to a comparator 1812, which also receives the derived set of summary statistics. An output of comparator 1812 can be used to form a revised posterior probability distribution that can be stored in storage 1814 as estimates for underlying grain characteristics. In an embodiment, those stored values can be provided for use as assumed values for the physical characteristics of the granular material used to generate the physical inputs. For example, the assumed values could be provided to a robotic pouring system that can adjust pouring configurations to accommodate different grain characteristics. 14. Likelihood-free inference engine 1808 might also take in as inputs some variable inputs related to an aggregation process. For example, the derived set of summary statistics might include data observed for a plurality of pour heights, pour spout diameters, and/or pour durations.

Figure 19:
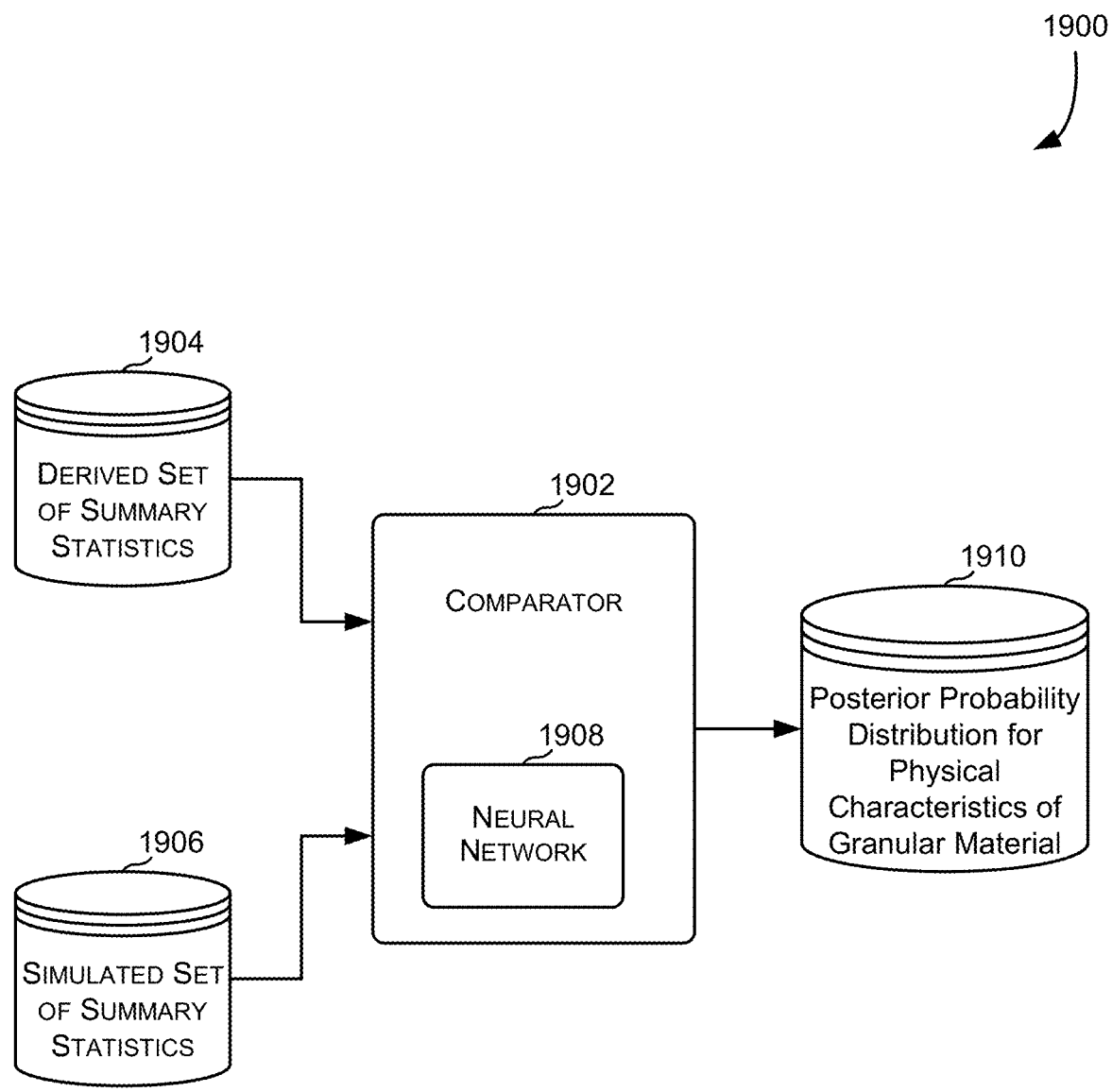
FIG. 19 illustrates an example comparator system, in accordance with an embodiment.

FIG. 19 illustrates an example comparator system 1900. A comparator 1902 compares a derived set of summary statistics 1904 and a simulated set of statistics 1906 using a neural network 1908 to derive a posterior probability distribution for physical characteristics of granular material 1910 from which the derived set of summary statistics 1904 was derived. The derived set of summary statistics 1904 might be derived using a depth camera and an image processor to process input data to determine summary statistics, such as distances in an aggregation of the grains of the granular material, a maximum height of the aggregation relative to a surface, a mean height, a standard deviation of heights, a maximum radius, a mean radius, a standard deviation of radii or direction, interquartile ranges of radii or direction, a kurtosis, and a distance correlation. The set of derived summary statistic might comprise statistics of the aggregation of the grains of the granular material including one or more time-varying statistic.

Figure 20:
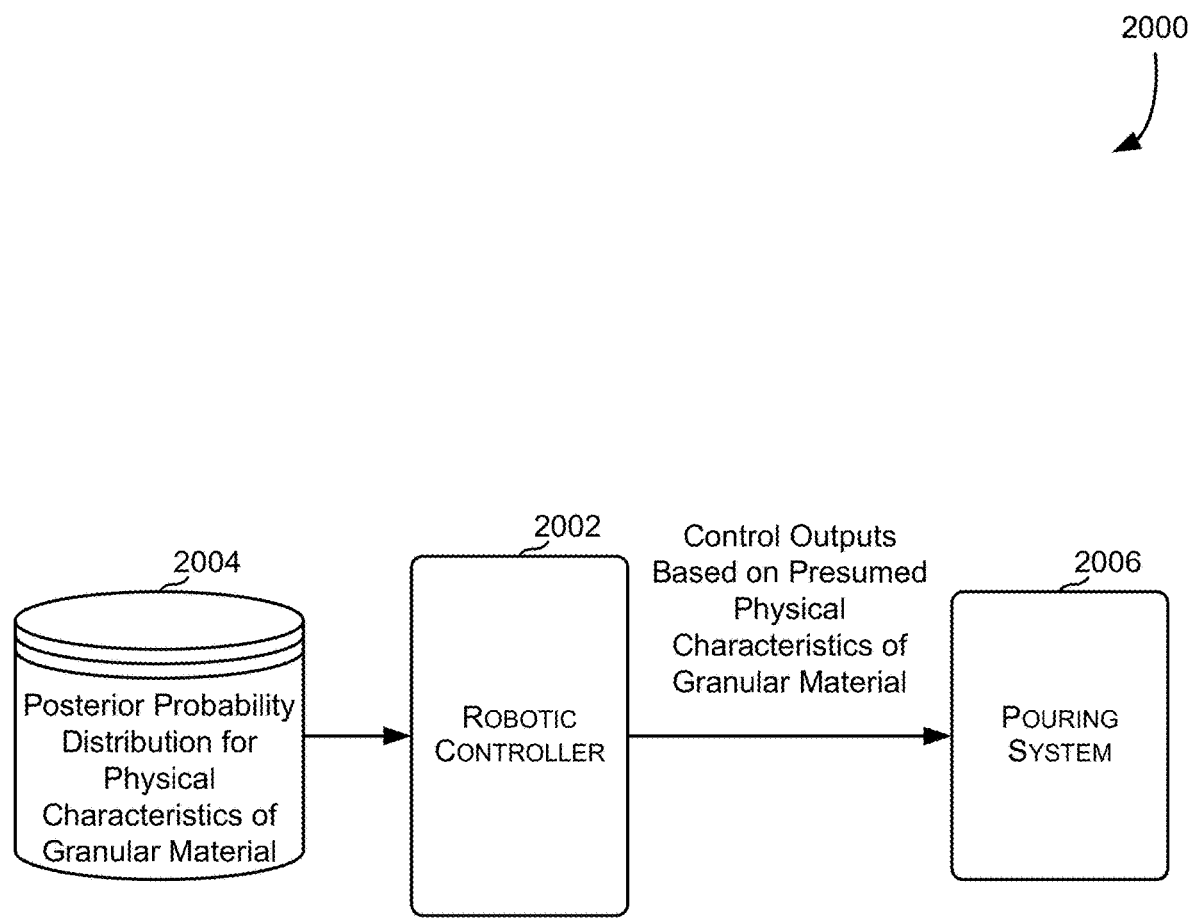
FIG. 20 illustrates a system as might use the posterior probability distribution for physical characteristics of granular material in some operations, in accordance with an embodiment.

FIG. 20 illustrates a system 2000 as might use the posterior probability distribution for physical characteristics of granular material in some operations. A simulator might be trained as illustrated in FIG. 18 and be used to generate the posterior probability distribution for physical characteristics of granular material from processing that is then used as values for the physical characteristics of the granular material. A robotic controller 2002 might read in that data from storage 2004 and output control signals to control a robotic pouring system 2006.

In an embodiment, a robotic pouring assembly comprises a hopper to receive granular material, and computer control and computer memory for storing granular physical characteristics values determined from prescribed values or from inferences from prior pourings of the granular material. The robotic pouring assembly can then adjust its operation accordingly, such as by adjusting a pour opening, sized to allow the granular material to flow from the hopper on a funnel or other shape opening, and a pour controller, coupled to the computer memory to read the granular physical characteristics values, wherein the pour controller controls a pouring through the pour opening based on the granular physical characteristics values. The control settings might also be determined in part using desired characteristics, such as desired flow rates, desired maximum spillage, etc.

A shape of a pile or a ring might be distilled to statistics from a particular distribution. As one example, a chi-distribution may be fit to a cross-section of a pile. In such embodiments, the vector T(X) might further include components representing a number, df of degrees of freedom of a standardized chi probability density, as well as a shift, b, and a scale, A, of the standardized chi probability density. The vector T(X) representing a set of features of a depth image of a granular material pour might thus be $T(X)=[\max(z), \mu(z), \sigma(z), \max(r), \mu(r), \sigma(x), \sigma(y), \sigma(r), \text{IQR}(x), \text{IQR}(y), \text{IQR}(r), \text{KURT}(r), \text{dCor}(r, z), df, b, A]^T$.

To extract the derived features from a grain formation, the depth image of the grain formation might be first down-sampled by factor n. Example values might be n=0.05 for $X^s$ and n=0.1 for $X^r$ to match resolutions of downsampled depth images. Using the color image from a depth camera, a color threshold may create a mask corresponding to grain-relevant pixels, thus reducing influence of pixels in an image not related to grains. The depth images may be fairly noisy and the mask may be used to segment out the ground pixels in $X^r$. The pixels corresponding to grains may be reprojected into 3D using a camera intrinsics matrix. For the real depth image, a plane may be fit to the non-grain pixels, and the point cloud reprojected from the grain pixels may be centered and rotated to account for any tilt of the camera relative to the plane.

A likelihood function may be defined as $p(T(X)|\theta)$ and a posterior probability might be defined as $p(\theta|T(X^s)=T(X^r))$. The likelihood function, which may be defined implicitly by $g(\theta)$, may be often intractable to evaluate or unavailable with complex simulations, which may require the use of a likelihood-free inference approach.

Given samples of $T(X^s)$, the posterior function $p(\theta|T(X^s)=T(X^r))$ may be approximated such that, from a real observation $X^r$, the proper simulation parameters of the grains $\theta$ to match bulk characteristics of the material may be inferred, summarized by derived feature set vector T(X). Because granular DEM simulations may be associated with complex systems of dynamical differential equations and numerical solvers, a simulator-agnostic inference framework may be chosen to approximate the intractable posterior by sampling from the simulator. The likelihood-free Bayesian inference framework, which may be a framework such as the BayesSim framework, may be used to approximate this posterior.

The system may estimate granular parameters $\theta=[\mu_s, \mu_r, e]^T$ from a vector $T(X^r)$ representing a derived set of features derived from the observation $X^r$. The estimation might use the framework, in which the estimate may approximate the posterior probability $p(\theta|T(X^s)=T(X^r))$ by sampling from a simulator g. The framework may learn an approximation of the posterior function, $q^\circ(\theta|T(X^s)=T(X^r))$, by mapping vector T(X) to a mixture of K Gaussian components via random Fourier features, where φ may be the set of learnable parameters of q. A Mixture Density Random Fourier Feature network (MDRFF) may learn from N pairs of parameters and a derived feature set vector, $\{\theta^i, T(X_i^s)\}_{i=1}^N$, which may be generated by independently sampling from a predefined prior probability distribution, p(θ), and forward simulating each sample, $\theta_i$. For twice differentiability of q, a Matérn kernel may be used with v=2.5, where v may increase with smoothness. In various embodiments, using the framework, the complexities and inaccuracies of the DEM simulator and PDE solver are incorporated via likelihood-free inference. Additionally, the multimodality of the approximated posterior q and its associated uncertainty may be used to analyze the accuracy and robustness of the simulation with respect to the parameters being inferred and measurement noise.

The following example may be an example implementation of the system, in accordance with at least one embodiment. A physical scene may be utilized for the simulator. For the physical scene, a funnel may be positioned with its bottom tip 12 cm above the ground surface, which may be wrapped in moderate-friction black velvet to limit pile spread and simplify grain segmentation.

The primary grain utilized may be the Israeli couscous, which may be geometrically similar to a rounded cylinder. Barley grains, which may have a similar density but may be slightly larger and more ellipsoidal, may also be utilized. A depth camera, such as the Intel RealSense D435 depth camera, may be positioned at 40 cm above the ground surface. This position may be based on field-of-view (FOV) coverage as well as clarity of depth image. Because depth image quality degrades as FOV increases, 40 cm may be a reasonable camera position to balance this tradeoff. A robot such as the ABB YuMi bilateral robot may also be utilized.

Within a simulated scene of the simulator, all measurable dimensions may be made equivalent in the simulated scene. Specifically, the funnel, which may be 3D modeled with the dimensions of the physical funnel, may be positioned at an equivalent distance above the ground surface. The spherical grains may be scaled to match the diameter of a single grain of Israeli couscous along its longest axis (4 mm). At the start of the simulation, 2000 grains may be spaced a grain width apart in a grid formation (10 wide by 10 deep by 20 high), where the bottom grains may be positioned right below the top lip of the funnel. In various embodiments, the initial position of these grains may be insignificant to the outcome of the simulation.

The coefficient of restitution e may be the ratio of a grain's speed before and after a collision, and may range from 0 to 1, in which 1 may denoted that all energy is conserved during collision. The ranges of coefficients of sliding friction $\mu_s$ and rolling friction $\mu_r$ that create a noticeable diversity in grain pile spread may be from 0 to 1 and from $10^{-7}$ to 0.1, respectively. Rolling friction may be sampled from a logarithmic distribution. A simulated depth camera may be positioned at a birds-eye-viewpoint, 29 cm from the surface ground, which may give it a 58 cm by 58 cm field-of-view. Some other distances might be used. The solver chosen may be a Newton linear solver Preconditioned Conjugate Residual (PCR), and 20 linear (inner) iterations with 4 Newton (outer) iterations may be utilized. The simulator may run with timestep one-sixtieth of a second, ten substeps, and a relaxation factor of 0.75 for stability and convergence.

Sensitivity tests may be run to help guide the design of the system and to illuminate any opportunities to add or reduce complexity. There may be various sources of noise when running the simulator to train the framework. The first may be purely algorithmic, due to the non-determinism of the simulator and numerical error. To measure algorithmic uncertainty, the simulator may be run a large number of times, such as 1000 times, with the same inputs except for sliding friction varying over the range $\mu_s=\{0.01, 1\}$, perhaps with a uniform probability distribution. The derived feature set for each $\mu_s$ may have variances of at least a couple orders of magnitude smaller than their mean values.

An insufficient number of samples for training and interpolation uncertainty may contribute to poor performance. A training set may be created by sampling $\mu_s$ uniformly between 0.01 and 1. A testing set may be generated by sampling between 0.01 and 1, independent of the training set. The accuracy of the friction coefficients inferred by the framework may improve with more samples. In various embodiments, for example, with 500 samples represented by the training set, the error in the friction coefficient estimate may be 0.0191±0.0799, while 1000 training samples may lower the error to 0.0062±0.0018.

Figure 21:
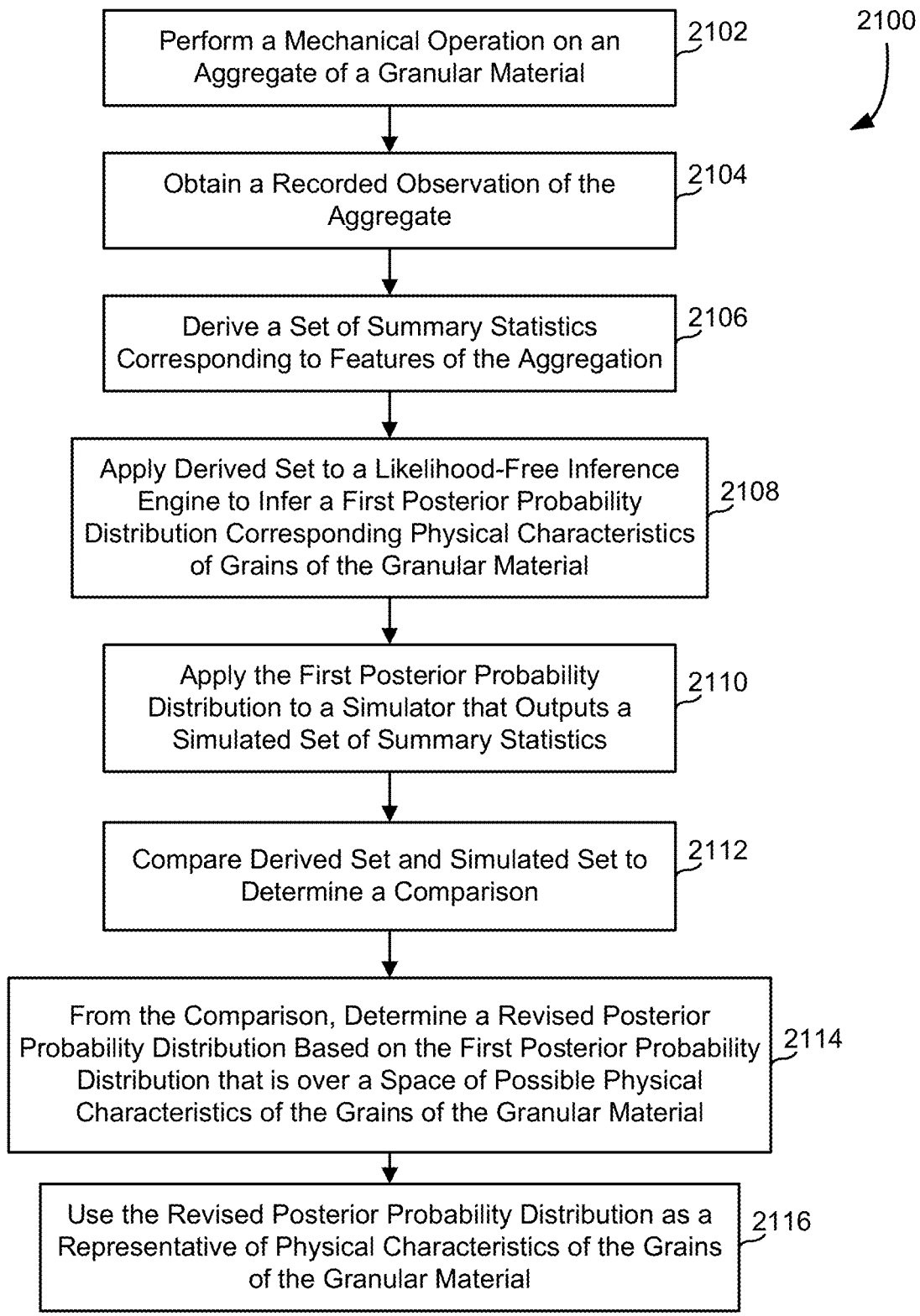
FIG. 21 is a flowchart of a process for determining physical characteristics of grains of the granular material from aggregates of the granular material, in accordance with an embodiment.

FIG. 21 is a flowchart of a process 2100 for determining physical characteristics of grains of the granular material from aggregates of the granular material. In step 2102, a mechanical operation, such as a pouring, scooping, and/or moving some aggregation of a granular material is performed. In step 2104, observations of the aggregation are recorded. In step 2106, a derived set of summary statistics, corresponding to one or more features of the aggregation, is derived from the recorded observations. In step 2108, the derived set of summary statistics is applied to a likelihood-free inference engine to infer a first posterior probability distribution corresponding to at least one physical characteristic of grains of the granular material.

In an embodiment, a prior probability distribution used by the likelihood-free inference engine to infer the first posterior probability distribution might be generated by an iterative process. For example, in an embodiment, an initial prior probability distribution might represent estimates of real-world behavior and then be updated based on experimental results. In a specific embodiment, an intermediate posterior probability distribution is determined by inference from the initial prior probability distribution and/or the experimental results, and then that intermediate posterior probability distribution could be used as a prior probability distribution to be an input to the likelihood-free inference engine to infer an ultimate posterior probability distribution.

In step 2110, the first posterior probability distribution is provided to a simulator that simulates the mechanical operation assuming the first posterior probability distribution represents the granular material, to produce a simulated set of summary statistics. In step 2112, a comparator compares the derived set of summary statistics to the simulated set of summary statistics to determine a comparison, which can be used for training the simulator. In at least one embodiment, the comparison provides a conditional probability. In step 2114, a revised posterior probability distribution is determined based on the first posterior probability distribution, wherein the revised posterior probability distribution is over a space of possible physical characteristics of the grains of the granular material. In step 2116, the revised posterior probability distribution is used as a representative of at least one physical characteristic of grains of the granular material. The recorded observation might comprise depth images of the aggregation of the granular material. The comparison might comprise training a neural network on comparisons to derive the revised posterior probability distribution based on the first posterior probability distribution. The derived set of summary statistics might comprise statistics of the aggregation including one or more of pile height, shape of a cross-section of a pile, average granular distance from a centroid, angle of repose of the aggregation, dispersion, shape or height distribution, and statistical dependence of grain locations imaged by a depth camera, a maximum height of the aggregation relative to a surface, a mean height, a standard deviation of heights, a maximum radius, a mean radius, a standard deviation of radii or direction, interquartile ranges of radii or direction, a kurtosis, and a distance correlation. Some of the derived set of summary statistics might be time-varying statistics.

Figure 22:
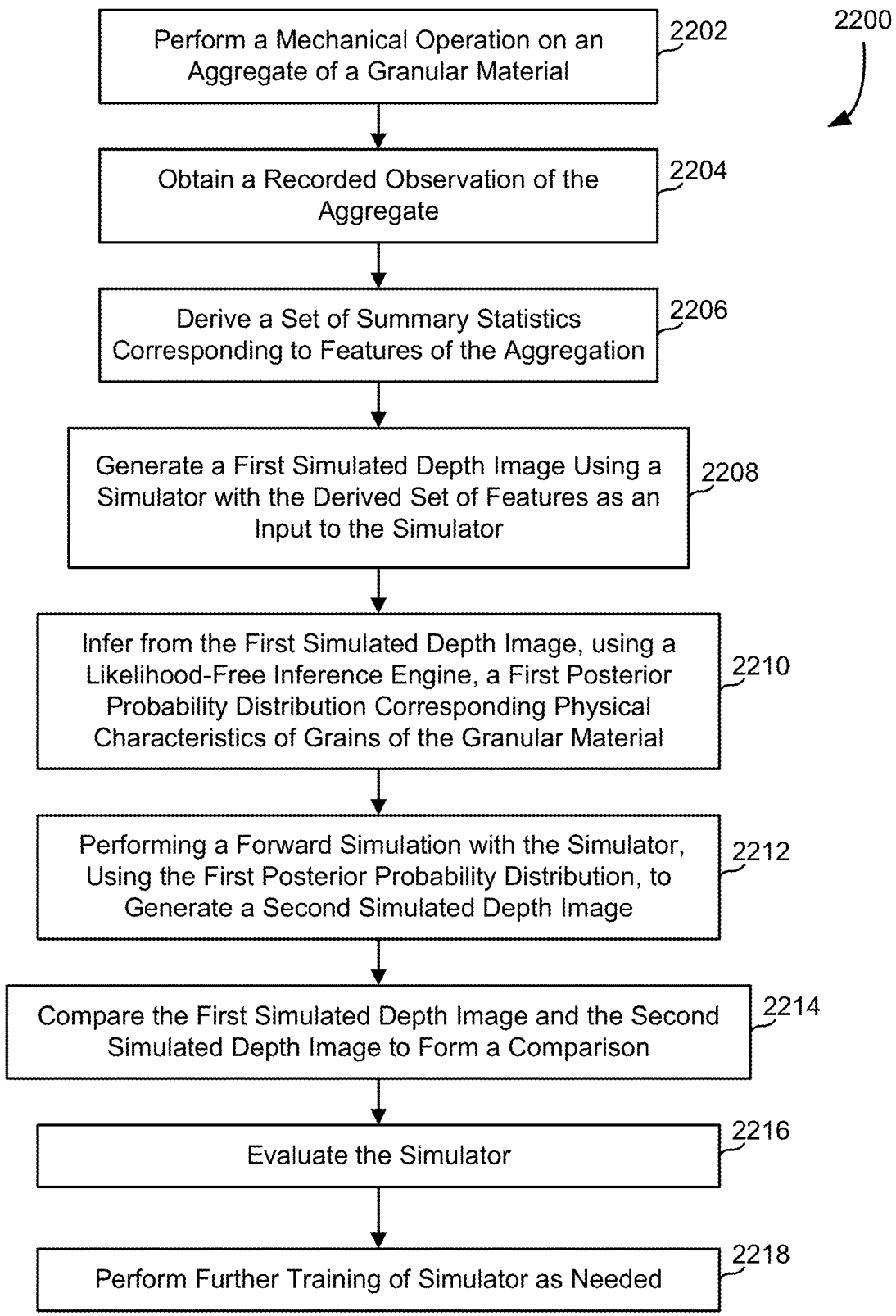
FIG. 22 is a flowchart illustrating a method of testing a simulator, in accordance with an embodiment.

FIG. 22 is a flowchart 2200 illustrating a method of testing a simulator. In step 2202, a mechanical operation, such as a pouring, scooping, and/or moving some aggregation of a granular material is performed. In step 2204, observations of the aggregation are recorded. In step 2206, a derived set of features of a granular material, comprising one or more features, is derived. In step 2208, generating a first simulated depth image using the simulator, with the derived set of features as an input to the simulator for the first simulated depth image. In step 2210, a likelihood-free inference engine infers, from the first simulated depth image, a first posterior probability distribution corresponding to at least one physical characteristic of grains of the granular material. In step 2212, a simulator does a forward simulation using the first posterior probability distribution, to generate a second simulated depth image. In step 2214, a comparator compares the first simulated depth image and the second simulated depth image to form a comparison. In step 2216, the simulator is evaluated. In an embodiment, this is performed by considering differences between the first simulated depth image—generated from the derived set of features—and the second simulated depth image—generated from the simulated set of features. In an embodiment, comparing the first simulated depth image and the second simulated depth image comprises computing an L2-norm error between the first simulated depth image and the second simulated depth image. In step 2218, the simulator is further trained as needed.

In an embodiment, some of these steps are repeated over a plurality of distinct derived sets of features of the granular material, which might include varying a first sampling of a coefficient of sliding friction over a first range, a second sampling of a coefficient of rolling friction over a second range, and a third sampling of a coefficient of restitution over a third range, wherein the first sampling is sampled uniformly, the second sampling is sampled logarithmically, and the third sampling is sampled uniformly.

The derived feature set of the real and simulated depth images of the system may lie within the same distribution. However, the two might not align or overlap, such as where drastically different observations are made, due to a low quality depth image or for other reasons. Two types of camera noise may be simulated on a sample testing set, where $\mu_s$ may be evenly sampled from 0.01 to 1 with all other parameters equivalent. An XY Gaussian blur with $\sigma=\{0, 2, 4, 6, 8\}$ may be convolved with the depth image, and pixel-wise Gaussian noise with $\sigma=\{0, 0.001, 0.002, 0.003, 0.004\}$ may be added to each depth value, with ranges chosen to mimic realistic noise magnitudes. These two perturbations may be applied independently; the resulting posteriors per true friction value may be illustrated by table 2300 in FIG. 23.

Figure 23:
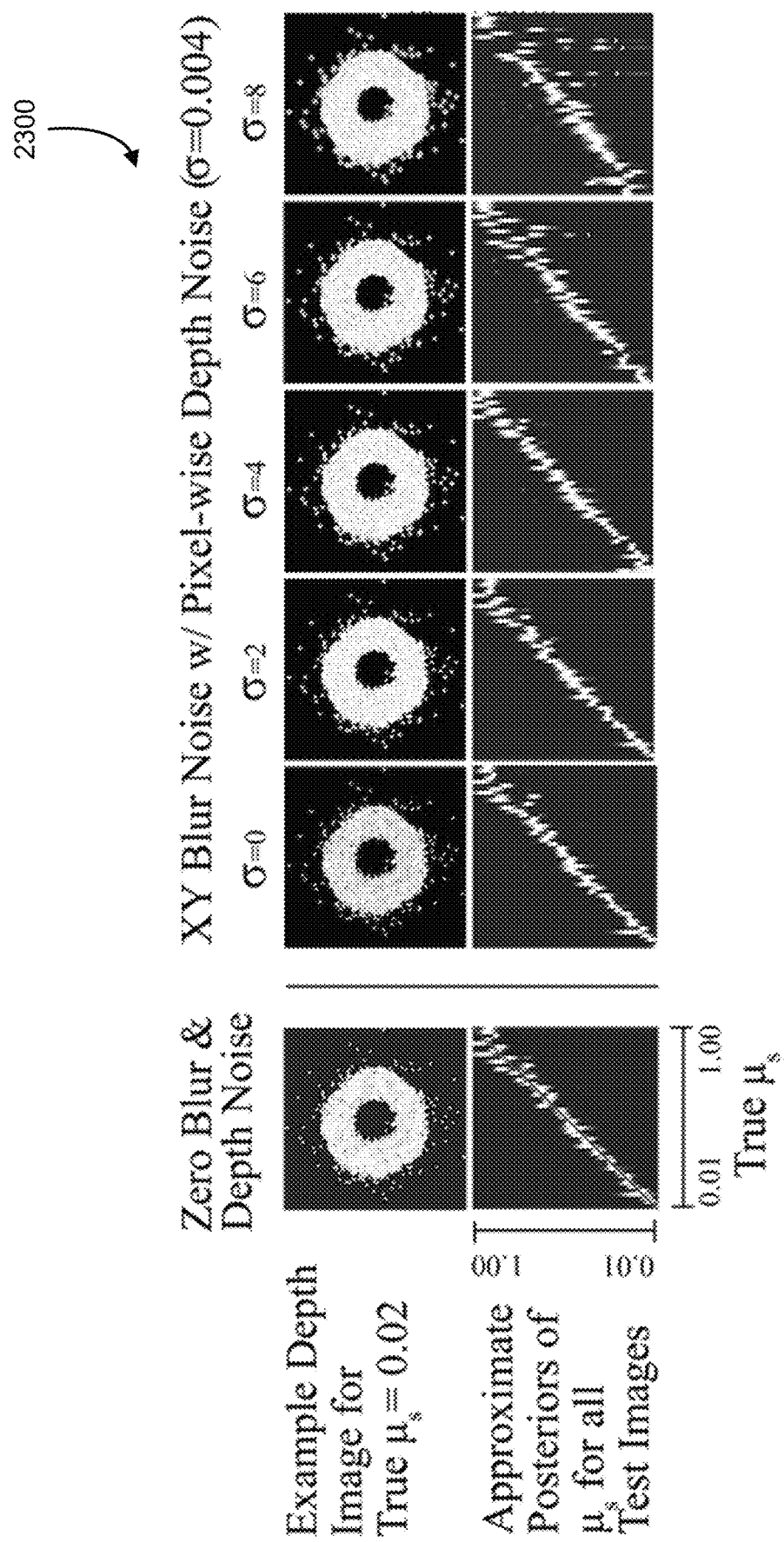
FIG. 23 illustrates an example of noise, in accordance with an embodiment.

FIG. 23 illustrates sensitivity to observation error. In an example shown, different levels of noise are applied by generating 50 test images with $\mu_s$ evenly sampled from 0.01 to 1. The resulting approximated posteriors are plotted per a true value of $\mu_s$, where the highest peaks correspond to the brightest points. In the posterior for the zero noise case, the shaded line in the plot is the like where the posterior would be exactly equal to the true value. A prefect inference would result in highest peaks centered around that shaded line. In an embodiment, inference of $\mu_s$ may be fairly robust to the level of per-pixel Gaussian depth noise applied. Accuracy might be more affected by Gaussian blur, such as where posterior peaks become wider and more multi-model with $\sigma>4$.

The initial positions of the simulated grains may affect the accuracy of the inferred $\mu_s$. The same trained model as described in the preceding paragraphs may be used, and new testing sets may be generated by varying the initial spacing between the grains to half and twice a grain's width and the height of the grains relative to the funnel. In various embodiments, there may be no noticeable effect on the final spread of the grains, with no statistically significant difference between the accuracies of the predicted friction coefficients.

The accuracy of the trained framework model may be tested on simulated depth images. A simulated depth image, $X^{s,i}$, of an i-th grain formation might be generated with a simulator having g( ) as its simulation function using an input θ. An accuracy of an inferred vector, $\theta^*=[\mu_s, \mu_r, e]$ might be performed by quantifying a difference between θ and θ*. In one method for evaluating how well the inferred parameters θ* matched the given observation $X^{s,i}$, a forward simulation may be run to obtain a new observation $X^{s,o}=g(\theta^*)$. The difference between the piles may be evaluated via the L2-norm error between $T(X^{s,i})$ and $T(X^{s,o})$, both which may be standardized over the derived feature set vectors of the training dataset.

Figure 24:
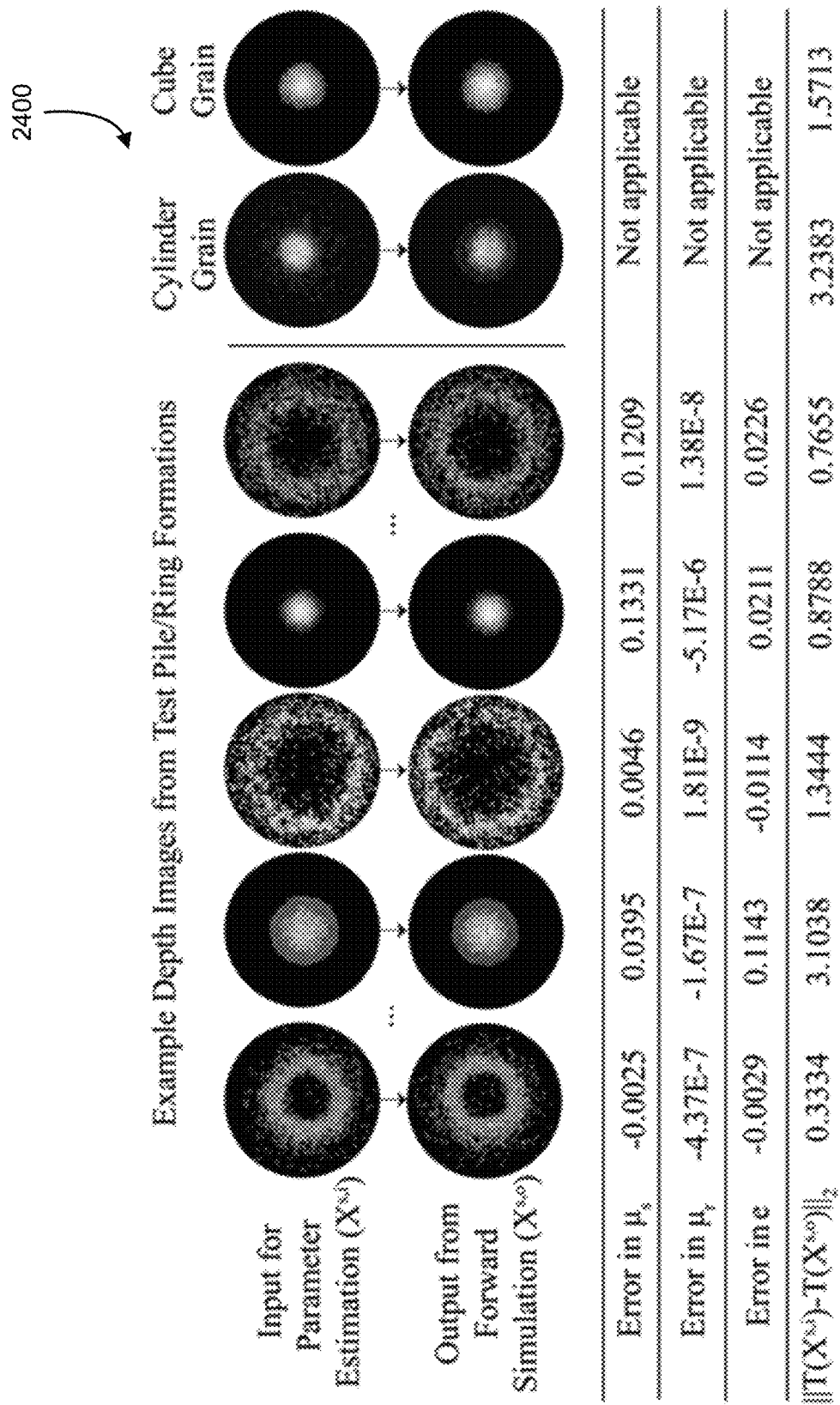
FIG. 24 illustrates an example of errors, in accordance with an embodiment.

The test grain formations may be simulated by randomly sampling the three parameters uniformly for $\mu_s$, and e and logarithmically for $\mu_r$ from their given ranges. In various embodiments, for example, the average error of the inferred e may be −0.0008±0.0148, while that of $\mu_s$ and $\ln(\mu_r)$ may be 0.0380±0.0646 and −1.1695±0.7032, respectively. In various embodiments, on average, estimates of $\mu_s$ and $\mu_r$, may be slightly above and below; the two variables may be dependent and tend to compensate for error in the other to create a similar pile shape. FIG. 24 illustrates examples 2400 of forward simulations of the inferred parameters for the test formations may generate visually equivalent shapes. In some embodiments, the average L2-norm error between the derived feature sets of the given piles and their corresponding forward simulated piles may be 1.582±0.3356. As illustrated in FIG. 24, simulated depth images of testing sets and simulated depth images from running a forward simulation with inferred parameters are compared. A table in FIG. 24 shows example errors in inferred parameters and corresponding L2-error between summary statistics.

Sim-to-sim comparisons may enable a principled approach to testing sensitivity to model error. For example, it may be assumed that all grains can be represented by spheres, when in reality most grains may be non-spherical. Sensitivity to mismatched geometry may be tested by creating a testing set of cylinder-shaped grains and cube-shaped grains, where the diameter and length of each grain may be 4 mm, the diameter of the training set spheres. Each testing set may comprise fifty different piles which may vary in $\mu_s$, while e and $\mu_r$ may be fixed to 0.5 and $10^{-6}$. The values of $\mu_s$, $\mu_r$, and e may be inferred from the test piles and forward simulated with spherical grains. Continuing with this example, comparing the forward simulated piles and original piles composed of cylindrical and cube grains, the L2-norm errors between the derived feature sets may be 4.0139±1.0574 and 1.8301±1.9275, respectively. Spherical grains may approximate piles made with cubes better than cylinders, possibly due to the asymmetry of cylinder geometry. In various embodiments, a spherical representation may be sufficient.

Parameters of real granular formations may be inferred to produce accurate simulations. For example, an initial test set may be utilized, and may comprise real depth images of approximately 2000 grains of Israeli couscous, poured through a funnel set at 12 cm above the ground surface. Ten different pours may be executed, and for each, ten consecutive depth images may be collected, which may be averaged to account for the camera temporal noise. For each of the ten averaged images pairs $\{X^{r,i}\}_{i=1}^{10}$, derived feature sets $\{T(X^{r,i})\}_{i=1}^{10}$ may be computed and $\mu_s$, $\mu_r$, and e may be inferred. Forward simulation may be run for each parameter set and the L2-error may be computed between the derived feature sets of the real pile and resulting forward-simulated pile. From the ten parameter sets inferred, the five corresponding to the lowest errors may be averaged. The inferred parameters for couscous may be: $\mu_s$=0.6687, $\mu_r$=8.1506E-7, and e=0.7689. The same procedure may be performed with barley: $\mu_s$=0.3807, $\mu_r$=1.0613E-6, and e=0.4792.

Figure 25:
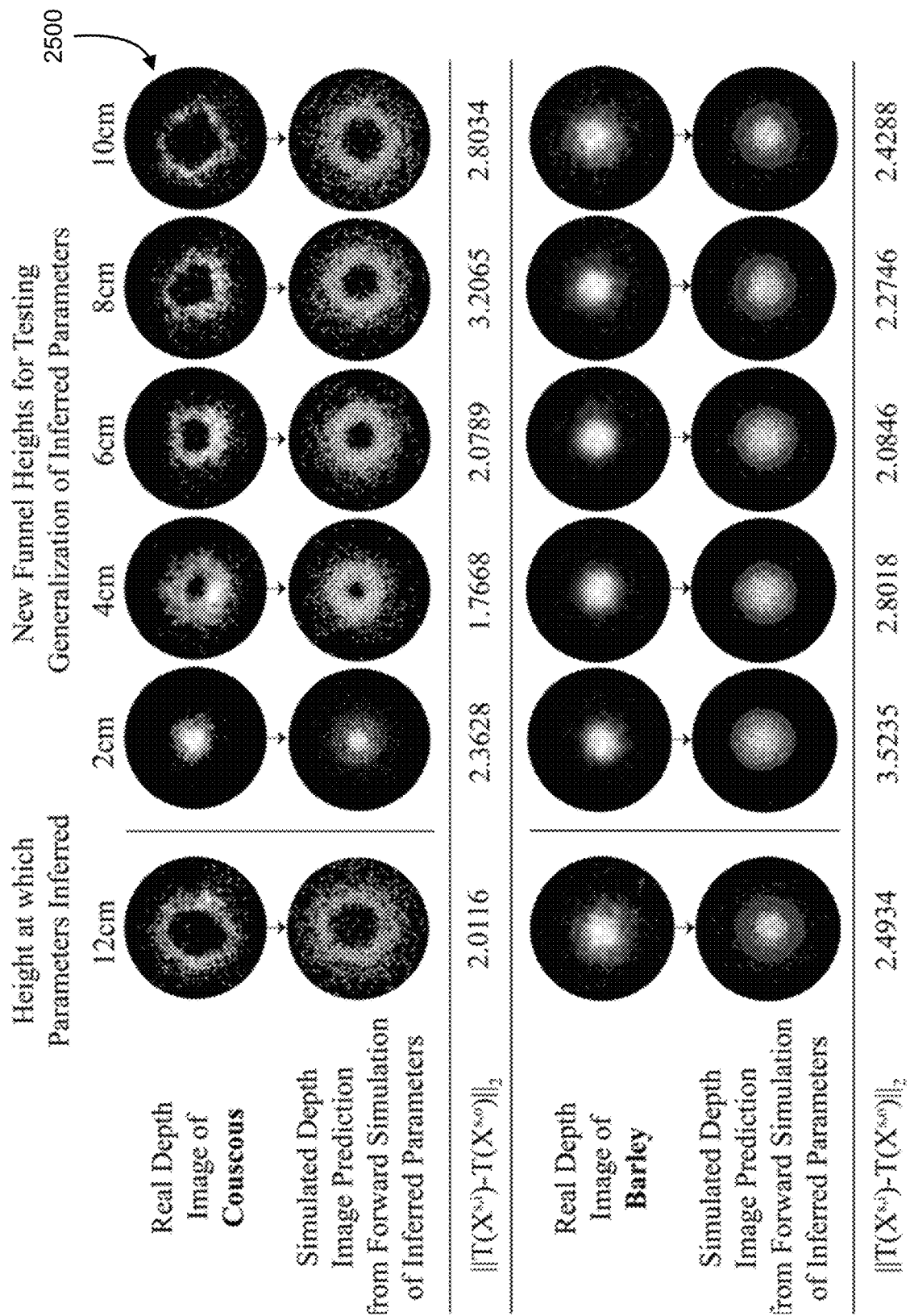
FIG. 25 illustrates an example of depth images, in accordance with an embodiment.

Forward simulation with the estimated parameters may capture similar macrobehavior as five pours performed at 12 cm, and may have an average L2-norm error of 2.2263±0.1377 and 2.0311±0.3807 between the real and simulated couscous and barley piles. Five more pours of each grain may be performed, in which each pour may be a different height: 2, 4, 6, 8, 10 cm off of the ground. For each of these pours, a forward simulation may be run with the same grain parameters while shifting the funnel height. FIG. 25 illustrates examples 2500 wherein the inferred parameters may generalize well, with relatively low L2-errors. In various embodiments, the framework may be utilized to reason about pour heights to create desired pile and ring shapes given a specific type of grain. FIG. 25 depicts comparisons of real depth images of piles poured at different heights and simulated depth images generated from running a forward simulation at the corresponding heights with parameters inferred from a height value of 12 cm. L2-error values are listed below corresponding depth images.

Figure 26:
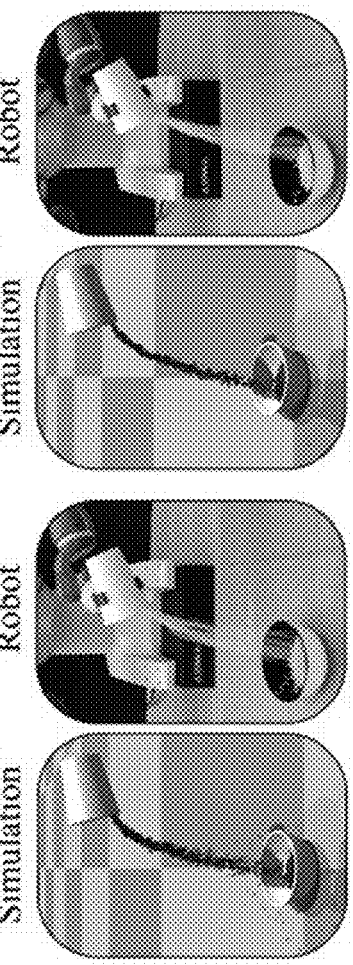
FIG. 26 illustrates an example robotic process, in accordance with an embodiment.
Figure 26:
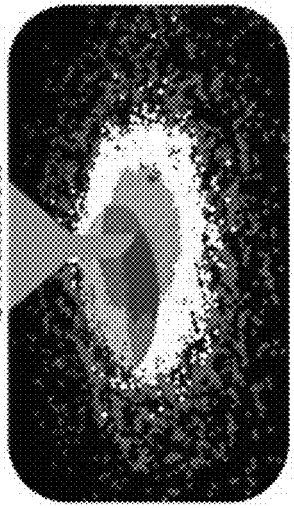
Figure 26:
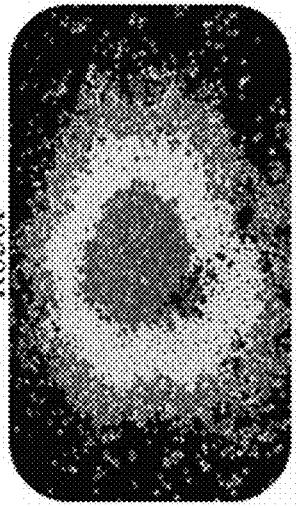

The framework may enable an industrial robot to pour granular material into a desired shape, as may be necessary in a kitchen or factory. A new model may be trained on 1000 simulated piles. The simulator parameters $\mu_s$, $\mu_r$, and e may be set to their inferred values for couscous (0.6687, 8.1506E-7, and 0.7689, respectively), and the funnel height may be uniformly sampled between 1 and 13 cm. Two derived feature sets may be computed from the resulting granular formation (e.g., the 5th and 50th percentile of granular radial distance, which may approximate the inner and outer radii of a ring). The model may then be evaluated on a testing set to infer the funnel height from these two derived feature sets; the height may be estimated within 0.0530±0.2221 cm. Derived feature sets may be chosen to correspond to a desired pattern of two concentric rings with an inner pile. The model may infer corresponding funnel heights of (27.1, 10.1, 1.5 cm). The robot may be commanded by the system to pour couscous from these heights, resulting in the desired pattern as depicted in the diagrams 2600 in FIG. 26. In FIG. 26, shading of the piles on the left of the figure represent differing ring shapes. Images in the upper right compare simulated results of a pouring and results of an actual pouring of grains into a bowl. As indicated, a simulation of couscous and barley can perform well in estimating magnitude of grains to leave the cereal bowl.

The presented framework may also predict undesirable spilling during a granular pouring task. The calibrated simulator may be used to simulate the pouring of couscous and barley into a cereal bowl, with the simulation relaxation constant increased from 0.75 to 0.9 to ensure accurate simulation of high-speed collisions. The number of grains that spilled out of the bowl may be counted. The industrial robot may then be used to precisely repeat the experiment in the real-world, pouring grains into a velvet-lined cereal bowl to match simulator conditions. As tabulated in FIG. 26, in most cases, the calibrated simulator may predict the number of spilled grains across different pouring heights with a high degree of accuracy.

Utilizing this system, the material parameters of granular materials may be inferred using a new framework likelihood-free Bayesian inference, efficient simulation, and simple experiments. The use of GPU-based simulation and off-the-shelf depth cameras may be utilized for robotics applications. Simulation-to-simulation inference may be highly accurate, and simulation-to-experiment inference may trail closely in performance. The system may allow for inferred parameters to be generalized well to different pouring heights, and furthermore, that, through the system, a robot may effectively reason about granular material to pour desired granular formations and predict its behavior in dynamic scenarios. In at least one embodiment, an industrial robot can be used for pouring materials. In at least one embodiment, the control processes described herein might be used in an environment not always considered robotic, such as for informing a process of moving granular materials, such as cereal stockpiles moved to/from ships.

Within the system, to improve inference, observations can be amended to include temporal sequences of depth images, with additional summary statistics to capture transient dynamics. Within the system, to enhance simulation, model cohesion may be utilized, allowing liquid-to-solid interactions (e.g., capillary bridging); in addition, simulated particle geometries may be represented as superquadrics, which may enable a more accurate approximation of complex real-world grain geometries. The system may also be utilized for more elaborate robotic manipulation tasks, such as moving the end effector along a trajectory to create an asymmetric grain trail, or scooping and pouring granular material into and out of assorted containers.

Inference and Training Logic

Figure 27A:
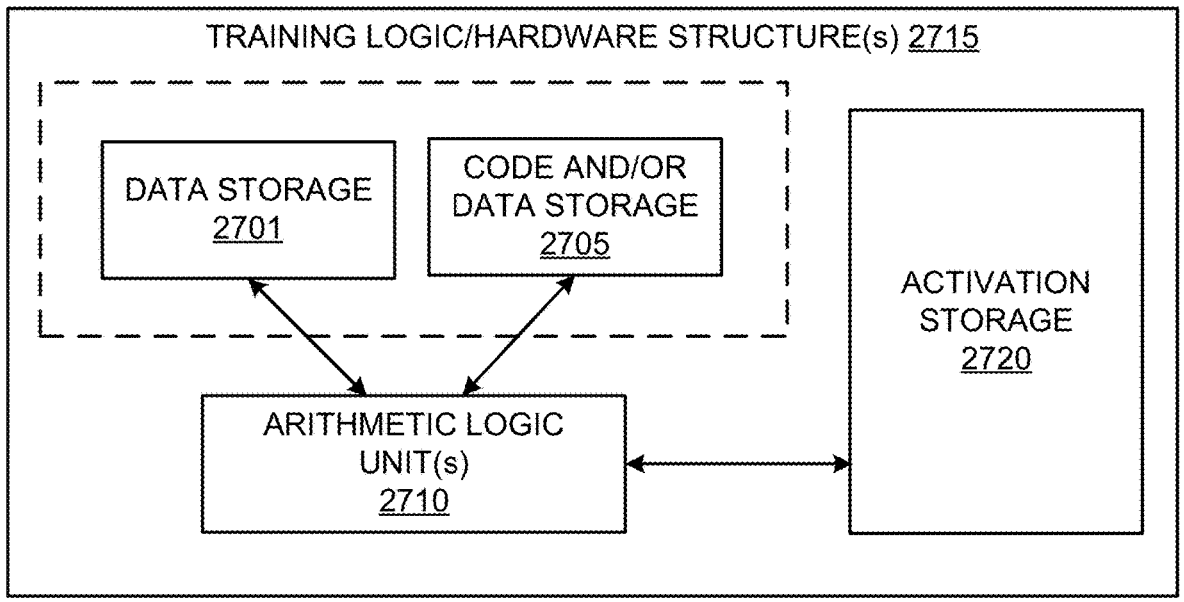
FIG. 27A illustrates inference and/or training logic, according to at least one embodiment.

FIG. 27A illustrates inference and/or training logic 2715 used to perform inferencing and/or training operations associated with one or more embodiments. Details regarding inference and/or training logic 2715 are provided below in conjunction with FIGS. 27A and/or 27B.

In at least one embodiment, inference and/or training logic 2715 may include, without limitation, code and/or data storage 2701 to store forward and/or output weight and/or input/output data, and/or other parameters to configure neurons or layers of a neural network trained and/or used for inferencing in aspects of one or more embodiments. In at least one embodiment, training logic 2715 may include, or be coupled to code and/or data storage 2701 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which such code corresponds. In at least one embodiment, code and/or data storage 2701 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 2701 may be included with other on-chip or off-chip data storage, including a processor's L1, L2, or L3 cache or system memory.

In at least one embodiment, any portion of code and/or data storage 2701 may be internal or external to one or more processors or other hardware logic devices or circuits. In at least one embodiment, code and/or code and/or data storage 2701 may be cache memory, dynamic randomly addressable memory ("DRAM"), static randomly addressable memory ("SRAM"), non-volatile memory (e.g., flash memory), or other storage. In at least one embodiment, a choice of whether code and/or code and/or data storage 2701 is internal or external to a processor, for example, or comprising DRAM, SRAM, flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 2715 may include, without limitation, a code and/or data storage 2705 to store backward and/or output weight and/or input/output data corresponding to neurons or layers of a neural network trained and/or used for inferencing in aspects of one or more embodiments. In at least one embodiment, code and/or data storage 2705 stores weight parameters and/or input/output data of each layer of a neural network trained or used in conjunction with one or more embodiments during backward propagation of input/output data and/or weight parameters during training and/or inferencing using aspects of one or more embodiments. In at least one embodiment, training logic 2715 may include, or be coupled to code and/or data storage 2705 to store graph code or other software to control timing and/or order, in which weight and/or other parameter information is to be loaded to configure, logic, including integer and/or floating point units (collectively, arithmetic logic units (ALUs).

In at least one embodiment, code, such as graph code, causes the loading of weight or other parameter information into processor ALUs based on an architecture of a neural network to which such code corresponds. In at least one embodiment, any portion of code and/or data storage 2705 may be included with other on-chip or off-chip data storage, including a processor's L1, L2, or L3 cache or system memory. In at least one embodiment, any portion of code and/or data storage 2705 may be internal or external to one or more processors or other hardware logic devices or circuits. In at least one embodiment, code and/or data storage 2705 may be cache memory, DRAM, SRAM, non-volatile memory (e.g., flash memory), or other storage. In at least one embodiment, a choice of whether code and/or data storage 2705 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, code and/or data storage 2701 and code and/or data storage 2705 may be separate storage structures. In at least one embodiment, code and/or data storage 2701 and code and/or data storage 2705 may be a combined storage structure. In at least one embodiment, code and/or data storage 2701 and code and/or data storage 2705 may be partially combined and partially separate. In at least one embodiment, any portion of code and/or data storage 2701 and code and/or data storage 2705 may be included with other on-chip or off-chip data storage, including a processor's L1, L2, or L3 cache or system memory.

In at least one embodiment, inference and/or training logic 2715 may include, without limitation, one or more arithmetic logic unit(s) ("ALU(s)") 2710, including integer and/or floating point units, to perform logical and/or mathematical operations based, at least in part on, or indicated by, training and/or inference code (e.g., graph code), a result of which may produce activations (e.g., output values from layers or neurons within a neural network) stored in an activation storage 2720 that are functions of input/output and/or weight parameter data stored in code and/or data storage 2701 and/or code and/or data storage 2705. In at least one embodiment, activations stored in activation storage 2720 are generated according to linear algebraic and or matrix-based mathematics performed by ALU(s) 2710 in response to performing instructions or other code, wherein weight values stored in code and/or data storage 2705 and/or data storage 2701 are used as operands along with other values, such as bias values, gradient information, momentum values, or other parameters or hyperparameters, any or all of which may be stored in code and/or data storage 2705 or code and/or data storage 2701 or another storage on or off-chip.

In at least one embodiment, ALU(s) 2710 are included within one or more processors or other hardware logic devices or circuits, whereas in another embodiment, ALU(s) 2710 may be external to a processor or other hardware logic device or circuit that uses them (e.g., a co-processor). In at least one embodiment, ALUs 2710 may be included within a processor's execution units or otherwise within a bank of ALUs accessible by a processor's execution units either within same processor or distributed between different processors of different types (e.g., central processing units, graphics processing units, fixed function units, etc.). In at least one embodiment, code and/or data storage 2701, code and/or data storage 2705, and activation storage 2720 may share a processor or other hardware logic device or circuit, whereas in another embodiment, they may be in different processors or other hardware logic devices or circuits, or some combination of same and different processors or other hardware logic devices or circuits. In at least one embodiment, any portion of activation storage 2720 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 2720 may be cache memory, DRAM, SRAM, non-volatile memory (e.g., flash memory), or other storage. In at least one embodiment, activation storage 2720 may be completely or partially within or external to one or more processors or other logical circuits. In at least one embodiment, a choice of whether activation storage 2720 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 2715 illustrated in FIG. 27A may be used in conjunction with an application-specific integrated circuit ("ASIC"), such as a TensorFlow® Processing Unit from Google, an inference processing unit (IPU) from Graphcore™, or a Nervana® (e.g., "Lake Crest") processor from Intel Corp. In at least one embodiment, inference and/or training logic 2715 illustrated in FIG. 27A may be used in conjunction with central processing unit ("CPU") hardware, graphics processing unit ("GPU") hardware or other hardware, such as field programmable gate arrays ("FPGAs").

Figure 27B:
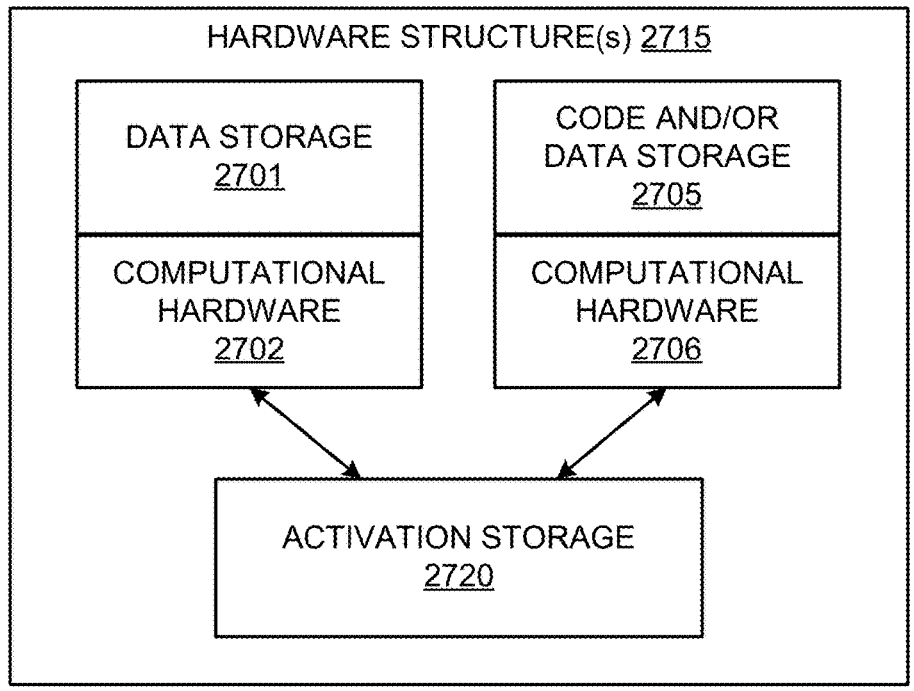
FIG. 27B illustrates inference and/or training logic, according to at least one embodiment.

FIG. 27B illustrates inference and/or training logic 2715, according to at least one embodiment. In at least one embodiment, inference and/or training logic 2715 may include, without limitation, hardware logic in which computational resources are dedicated or otherwise exclusively used in conjunction with weight values or other information corresponding to one or more layers of neurons within a neural network. In at least one embodiment, inference and/or training logic 2715 illustrated in FIG. 27B may be used in conjunction with an application-specific integrated circuit (ASIC), such as TensorFlow® Processing Unit from Google, an inference processing unit (IPU) from Graphcore™, or a Nervana® (e.g., "Lake Crest") processor from Intel Corp. In at least one embodiment, inference and/or training logic 2715 illustrated in FIG. 27B may be used in conjunction with central processing unit (CPU) hardware, graphics processing unit (GPU) hardware or other hardware, such as field programmable gate arrays (FPGAs). In at least one embodiment, inference and/or training logic 2715 includes, without limitation, code and/or data storage 2701 and code and/or data storage 2705, which may be used to store code (e.g., graph code), weight values and/or other information, including bias values, gradient information, momentum values, and/or other parameter or hyperparameter information. In at least one embodiment illustrated in FIG. 27B, each of code and/or data storage 2701 and code and/or data storage 2705 is associated with a dedicated computational resource, such as computational hardware 2702 and computational hardware 2706, respectively. In at least one embodiment, each of computational hardware 2702 and computational hardware 2706 comprises one or more ALUs that perform mathematical functions, such as linear algebraic functions, only on information stored in code and/or data storage 2701 and code and/or data storage 2705, respectively, result of which is stored in activation storage 2720.

In at least one embodiment, each of code and/or data storage 2701 and 2705 and corresponding computational hardware 2702 and 2706, respectively, correspond to different layers of a neural network, such that resulting activation from one storage/computational pair 2701/2702 of code and/or data storage 2701 and computational hardware 2702 is provided as an input to a next storage/computational pair 2705/2706 of code and/or data storage 2705 and computational hardware 2706, in order to mirror a conceptual organization of a neural network. In at least one embodiment, each of storage/computational pairs 2701/2702 and 2705/2706 may correspond to more than one neural network layer. In at least one embodiment, additional storage/computation pairs (not shown) subsequent to or in parallel with storage/computation pairs 2701/2702 and 2705/2706 may be included in inference and/or training logic 2715.

Neural Network Training and Deployment

Figure 28:
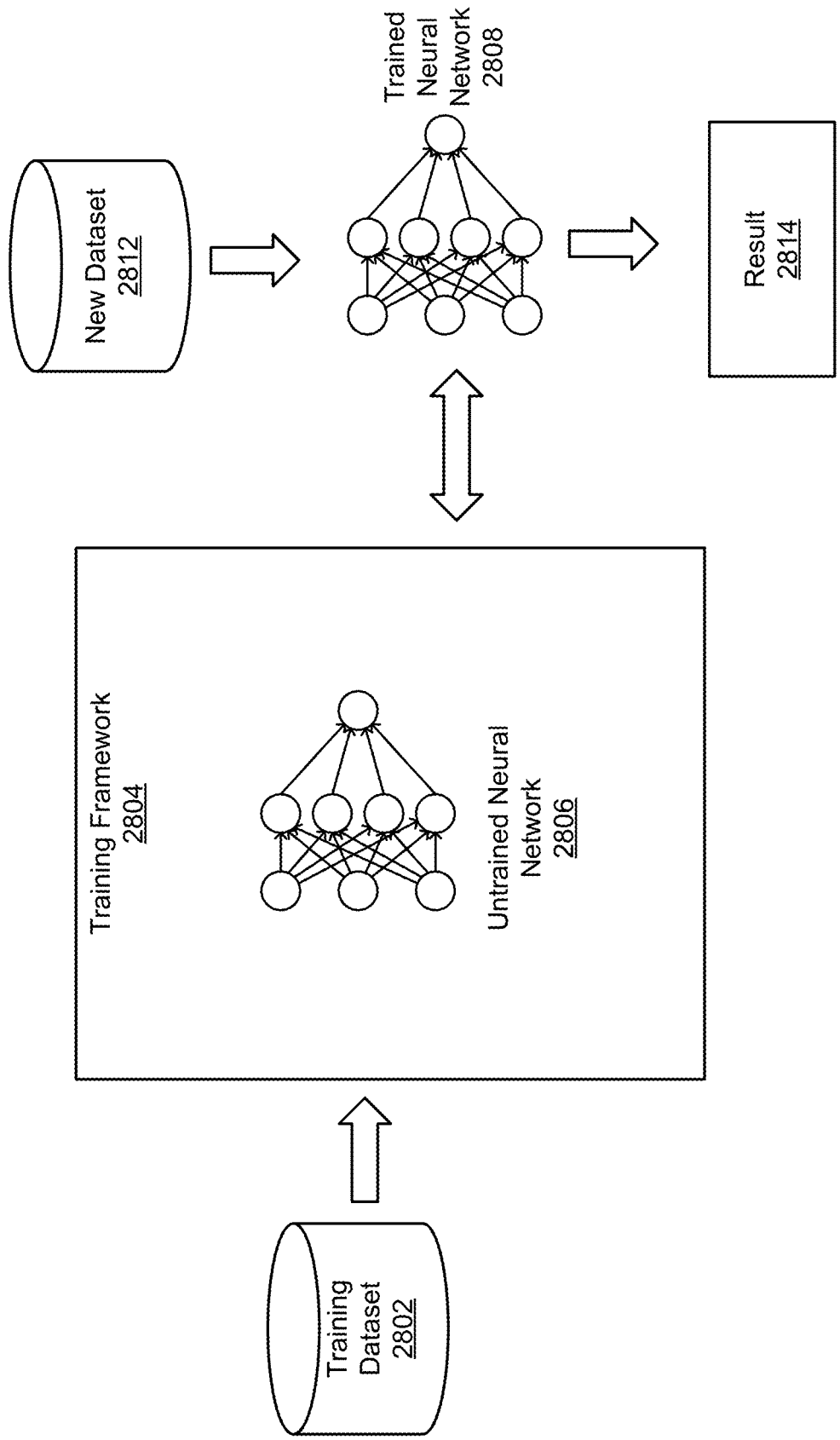
FIG. 28 illustrates training and deployment of a neural network, according to at least one embodiment.

FIG. 28 illustrates training and deployment of a deep neural network, according to at least one embodiment. In at least one embodiment, untrained neural network 2806 is trained using a training dataset 2802. In at least one embodiment, training framework 2804 is a PyTorch framework, whereas in other embodiments, training framework 2804 is a TensorFlow, Boost, Caffe, Microsoft Cognitive Toolkit/CNTK, MXNet, Chainer, Keras, Deeplearning4j, or other training framework. In at least one embodiment, training framework 2804 trains an untrained neural network 2806 and enables it to be trained using processing resources described herein to generate a trained neural network 2808. In at least one embodiment, weights may be chosen randomly or by pre-training using a deep belief network. In at least one embodiment, training may be performed in either a supervised, partially supervised, or unsupervised manner.

In at least one embodiment, untrained neural network 2806 is trained using supervised learning, wherein training dataset 2802 includes an input paired with a desired output for an input, or where training dataset 2802 includes input having a known output and an output of neural network 2806 is manually graded. In at least one embodiment, untrained neural network 2806 is trained in a supervised manner and processes inputs from training dataset 2802 and compares resulting outputs against a set of expected or desired outputs. In at least one embodiment, errors are then propagated back through untrained neural network 2806. In at least one embodiment, training framework 2804 adjusts weights that control untrained neural network 2806. In at least one embodiment, training framework 2804 includes tools to monitor how well untrained neural network 2806 is converging towards a model, such as trained neural network 2808, suitable to generating correct answers, such as in result 2814, based on input data such as a new dataset 2812. In at least one embodiment, training framework 2804 trains untrained neural network 2806 repeatedly while adjust weights to refine an output of untrained neural network 2806 using a loss function and adjustment algorithm, such as stochastic gradient descent. In at least one embodiment, training framework 2804 trains untrained neural network 2806 until untrained neural network 2806 achieves a desired accuracy. In at least one embodiment, trained neural network 2808 can then be deployed to implement any number of machine learning operations.

In at least one embodiment, untrained neural network 2806 is trained using unsupervised learning, wherein untrained neural network 2806 attempts to train itself using unlabeled data. In at least one embodiment, unsupervised learning training dataset 2802 will include input data without any associated output data or "ground truth" data. In at least one embodiment, untrained neural network 2806 can learn groupings within training dataset 2802 and can determine how individual inputs are related to untrained dataset 2802. In at least one embodiment, unsupervised training can be used to generate a self-organizing map in trained neural network 2808 capable of performing operations useful in reducing dimensionality of new dataset 2812. In at least one embodiment, unsupervised training can also be used to perform anomaly detection, which allows identification of data points in new dataset 2812 that deviate from normal patterns of new dataset 2812.

In at least one embodiment, semi-supervised learning may be used, which is a technique in which in training dataset 2802 includes a mix of labeled and unlabeled data. In at least one embodiment, training framework 2804 may be used to perform incremental learning, such as through transferred learning techniques. In at least one embodiment, incremental learning enables trained neural network 2808 to adapt to new dataset 2812 without forgetting knowledge instilled within trained neural network 2808 during initial training.

Data Center

Figure 29:
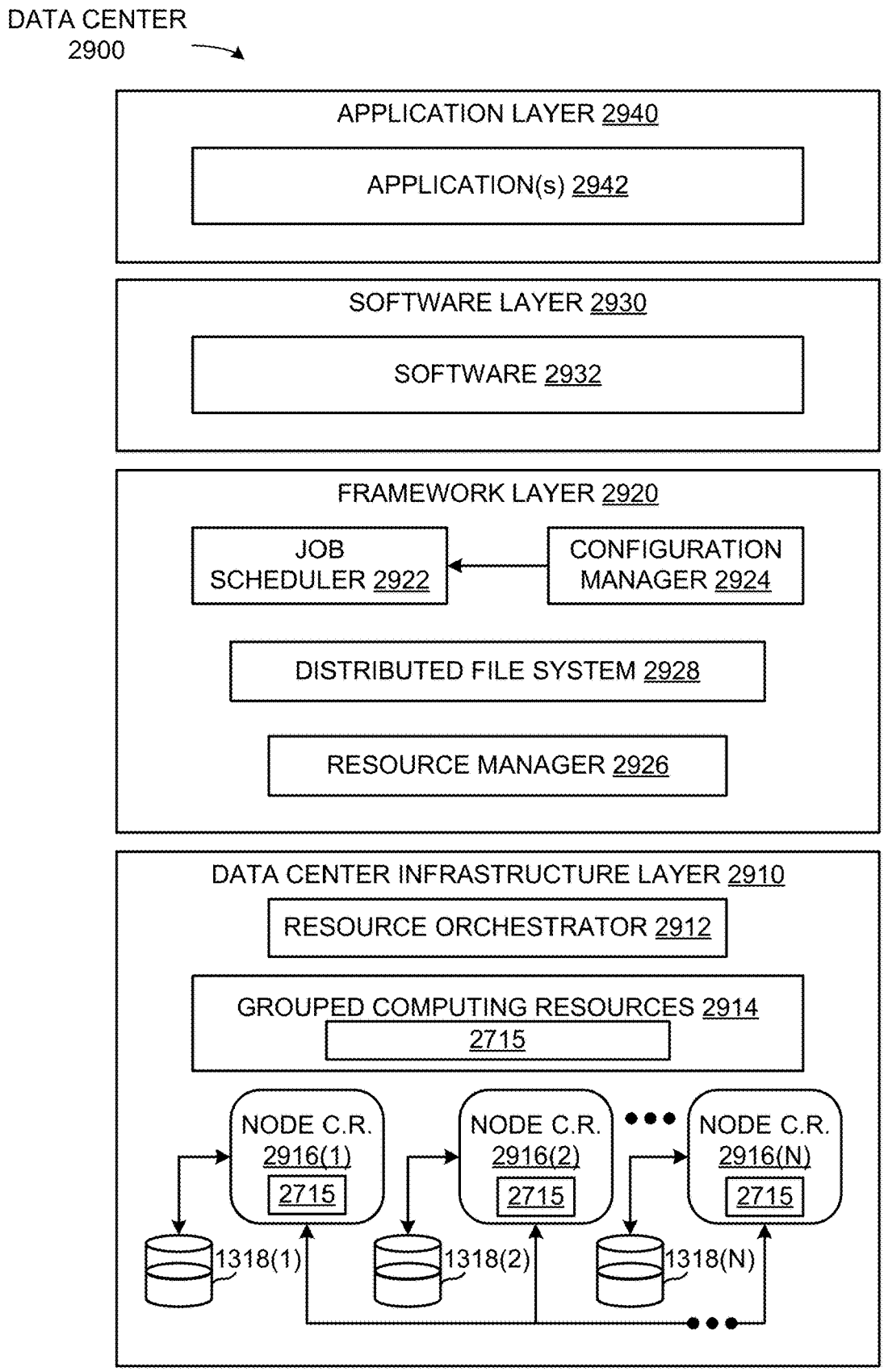
FIG. 29 illustrates an example data center system, according to at least one embodiment.
Figure 30:
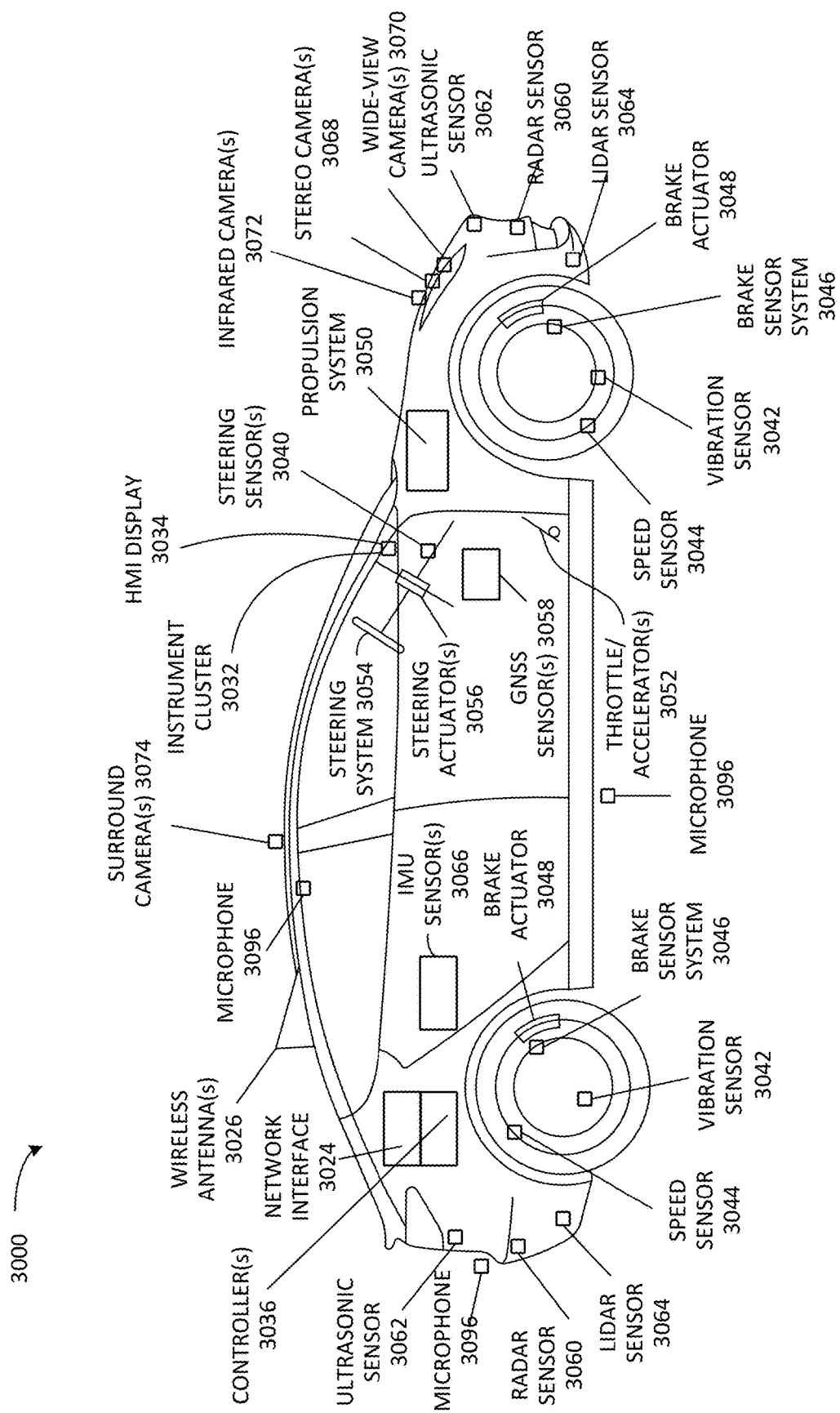
FIG. 30A illustrates an example of an autonomous vehicle, according to at least one embodiment.
FIG. 30B illustrates an example of camera locations and fields of view for the autonomous vehicle of FIG. 30A, according to at least one embodiment.
FIG. 30C is a block diagram illustrating an example system architecture for the autonomous vehicle of FIG. 30A, according to at least one embodiment.
FIG. 30D is a diagram illustrating a system for communication between cloud-based server(s) and the autonomous vehicle of FIG. 30A, according to at least one embodiment.
Figure 30:
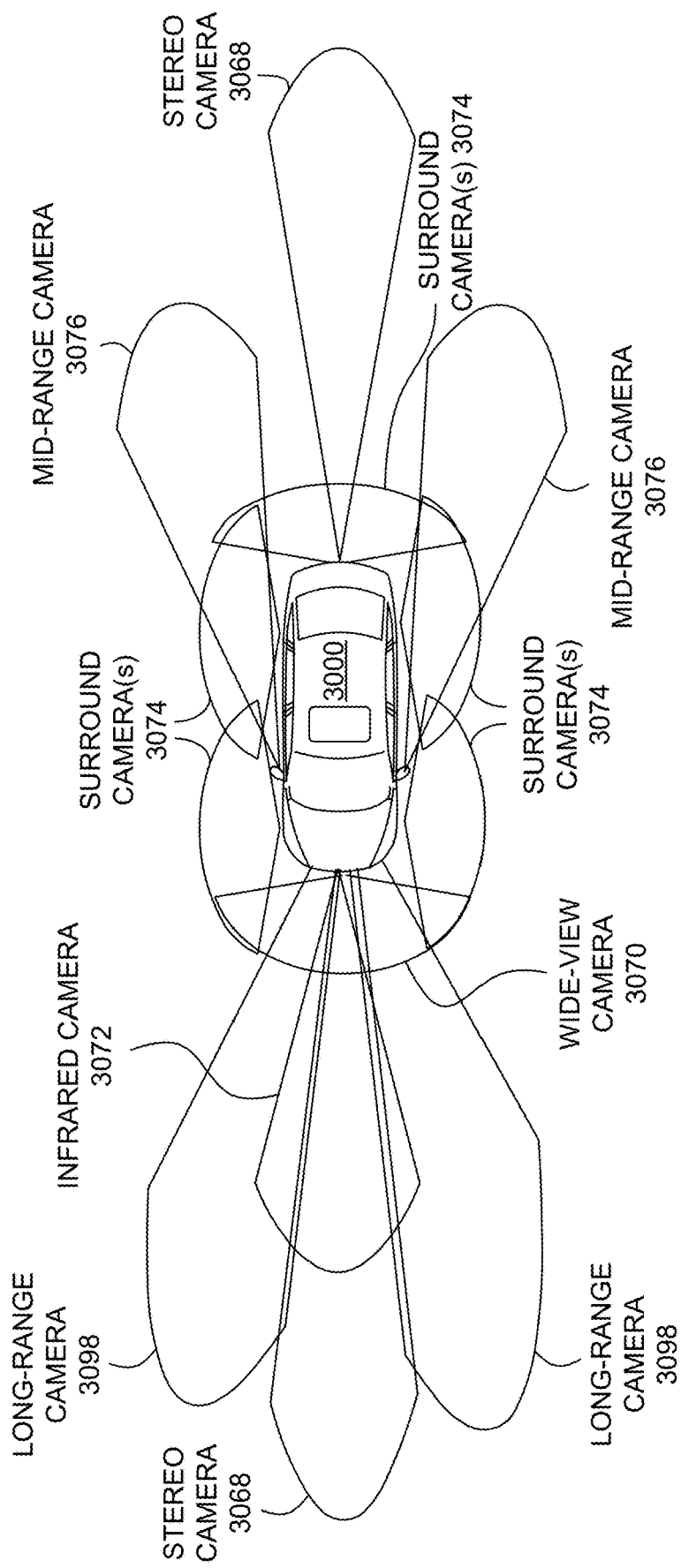
Figure 30:
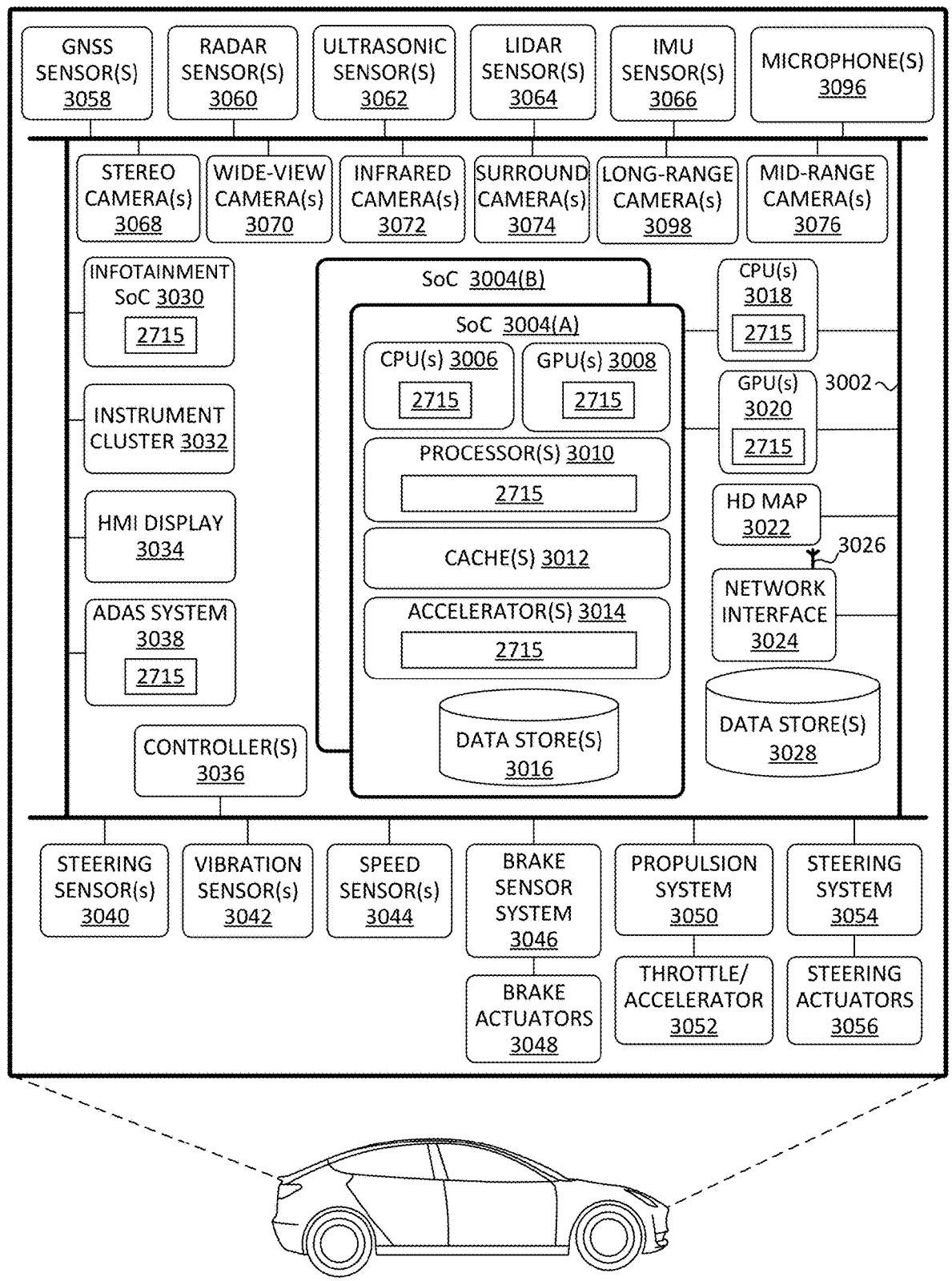
Figure 30:
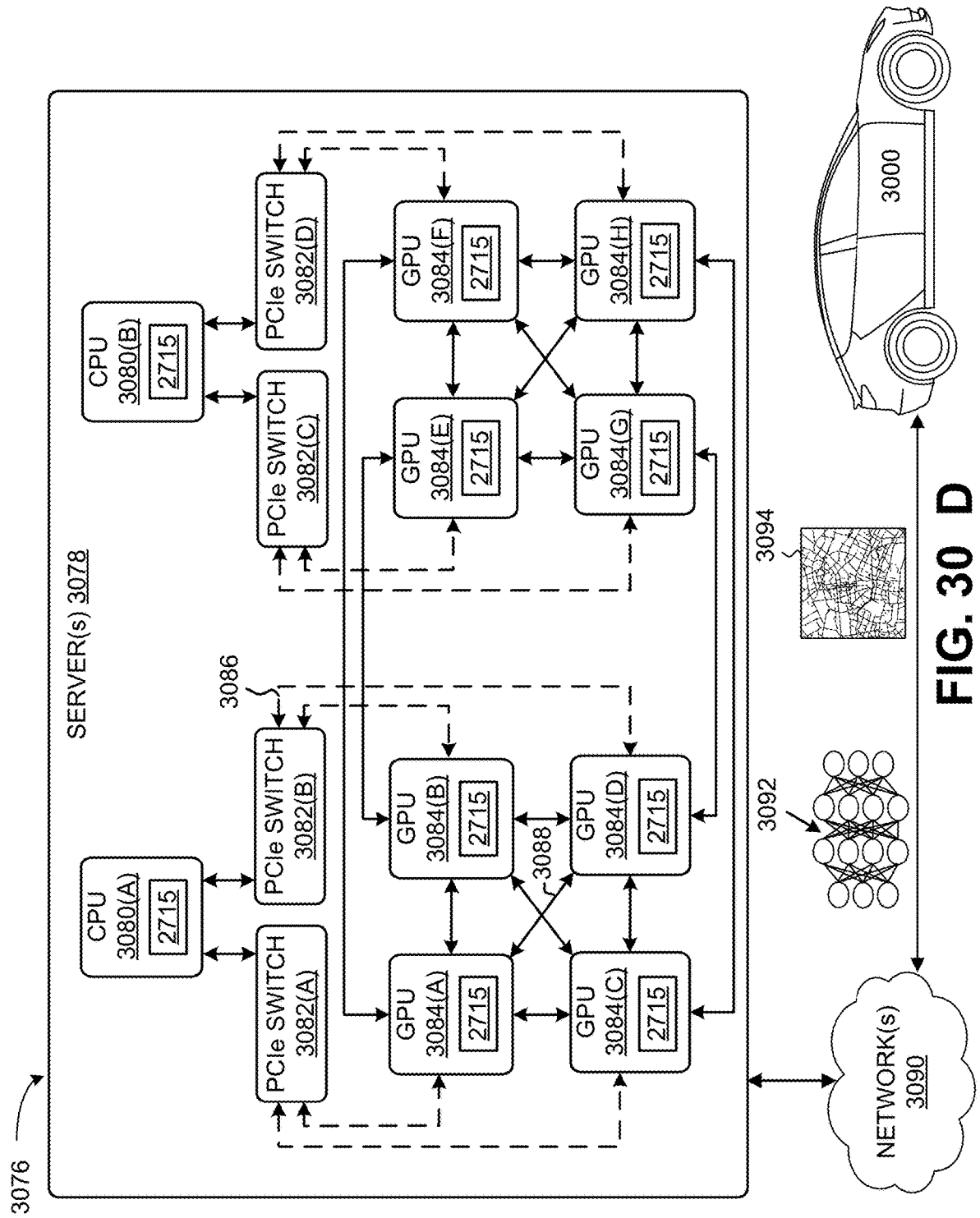

FIG. 29 illustrates an example data center 2900, in which at least one embodiment may be used. In at least one embodiment, data center 2900 includes a data center infrastructure layer 2910, a framework layer 2920, a software layer 2930 and an application layer 2940.

In at least one embodiment, as shown in FIG. 29, data center infrastructure layer 2910 may include a resource orchestrator 2912, grouped computing resources 2914, and node computing resources ("node C.R.s") 2916(1)-2916(N), where "N" represents a positive integer (which may be a different integer "N" than used in other figures). In at least one embodiment, node C.R.s 2916(1)-2916(N) may include, but are not limited to, any number of central processing units ("CPUs") or other processors (including accelerators, field programmable gate arrays (FPGAs), graphics processors, etc.), memory storage devices 2918(1)-2918(N) (e.g., dynamic read-only memory, solid state storage or disk drives), network input/output ("NW I/O") devices, network switches, virtual machines ("VMs"), power modules, and cooling modules, etc. In at least one embodiment, one or more node C.R.s from among node C.R.s 2916(1)-2916(N) may be a server having one or more of above-mentioned computing resources.

In at least one embodiment, grouped computing resources 2914 may include separate groupings of node C.R.s housed within one or more racks (not shown), or many racks housed in data centers at various geographical locations (also not shown). In at least one embodiment, separate groupings of node C.R.s within grouped computing resources 2914 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 2912 may configure or otherwise control one or more node C.R.s 2916(1)-2916(N) and/or grouped computing resources 2914. In at least one embodiment, resource orchestrator 2912 may include a software design infrastructure ("SDI") management entity for data center 2900. In at least one embodiment, resource orchestrator 2712 may include hardware, software or some combination thereof.

In at least one embodiment, as shown in FIG. 29, framework layer 2920 includes a job scheduler 2922, a configuration manager 2924, a resource manager 2926 and a distributed file system 2928. In at least one embodiment, framework layer 2920 may include a framework to support software 2932 of software layer 2930 and/or one or more application(s) 2942 of application layer 2940. In at least one embodiment, software 2932 or application(s) 2942 may respectively include web-based service software or applications, such as those provided by Amazon Web Services, Google Cloud and Microsoft Azure. In at least one embodiment, framework layer 2920 may be, but is not limited to, a type of free and open-source software web application framework such as Apache Spark™ (hereinafter "Spark") that may utilize distributed file system 2928 for large-scale data processing (e.g., "big data"). In at least one embodiment, job scheduler 2932 may include a Spark driver to facilitate scheduling of workloads supported by various layers of data center 2900. In at least one embodiment, configuration manager 2924 may be capable of configuring different layers such as software layer 2930 and framework layer 2920 including Spark and distributed file system 2928 for supporting large-scale data processing. In at least one embodiment, resource manager 2926 may be capable of managing clustered or grouped computing resources mapped to or allocated for support of distributed file system 2928 and job scheduler 2922. In at least one embodiment, clustered or grouped computing resources may include grouped computing resources 2914 at data center infrastructure layer 2910. In at least one embodiment, resource manager 2926 may coordinate with resource orchestrator 2912 to manage these mapped or allocated computing resources.

In at least one embodiment, software 2932 included in software layer 2930 may include software used by at least portions of node C.R.s 2916(1)-2916(N), grouped computing resources 2914, and/or distributed file system 2928 of framework layer 2920. In at least one embodiment, one or more types of software may include, but are not limited to, Internet web page search software, e-mail virus scan software, database software, and streaming video content software.

In at least one embodiment, application(s) 2942 included in application layer 2940 may include one or more types of applications used by at least portions of node C.R.s 2916 (1)-2916(N), grouped computing resources 2914, and/or distributed file system 2928 of framework layer 2920. In at least one embodiment, one or more types of applications may include, but are not limited to, any number of a genomics application, a cognitive compute, application and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 2924, resource manager 2926, and resource orchestrator 2912 may implement any number and type of self-modifying actions based on any amount and type of data acquired in any technically feasible fashion. In at least one embodiment, self-modifying actions may relieve a data center operator of data center 2900 from making possibly bad configuration decisions and possibly avoiding underutilized and/or poor performing portions of a data center.

In at least one embodiment, data center 2900 may include tools, services, software or other resources to train one or more machine learning models or predict or infer information using one or more machine learning models according to one or more embodiments described herein. For example, in at least one embodiment, a machine learning model may be trained by calculating weight parameters according to a neural network architecture using software and computing resources described above with respect to data center 2900. In at least one embodiment, trained machine learning models corresponding to one or more neural networks may be used to infer or predict information using resources described above with respect to data center 2900 by using weight parameters calculated through one or more training techniques described herein.

In at least one embodiment, data center may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 29 for inferencing or predicting operations based, at least in part, on weight parameters calculated using neural network training operations, neural network functions and/or architectures, or neural network use cases described herein. In an embodiment, the simulators, comparators, and/or inference engines described here might use such inference and/or training logic.

Autonomous Vehicle

FIG. 30A illustrates an example of an autonomous vehicle 3000, according to at least one embodiment. In at least one embodiment, autonomous vehicle 3000 (alternatively referred to herein as "vehicle 3000") may be, without limitation, a passenger vehicle, such as a car, a truck, a bus, and/or another type of vehicle that accommodates one or more passengers. In at least one embodiment, vehicle 3000 may be a semi-tractor-trailer truck used for hauling cargo. In at least one embodiment, vehicle 3000 may be an airplane, robotic vehicle, or other kind of vehicle.

Autonomous vehicles may be described in terms of automation levels, defined by National Highway Traffic Safety Administration ("NHTSA"), a division of US Department of Transportation, and Society of Automotive Engineers ("SAE") "Taxonomy and Definitions for Terms Related to Driving Automation Systems for On-Road Motor Vehicles" (e.g., Standard No. J3016-201806, published on Jun. 15, 2018, Standard No. J3016-201609, published on Sep. 30, 2016, and previous and future versions of this standard). In at least one embodiment, vehicle 3000 may be capable of functionality in accordance with one or more of Level 1 through Level 5 of autonomous driving levels. For example, in at least one embodiment, vehicle 3000 may be capable of conditional automation (Level 3), high automation (Level 4), and/or full automation (Level 5), depending on embodiment.

In at least one embodiment, vehicle 3000 may include, without limitation, components such as a chassis, a vehicle body, wheels (e.g., 2, 4, 6, 8, 18, etc.), tires, axles, and other components of a vehicle. In at least one embodiment, vehicle 3000 may include, without limitation, a propulsion system 3050, such as an internal combustion engine, hybrid electric power plant, an all-electric engine, and/or another propulsion system type. In at least one embodiment, propulsion system 3050 may be connected to a drive train of vehicle 3000, which may include, without limitation, a transmission, to enable propulsion of vehicle 3000. In at least one embodiment, propulsion system 3050 may be controlled in response to receiving signals from a throttle/accelerator(s) 3052.

In at least one embodiment, a steering system 3054, which may include, without limitation, a steering wheel, is used to steer vehicle 3000 (e.g., along a desired path or route) when propulsion system 3050 is operating (e.g., when vehicle 3000 is in motion). In at least one embodiment, steering system 3054 may receive signals from steering actuator(s) 3056. In at least one embodiment, a steering wheel may be optional for full automation (Level 5) functionality. In at least one embodiment, a brake sensor system 3046 may be used to operate vehicle brakes in response to receiving signals from brake actuator(s) 3048 and/or brake sensors.

In at least one embodiment, controller(s) 3036, which may include, without limitation, one or more system on chips ("SoCs") (not shown in FIG. 30A) and/or graphics processing unit(s) ("GPU(s)"), provide signals (e.g., representative of commands) to one or more components and/or systems of vehicle 3000. For instance, in at least one embodiment, controller(s) 3036 may send signals to operate vehicle brakes via brake actuator(s) 3048, to operate steering system 3054 via steering actuator(s) 3056, to operate propulsion system 3050 via throttle/accelerator(s) 3052. In at least one embodiment, controller(s) 3036 may include one or more onboard (e.g., integrated) computing devices that process sensor signals, and output operation commands (e.g., signals representing commands) to enable autonomous driving and/or to assist a human driver in driving vehicle 3000. In at least one embodiment, controller(s) 3036 may include a first controller for autonomous driving functions, a second controller for functional safety functions, a third controller for artificial intelligence functionality (e.g., computer vision), a fourth controller for infotainment functionality, a fifth controller for redundancy in emergency conditions, and/or other controllers. In at least one embodiment, a single controller may handle two or more of above functionalities, two or more controllers may handle a single functionality, and/or any combination thereof.

In at least one embodiment, controller(s) 3036 provide signals for controlling one or more components and/or systems of vehicle 3000 in response to sensor data received from one or more sensors (e.g., sensor inputs). In at least one embodiment, sensor data may be received from, for example and without limitation, global navigation satellite systems ("GNSS") sensor(s) 3058 (e.g., Global Positioning System sensor(s)), RADAR sensor(s) 3060, ultrasonic sensor(s) 3062, LIDAR sensor(s) 3064, inertial measurement unit ("IMU") sensor(s) 3066 (e.g., accelerometer(s), gyroscope(s), a magnetic compass or magnetic compasses, magnetometer(s), etc.), microphone(s) 3096, stereo camera(s) 3068, wide-view camera(s) 3070 (e.g., fisheye cameras), infrared camera(s) 3072, surround camera(s) 3074 (e.g., 360 degree cameras), long-range cameras (not shown in FIG. 30A), mid-range camera(s) (not shown in FIG. 30A), speed sensor(s) 3044 (e.g., for measuring speed of vehicle 3000), vibration sensor(s) 3042, steering sensor(s) 3040, brake sensor(s) (e.g., as part of brake sensor system 3046), and/or other sensor types.

In at least one embodiment, one or more of controller(s) 3036 may receive inputs (e.g., represented by input data) from an instrument cluster 3032 of vehicle 3000 and provide outputs (e.g., represented by output data, display data, etc.) via a human-machine interface ("HMI") display 3034, an audible annunciator, a loudspeaker, and/or via other components of vehicle 3000. In at least one embodiment, outputs may include information such as vehicle velocity, speed, time, map data (e.g., a High Definition map (not shown in FIG. 30A), location data (e.g., vehicle's 3000 location, such as on a map), direction, location of other vehicles (e.g., an occupancy grid), information about objects and status of objects as perceived by controller(s) 3036, etc. For example, in at least one embodiment, HMI display 3034 may display information about presence of one or more objects (e.g., a street sign, caution sign, traffic light changing, etc.), and/or information about driving maneuvers vehicle has made, is making, or will make (e.g., changing lanes now, taking exit 34B in two miles, etc.).

In at least one embodiment, vehicle 3000 further includes a network interface 3024 which may use wireless antenna(s) 3026 and/or modem(s) to communicate over one or more networks. For example, in at least one embodiment, network interface 3024 may be capable of communication over Long-Term Evolution ("LTE"), Wideband Code Division Multiple Access ("WCDMA"), Universal Mobile Telecommunications System ("UMTS"), Global System for Mobile communication ("GSM"), IMT-CDMA Multi-Carrier ("CDMA2000") networks, etc. In at least one embodiment, wireless antenna(s) 3026 may also enable communication between objects in environment (e.g., vehicles, mobile devices, etc.), using local area network(s), such as Bluetooth, Bluetooth Low Energy ("LE"), Z-Wave, ZigBee, etc., and/or low power wide-area network(s) ("LPWANs"), such as LoRaWAN, SigFox, etc. protocols.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 30A for inferencing or predicting operations based, at least in part, on weight parameters calculated using neural network training operations, neural network functions and/or architectures, or neural network use cases described herein.

FIG. 30B illustrates an example of camera locations and fields of view for autonomous vehicle 3000 of FIG. 30A, according to at least one embodiment. In at least one embodiment, cameras and respective fields of view are one example embodiment and are not intended to be limiting. For instance, in at least one embodiment, additional and/or alternative cameras may be included and/or cameras may be located at different locations on vehicle 3000.

In at least one embodiment, camera types for cameras may include, but are not limited to, digital cameras that may be adapted for use with components and/or systems of vehicle 3000. In at least one embodiment, camera(s) may operate at automotive safety integrity level ("ASIL") B and/or at another ASIL. In at least one embodiment, camera types may be capable of any image capture rate, such as 60 frames per second (fps), 1220 fps, 240 fps, etc., depending on embodiment. In at least one embodiment, cameras may be capable of using rolling shutters, global shutters, another type of shutter, or a combination thereof. In at least one embodiment, color filter array may include a red clear clear clear ("RCCC") color filter array, a red clear clear blue ("RCCB") color filter array, a red blue green clear ("RBGC") color filter array, a Foveon X3 color filter array, a Bayer sensors ("RGGB") color filter array, a monochrome sensor color filter array, and/or another type of color filter array. In at least one embodiment, clear pixel cameras, such as cameras with an RCCC, an RCCB, and/or an RBGC color filter array, may be used in an effort to increase light sensitivity.

In at least one embodiment, one or more of camera(s) may be used to perform advanced driver assistance systems ("ADAS") functions (e.g., as part of a redundant or fail-safe design). For example, in at least one embodiment, a Multi-Function Mono Camera may be installed to provide functions including lane departure warning, traffic sign assist and intelligent headlamp control. In at least one embodiment, one or more of camera(s) (e.g., all cameras) may record and provide image data (e.g., video) simultaneously.

In at least one embodiment, one or more camera may be mounted in a mounting assembly, such as a custom designed (three-dimensional ("3D") printed) assembly, in order to cut out stray light and reflections from within vehicle 3000 (e.g., reflections from dashboard reflected in windshield mirrors) which may interfere with camera image data capture abilities. With reference to wing-mirror mounting assemblies, in at least one embodiment, wing-mirror assemblies may be custom 3D printed so that a camera mounting plate matches a shape of a wing-mirror. In at least one embodiment, camera(s) may be integrated into wing-mirrors. In at least one embodiment, for side-view cameras, camera(s) may also be integrated within four pillars at each corner of a cabin.

In at least one embodiment, cameras with a field of view that include portions of an environment in front of vehicle 3000 (e.g., front-facing cameras) may be used for surround view, to help identify forward facing paths and obstacles, as well as aid in, with help of one or more of controller(s) 3036 and/or control SoCs, providing information critical to generating an occupancy grid and/or determining preferred vehicle paths. In at least one embodiment, front-facing cameras may be used to perform many similar ADAS functions as LIDAR, including, without limitation, emergency braking, pedestrian detection, and collision avoidance. In at least one embodiment, front-facing cameras may also be used for ADAS functions and systems including, without limitation, Lane Departure Warnings ("LDW"), Autonomous Cruise Control ("ACC"), and/or other functions such as traffic sign recognition.

In at least one embodiment, a variety of cameras may be used in a front-facing configuration, including, for example, a monocular camera platform that includes a CMOS ("complementary metal oxide semiconductor") color imager. In at least one embodiment, a wide-view camera 3070 may be used to perceive objects coming into view from a periphery (e.g., pedestrians, crossing traffic or bicycles). Although only one wide-view camera 3070 is illustrated in FIG. 30B, in other embodiments, there may be any number (including zero) wide-view cameras on vehicle 3000. In at least one embodiment, any number of long-range camera(s) 3098 (e.g., a long-view stereo camera pair) may be used for depth-based object detection, especially for objects for which a neural network has not yet been trained. In at least one embodiment, long-range camera(s) 3098 may also be used for object detection and classification, as well as basic object tracking.

In at least one embodiment, any number of stereo camera(s) 3068 may also be included in a front-facing configuration. In at least one embodiment, one or more of stereo camera(s) 3068 may include an integrated control unit comprising a scalable processing unit, which may provide a programmable logic ("FPGA") and a multi-core microprocessor with an integrated Controller Area Network ("CAN") or Ethernet interface on a single chip. In at least one embodiment, such a unit may be used to generate a 3D map of an environment of vehicle 3000, including a distance estimate for all points in an image. In at least one embodiment, one or more of stereo camera(s) 3068 may include, without limitation, compact stereo vision sensor(s) that may include, without limitation, two camera lenses (one each on left and right) and an image processing chip that may measure distance from vehicle 3000 to target object and use generated information (e.g., metadata) to activate autonomous emergency braking and lane departure warning functions. In at least one embodiment, other types of stereo camera(s) 3068 may be used in addition to, or alternatively from, those described herein.

In at least one embodiment, cameras with a field of view that include portions of environment to sides of vehicle 3000 (e.g., side-view cameras) may be used for surround view, providing information used to create and update an occupancy grid, as well as to generate side impact collision warnings. For example, in at least one embodiment, surround camera(s) 3074 (e.g., four surround cameras as illustrated in FIG. 30B) could be positioned on vehicle 3000. In at least one embodiment, surround camera(s) 3074 may include, without limitation, any number and combination of wide-view cameras, fisheye camera(s), 360 degree camera(s), and/or similar cameras. For instance, in at least one embodiment, four fisheye cameras may be positioned on a front, a rear, and sides of vehicle 3000. In at least one embodiment, vehicle 3000 may use three surround camera(s) 3074 (e.g., left, right, and rear), and may leverage one or more other camera(s) (e.g., a forward-facing camera) as a fourth surround-view camera.

In at least one embodiment, cameras with a field of view that include portions of an environment behind vehicle 3000 (e.g., rear-view cameras) may be used for parking assistance, surround view, rear collision warnings, and creating and updating an occupancy grid. In at least one embodiment, a wide variety of cameras may be used including, but not limited to, cameras that are also suitable as a front-facing camera(s) (e.g., long-range cameras 3098 and/or mid-range camera(s) 3076, stereo camera(s) 3068), infrared camera(s) 3072, etc.), as described herein.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 30B for inferencing or predicting operations based, at least in part, on weight parameters calculated using neural network training operations, neural network functions and/or architectures, or neural network use cases described herein.

FIG. 30C is a block diagram illustrating an example system architecture for autonomous vehicle 3000 of FIG. 30A, according to at least one embodiment. In at least one embodiment, each of components, features, and systems of vehicle 3000 in FIG. 30C is illustrated as being connected via a bus 3002. In at least one embodiment, bus 3002 may include, without limitation, a CAN data interface (alternatively referred to herein as a "CAN bus"). In at least one embodiment, a CAN may be a network inside vehicle 3000 used to aid in control of various features and functionality of vehicle 3000, such as actuation of brakes, acceleration, braking, steering, windshield wipers, etc. In at least one embodiment, bus 3002 may be configured to have dozens or even hundreds of nodes, each with its own unique identifier (e.g., a CAN ID). In at least one embodiment, bus 3002 may be read to find steering wheel angle, ground speed, engine revolutions per minute ("RPMs"), button positions, and/or other vehicle status indicators. In at least one embodiment, bus 3002 may be a CAN bus that is ASIL B compliant.

In at least one embodiment, in addition to, or alternatively from CAN, FlexRay and/or Ethernet protocols may be used. In at least one embodiment, there may be any number of busses forming bus 3002, which may include, without limitation, zero or more CAN busses, zero or more FlexRay busses, zero or more Ethernet busses, and/or zero or more other types of busses using different protocols. In at least one embodiment, two or more busses may be used to perform different functions, and/or may be used for redundancy. For example, a first bus may be used for collision avoidance functionality and a second bus may be used for actuation control. In at least one embodiment, each bus of bus 3002 may communicate with any of components of vehicle 3000, and two or more busses of bus 3002 may communicate with corresponding components. In at least one embodiment, each of any number of system(s) on chip(s) ("SoC(s)") 3004 (such as SoC 3004(A) and SoC 3004(B), each of controller(s) 3036, and/or each computer within vehicle may have access to same input data (e.g., inputs from sensors of vehicle 3000), and may be connected to a common bus, such CAN bus.

In at least one embodiment, vehicle 3000 may include one or more controller(s) 3036, such as those described herein with respect to FIG. 30A. In at least one embodiment, controller(s) 3036 may be used for a variety of functions. In at least one embodiment, controller(s) 3036 may be coupled to any of various other components and systems of vehicle 3000, and may be used for control of vehicle 3000, artificial intelligence of vehicle 3000, infotainment for vehicle 3000, and/or other functions.

In at least one embodiment, vehicle 3000 may include any number of SoCs 3004. In at least one embodiment, each of SoCs 3004 may include, without limitation, central processing units ("CPU(s)") 3006, graphics processing units ("GPU(s)") 3008, processor(s) 3010, cache(s) 3012, accelerator(s) 3014, data store(s) 3016, and/or other components and features not illustrated. In at least one embodiment, SoC(s) 3004 may be used to control vehicle 3000 in a variety of platforms and systems. For example, in at least one embodiment, SoC(s) 3004 may be combined in a system (e.g., system of vehicle 3000) with a High Definition ("HD") map 3022 which may obtain map refreshes and/or updates via network interface 3024 from one or more servers (not shown in FIG. 30C).

In at least one embodiment, CPU(s) 3006 may include a CPU cluster or CPU complex (alternatively referred to herein as a "CCPLEX"). In at least one embodiment, CPU(s) 3006 may include multiple cores and/or level two ("L2") caches. For instance, in at least one embodiment, CPU(s) 3006 may include eight cores in a coherent multi-processor configuration. In at least one embodiment, CPU(s) 3006 may include four dual-core clusters where each cluster has a dedicated L2 cache (e.g., a 2 megabyte (MB) L2 cache). In at least one embodiment, CPU(s) 3006 (e.g., CCPLEX) may be configured to support simultaneous cluster operations enabling any combination of clusters of CPU(s) 3006 to be active at any given time.

In at least one embodiment, one or more of CPU(s) 3006 may implement power management capabilities that include, without limitation, one or more of following features: individual hardware blocks may be clock-gated automatically when idle to save dynamic power; each core clock may be gated when such core is not actively executing instructions due to execution of Wait for Interrupt ("WFI")/Wait for Event ("WFE") instructions; each core may be independently power-gated; each core cluster may be independently clock-gated when all cores are clock-gated or power-gated; and/or each core cluster may be independently power-gated when all cores are power-gated. In at least one embodiment, CPU(s) 3006 may further implement an enhanced algorithm for managing power states, where allowed power states and expected wakeup times are specified, and hardware/microcode determines which best power state to enter for core, cluster, and CCPLEX. In at least one embodiment, processing cores may support simplified power state entry sequences in software with work offloaded to microcode.

In at least one embodiment, GPU(s) 3008 may include an integrated GPU (alternatively referred to herein as an "iGPU"). In at least one embodiment, GPU(s) 3008 may be programmable and may be efficient for parallel workloads. In at least one embodiment, GPU(s) 3008 may use an enhanced tensor instruction set. In at least one embodiment, GPU(s) 3008 may include one or more streaming microprocessors, where each streaming microprocessor may include a level one ("L1") cache (e.g., an L1 cache with at least 96 KB storage capacity), and two or more streaming microprocessors may share an L2 cache (e.g., an L2 cache with a 512 KB storage capacity). In at least one embodiment, GPU(s) 3008 may include at least eight streaming microprocessors. In at least one embodiment, GPU(s) 3008 may use compute application programming interface(s) (API(s)). In at least one embodiment, GPU(s) 3008 may use one or more parallel computing platforms and/or programming models (e.g., NVIDIA's CUDA model).

In at least one embodiment, one or more of GPU(s) 3008 may be power-optimized for best performance in automotive and embedded use cases. For example, in at least one embodiment, GPU(s) 3008 could be fabricated on Fin field-effect transistor ("FinFET") circuitry. In at least one embodiment, each streaming microprocessor may incorporate a number of mixed-precision processing cores partitioned into multiple blocks. For example, and without limitation, 64 PF32 cores and 32 PF64 cores could be partitioned into four processing blocks. In at least one embodiment, each processing block could be allocated 16 FP32 cores, 8 FP64 cores, 16 INT32 cores, two mixed-precision NVIDIA Tensor cores for deep learning matrix arithmetic, a level zero ("L0") instruction cache, a warp scheduler, a dispatch unit, and/or a 64 KB register file. In at least one embodiment, streaming microprocessors may include independent parallel integer and floating-point data paths to provide for efficient execution of workloads with a mix of computation and addressing calculations. In at least one embodiment, streaming microprocessors may include independent thread scheduling capability to enable finer-grain synchronization and cooperation between parallel threads. In at least one embodiment, streaming microprocessors may include a combined L1 data cache and shared memory unit in order to improve performance while simplifying programming.

In at least one embodiment, one or more of GPU(s) 3008 may include a high bandwidth memory ("HBM") and/or a 16 GB HBM2 memory subsystem to provide, in some examples, about 900 GB/second peak memory bandwidth. In at least one embodiment, in addition to, or alternatively from, HBM memory, a synchronous graphics random-access memory ("SGRAM") may be used, such as a graphics double data rate type five synchronous random-access memory ("GDDR5").

In at least one embodiment, GPU(s) 3008 may include unified memory technology. In at least one embodiment, address translation services ("ATS") support may be used to allow GPU(s) 3008 to access CPU(s) 3006 page tables directly. In at least one embodiment, embodiment, when a GPU of GPU(s) 3008 memory management unit ("MMU") experiences a miss, an address translation request may be transmitted to CPU(s) 3006. In response, 2 CPU of CPU(s) 3006 may look in its page tables for a virtual-to-physical mapping for an address and transmit translation back to GPU(s) 3008, in at least one embodiment. In at least one embodiment, unified memory technology may allow a single unified virtual address space for memory of both CPU(s) 3006 and GPU(s) 3008, thereby simplifying GPU(s) 3008 programming and porting of applications to GPU(s) 3008.

In at least one embodiment, GPU(s) 3008 may include any number of access counters that may keep track of frequency of access of GPU(s) 3008 to memory of other processors. In at least one embodiment, access counter(s) may help ensure that memory pages are moved to physical memory of a processor that is accessing pages most frequently, thereby improving efficiency for memory ranges shared between processors.

In at least one embodiment, one or more of SoC(s) 3004 may include any number of cache(s) 3012, including those described herein. For example, in at least one embodiment, cache(s) 3012 could include a level three ("L3") cache that is available to both CPU(s) 3006 and GPU(s) 3008 (e.g., that is connected to CPU(s) 3006 and GPU(s) 3008). In at least one embodiment, cache(s) 3012 may include a write-back cache that may keep track of states of lines, such as by using a cache coherence protocol (e.g., MEI, MESI, MSI, etc.). In at least one embodiment, a L3 cache may include 4 MB of memory or more, depending on embodiment, although smaller cache sizes may be used.

In at least one embodiment, one or more of SoC(s) 3004 may include one or more accelerator(s) 3014 (e.g., hardware accelerators, software accelerators, or a combination thereof). In at least one embodiment, SoC(s) 3004 may include a hardware acceleration cluster that may include optimized hardware accelerators and/or large on-chip memory. In at least one embodiment, large on-chip memory (e.g., 4 MB of SRAM), may enable a hardware acceleration cluster to accelerate neural networks and other calculations. In at least one embodiment, a hardware acceleration cluster may be used to complement GPU(s) 3008 and to off-load some of tasks of GPU(s) 3008 (e.g., to free up more cycles of GPU(s) 3008 for performing other tasks). In at least one embodiment, accelerator(s) 3014 could be used for targeted workloads (e.g., perception, convolutional neural networks ("CNNs"), recurrent neural networks ("RNNs"), etc.) that are stable enough to be amenable to acceleration. In at least one embodiment, a CNN may include a region-based or regional convolutional neural networks ("RCNNs") and Fast RCNNs (e.g., as used for object detection) or other type of CNN.

In at least one embodiment, accelerator(s) 3014 (e.g., hardware acceleration cluster) may include one or more deep learning accelerator ("DLA"). In at least one embodiment, DLA(s) may include, without limitation, one or more Tensor processing units ("TPUs") that may be configured to provide an additional ten trillion operations per second for deep learning applications and inferencing. In at least one embodiment, TPUs may be accelerators configured to, and optimized for, performing image processing functions (e.g., for CNNs, RCNNs, etc.). In at least one embodiment, DLA(s) may further be optimized for a specific set of neural network types and floating point operations, as well as inferencing. In at least one embodiment, design of DLA(s) may provide more performance per millimeter than a typical general-purpose GPU, and typically vastly exceeds performance of a CPU. In at least one embodiment, TPU(s) may perform several functions, including a single-instance convolution function, supporting, for example, INT8, INT16, and FP16 data types for both features and weights, as well as post-processor functions. In at least one embodiment, DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones; a CNN for facial recognition and vehicle owner identification using data from camera sensors; and/or a CNN for security and/or safety related events.

In at least one embodiment, DLA(s) may perform any function of GPU(s) 3008, and by using an inference accelerator, for example, a designer may target either DLA(s) or GPU(s) 3008 for any function. For example, in at least one embodiment, a designer may focus processing of CNNs and floating point operations on DLA(s) and leave other functions to GPU(s) 3008 and/or accelerator(s) 3014.

In at least one embodiment, accelerator(s) 3014 may include programmable vision accelerator ("PVA"), which may alternatively be referred to herein as a computer vision accelerator. In at least one embodiment, PVA may be designed and configured to accelerate computer vision algorithms for advanced driver assistance system ("ADAS") 3038, autonomous driving, augmented reality ("AR") applications, and/or virtual reality ("VR") applications. In at least one embodiment, PVA may provide a balance between performance and flexibility. For example, in at least one embodiment, each PVA may include, for example and without limitation, any number of reduced instruction set computer ("RISC") cores, direct memory access ("DMA"), and/or any number of vector processors.

In at least one embodiment, RISC cores may interact with image sensors (e.g., image sensors of any cameras described herein), image signal processor(s), etc. In at least one embodiment, each RISC core may include any amount of memory. In at least one embodiment, RISC cores may use any of a number of protocols, depending on embodiment. In at least one embodiment, RISC cores may execute a real-time operating system ("RTOS"). In at least one embodiment, RISC cores may be implemented using one or more integrated circuit devices, application specific integrated circuits ("ASICs"), and/or memory devices. For example, in at least one embodiment, RISC cores could include an instruction cache and/or a tightly coupled RAM.

In at least one embodiment, DMA may enable components of PVA to access system memory independently of CPU(s) 3006. In at least one embodiment, DMA may support any number of features used to provide optimization to a PVA including, but not limited to, supporting multi-dimensional addressing and/or circular addressing. In at least one embodiment, DMA may support up to six or more dimensions of addressing, which may include, without limitation, block width, block height, block depth, horizontal block stepping, vertical block stepping, and/or depth stepping.

In at least one embodiment, vector processors may be programmable processors that may be designed to efficiently and flexibly execute programming for computer vision algorithms and provide signal processing capabilities. In at least one embodiment, a PVA may include a PVA core and two vector processing subsystem partitions. In at least one embodiment, a PVA core may include a processor subsystem, DMA engine(s) (e.g., two DMA engines), and/or other peripherals. In at least one embodiment, a vector processing subsystem may operate as a primary processing engine of a PVA, and may include a vector processing unit ("VPU"), an instruction cache, and/or vector memory (e.g., "VMEM"). In at least one embodiment, VPU core may include a digital signal processor such as, for example, a single instruction, multiple data ("SIMD"), very long instruction word ("VLIW") digital signal processor. In at least one embodiment, a combination of SIMD and VLIW may enhance throughput and speed.

In at least one embodiment, each of vector processors may include an instruction cache and may be coupled to dedicated memory. As a result, in at least one embodiment, each of vector processors may be configured to execute independently of other vector processors. In at least one embodiment, vector processors that are included in a particular PVA may be configured to employ data parallelism. For instance, in at least one embodiment, plurality of vector processors included in a single PVA may execute a common computer vision algorithm, but on different regions of an image. In at least one embodiment, vector processors included in a particular PVA may simultaneously execute different computer vision algorithms, on one image, or even execute different algorithms on sequential images or portions of an image. In at least one embodiment, among other things, any number of PVAs may be included in hardware acceleration cluster and any number of vector processors may be included in each PVA. In at least one embodiment, PVA may include additional error correcting code ("ECC") memory, to enhance overall system safety.

In at least one embodiment, accelerator(s) 3014 may include a computer vision network on-chip and static random-access memory ("SRAM"), for providing a high-bandwidth, low latency SRAM for accelerator(s) 3014. In at least one embodiment, on-chip memory may include at least 4 MB SRAM, comprising, for example and without limitation, eight field-configurable memory blocks, that may be accessible by both a PVA and a DLA. In at least one embodiment, each pair of memory blocks may include an advanced peripheral bus ("APB") interface, configuration circuitry, a controller, and a multiplexer. In at least one embodiment, any type of memory may be used. In at least one embodiment, a PVA and a DLA may access memory via a backbone that provides a PVA and a DLA with high-speed access to memory. In at least one embodiment, a backbone may include a computer vision network on-chip that interconnects a PVA and a DLA to memory (e.g., using APB).

In at least one embodiment, a computer vision network on-chip may include an interface that determines, before transmission of any control signal/address/data, that both a PVA and a DLA provide ready and valid signals. In at least one embodiment, an interface may provide for separate phases and separate channels for transmitting control signals/addresses/data, as well as burst-type communications for continuous data transfer. In at least one embodiment, an interface may comply with International Organization for Standardization ("ISO") 26262 or International Electrotechnical Commission ("IEC") 61508 standards, although other standards and protocols may be used.

In at least one embodiment, one or more of SoC(s) 3004 may include a real-time ray-tracing hardware accelerator. In at least one embodiment, real-time ray-tracing hardware accelerator may be used to quickly and efficiently determine positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses.

In at least one embodiment, accelerator(s) 3014 can have a wide array of uses for autonomous driving. In at least one embodiment, a PVA may be used for key processing stages in ADAS and autonomous vehicles. In at least one embodiment, a PVA's capabilities are a good match for algorithmic domains needing predictable processing, at low power and low latency. In other words, a PVA performs well on semi-dense or dense regular computation, even on small data sets, which might require predictable run-times with low latency and low power. In at least one embodiment, such as in vehicle 3000, PVAs might be designed to run classic computer vision algorithms, as they can be efficient at object detection and operating on integer math.

For example, according to at least one embodiment of technology, a PVA is used to perform computer stereo vision. In at least one embodiment, a semi-global matching-based algorithm may be used in some examples, although this is not intended to be limiting. In at least one embodiment, applications for Level 3-5 autonomous driving use motion estimation/stereo matching on-the-fly (e.g., structure from motion, pedestrian recognition, lane detection, etc.). In at least one embodiment, a PVA may perform computer stereo vision functions on inputs from two monocular cameras.

In at least one embodiment, a PVA may be used to perform dense optical flow. For example, in at least one embodiment, a PVA could process raw RADAR data (e.g., using a 4D Fast Fourier Transform) to provide processed RADAR data. In at least one embodiment, a PVA is used for time of flight depth processing, by processing raw time of flight data to provide processed time of flight data, for example.

In at least one embodiment, a DLA may be used to run any type of network to enhance control and driving safety, including for example and without limitation, a neural network that outputs a measure of confidence for each object detection. In at least one embodiment, confidence may be represented or interpreted as a probability, or as providing a relative "weight" of each detection compared to other detections. In at least one embodiment, a confidence measure enables a system to make further decisions regarding which detections should be considered as true positive detections rather than false positive detections. In at least one embodiment, a system may set a threshold value for confidence and consider only detections exceeding threshold value as true positive detections. In an embodiment in which an automatic emergency braking ("AEB") system is used, false positive detections would cause vehicle to automatically perform emergency braking, which is obviously undesirable. In at least one embodiment, highly confident detections may be considered as triggers for AEB In at least one embodiment, a DLA may run a neural network for regressing confidence value. In at least one embodiment, neural network may take as its input at least some subset of parameters, such as bounding box dimensions, ground plane estimate obtained (e.g., from another subsystem), output from IMU sensor(s) 3066 that correlates with vehicle 3000 orientation, distance, 3D location estimates of object obtained from neural network and/or other sensors (e.g., LIDAR sensor(s) 3064 or RADAR sensor(s) 3060), among others.

In at least one embodiment, one or more of SoC(s) 3004 may include data store(s) 3016 (e.g., memory). In at least one embodiment, data store(s) 3016 may be on-chip memory of SoC(s) 3004, which may store neural networks to be executed on GPU(s) 3008 and/or a DLA. In at least one embodiment, data store(s) 3016 may be large enough in capacity to store multiple instances of neural networks for redundancy and safety. In at least one embodiment, data store(s) 3016 may comprise L2 or L3 cache(s).

In at least one embodiment, one or more of SoC(s) 3004 may include any number of processor(s) 3010 (e.g., embedded processors). In at least one embodiment, processor(s) 3010 may include a boot and power management processor that may be a dedicated processor and subsystem to handle boot power and management functions and related security enforcement. In at least one embodiment, a boot and power management processor may be a part of a boot sequence of SoC(s) 3004 and may provide runtime power management services. In at least one embodiment, a boot power and management processor may provide clock and voltage programming, assistance in system low power state transitions, management of SoC(s) 3004 thermals and temperature sensors, and/or management of SoC(s) 3004 power states. In at least one embodiment, each temperature sensor may be implemented as a ring-oscillator whose output frequency is proportional to temperature, and SoC(s) 3004 may use ring-oscillators to detect temperatures of CPU(s) 3006, GPU(s) 3008, and/or accelerator(s) 3014. In at least one embodiment, if temperatures are determined to exceed a threshold, then a boot and power management processor may enter a temperature fault routine and put SoC(s) 3004 into a lower power state and/or put vehicle 3000 into a chauffeur to safe stop mode (e.g., bring vehicle 3000 to a safe stop).

In at least one embodiment, processor(s) 3010 may further include a set of embedded processors that may serve as an audio processing engine which may be an audio subsystem that enables full hardware support for multi-channel audio over multiple interfaces, and a broad and flexible range of audio I/O interfaces. In at least one embodiment, an audio processing engine is a dedicated processor core with a digital signal processor with dedicated RAM.

In at least one embodiment, processor(s) 3010 may further include an always-on processor engine that may provide necessary hardware features to support low power sensor management and wake use cases. In at least one embodiment, an always-on processor engine may include, without limitation, a processor core, a tightly coupled RAM, supporting peripherals (e.g., timers and interrupt controllers), various I/O controller peripherals, and routing logic.

In at least one embodiment, processor(s) 3010 may further include a safety cluster engine that includes, without limitation, a dedicated processor subsystem to handle safety management for automotive applications. In at least one embodiment, a safety cluster engine may include, without limitation, two or more processor cores, a tightly coupled RAM, support peripherals (e.g., timers, an interrupt controller, etc.), and/or routing logic. In a safety mode, two or more cores may operate, in at least one embodiment, in a lockstep mode and function as a single core with comparison logic to detect any differences between their operations. In at least one embodiment, processor(s) 3010 may further include a real-time camera engine that may include, without limitation, a dedicated processor subsystem for handling real-time camera management. In at least one embodiment, processor(s) 3010 may further include a high-dynamic range signal processor that may include, without limitation, an image signal processor that is a hardware engine that is part of a camera processing pipeline.

In at least one embodiment, processor(s) 3010 may include a video image compositor that may be a processing block (e.g., implemented on a microprocessor) that implements video post-processing functions needed by a video playback application to produce a final image for a player window. In at least one embodiment, a video image compositor may perform lens distortion correction on wide-view camera(s) 3070, surround camera(s) 3074, and/or on in-cabin monitoring camera sensor(s). In at least one embodiment, in-cabin monitoring camera sensor(s) are preferably monitored by a neural network running on another instance of SoC 3004, configured to identify in cabin events and respond accordingly. In at least one embodiment, an in-cabin system may perform, without limitation, lip reading to activate cellular service and place a phone call, dictate emails, change a vehicle's destination, activate or change a vehicle's infotainment system and settings, or provide voice-activated web surfing. In at least one embodiment, certain functions are available to a driver when a vehicle is operating in an autonomous mode and are disabled otherwise.

In at least one embodiment, a video image compositor may include enhanced temporal noise reduction for both spatial and temporal noise reduction. For example, in at least one embodiment, where motion occurs in a video, noise reduction weights spatial information appropriately, decreasing weights of information provided by adjacent frames. In at least one embodiment, where an image or portion of an image does not include motion, temporal noise reduction performed by video image compositor may use information from a previous image to reduce noise in a current image.

In at least one embodiment, a video image compositor may also be configured to perform stereo rectification on input stereo lens frames. In at least one embodiment, a video image compositor may further be used for user interface composition when an operating system desktop is in use, and GPU(s) 3008 are not required to continuously render new surfaces. In at least one embodiment, when GPU(s) 3008 are powered on and active doing 3D rendering, a video image compositor may be used to offload GPU(s) 3008 to improve performance and responsiveness.

In at least one embodiment, one or more SoC of SoC(s) 3004 may further include a mobile industry processor interface ("MIPI") camera serial interface for receiving video and input from cameras, a high-speed interface, and/or a video input block that may be used for a camera and related pixel input functions. In at least one embodiment, one or more of SoC(s) 3004 may further include an input/output controller(s) that may be controlled by software and may be used for receiving I/O signals that are uncommitted to a specific role.

In at least one embodiment, one or more Soc of SoC(s) 3004 may further include a broad range of peripheral interfaces to enable communication with peripherals, audio encoders/decoders ("codecs"), power management, and/or other devices. In at least one embodiment, SoC(s) 3004 may be used to process data from cameras (e.g., connected over Gigabit Multimedia Serial Link and Ethernet channels), sensors (e.g., LIDAR sensor(s) 3064, RADAR sensor(s) 3060, etc. that may be connected over Ethernet channels), data from bus 3002 (e.g., speed of vehicle 3000, steering wheel position, etc.), data from GNSS sensor(s) 3058 (e.g., connected over a Ethernet bus or a CAN bus), etc. In at least one embodiment, one or more SoC of SoC(s) 3004 may further include dedicated high-performance mass storage controllers that may include their own DMA engines, and that may be used to free CPU(s) 3006 from routine data management tasks.

In at least one embodiment, SoC(s) 3004 may be an end-to-end platform with a flexible architecture that spans automation Levels 3-5, thereby providing a comprehensive functional safety architecture that leverages and makes efficient use of computer vision and ADAS techniques for diversity and redundancy, and provides a platform for a flexible, reliable driving software stack, along with deep learning tools. In at least one embodiment, SoC(s) 3004 may be faster, more reliable, and even more energy-efficient and space-efficient than conventional systems. For example, in at least one embodiment, accelerator(s) 3014, when combined with CPU(s) 3006, GPU(s) 3008, and data store(s) 3016, may provide for a fast, efficient platform for Level 3-5 autonomous vehicles.

In at least one embodiment, computer vision algorithms may be executed on CPUs, which may be configured using a high-level programming language, such as C, to execute a wide variety of processing algorithms across a wide variety of visual data. However, in at least one embodiment, CPUs are oftentimes unable to meet performance requirements of many computer vision applications, such as those related to execution time and power consumption, for example. In at least one embodiment, many CPUs are unable to execute complex object detection algorithms in real-time, which is used in in-vehicle ADAS applications and in practical Level 3-5 autonomous vehicles.

Embodiments described herein allow for multiple neural networks to be performed simultaneously and/or sequentially, and for results to be combined together to enable Level 3-5 autonomous driving functionality. For example, in at least one embodiment, a CNN executing on a DLA or a discrete GPU (e.g., GPU(s) 3020) may include text and word recognition, allowing reading and understanding of traffic signs, including signs for which a neural network has not been specifically trained. In at least one embodiment, a DLA may further include a neural network that is able to identify, interpret, and provide semantic understanding of a sign, and to pass that semantic understanding to path planning modules running on a CPU Complex.

In at least one embodiment, multiple neural networks may be run simultaneously, as for Level 3, 4, or 5 driving. For example, in at least one embodiment, a warning sign stating "Caution: flashing lights indicate icy conditions," along with an electric light, may be independently or collectively interpreted by several neural networks. In at least one embodiment, such warning sign itself may be identified as a traffic sign by a first deployed neural network (e.g., a neural network that has been trained), text "flashing lights indicate icy conditions" may be interpreted by a second deployed neural network, which informs a vehicle's path planning software (preferably executing on a CPU Complex) that when flashing lights are detected, icy conditions exist. In at least one embodiment, a flashing light may be identified by operating a third deployed neural network over multiple frames, informing a vehicle's path-planning software of a presence (or an absence) of flashing lights. In at least one embodiment, all three neural networks may run simultaneously, such as within a DLA and/or on GPU(s) 3008.

In at least one embodiment, a CNN for facial recognition and vehicle owner identification may use data from camera sensors to identify presence of an authorized driver and/or owner of vehicle 3000. In at least one embodiment, an always-on sensor processing engine may be used to unlock a vehicle when an owner approaches a driver door and turns on lights, and, in a security mode, to disable such vehicle when an owner leaves such vehicle. In this way, SoC(s) 3004 provide for security against theft and/or carjacking.

In at least one embodiment, a CNN for emergency vehicle detection and identification may use data from microphones 3096 to detect and identify emergency vehicle sirens. In at least one embodiment, SoC(s) 3004 use a CNN for classifying environmental and urban sounds, as well as classifying visual data. In at least one embodiment, a CNN running on a DLA is trained to identify a relative closing speed of an emergency vehicle (e.g., by using a Doppler effect). In at least one embodiment, a CNN may also be trained to identify emergency vehicles specific to a local area in which a vehicle is operating, as identified by GNSS sensor(s) 3058. In at least one embodiment, when operating in Europe, a CNN will seek to detect European sirens, and when in North America, a CNN will seek to identify only North American sirens. In at least one embodiment, once an emergency vehicle is detected, a control program may be used to execute an emergency vehicle safety routine, slowing a vehicle, pulling over to a side of a road, parking a vehicle, and/or idling a vehicle, with assistance of ultrasonic sensor(s) 3062, until emergency vehicles pass.

In at least one embodiment, vehicle 3000 may include CPU(s) 3018 (e.g., discrete CPU(s), or dCPU(s)), that may be coupled to SoC(s) 3004 via a high-speed interconnect (e.g., PCIe). In at least one embodiment, CPU(s) 3018 may include an X86 processor, for example. CPU(s) 3018 may be used to perform any of a variety of functions, including arbitrating potentially inconsistent results between ADAS sensors and SoC(s) 3004, and/or monitoring status and health of controller(s) 3036 and/or an infotainment system on a chip ("infotainment SoC") 3030, for example.

In at least one embodiment, vehicle 3000 may include GPU(s) 3020 (e.g., discrete GPU(s), or dGPU(s)), that may be coupled to SoC(s) 3004 via a high-speed interconnect (e.g., NVIDIA's NVLINK channel). In at least one embodiment, GPU(s) 3020 may provide additional artificial intelligence functionality, such as by executing redundant and/or different neural networks, and may be used to train and/or update neural networks based at least in part on input (e.g., sensor data) from sensors of a vehicle 3000.

In at least one embodiment, vehicle 3000 may further include network interface 3024 which may include, without limitation, wireless antenna(s) 3026 (e.g., one or more wireless antennas for different communication protocols, such as a cellular antenna, a Bluetooth antenna, etc.). In at least one embodiment, network interface 3024 may be used to enable wireless connectivity to Internet cloud services (e.g., with server(s) and/or other network devices), with other vehicles, and/or with computing devices (e.g., client devices of passengers). In at least one embodiment, to communicate with other vehicles, a direct link may be established between vehicle 300 and another vehicle and/or an indirect link may be established (e.g., across networks and over the Internet). In at least one embodiment, direct links may be provided using a vehicle-to-vehicle communication link. In at least one embodiment, a vehicle-to-vehicle communication link may provide vehicle 3000 information about vehicles in proximity to vehicle 3000 (e.g., vehicles in front of, on a side of, and/or behind vehicle 3000). In at least one embodiment, such aforementioned functionality may be part of a cooperative adaptive cruise control functionality of vehicle 3000.

In at least one embodiment, network interface 3024 may include an SoC that provides modulation and demodulation functionality and enables controller(s) 3036 to communicate over wireless networks. In at least one embodiment, network interface 3024 may include a radio frequency front-end for up-conversion from baseband to radio frequency, and down conversion from radio frequency to baseband. In at least one embodiment, frequency conversions may be performed in any technically feasible fashion. For example, frequency conversions could be performed through well-known processes, and/or using super-heterodyne processes. In at least one embodiment, radio frequency front end functionality may be provided by a separate chip. In at least one embodiment, network interfaces may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

In at least one embodiment, vehicle 3000 may further include data store(s) 3028 which may include, without limitation, off-chip (e.g., off SoC(s) 3004) storage. In at least one embodiment, data store(s) 3028 may include, without limitation, one or more storage elements including RAM, SRAM, dynamic random-access memory ("DRAM"), video random-access memory ("VRAM"), flash memory, hard disks, and/or other components and/or devices that may store at least one bit of data.

In at least one embodiment, vehicle 3000 may further include GNSS sensor(s) 3058 (e.g., GPS and/or assisted GPS sensors), to assist in mapping, perception, occupancy grid generation, and/or path planning functions. In at least one embodiment, any number of GNSS sensor(s) 3058 may be used, including, for example and without limitation, a GPS using a USB connector with an Ethernet-to-Serial (e.g., RS-232) bridge.

In at least one embodiment, vehicle 3000 may further include RADAR sensor(s) 3060. In at least one embodiment, RADAR sensor(s) 3060 may be used by vehicle 3000 for long-range vehicle detection, even in darkness and/or severe weather conditions. In at least one embodiment, RADAR functional safety levels may be ASIL B. In at least one embodiment, RADAR sensor(s) 3060 may use a CAN bus and/or bus 3002 (e.g., to transmit data generated by RADAR sensor(s) 3060) for control and to access object tracking data, with access to Ethernet channels to access raw data in some examples. In at least one embodiment, a wide variety of RADAR sensor types may be used. For example, and without limitation, RADAR sensor(s) 3060 may be suitable for front, rear, and side RADAR use. In at least one embodiment, one or more sensor of RADAR sensors(s) 3060 is a Pulse Doppler RADAR sensor.

In at least one embodiment, RADAR sensor(s) 3060 may include different configurations, such as long-range with narrow field of view, short-range with wide field of view, short-range side coverage, etc. In at least one embodiment, long-range RADAR may be used for adaptive cruise control functionality. In at least one embodiment, long-range RADAR systems may provide a broad field of view realized by two or more independent scans, such as within a 250 m (meter) range. In at least one embodiment, RADAR sensor(s) 3060 may help in distinguishing between static and moving objects, and may be used by ADAS system 3038 for emergency brake assist and forward collision warning. In at least one embodiment, sensors 3060(*s*) included in a long-range RADAR system may include, without limitation, monostatic multimodal RADAR with multiple (e.g., six or more) fixed RADAR antennae and a high-speed CAN and FlexRay interface. In at least one embodiment, with six antennae, a central four antennae may create a focused beam pattern, designed to record vehicle's 3000 surroundings at higher speeds with minimal interference from traffic in adjacent lanes. In at least one embodiment, another two antennae may expand field of view, making it possible to quickly detect vehicles entering or leaving a lane of vehicle 3000.

In at least one embodiment, mid-range RADAR systems may include, as an example, a range of up to 160 m (front) or 80 m (rear), and a field of view of up to 42 degrees (front) or 150 degrees (rear). In at least one embodiment, short-range RADAR systems may include, without limitation, any number of RADAR sensor(s) 3060 designed to be installed at both ends of a rear bumper. When installed at both ends of a rear bumper, in at least one embodiment, a RADAR sensor system may create two beams that constantly monitor blind spots in a rear direction and next to a vehicle. In at least one embodiment, short-range RADAR systems may be used in ADAS system 3038 for blind spot detection and/or lane change assist.

In at least one embodiment, vehicle 3000 may further include ultrasonic sensor(s) 3062. In at least one embodiment, ultrasonic sensor(s) 3062, which may be positioned at a front, a back, and/or side location of vehicle 3000, may be used for parking assist and/or to create and update an occupancy grid. In at least one embodiment, a wide variety of ultrasonic sensor(s) 3062 may be used, and different ultrasonic sensor(s) 3062 may be used for different ranges of detection (e.g., 2.5 m, 4 m). In at least one embodiment, ultrasonic sensor(s) 3062 may operate at functional safety levels of ASIL B.

In at least one embodiment, vehicle 3000 may include LIDAR sensor(s) 3064. In at least one embodiment, LIDAR sensor(s) 3064 may be used for object and pedestrian detection, emergency braking, collision avoidance, and/or other functions. In at least one embodiment, LIDAR sensor(s) 3064 may operate at functional safety level ASIL B. In at least one embodiment, vehicle 3000 may include multiple LIDAR sensors 3064 (e.g., two, four, six, etc.) that may use an Ethernet channel (e.g., to provide data to a Gigabit Ethernet switch).

In at least one embodiment, LIDAR sensor(s) 3064 may be capable of providing a list of objects and their distances for a 360-degree field of view. In at least one embodiment, commercially available LIDAR sensor(s) 3064 may have an advertised range of approximately 100 m, with an accuracy of 2 cm to 3 cm, and with support for a 100 Mbps Ethernet connection, for example. In at least one embodiment, one or more non-protruding LIDAR sensors may be used. In such an embodiment, LIDAR sensor(s) 3064 may include a small device that may be embedded into a front, a rear, a side, and/or a corner location of vehicle 3000. In at least one embodiment, LIDAR sensor(s) 3064, in such an embodiment, may provide up to a 120-degree horizontal and 35-degree vertical field-of-view, with a 200 m range even for low-reflectivity objects. In at least one embodiment, front-mounted LIDAR sensor(s) 3064 may be configured for a horizontal field of view between 45 degrees and 135 degrees.

In at least one embodiment, LIDAR technologies, such as 3D flash LIDAR, may also be used. In at least one embodiment, 3D flash LIDAR uses a flash of a laser as a transmission source, to illuminate surroundings of vehicle 3000 up to approximately 200 m. In at least one embodiment, a flash LIDAR unit includes, without limitation, a receptor, which records laser pulse transit time and reflected light on each pixel, which in turn corresponds to a range from vehicle 3000 to objects. In at least one embodiment, flash LIDAR may allow for highly accurate and distortion-free images of surroundings to be generated with every laser flash. In at least one embodiment, four flash LIDAR sensors may be deployed, one at each side of vehicle 3000. In at least one embodiment, 3D flash LIDAR systems include, without limitation, a solid-state 3D staring array LIDAR camera with no moving parts other than a fan (e.g., a non-scanning LIDAR device). In at least one embodiment, flash LIDAR device may use a 5 nanosecond class I (eye-safe) laser pulse per frame and may capture reflected laser light as a 3D range point cloud and co-registered intensity data.

In at least one embodiment, vehicle 3000 may further include IMU sensor(s) 3066. In at least one embodiment, IMU sensor(s) 3066 may be located at a center of a rear axle of vehicle 3000. In at least one embodiment, IMU sensor(s) 3066 may include, for example and without limitation, accelerometer(s), magnetometer(s), gyroscope(s), a magnetic compass, magnetic compasses, and/or other sensor types. In at least one embodiment, such as in six-axis applications, IMU sensor(s) 3066 may include, without limitation, accelerometers and gyroscopes. In at least one embodiment, such as in nine-axis applications, IMU sensor(s) 3066 may include, without limitation, accelerometers, gyroscopes, and magnetometers.

In at least one embodiment, IMU sensor(s) 3066 may be implemented as a miniature, high performance GPS-Aided Inertial Navigation System ("GPS/INS") that combines micro-electro-mechanical systems ("MEMS") inertial sensors, a high-sensitivity GPS receiver, and advanced Kalman filtering algorithms to provide estimates of position, velocity, and attitude. In at least one embodiment, IMU sensor(s) 3066 may enable vehicle 3000 to estimate its heading without requiring input from a magnetic sensor by directly observing and correlating changes in velocity from a GPS to IMU sensor(s) 3066. In at least one embodiment, IMU sensor(s) 3066 and GNSS sensor(s) 3058 may be combined in a single integrated unit.

In at least one embodiment, vehicle 3000 may include microphone(s) 3096 placed in and/or around vehicle 3000. In at least one embodiment, microphone(s) 3096 may be used for emergency vehicle detection and identification, among other things.

In at least one embodiment, vehicle 3000 may further include any number of camera types, including stereo camera(s) 3068, wide-view camera(s) 3070, infrared camera(s) 3072, surround camera(s) 3074, long-range camera(s) 3098, mid-range camera(s) 3076, and/or other camera types. In at least one embodiment, cameras may be used to capture image data around an entire periphery of vehicle 3000. In at least one embodiment, which types of cameras used depends on vehicle 3000. In at least one embodiment, any combination of camera types may be used to provide necessary coverage around vehicle 3000. In at least one embodiment, a number of cameras deployed may differ depending on embodiment. For example, in at least one embodiment, vehicle 3000 could include six cameras, seven cameras, ten cameras, twelve cameras, or another number of cameras. In at least one embodiment, cameras may support, as an example and without limitation, Gigabit Multimedia Serial Link ("GMSL") and/or Gigabit Ethernet communications. In at least one embodiment, each camera might be as described with more detail previously herein with respect to FIG. 30A and FIG. 30B.

In at least one embodiment, vehicle 3000 may further include vibration sensor(s) 3042. In at least one embodiment, vibration sensor(s) 3042 may measure vibrations of components of vehicle 3000, such as axle(s). For example, in at least one embodiment, changes in vibrations may indicate a change in road surfaces. In at least one embodiment, when two or more vibration sensors 3042 are used, differences between vibrations may be used to determine friction or slippage of road surface (e.g., when a difference in vibration is between a power-driven axle and a freely rotating axle).

In at least one embodiment, vehicle 3000 may include ADAS system 3038. In at least one embodiment, ADAS system 3038 may include, without limitation, an SoC, in some examples. In at least one embodiment, ADAS system 3038 may include, without limitation, any number and combination of an autonomous/adaptive/automatic cruise control ("ACC") system, a cooperative adaptive cruise control ("CACC") system, a forward crash warning ("FCW") system, an automatic emergency braking ("AEB") system, a lane departure warning ("LDW)" system, a lane keep assist ("LKA") system, a blind spot warning ("BSW") system, a rear cross-traffic warning ("RCTW") system, a collision warning ("CW") system, a lane centering ("LC") system, and/or other systems, features, and/or functionality.

In at least one embodiment, ACC system may use RADAR sensor(s) 3060, LIDAR sensor(s) 3064, and/or any number of camera(s). In at least one embodiment, ACC system may include a longitudinal ACC system and/or a lateral ACC system. In at least one embodiment, a longitudinal ACC system monitors and controls distance to another vehicle immediately ahead of vehicle 3000 and automatically adjusts speed of vehicle 3000 to maintain a safe distance from vehicles ahead. In at least one embodiment, a lateral ACC system performs distance keeping, and advises vehicle 3000 to change lanes when necessary. In at least one embodiment, a lateral ACC is related to other ADAS applications, such as LC and CW.

In at least one embodiment, a CACC system uses information from other vehicles that may be received via network interface 3024 and/or wireless antenna(s) 3026 from other vehicles via a wireless link, or indirectly, over a network connection (e.g., over the Internet). In at least one embodiment, direct links may be provided by a vehicle-to-vehicle ("V2V") communication link, while indirect links may be provided by an infrastructure-to-vehicle ("I2V") communication link. In general, V2V communication provides information about immediately preceding vehicles (e.g., vehicles immediately ahead of and in same lane as vehicle 3000), while I2V communication provides information about traffic further ahead. In at least one embodiment, a CACC system may include either or both I2V and V2V information sources. In at least one embodiment, given information of vehicles ahead of vehicle 3000, a CACC system may be more reliable and it has potential to improve traffic flow smoothness and reduce congestion on road.

In at least one embodiment, an FCW system is designed to alert a driver to a hazard, so that such driver may take corrective action. In at least one embodiment, an FCW system uses a front-facing camera and/or RADAR sensor(s) 3060, coupled to a dedicated processor, DSP, FPGA, and/or ASIC, that is electrically coupled to provide driver feedback, such as a display, speaker, and/or vibrating component. In at least one embodiment, an FCW system may provide a warning, such as in form of a sound, visual warning, vibration and/or a quick brake pulse.

In at least one embodiment, an AEB system detects an impending forward collision with another vehicle or other object, and may automatically apply brakes if a driver does not take corrective action within a specified time or distance parameter. In at least one embodiment, AEB system may use front-facing camera(s) and/or RADAR sensor(s) 3060, coupled to a dedicated processor, DSP, FPGA, and/or ASIC. In at least one embodiment, when an AEB system detects a hazard, it will typically first alert a driver to take corrective action to avoid collision and, if that driver does not take corrective action, that AEB system may automatically apply brakes in an effort to prevent, or at least mitigate, an impact of a predicted collision. In at least one embodiment, an AEB system may include techniques such as dynamic brake support and/or crash imminent braking.

In at least one embodiment, an LDW system provides visual, audible, and/or tactile warnings, such as steering wheel or seat vibrations, to alert driver when vehicle 3000 crosses lane markings. In at least one embodiment, an LDW system does not activate when a driver indicates an intentional lane departure, such as by activating a turn signal. In at least one embodiment, an LDW system may use front-side facing cameras, coupled to a dedicated processor, DSP, FPGA, and/or ASIC, that is electrically coupled to provide driver feedback, such as a display, speaker, and/or vibrating component. In at least one embodiment, an LKA system is a variation of an LDW system. In at least one embodiment, an LKA system provides steering input or braking to correct vehicle 3000 if vehicle 3000 starts to exit its lane.

In at least one embodiment, a BSW system detects and warns a driver of vehicles in an automobile's blind spot. In at least one embodiment, a BSW system may provide a visual, audible, and/or tactile alert to indicate that merging or changing lanes is unsafe. In at least one embodiment, a BSW system may provide an additional warning when a driver uses a turn signal. In at least one embodiment, a BSW system may use rear-side facing camera(s) and/or RADAR sensor(s) 3060, coupled to a dedicated processor, DSP, FPGA, and/or ASIC, that is electrically coupled to driver feedback, such as a display, speaker, and/or vibrating component.

In at least one embodiment, an RCTW system may provide visual, audible, and/or tactile notification when an object is detected outside a rear-camera range when vehicle 3000 is backing up. In at least one embodiment, an RCTW system includes an AEB system to ensure that vehicle brakes are applied to avoid a crash. In at least one embodiment, an RCTW system may use one or more rear-facing RADAR sensor(s) 3060, coupled to a dedicated processor, DSP, FPGA, and/or ASIC, that is electrically coupled to provide driver feedback, such as a display, speaker, and/or vibrating component.

In at least one embodiment, conventional ADAS systems may be prone to false positive results which may be annoying and distracting to a driver, but typically are not catastrophic, because conventional ADAS systems alert a driver and allow that driver to decide whether a safety condition truly exists and act accordingly. In at least one embodiment, vehicle 3000 itself decides, in case of conflicting results, whether to heed result from a primary computer or a secondary computer (e.g., a first controller or a second controller of controllers 3036). For example, in at least one embodiment, ADAS system 3038 may be a backup and/or secondary computer for providing perception information to a backup computer rationality module. In at least one embodiment, a backup computer rationality monitor may run redundant diverse software on hardware components to detect faults in perception and dynamic driving tasks. In at least one embodiment, outputs from ADAS system 3038 may be provided to a supervisory MCU. In at least one embodiment, if outputs from a primary computer and outputs from a secondary computer conflict, a supervisory MCU determines how to reconcile conflict to ensure safe operation.

In at least one embodiment, a primary computer may be configured to provide a supervisory MCU with a confidence score, indicating that primary computer's confidence in a chosen result. In at least one embodiment, if that confidence score exceeds a threshold, that supervisory MCU may follow that primary computer's direction, regardless of whether that secondary computer provides a conflicting or inconsistent result. In at least one embodiment, where a confidence score does not meet a threshold, and where primary and secondary computers indicate different results (e.g., a conflict), a supervisory MCU may arbitrate between computers to determine an appropriate outcome.

In at least one embodiment, a supervisory MCU may be configured to run a neural network(s) that is trained and configured to determine, based at least in part on outputs from a primary computer and outputs from a secondary computer, conditions under which that secondary computer provides false alarms. In at least one embodiment, neural network(s) in a supervisory MCU may learn when a secondary computer's output may be trusted, and when it cannot. For example, in at least one embodiment, when that secondary computer is a RADAR-based FCW system, a neural network(s) in that supervisory MCU may learn when an FCW system is identifying metallic objects that are not, in fact, hazards, such as a drainage grate or manhole cover that triggers an alarm. In at least one embodiment, when a secondary computer is a camera-based LDW system, a neural network in a supervisory MCU may learn to override LDW when bicyclists or pedestrians are present and a lane departure is, in fact, a safest maneuver. In at least one embodiment, a supervisory MCU may include at least one of a DLA or a GPU suitable for running neural network(s) with associated memory. In at least one embodiment, a supervisory MCU may comprise and/or be included as a component of SoC(s) 3004.

In at least one embodiment, ADAS system 3038 may include a secondary computer that performs ADAS functionality using traditional rules of computer vision. In at least one embodiment, that secondary computer may use classic computer vision rules (if-then), and presence of a neural network(s) in a supervisory MCU may improve reliability, safety and performance. For example, in at least one embodiment, diverse implementation and intentional non-identity makes an overall system more fault-tolerant, especially to faults caused by software (or software-hardware interface) functionality. For example, in at least one embodiment, if there is a software bug or error in software running on a primary computer, and non-identical software code running on a secondary computer provides a consistent overall result, then a supervisory MCU may have greater confidence that an overall result is correct, and a bug in software or hardware on that primary computer is not causing a material error.

In at least one embodiment, an output of ADAS system 3038 may be fed into a primary computer's perception block and/or a primary computer's dynamic driving task block. For example, in at least one embodiment, if ADAS system 3038 indicates a forward crash warning due to an object immediately ahead, a perception block may use this information when identifying objects. In at least one embodiment, a secondary computer may have its own neural network that is trained and thus reduces a risk of false positives, as described herein.

In at least one embodiment, vehicle 3000 may further include infotainment SoC 3030 (e.g., an in-vehicle infotainment system (IVI)). Although illustrated and described as an SoC, infotainment system SoC 3030, in at least one embodiment, may not be an SoC, and may include, without limitation, two or more discrete components. In at least one embodiment, infotainment SoC 3030 may include, without limitation, a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, WiFi, etc.), and/or information services (e.g., navigation systems, rear-parking assistance, a radio data system, vehicle related information such as fuel level, total distance covered, brake fuel level, oil level, door open/close, air filter information, etc.) to vehicle 3000. For example, infotainment SoC 3030 could include radios, disk players, navigation systems, video players, USB and Bluetooth connectivity, carputers, in-car entertainment, WiFi, steering wheel audio controls, hands free voice control, a heads-up display ("HUD"), HMI display 3034, a telematics device, a control panel (e.g., for controlling and/or interacting with various components, features, and/or systems), and/or other components. In at least one embodiment, infotainment SoC 3030 may further be used to provide information (e.g., visual and/or audible) to user(s) of vehicle 3000, such as information from ADAS system 3038, autonomous driving information such as planned vehicle maneuvers, trajectories, surrounding environment information (e.g., intersection information, vehicle information, road information, etc.), and/or other information.

In at least one embodiment, infotainment SoC 3030 may include any amount and type of GPU functionality. In at least one embodiment, infotainment SoC 3030 may communicate over bus 3002 with other devices, systems, and/or components of vehicle 3000. In at least one embodiment, infotainment SoC 3030 may be coupled to a supervisory MCU such that a GPU of an infotainment system may perform some self-driving functions in event that primary controller(s) 3036 (e.g., primary and/or backup computers of vehicle 3000) fail. In at least one embodiment, infotainment SoC 3030 may put vehicle 3000 into a chauffeur to safe stop mode, as described herein.

In at least one embodiment, vehicle 3000 may further include instrument cluster 3032 (e.g., a digital dash, an electronic instrument cluster, a digital instrument panel, etc.). In at least one embodiment, instrument cluster 3032 may include, without limitation, a controller and/or supercomputer (e.g., a discrete controller or supercomputer). In at least one embodiment, instrument cluster 3032 may include, without limitation, any number and combination of a set of instrumentation such as a speedometer, fuel level, oil pressure, tachometer, odometer, turn indicators, gearshift position indicator, seat belt warning light(s), parking-brake warning light(s), engine-malfunction light(s), supplemental restraint system (e.g., airbag) information, lighting controls, safety system controls, navigation information, etc. In some examples, information may be displayed and/or shared among infotainment SoC 3030 and instrument cluster 3032. In at least one embodiment, instrument cluster 3032 may be included as part of infotainment SoC 3030, or vice versa.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 30C for inferencing or predicting operations based, at least in part, on weight parameters calculated using neural network training operations, neural network functions and/or architectures, or neural network use cases described herein.

FIG. 30D is a diagram of a system 3076 for communication between cloud-based server(s) and autonomous vehicle 3000 of FIG. 30A, according to at least one embodiment. In at least one embodiment, system 3076 may include, without limitation, server(s) 3078, network(s) 3090, and any number and type of vehicles, including vehicle 3000. In at least one embodiment, server(s) 3078 may include, without limitation, a plurality of GPUs 3084(A)-3084(H) (collectively referred to herein as GPUs 3084), PCIe switches 3082(A)-3082(D) (collectively referred to herein as PCIe switches 3082), and/or CPUs 3080(A)-3080(B) (collectively referred to herein as CPUs 3080). In at least one embodiment, GPUs 3084, CPUs 3080, and PCIe switches 3082 may be interconnected with high-speed interconnects such as, for example and without limitation, NVLink interfaces 3088 developed by NVIDIA and/or PCIe connections 3086. In at least one embodiment, GPUs 3084 are connected via an NVLink and/or NVSwitch SoC and GPUs 3084 and PCIe switches 3082 are connected via PCIe interconnects. Although eight GPUs 3084, two CPUs 3080, and four PCIe switches 3082 are illustrated, this is not intended to be limiting. In at least one embodiment, each of server(s) 3078 may include, without limitation, any number of GPUs 3084, CPUs 3080, and/or PCIe switches 3082, in any combination. For example, in at least one embodiment, server(s) 3078 could each include eight, sixteen, thirty-two, and/or more GPUs 3084.

In at least one embodiment, server(s) 3078 may receive, over network(s) 3090 and from vehicles, image data representative of images showing unexpected or changed road conditions, such as recently commenced road-work. In at least one embodiment, server(s) 3078 may transmit, over network(s) 3090 and to vehicles, neural networks 3092, updated or otherwise, and/or map information 3094, including, without limitation, information regarding traffic and road conditions. In at least one embodiment, updates to map information 3094 may include, without limitation, updates for HD map 3022, such as information regarding construction sites, potholes, detours, flooding, and/or other obstructions. In at least one embodiment, neural networks 3092, and/or map information 3094 may have resulted from new training and/or experiences represented in data received from any number of vehicles in an environment, and/or based at least in part on training performed at a data center (e.g., using server(s) 3078 and/or other servers).

In at least one embodiment, server(s) 3078 may be used to train machine learning models (e.g., neural networks) based at least in part on training data. In at least one embodiment, training data may be generated by vehicles, and/or may be generated in a simulation (e.g., using a game engine). In at least one embodiment, any amount of training data is tagged (e.g., where associated neural network benefits from supervised learning) and/or undergoes other pre-processing. In at least one embodiment, any amount of training data is not tagged and/or pre-processed (e.g., where associated neural network does not require supervised learning). In at least one embodiment, once machine learning models are trained, machine learning models may be used by vehicles (e.g., transmitted to vehicles over network(s) 3090), and/or machine learning models may be used by server(s) 3078 to remotely monitor vehicles.

In at least one embodiment, server(s) 3078 may receive data from vehicles and apply data to up-to-date real-time neural networks for real-time intelligent inferencing. In at least one embodiment, server(s) 3078 may include deep-learning supercomputers and/or dedicated AI computers powered by GPU(s) 3084, such as a DGX and DGX Station machines developed by NVIDIA. However, in at least one embodiment, server(s) 3078 may include deep learning infrastructure that uses CPU-powered data centers.

In at least one embodiment, deep-learning infrastructure of server(s) 3078 may be capable of fast, real-time inferencing, and may use that capability to evaluate and verify health of processors, software, and/or associated hardware in vehicle 3000. For example, in at least one embodiment, deep-learning infrastructure may receive periodic updates from vehicle 3000, such as a sequence of images and/or objects that vehicle 3000 has located in that sequence of images (e.g., via computer vision and/or other machine learning object classification techniques). In at least one embodiment, deep-learning infrastructure may run its own neural network to identify objects and compare them with objects identified by vehicle 3000 and, if results do not match and deep-learning infrastructure concludes that AI in vehicle 3000 is malfunctioning, then server(s) 3078 may transmit a signal to vehicle 3000 instructing a fail-safe computer of vehicle 3000 to assume control, notify passengers, and complete a safe parking maneuver.

In at least one embodiment, server(s) 3078 may include GPU(s) 3084 and one or more programmable inference accelerators (e.g., NVIDIA's TensorRT 3 devices). In at least one embodiment, a combination of GPU-powered servers and inference acceleration may make real-time responsiveness possible. In at least one embodiment, such as where performance is less critical, servers powered by CPUs, FPGAs, and other processors may be used for inferencing. In at least one embodiment, hardware structure(s) 2715 are used to perform one or more embodiments. Details regarding hardware structure(x) 2715 are provided herein in conjunction with FIGS. 27A and/or 27B.

Computer Systems

Figure 31:
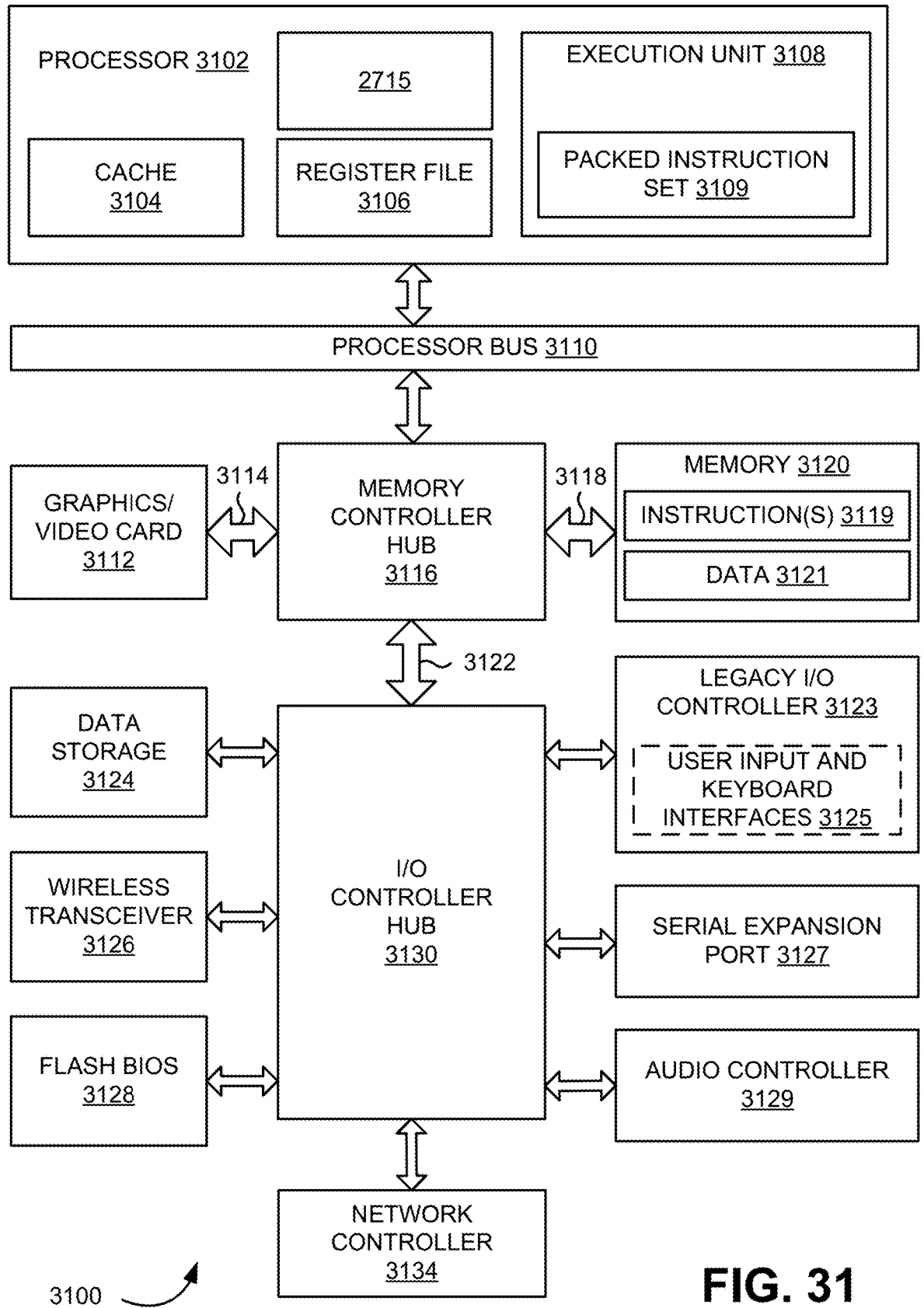
FIG. 31 is a block diagram illustrating a computer system, according to at least one embodiment.

FIG. 31 is a block diagram illustrating an exemplary computer system, which may be a system with interconnected devices and components, a system-on-a-chip (SOC) or some combination thereof formed with a processor that may include execution units to execute an instruction, according to at least one embodiment. In at least one embodiment, a computer system 3100 may include, without limitation, a component, such as a processor 3102 to employ execution units including logic to perform algorithms for process data, in accordance with present disclosure, such as in embodiment described herein. In at least one embodiment, computer system 3100 may include processors, such as PENTIUM® Processor family, Xeon™ Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 3100 may execute a version of WINDOWS operating system available from Microsoft Corporation of Redmond, Wash., although other operating systems (UNIX and Linux, for example), embedded software, and/or graphical user interfaces, may also be used.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, computer system 3100 may include, without limitation, processor 3102 that may include, without limitation, one or more execution units 3108 to perform machine learning model training and/or inferencing according to techniques described herein. In at least one embodiment, computer system 3100 is a single processor desktop or server system, but in another embodiment, computer system 3100 may be a multiprocessor system. In at least one embodiment, processor 3102 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, processor 3102 may be coupled to a processor bus 3110 that may transmit data signals between processor 3102 and other components in computer system 3100.

In at least one embodiment, processor 3102 may include, without limitation, a Level 1 ("L1") internal cache memory ("cache") 3104. In at least one embodiment, processor 3102 may have a single internal cache or multiple levels of internal cache. In at least one embodiment, cache memory may reside external to processor 3102. Other embodiments may also include a combination of both internal and external caches depending on particular implementation and needs. In at least one embodiment, a register file 3106 may store different types of data in various registers including, without limitation, integer registers, floating point registers, status registers, and an instruction pointer register.

In at least one embodiment, execution unit 3108, including, without limitation, logic to perform integer and floating point operations, also resides in processor 3102. In at least one embodiment, processor 3102 may also include a microcode ("ucode") read only memory ("ROM") that stores microcode for certain macro instructions. In at least one embodiment, execution unit 3108 may include logic to handle a packed instruction set 3109. In at least one embodiment, by including packed instruction set 3109 in an instruction set of a general-purpose processor, along with associated circuitry to execute instructions, operations used by many multimedia applications may be performed using packed data in processor 3102. In at least one embodiment, many multimedia applications may be accelerated and executed more efficiently by using a full width of a processor's data bus for performing operations on packed data, which may eliminate a need to transfer smaller units of data across that processor's data bus to perform one or more operations one data element at a time.

In at least one embodiment, execution unit 3108 may also be used in microcontrollers, embedded processors, graphics devices, DSPs, and other types of logic circuits. In at least one embodiment, computer system 3100 may include, without limitation, a memory 3120. In at least one embodiment, memory 3120 may be a Dynamic Random Access Memory ("DRAM") device, a Static Random Access Memory ("SRAM") device, a flash memory device, or another memory device. In at least one embodiment, memory 3120 may store instruction(s) 3119 and/or data 3121 represented by data signals that may be executed by processor 3102.

In at least one embodiment, a system logic chip may be coupled to processor bus 3110 and memory 3120. In at least one embodiment, a system logic chip may include, without limitation, a memory controller hub ("MCH") 3116, and processor 3102 may communicate with MCH 3116 via processor bus 3110. In at least one embodiment, MCH 3116 may provide a high bandwidth memory path 3118 to memory 3120 for instruction and data storage and for storage of graphics commands, data and textures. In at least one embodiment, MCH 3116 may direct data signals between processor 3102, memory 3120, and other components in computer system 3100 and to bridge data signals between processor bus 3110, memory 3120, and a system I/O interface 3122. In at least one embodiment, a system logic chip may provide a graphics port for coupling to a graphics controller. In at least one embodiment, MCH 3116 may be coupled to memory 3120 through high bandwidth memory path 3118 and a graphics/video card 3112 may be coupled to MCH 3116 through an Accelerated Graphics Port ("AGP") interconnect 3114.

In at least one embodiment, computer system 3100 may use system I/O interface 3122 as a proprietary hub interface bus to couple MCH 3116 to an I/O controller hub ("ICH") 3130. In at least one embodiment, ICH 3130 may provide direct connections to some I/O devices via a local I/O bus. In at least one embodiment, a local I/O bus may include, without limitation, a high-speed I/O bus for connecting peripherals to memory 3120, a chipset, and processor 3102. Examples may include, without limitation, an audio controller 3129, a firmware hub ("flash BIOS") 3128, a wireless transceiver 3126, a data storage 3124, a legacy I/O controller 3123 containing user input and keyboard interfaces 3125, a serial expansion port 3127, such as a Universal Serial Bus ("USB") port, and a network controller 3134. In at least one embodiment, data storage 3124 may comprise a hard disk drive, a floppy disk drive, a CD-ROM device, a flash memory device, or other mass storage device.

In at least one embodiment, FIG. 31 illustrates a system, which includes interconnected hardware devices or "chips", whereas in other embodiments, FIG. 31 may illustrate an exemplary SoC. In at least one embodiment, devices illustrated in FIG. 31 may be interconnected with proprietary interconnects, standardized interconnects (e.g., PCIe) or some combination thereof. In at least one embodiment, one or more components of computer system 3100 are interconnected using compute express link (CXL) interconnects.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 31 for inferencing or predicting operations based, at least in part, on weight parameters calculated using neural network training operations, neural network functions and/or architectures, or neural network use cases described herein.

Figure 32:
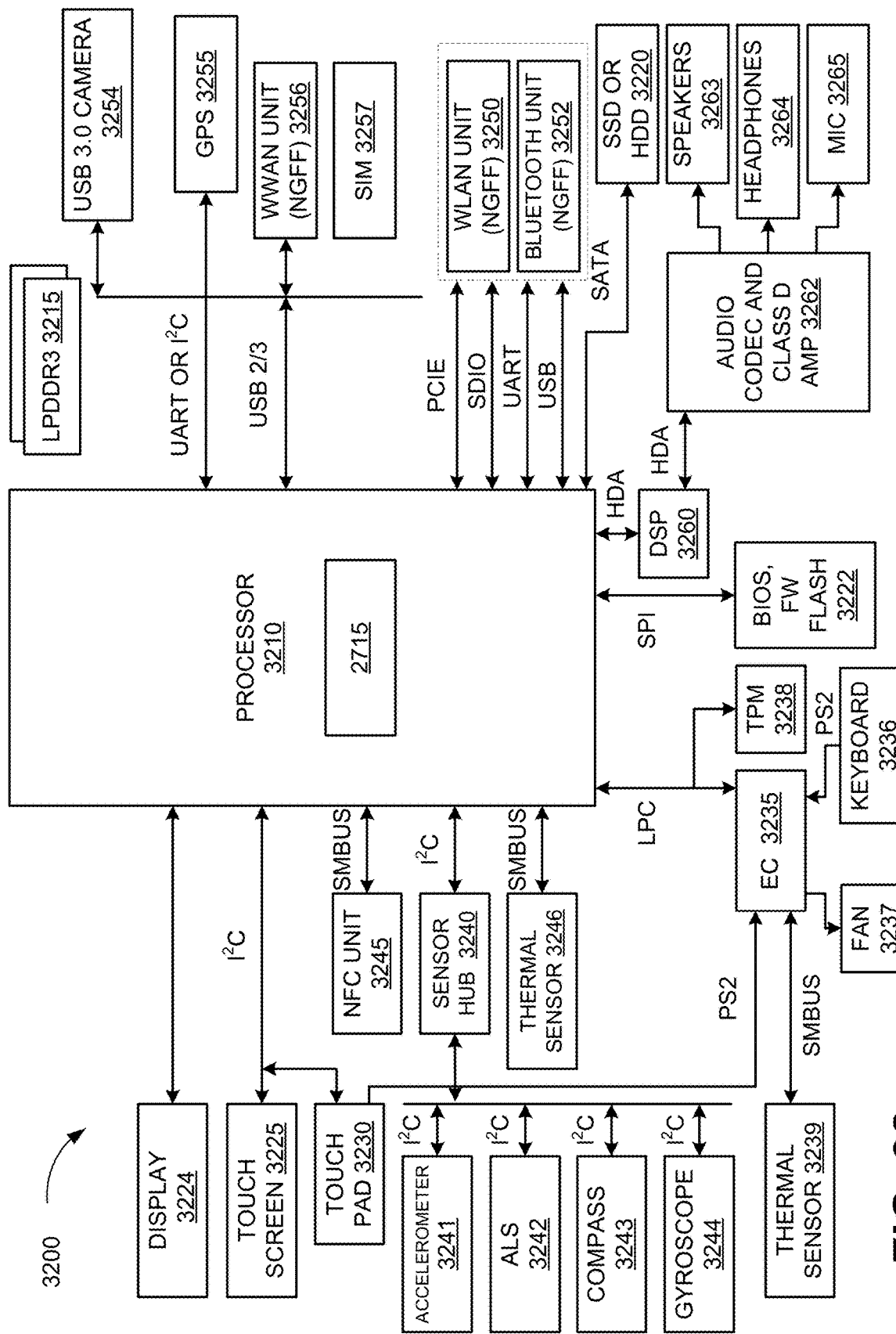
FIG. 32 is a block diagram illustrating a computer system, according to at least one embodiment.

FIG. 32 is a block diagram illustrating an electronic device 3200 for utilizing a processor 3210, according to at least one embodiment. In at least one embodiment, electronic device 3200 may be, for example and without limitation, a notebook, a tower server, a rack server, a blade server, a laptop, a desktop, a tablet, a mobile device, a phone, an embedded computer, or any other suitable electronic device.

In at least one embodiment, electronic device 3200 may include, without limitation, processor 3210 communicatively coupled to any suitable number or kind of components, peripherals, modules, or devices. In at least one embodiment, processor 3210 is coupled using a bus or interface, such as a I$^2$C bus, a System Management Bus ("SMBus"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3, etc.), or a Universal Asynchronous Receiver/Transmitter ("UART") bus. In at least one embodiment, FIG. 32 illustrates a system, which includes interconnected hardware devices or "chips", whereas in other embodiments, FIG. 32 may illustrate an exemplary SoC. In at least one embodiment, devices illustrated in FIG. 32 may be interconnected with proprietary interconnects, standardized interconnects (e.g., PCIe) or some combination thereof. In at least one embodiment, one or more components of FIG. 32 are interconnected using compute express link (CXL) interconnects.

In at least one embodiment, FIG. 32 may include a display 3224, a touch screen 3225, a touch pad 3230, a Near Field Communications unit ("NFC") 3245, a sensor hub 3240, a thermal sensor 3246, an Express Chipset ("EC") 3235, a Trusted Platform Module ("TPM") 3238, BIOS/firmware/flash memory ("BIOS, FW Flash") 3222, a DSP 3260, a drive 3220 such as a Solid State Disk ("SSD") or a Hard Disk Drive ("HDD"), a wireless local area network unit ("WLAN") 3250, a Bluetooth unit 3252, a Wireless Wide Area Network unit ("WWAN") 3256, a Global Positioning System (GPS) unit 3255, a camera ("USB 3.0 camera") 3254 such as a USB 3.0 camera, and/or a Low Power Double Data Rate ("LPDDR") memory unit ("LPDDR3") 3215 implemented in, for example, an LPDDR3 standard. These components may each be implemented in any suitable manner.

In at least one embodiment, other components may be communicatively coupled to processor 3210 through components described herein. In at least one embodiment, an accelerometer 3241, an ambient light sensor ("ALS") 3242, a compass 3243, and a gyroscope 3244 may be communicatively coupled to sensor hub 3240. In at least one embodiment, a thermal sensor 3239, a fan 3237, a keyboard 3236, and touch pad 3230 may be communicatively coupled to EC 3235. In at least one embodiment, speakers 3263, headphones 3264, and a microphone ("mic") 3265 may be communicatively coupled to an audio unit ("audio codec and class D amp") 3262, which may in turn be communicatively coupled to DSP 3260. In at least one embodiment, audio unit 3262 may include, for example and without limitation, an audio coder/decoder ("codec") and a class D amplifier. In at least one embodiment, a SIM card ("SIM") 3257 may be communicatively coupled to WWAN unit 3256. In at least one embodiment, components such as WLAN unit 3250 and Bluetooth unit 3252, as well as WWAN unit 3256 may be implemented in a Next Generation Form Factor ("NGFF").

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 32 for inferencing or predicting operations based, at least in part, on weight parameters calculated using neural network training operations, neural network functions and/or architectures, or neural network use cases described herein.

Figure 33:
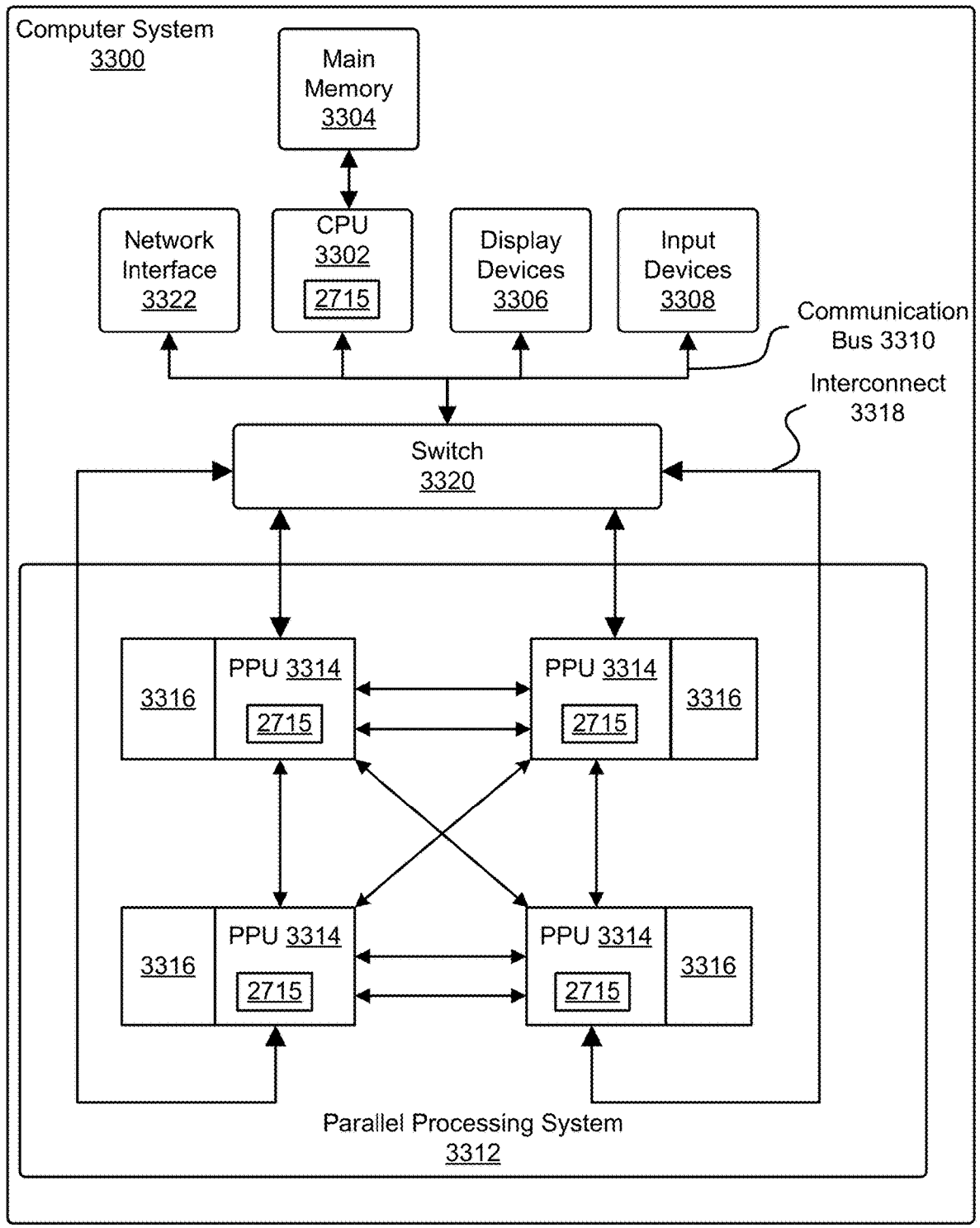
FIG. 33 illustrates a computer system, according to at least one embodiment.

FIG. 33 illustrates a computer system 3300, according to at least one embodiment. In at least one embodiment, computer system 3300 is configured to implement various processes and methods described throughout this disclosure.

In at least one embodiment, computer system 3300 comprises, without limitation, at least one central processing unit ("CPU") 3302 that is connected to a communication bus 3310 implemented using any suitable protocol, such as PCI ("Peripheral Component Interconnect"), peripheral component interconnect express ("PCI-Express"), AGP ("Accelerated Graphics Port"), HyperTransport, or any other bus or point-to-point communication protocol(s). In at least one embodiment, computer system 3300 includes, without limitation, a main memory 3304 and control logic (e.g., implemented as hardware, software, or a combination thereof) and data are stored in main memory 3304, which may take form of random access memory ("RAM"). In at least one embodiment, a network interface subsystem ("network interface") 3322 provides an interface to other computing devices and networks for receiving data from and transmitting data to other systems with computer system 3300.

In at least one embodiment, computer system 3300, in at least one embodiment, includes, without limitation, input devices 3308, a parallel processing system 3312, and display devices 3306 that can be implemented using a conventional cathode ray tube ("CRT"), a liquid crystal display ("LCD"), a light emitting diode ("LED") display, a plasma display, or other suitable display technologies. In at least one embodiment, user input is received from input devices 3308 such as keyboard, mouse, touchpad, microphone, etc. In at least one embodiment, each module described herein can be situated on a single semiconductor platform to form a processing system.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 33 for inferencing or predicting operations based, at least in part, on weight parameters calculated using neural network training operations, neural network functions and/or architectures, or neural network use cases described herein.

Figure 34:
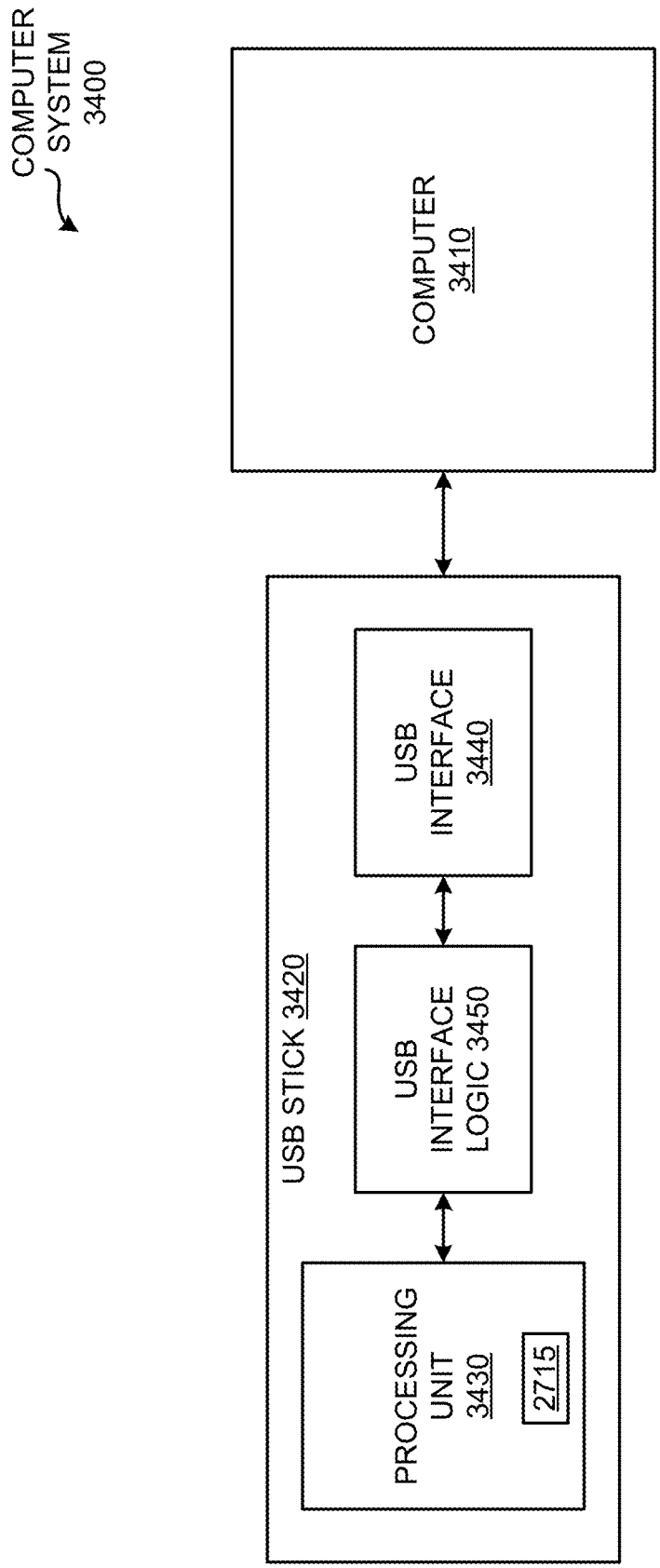
FIG. 34 illustrates a computer system, according to at least one embodiment.
Figure 35:
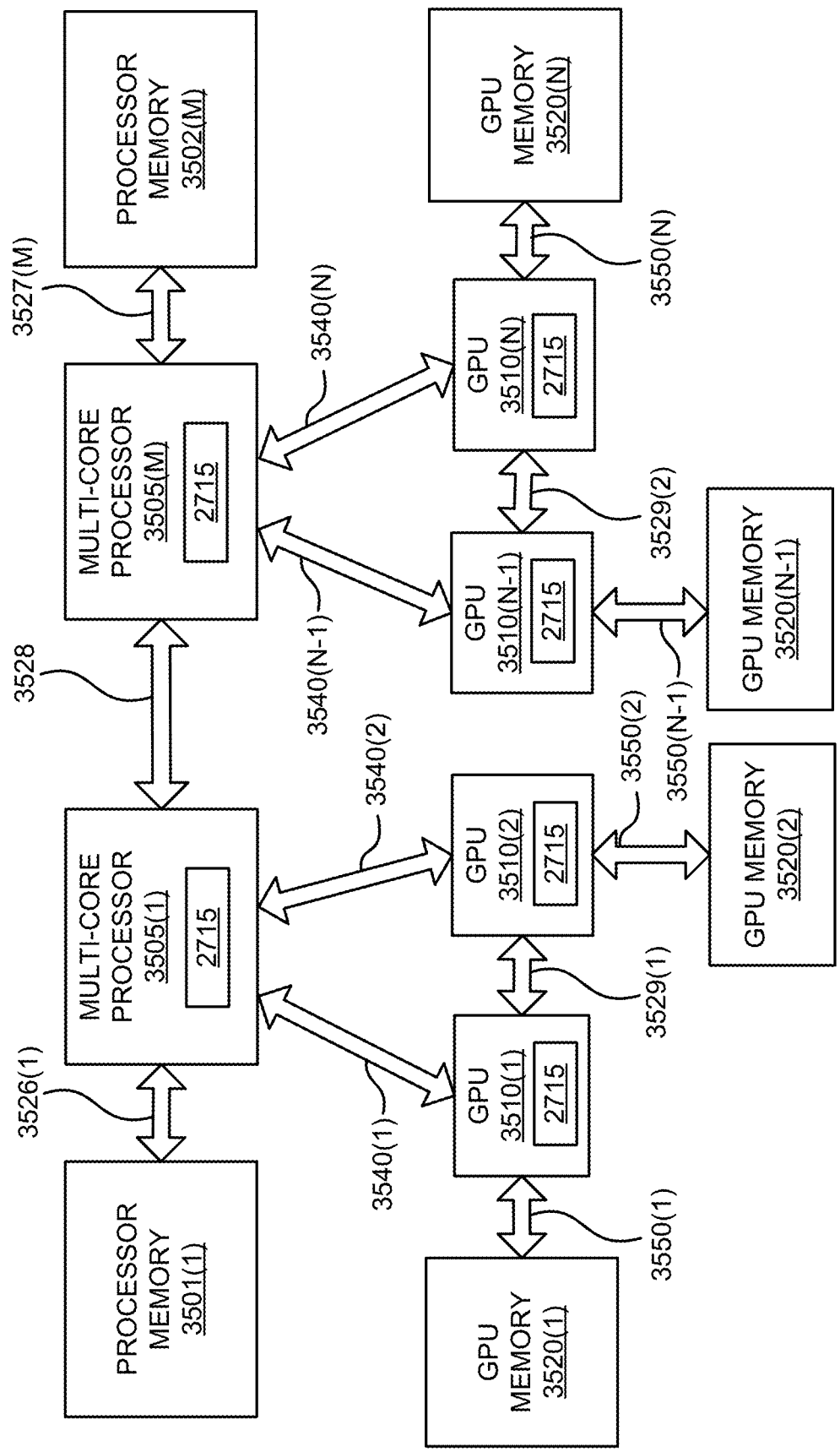
FIG. 35A illustrates a computer system, according to at least one embodiment.
FIG. 35B illustrates a computer system, according to at least one embodiment.
FIG. 35C illustrates a computer system, according to at least one embodiment.
FIG. 35D illustrates a computer system, according to at least one embodiment.
FIGS. 35E and 35F illustrate a shared programming model, according to at least one embodiment.
Figure 35:
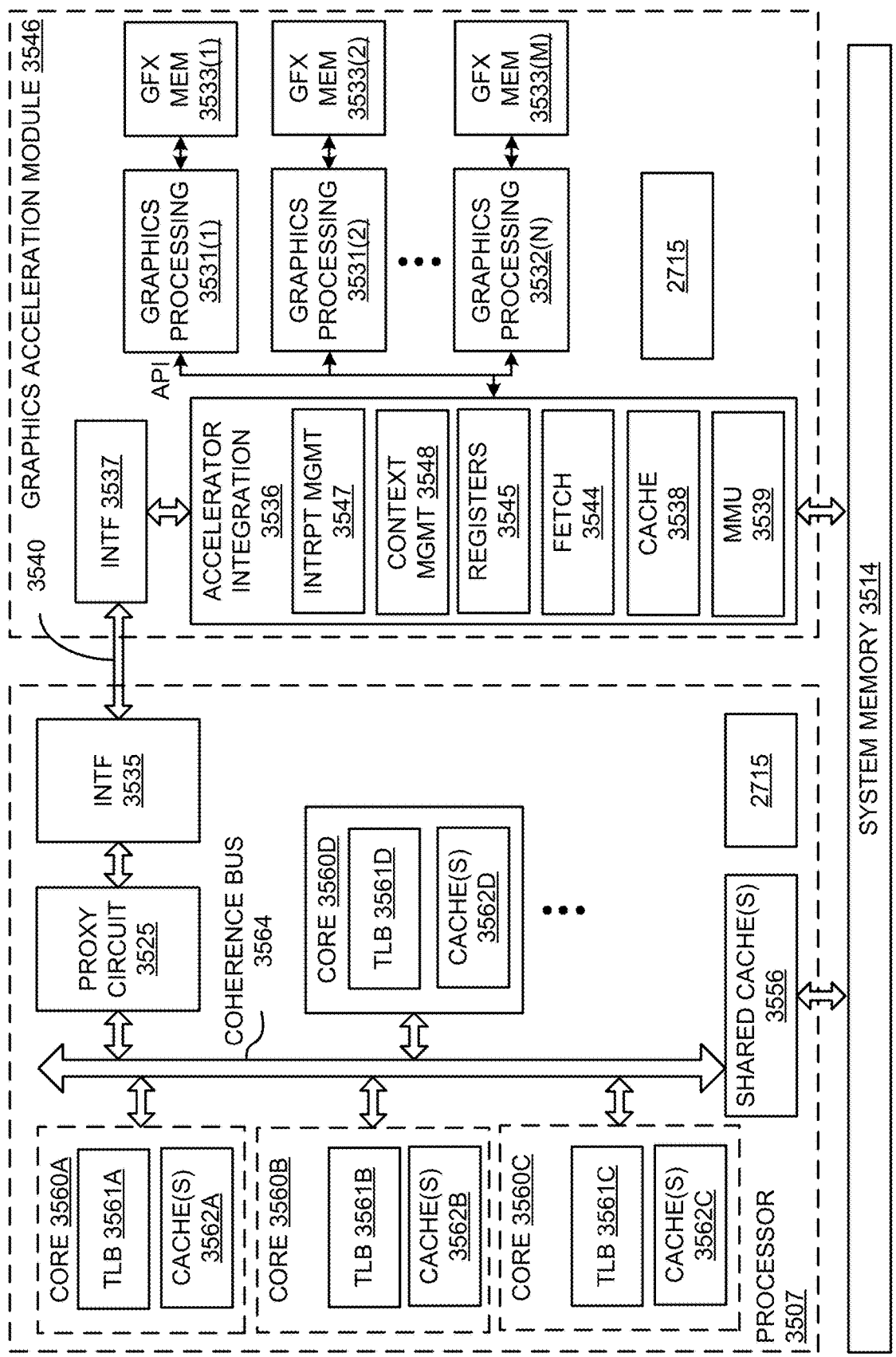
Figure 35:
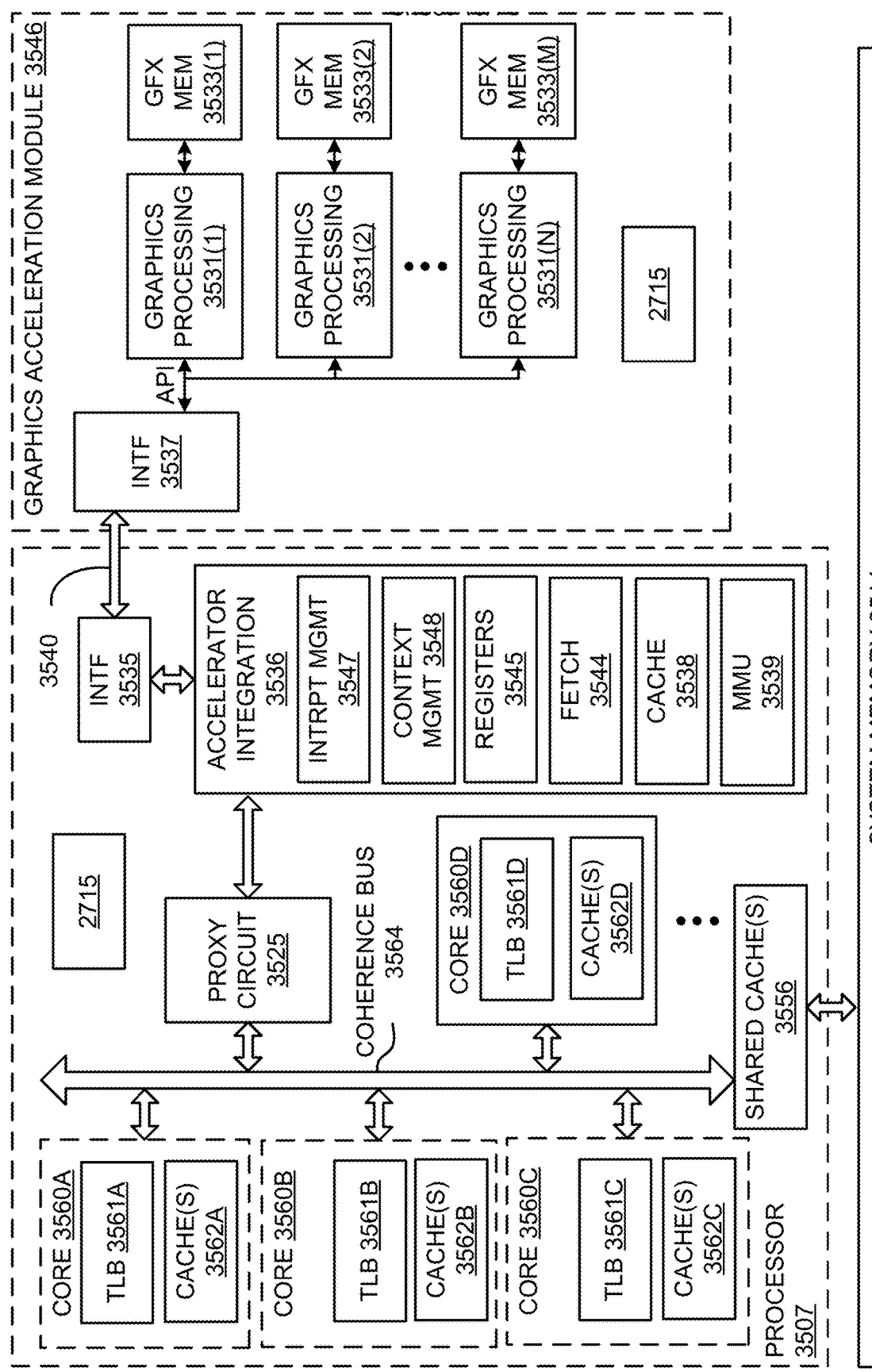
Figure 35:
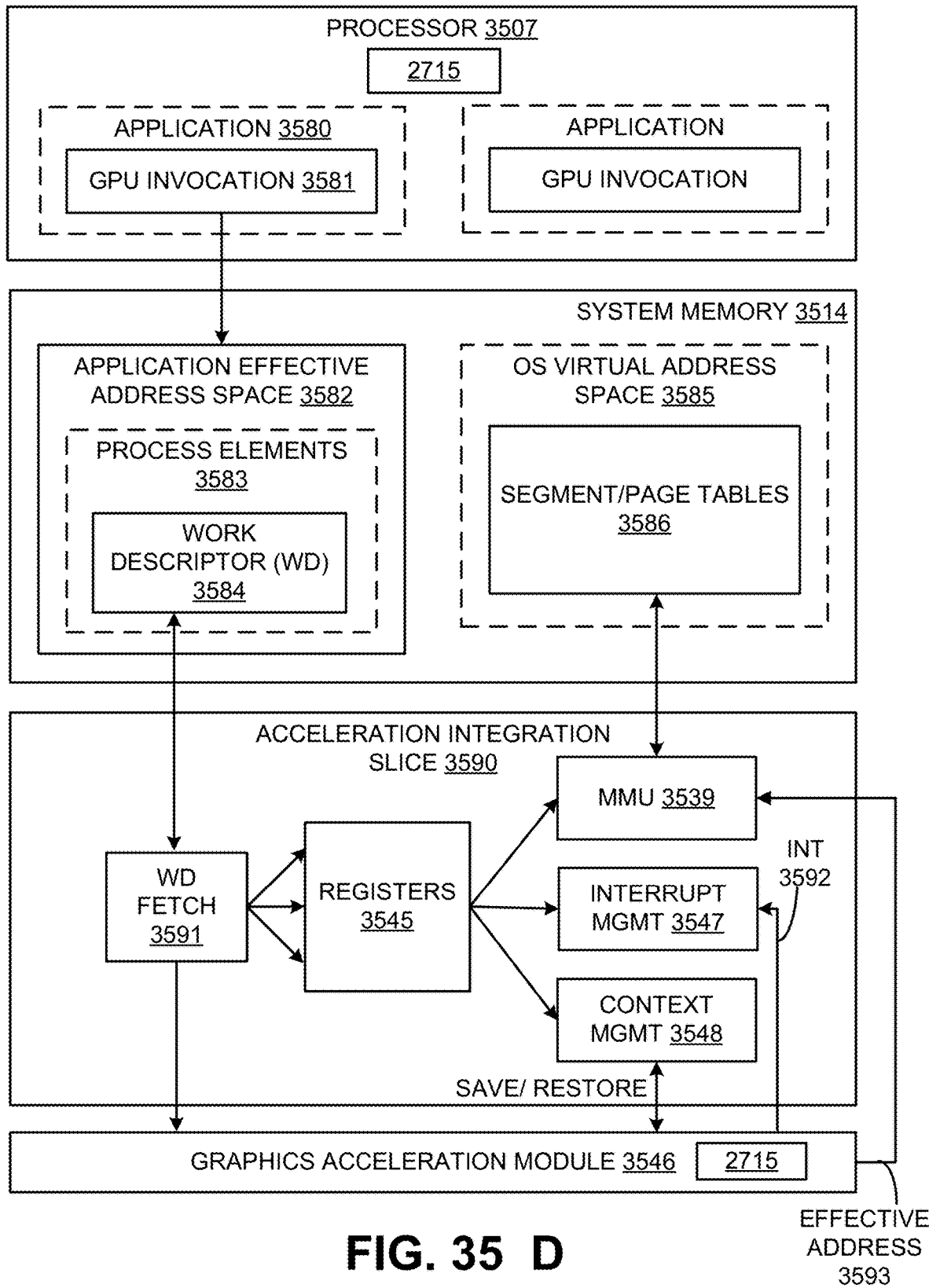
Figure 35:
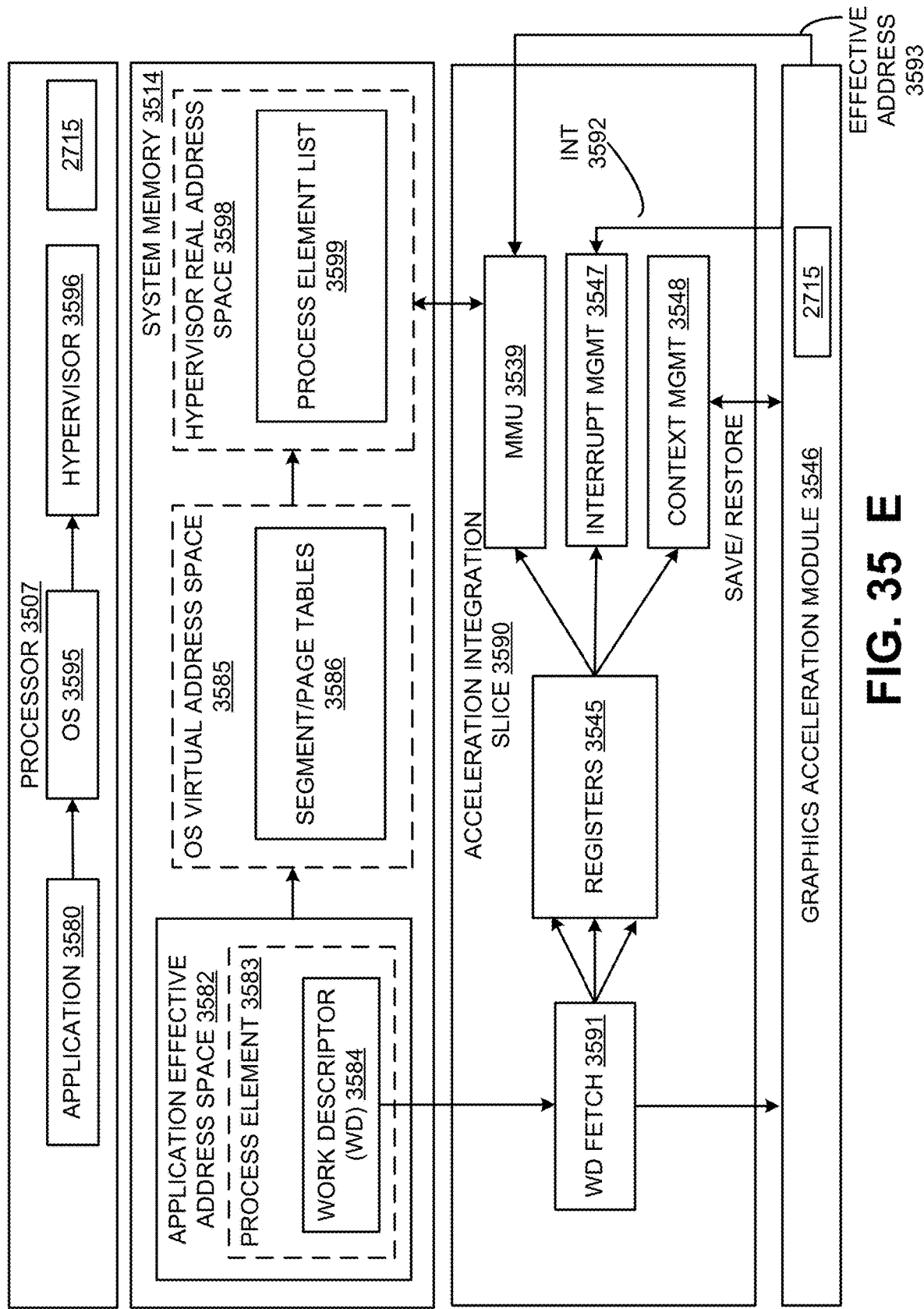
Figure 35:
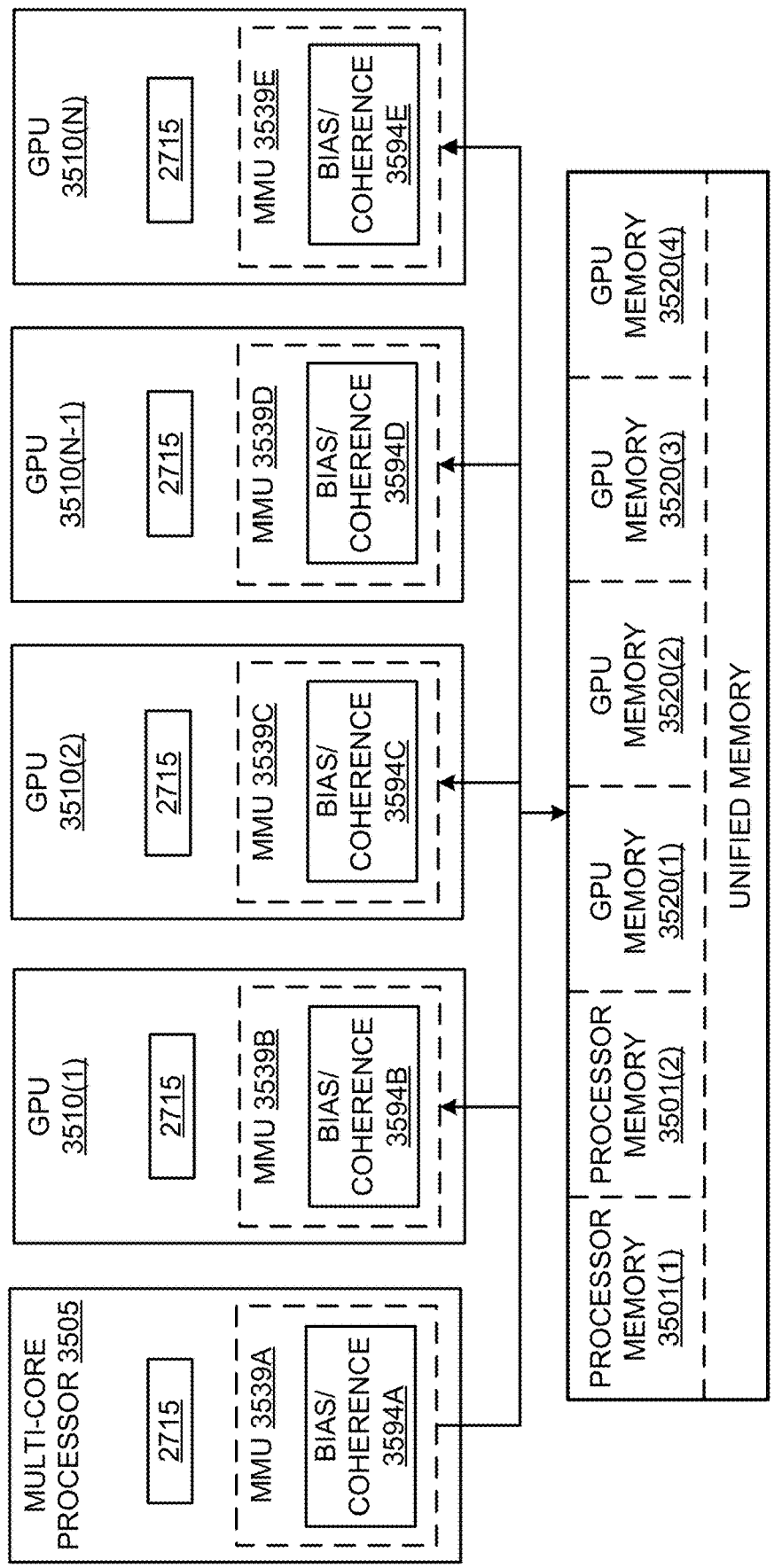

FIG. 34 illustrates a computer system 3400, according to at least one embodiment. In at least one embodiment, computer system 3400 includes, without limitation, a computer 3410 and a USB stick 3420. In at least one embodiment, computer 3410 may include, without limitation, any number and type of processor(s) (not shown) and a memory (not shown). In at least one embodiment, computer 3410 includes, without limitation, a server, a cloud instance, a laptop, and a desktop computer.

In at least one embodiment, USB stick 3420 includes, without limitation, a processing unit 3430, a USB interface 3440, and USB interface logic 3450. In at least one embodiment, processing unit 3430 may be any instruction execution system, apparatus, or device capable of executing instructions. In at least one embodiment, processing unit 3430 may include, without limitation, any number and type of processing cores (not shown). In at least one embodiment, processing unit 3430 comprises an application specific integrated circuit ("ASIC") that is optimized to perform any amount and type of operations associated with machine learning. For instance, in at least one embodiment, processing unit 3430 is a tensor processing unit ("TPC") that is optimized to perform machine learning inference operations. In at least one embodiment, processing unit 3430 is a vision processing unit ("VPU") that is optimized to perform machine vision and machine learning inference operations.

In at least one embodiment, USB interface 3440 may be any type of USB connector or USB socket. For instance, in at least one embodiment, USB interface 3440 is a USB 3.0 Type-C socket for data and power. In at least one embodiment, USB interface 3440 is a USB 3.0 Type-A connector. In at least one embodiment, USB interface logic 3450 may include any amount and type of logic that enables processing unit 3430 to interface with devices (e.g., computer 3410) via USB connector 3440.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 34 for inferencing or predicting operations based, at least in part, on weight parameters calculated using neural network training operations, neural network functions and/or architectures, or neural network use cases described herein.

FIG. 35A illustrates an exemplary architecture in which a plurality of GPUs 3510(1)-3510(N) is communicatively coupled to a plurality of multi-core processors 3505(1)-3505(M) over high-speed links 3540(1)-3540(N) (e.g., buses, point-to-point interconnects, etc.). In at least one embodiment, high-speed links 3540(1)-3540(N) support a communication throughput of 4 GB/s, 30 GB/s, 80 GB/s or higher. In at least one embodiment, various interconnect protocols may be used including, but not limited to, PCIe 4.0 or 5.0 and NVLink 2.0. In various figures, "N" and "M" represent positive integers, values of which may be different from figure to figure.

In addition, and in at least one embodiment, two or more of GPUs 3510 are interconnected over high-speed links 3529(1)-3529(2), which may be implemented using similar or different protocols/links than those used for high-speed links 3540(1)-3540(N). Similarly, two or more of multi-core processors 3505 may be connected over a high-speed link 3528 which may be symmetric multi-processor (SMP) buses operating at 20 GB/s, 30 GB/s, 120 GB/s or higher. Alternatively, all communication between various system components shown in FIG. 35A may be accomplished using similar protocols/links (e.g., over a common interconnection fabric).

In at least one embodiment, each multi-core processor 3505 is communicatively coupled to a processor memory 3501(1)-3501(M), via memory interconnects 3526(1)-3526(M), respectively, and each GPU 3510(1)-3510(N) is communicatively coupled to GPU memory 3520(1)-3520(N) over GPU memory interconnects 3550(1)-3550(N), respectively. In at least one embodiment, memory interconnects 3526 and 3550 may utilize similar or different memory access technologies. By way of example, and not limitation, processor memories 3501(1)-3501(M) and GPU memories 3520 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D)(Point or Nano-Ram. In at least one embodiment, some portion of processor memories 3501 may be volatile memory and another portion may be non-volatile memory (e.g., using a two-level memory (2LM) hierarchy).

As described herein, although various multi-core processors 3505 and GPUs 3510 may be physically coupled to a particular memory 3501, 3520, respectively, and/or a unified memory architecture may be implemented in which a virtual system address space (also referred to as "effective address" space) is distributed among various physical memories. For example, processor memories 3501(1)-3501(M) may each comprise 64 GB of system memory address space and GPU memories 3520(1)-3520(N) may each comprise 32 GB of system memory address space resulting in a total of 256 GB addressable memory when M=2 and N=4. Other values for N and M are possible.

FIG. 35B illustrates additional details for an interconnection between a multi-core processor 3507 and a graphics acceleration module 3546 in accordance with one exemplary embodiment. In at least one embodiment, graphics acceleration module 3546 may include one or more GPU chips integrated on a line card which is coupled to processor 3507 via high-speed link 3540 (e.g., a PCIe bus, NVLink, etc.). In at least one embodiment, graphics acceleration module 3546 may alternatively be integrated on a package or chip with processor 3507.

In at least one embodiment, processor 3507 includes a plurality of cores 3560A-3560D, each with a translation lookaside buffer ("TLB") 3561A-3561D and one or more caches 3562A-3562D. In at least one embodiment, cores 3560A-3560D may include various other components for executing instructions and processing data that are not illustrated. In at least one embodiment, caches 3562A-3562D may comprise Level 1 (L1) and Level 2 (L2) caches. In addition, one or more shared caches 3556 may be included in caches 3562A-3562D and shared by sets of cores 3560A-3560D. For example, one embodiment of processor 3507 includes 24 cores, each with its own L1 cache, twelve shared L2 caches, and twelve shared L3 caches. In this embodiment, one or more L2 and L3 caches are shared by two adjacent cores. In at least one embodiment, processor 3507 and graphics acceleration module 3546 connect with system memory 3514, which may include processor memories 3501(1)-3501(M) of FIG. 35A.

In at least one embodiment, coherency is maintained for data and instructions stored in various caches 3562A-3562D, 3556 and system memory 3514 via inter-core communication over a coherence bus 3564. In at least one embodiment, for example, each cache may have cache coherency logic/circuitry associated therewith to communicate to over coherence bus 3564 in response to detected reads or writes to particular cache lines. In at least one embodiment, a cache snooping protocol is implemented over coherence bus 3564 to snoop cache accesses.

In at least one embodiment, a proxy circuit 3525 communicatively couples graphics acceleration module 3546 to coherence bus 3564, allowing graphics acceleration module 3546 to participate in a cache coherence protocol as a peer of cores 3560A-3560D. In particular, in at least one embodiment, an interface 3535 provides connectivity to proxy circuit 3525 over high-speed link 3540 and an interface 3537 connects graphics acceleration module 3546 to high speed link 3540.

In at least one embodiment, an accelerator integration circuit 3536 provides cache management, memory access, context management, and interrupt management services on behalf of a plurality of graphics processing engines 3531(1)-3531(N) of graphics acceleration module 3546. In at least one embodiment, graphics processing engines 3531(1)-3531(N) may each comprise a separate graphics processing unit (GPU). In at least one embodiment, graphics processing engines 3531(1)-3531(N) alternatively may comprise different types of graphics processing engines within a GPU, such as graphics execution units, media processing engines (e.g., video encoders/decoders), samplers, and blit engines. In at least one embodiment, graphics acceleration module 3546 may be a GPU with a plurality of graphics processing engines 3531(1)-3531(N) or graphics processing engines 3531(1)-3531(N) may be individual GPUs integrated on a common package, line card, or chip.

In at least one embodiment, accelerator integration circuit 3536 includes a memory management unit (MMU) 3539 for performing various memory management functions such as virtual-to-physical memory translations (also referred to as effective-to-real memory translations) and memory access protocols for accessing system memory 3514. In at least one embodiment, MMU 3539 may also include a translation lookaside buffer (TLB) (not shown) for caching virtual/ effective to physical/real address translations. In at least one embodiment, a cache 3538 can store commands and data for efficient access by graphics processing engines 3531(1)-3531(N). In at least one embodiment, data stored in cache 3538 and graphics memories 3533(1)-3533(M) is kept coherent with core caches 3562A-3562D, 3556 and system memory 3514, possibly using a fetch unit 3544. As mentioned, this may be accomplished via proxy circuit 3525 on behalf of cache 3538 and memories 3533(1)-3533(M) (e.g., sending updates to cache 3538 related to modifications/accesses of cache lines on processor caches 3562A-3562D, 3556 and receiving updates from cache 3538).

In at least one embodiment, a set of registers 3545 store context data for threads executed by graphics processing engines 3531(1)-3531(N) and a context management circuit 3548 manages thread contexts. For example, context management circuit 3548 may perform save and restore operations to save and restore contexts of various threads during contexts switches (e.g., where a first thread is saved and a second thread is stored so that a second thread can be execute by a graphics processing engine). For example, on a context switch, context management circuit 3548 may store current register values to a designated region in memory (e.g., identified by a context pointer). It may then restore register values when returning to a context. In at least one embodiment, an interrupt management circuit 3547 receives and processes interrupts received from system devices.

In at least one embodiment, virtual/effective addresses from a graphics processing engine 3531 are translated to real/physical addresses in system memory 3514 by MMU 3539. In at least one embodiment, accelerator integration circuit 3536 supports multiple (e.g., 4, 8, 16) graphics accelerator modules 3546 and/or other accelerator devices. In at least one embodiment, graphics accelerator module 3546 may be dedicated to a single application executed on processor 3507 or may be shared between multiple applications. In at least one embodiment, a virtualized graphics execution environment is presented in which resources of graphics processing engines 3531(1)-3531(N) are shared with multiple applications or virtual machines (VMs). In at least one embodiment, resources may be subdivided into "slices" which are allocated to different VMs and/or applications based on processing requirements and priorities associated with VMs and/or applications.

In at least one embodiment, accelerator integration circuit 3536 performs as a bridge to a system for graphics acceleration module 3546 and provides address translation and system memory cache services. In addition, in at least one embodiment, accelerator integration circuit 3536 may provide virtualization facilities for a host processor to manage virtualization of graphics processing engines 3531(1)-3531(N), interrupts, and memory management.

In at least one embodiment, because hardware resources of graphics processing engines 3531(1)-3531(N) are mapped explicitly to a real address space seen by host processor 3507, any host processor can address these resources directly using an effective address value. In at least one embodiment, one function of accelerator integration circuit 3536 is physical separation of graphics processing engines 3531(1)-3531(N) so that they appear to a system as independent units.

In at least one embodiment, one or more graphics memories 3533(1)-3533(M) are coupled to each of graphics processing engines 3531(1)-3531(N), respectively and N=M. In at least one embodiment, graphics memories 3533(1)-3533(M) store instructions and data being processed by each of graphics processing engines 3531(1)-3531(N). In at least one embodiment, graphics memories 3533(1)-3533(M) may be volatile memories such as DRAMs (including stacked DRAMs), GDDR memory (e.g., GDDR5, GDDR6), or HBM, and/or may be non-volatile memories such as 3D XPoint or Nano-Ram.

In at least one embodiment, to reduce data traffic over high-speed link 3540, biasing techniques can be used to ensure that data stored in graphics memories 3533(1)-3533(M) is data that will be used most frequently by graphics processing engines 3531(1)-3531(N) and preferably not used by cores 3560A-3560D (at least not frequently). Similarly, in at least one embodiment, a biasing mechanism attempts to keep data needed by cores (and preferably not graphics processing engines 3531(1)-3531(N)) within caches 3562A-3562D, 3556 and system memory 3514.

FIG. 35C illustrates another exemplary embodiment in which accelerator integration circuit 3536 is integrated within processor 3507. In this embodiment, graphics processing engines 3531(1)-3531(N) communicate directly over high-speed link 3540 to accelerator integration circuit 3536 via interface 3537 and interface 3535 (which, again, may be any form of bus or interface protocol). In at least one embodiment, accelerator integration circuit 3536 may perform similar operations as those described with respect to FIG. 35B, but potentially at a higher throughput given its close proximity to coherence bus 3564 and caches 3562A-3562D, 3556. In at least one embodiment, an accelerator integration circuit supports different programming models including a dedicated-process programming model (no graphics acceleration module virtualization) and shared programming models (with virtualization), which may include programming models which are controlled by accelerator integration circuit 3536 and programming models which are controlled by graphics acceleration module 3546.

In at least one embodiment, graphics processing engines 3531(1)-3531(N) are dedicated to a single application or process under a single operating system. In at least one embodiment, a single application can funnel other application requests to graphics processing engines 3531(1)-3531(N), providing virtualization within a VM/partition.

In at least one embodiment, graphics processing engines 3531(1)-3531(N), may be shared by multiple VM/application partitions. In at least one embodiment, shared models may use a system hypervisor to virtualize graphics processing engines 3531(1)-3531(N) to allow access by each operating system. In at least one embodiment, for single-partition systems without a hypervisor, graphics processing engines 3531(1)-3531(N) are owned by an operating system. In at least one embodiment, an operating system can virtualize graphics processing engines 3531(1)-3531(N) to provide access to each process or application.

In at least one embodiment, graphics acceleration module 3546 or an individual graphics processing engine 3531(1)-3531(N) selects a process element using a process handle. In at least one embodiment, process elements are stored in system memory 3514 and are addressable using an effective address to real address translation technique described herein. In at least one embodiment, a process handle may be an implementation-specific value provided to a host process when registering its context with graphics processing engine 3531(1)-3531(N) (that is, calling system software to add a process element to a process element linked list). In at least one embodiment, a lower 16-bits of a process handle may be an offset of a process element within a process element linked list.

FIG. 35D illustrates an exemplary accelerator integration slice 3590. In at least one embodiment, a "slice" comprises a specified portion of processing resources of accelerator integration circuit 3536. In at least one embodiment, an application is effective address space 3582 within system memory 3514 stores process elements 3583. In at least one embodiment, process elements 3583 are stored in response to GPU invocations 3581 from applications 3580 executed on processor 3507. In at least one embodiment, a process element 3583 contains process state for corresponding application 3580. In at least one embodiment, a work descriptor (WD) 3584 contained in process element 3583 can be a single job requested by an application or may contain a pointer to a queue of jobs. In at least one embodiment, WD 3584 is a pointer to a job request queue in an application's effective address space 3582.

In at least one embodiment, graphics acceleration module 3546 and/or individual graphics processing engines 3531(1)-3531(N) can be shared by all or a subset of processes in a system. In at least one embodiment, an infrastructure for setting up process states and sending a WD 3584 to a graphics acceleration module 3546 to start a job in a virtualized environment may be included.

In at least one embodiment, a dedicated-process programming model is implementation-specific. In at least one embodiment, in this model, a single process owns graphics acceleration module 3546 or an individual graphics processing engine 3531. In at least one embodiment, when graphics acceleration module 3546 is owned by a single process, a hypervisor initializes accelerator integration circuit 3536 for an owning partition and an operating system initializes accelerator integration circuit 3536 for an owning process when graphics acceleration module 3546 is assigned.

In at least one embodiment, in operation, a WD fetch unit 3591 in accelerator integration slice 3590 fetches next WD 3584, which includes an indication of work to be done by one or more graphics processing engines of graphics acceleration module 3546. In at least one embodiment, data from WD 3584 may be stored in registers 3545 and used by MMU 3539, interrupt management circuit 3547 and/or context management circuit 3548 as illustrated. For example, one embodiment of MMU 3539 includes segment/page walk circuitry for accessing segment/page tables 3586 within an OS virtual address space 3585. In at least one embodiment, interrupt management circuit 3547 may process interrupt events 3592 received from graphics acceleration module 3546. In at least one embodiment, when performing graphics operations, an effective address 3593 generated by a graphics processing engine 3531(1)-3531(N) is translated to a real address by MMU 3539.

In at least one embodiment, registers 3545 are duplicated for each graphics processing engine 3531(1)-3531(N) and/or graphics acceleration module 3546 and may be initialized by a hypervisor or an operating system. In at least one embodiment, each of these duplicated registers may be included in an accelerator integration slice 3590. Exemplary registers that may be initialized by a hypervisor are shown in Table 1.

TABLE 1

| Hypervisor Initialized Registers | |
|---|---|
| Register # | Description |
| 1 | Slice Control Register |
| 2 | Real Address (RA) Scheduled Processes Area Pointer |

TABLE 1-continued

| Hypervisor Initialized Registers | |
|---|---|
| Register # | Description |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by an operating system are shown in Table 2.

TABLE 2

| Operating System Initialized Registers | |
|---|---|
| Register # | Description |
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In at least one embodiment, each WD 3584 is specific to a particular graphics acceleration module 3546 and/or graphics processing engines 3531(1)-3531(N). In at least one embodiment, it contains all information required by a graphics processing engine 3531(1)-3531(N) to do work, or it can be a pointer to a memory location where an application has set up a command queue of work to be completed.

FIG. 35E illustrates additional details for one exemplary embodiment of a shared model. This embodiment includes a hypervisor real address space 3598 in which a process element list 3599 is stored. In at least one embodiment, hypervisor real address space 3598 is accessible via a hypervisor 3596 which virtualizes graphics acceleration module engines for operating system 3595.

In at least one embodiment, shared programming models allow for all or a subset of processes from all or a subset of partitions in a system to use a graphics acceleration module 3546. In at least one embodiment, there are two programming models where graphics acceleration module 3546 is shared by multiple processes and partitions, namely time-sliced shared and graphics directed shared.

In at least one embodiment, in this model, system hypervisor 3596 owns graphics acceleration module 3546 and makes its function available to all operating systems 3595. In at least one embodiment, for a graphics acceleration module 3546 to support virtualization by system hypervisor 3596, graphics acceleration module 3546 may adhere to certain requirements, such as (1) an application's job request must be autonomous (that is, state does not need to be maintained between jobs), or graphics acceleration module 3546 must provide a context save and restore mechanism, (2) an application's job request is guaranteed by graphics acceleration module 3546 to complete in a specified amount of time, including any translation faults, or graphics acceleration module 3546 provides an ability to preempt processing of a job, and (3) graphics acceleration module 3546 must be guaranteed fairness between processes when operating in a directed shared programming model.

In at least one embodiment, application 3580 is required to make an operating system 3595 system call with a graphics acceleration module type, a work descriptor (WD), an authority mask register (AMR) value, and a context save/restore area pointer (CSRP). In at least one embodiment, graphics acceleration module type describes a targeted acceleration function for a system call. In at least one embodiment, graphics acceleration module type may be a system-specific value. In at least one embodiment, WD is formatted specifically for graphics acceleration module 3546 and can be in a form of a graphics acceleration module 3546 command, an effective address pointer to a user-defined structure, an effective address pointer to a queue of commands, or any other data structure to describe work to be done by graphics acceleration module 3546.

In at least one embodiment, an AMR value is an AMR state to use for a current process. In at least one embodiment, a value passed to an operating system is similar to an application setting an AMR. In at least one embodiment, if accelerator integration circuit 3536 (not shown) and graphics acceleration module 3546 implementations do not support a User Authority Mask Override Register (UAMOR), an operating system may apply a current UAMOR value to an AMR value before passing an AMR in a hypervisor call. In at least one embodiment, hypervisor 3596 may optionally apply a current Authority Mask Override Register (AMOR) value before placing an AMR into process element 3583. In at least one embodiment, CSRP is one of registers 3545 containing an effective address of an area in an application's effective address space 3582 for graphics acceleration module 3546 to save and restore context state. In at least one embodiment, this pointer is optional if no state is required to be saved between jobs or when a job is preempted. In at least one embodiment, context save/restore area may be pinned system memory.

Upon receiving a system call, operating system 3595 may verify that application 3580 has registered and been given authority to use graphics acceleration module 3546. In at least one embodiment, operating system 3595 then calls hypervisor 3596 with information shown in Table 3.

TABLE 3

| OS to Hypervisor Call Parameters | |
|---|---|
| Parameter # | Description |
| 1 | A work descriptor (WD) |
| 2 | An Authority Mask Register (AMR) value (potentially masked) |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |

In at least one embodiment, upon receiving a hypervisor call, hypervisor 3596 verifies that operating system 3595 has registered and been given authority to use graphics acceleration module 3546. In at least one embodiment, hypervisor 3596 then puts process element 3583 into a process element linked list for a corresponding graphics acceleration module 3546 type. In at least one embodiment, a process element may include information shown in Table 4.

TABLE 4

| Process Element Information | |
|---|---|
| Element # | Description |
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |
| 8 | Interrupt vector table, derived from hypervisor call parameters |
| 9 | A state register (SR) value |
| 10 | A logical partition ID (LPID) |
| 11 | A real address (RA) hypervisor accelerator utilization record pointer |
| 12 | Storage Descriptor Register (SDR) |

In at least one embodiment, hypervisor initializes a plurality of accelerator integration slice 3590 registers 3545.

As illustrated in FIG. 35F, in at least one embodiment, a unified memory is used, addressable via a common virtual memory address space used to access physical processor memories 3501(1)-3501(N) and GPU memories 3520(1)-3520(N). In this implementation, operations executed on GPUs 3510(1)-3510(N) utilize a same virtual/effective memory address space to access processor memories 3501(1)-3501(M) and vice versa, thereby simplifying programmability. In at least one embodiment, a first portion of a virtual/effective address space is allocated to processor memory 3501(1), a second portion to second processor memory 3501(N), a third portion to GPU memory 3520(1), and so on. In at least one embodiment, an entire virtual/effective memory space (sometimes referred to as an effective address space) is thereby distributed across each of processor memories 3501 and GPU memories 3520, allowing any processor or GPU to access any physical memory with a virtual address mapped to that memory.

In at least one embodiment, bias/coherence management circuitry 3594A-3594E within one or more of MMUs 3539A-3539E ensures cache coherence between caches of one or more host processors (e.g., 3505) and GPUs 3510 and implements biasing techniques indicating physical memories in which certain types of data should be stored. In at least one embodiment, while multiple instances of bias/coherence management circuitry 3594A-3594E are illustrated in FIG. 35F, bias/coherence circuitry may be implemented within an MMU of one or more host processors 3505 and/or within accelerator integration circuit 3536.

One embodiment allows GPU memories 3520 to be mapped as part of system memory, and accessed using shared virtual memory (SVM) technology, but without suffering performance drawbacks associated with full system cache coherence. In at least one embodiment, an ability for GPU memories 3520 to be accessed as system memory without onerous cache coherence overhead provides a beneficial operating environment for GPU offload. In at least one embodiment, this arrangement allows software of host processor 3505 to setup operands and access computation results, without overhead of tradition I/O DMA data copies. In at least one embodiment, such traditional copies involve driver calls, interrupts and memory mapped I/O (MMIO) accesses that are all inefficient relative to simple memory accesses. In at least one embodiment, an ability to access GPU memories 3520 without cache coherence overheads can be critical to execution time of an offloaded computation. In at least one embodiment, in cases with substantial streaming write memory traffic, for example, cache coherence overhead can significantly reduce an effective write bandwidth seen by a GPU 3510. In at least one embodiment, efficiency of operand setup, efficiency of results access, and efficiency of GPU computation may play a role in determining effectiveness of a GPU offload.

In at least one embodiment, selection of GPU bias and host processor bias is driven by a bias tracker data structure. In at least one embodiment, a bias table may be used, for example, which may be a page-granular structure (e.g., controlled at a granularity of a memory page) that includes 1 or 2 bits per GPU-attached memory page. In at least one embodiment, a bias table may be implemented in a stolen memory range of one or more GPU memories 3520, with or without a bias cache in a GPU 3510 (e.g., to cache frequently/recently used entries of a bias table). Alternatively, in at least one embodiment, an entire bias table may be maintained within a GPU.

In at least one embodiment, a bias table entry associated with each access to a GPU attached memory 3520 is accessed prior to actual access to a GPU memory, causing following operations. In at least one embodiment, local requests from a GPU 3510 that find their page in GPU bias are forwarded directly to a corresponding GPU memory 3520. In at least one embodiment, local requests from a GPU that find their page in host bias are forwarded to processor 3505 (e.g., over a high-speed link as described herein). In at least one embodiment, requests from processor 3505 that find a requested page in host processor bias complete a request like a normal memory read. Alternatively, requests directed to a GPU-biased page may be forwarded to a GPU 3510. In at least one embodiment, a GPU may then transition a page to a host processor bias if it is not currently using a page. In at least one embodiment, a bias state of a page can be changed either by a software-based mechanism, a hardware-assisted software-based mechanism, or, for a limited set of cases, a purely hardware-based mechanism.

In at least one embodiment, one mechanism for changing bias state employs an API call (e.g., OpenCL), which, in turn, calls a GPU's device driver which, in turn, sends a message (or enqueues a command descriptor) to a GPU directing it to change a bias state and, for some transitions, perform a cache flushing operation in a host. In at least one embodiment, a cache flushing operation is used for a transition from host processor 3505 bias to GPU bias, but is not for an opposite transition.

In at least one embodiment, cache coherency is maintained by temporarily rendering GPU-biased pages uncacheable by host processor 3505. In at least one embodiment, to access these pages, processor 3505 may request access from GPU 3510, which may or may not grant access right away. In at least one embodiment, thus, to reduce communication between processor 3505 and GPU 3510 it is beneficial to ensure that GPU-biased pages are those which are required by a GPU but not host processor 3505 and vice versa.

Hardware structure(s) 2715 are used to perform one or more embodiments. Details regarding a hardware structure(s) 2715 may be provided herein in conjunction with FIG. 27A and/or 27B.

Figure 36:
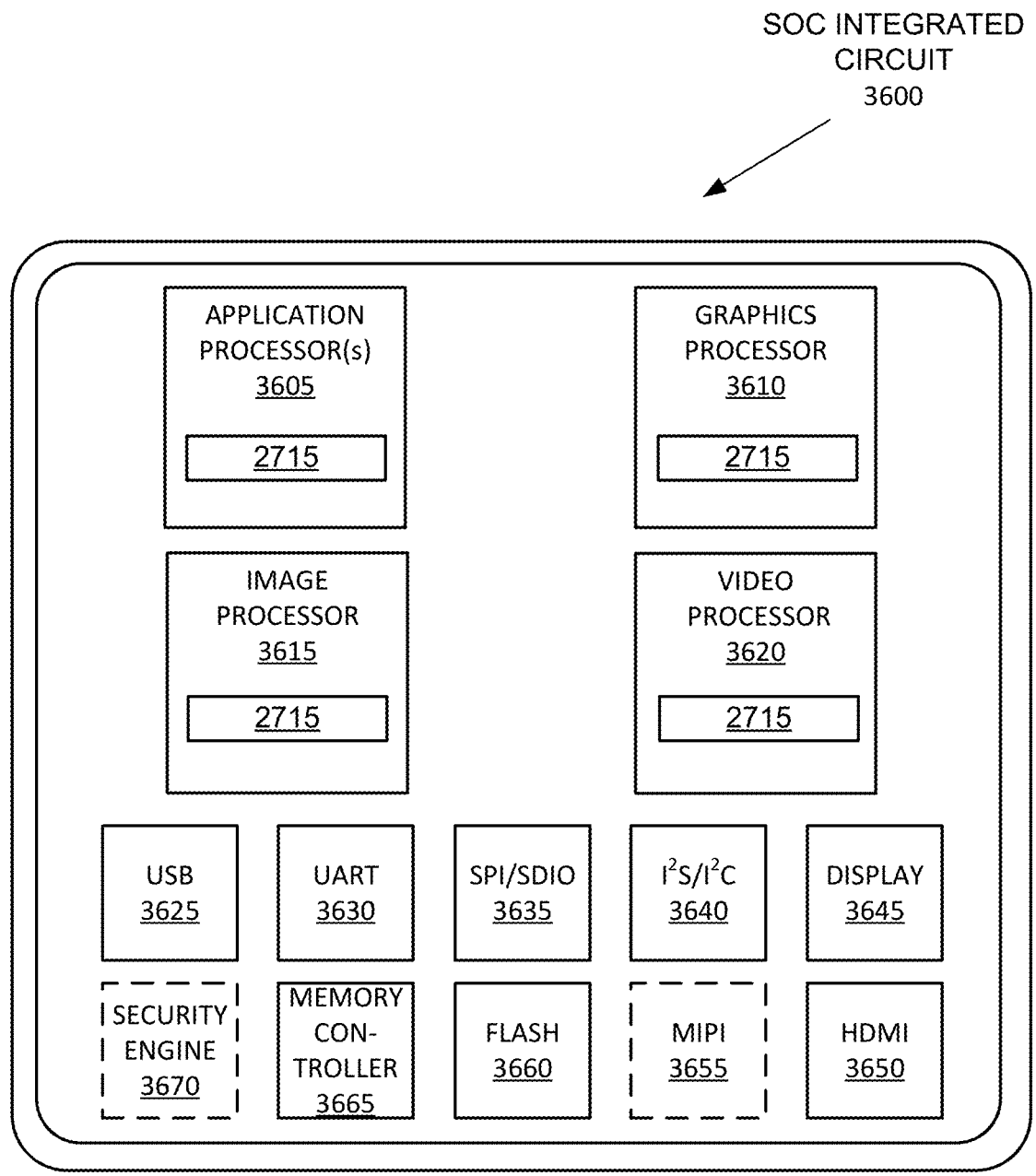
FIG. 36 illustrates exemplary integrated circuits and associated graphics processors, according to at least one embodiment.

FIG. 36 illustrates exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIG. 36 is a block diagram illustrating an exemplary system on a chip integrated circuit 3600 that may be fabricated using one or more IP cores, according to at least one embodiment. In at least one embodiment, integrated circuit 3600 includes one or more application processor(s) 3605 (e.g., CPUs), at least one graphics processor 3610, and may additionally include an image processor 3615 and/or a video processor 3620, any of which may be a modular IP core. In at least one embodiment, integrated circuit 3600 includes peripheral or bus logic including a USB controller 3625, a UART controller 3630, an SPI/SDIO controller 3635, and an $I^2S/I^2C$ controller 3640. In at least one embodiment, integrated circuit 3600 can include a display device 3645 coupled to one or more of a high-definition multimedia interface (HDMI) controller 3650 and a mobile industry processor interface (MIPI) display interface 3655. In at least one embodiment, storage may be provided by a flash memory subsystem 3660 including flash memory and a flash memory controller. In at least one embodiment, a memory interface may be provided via a memory controller 3665 for access to SDRAM or SRAM memory devices. In at least one embodiment, some integrated circuits additionally include an embedded security engine 3670.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in integrated circuit 3600 for inferencing or predicting operations based, at least in part, on weight parameters calculated using neural network training operations, neural network functions and/or architectures, or neural network use cases described herein.

Figure 37A:
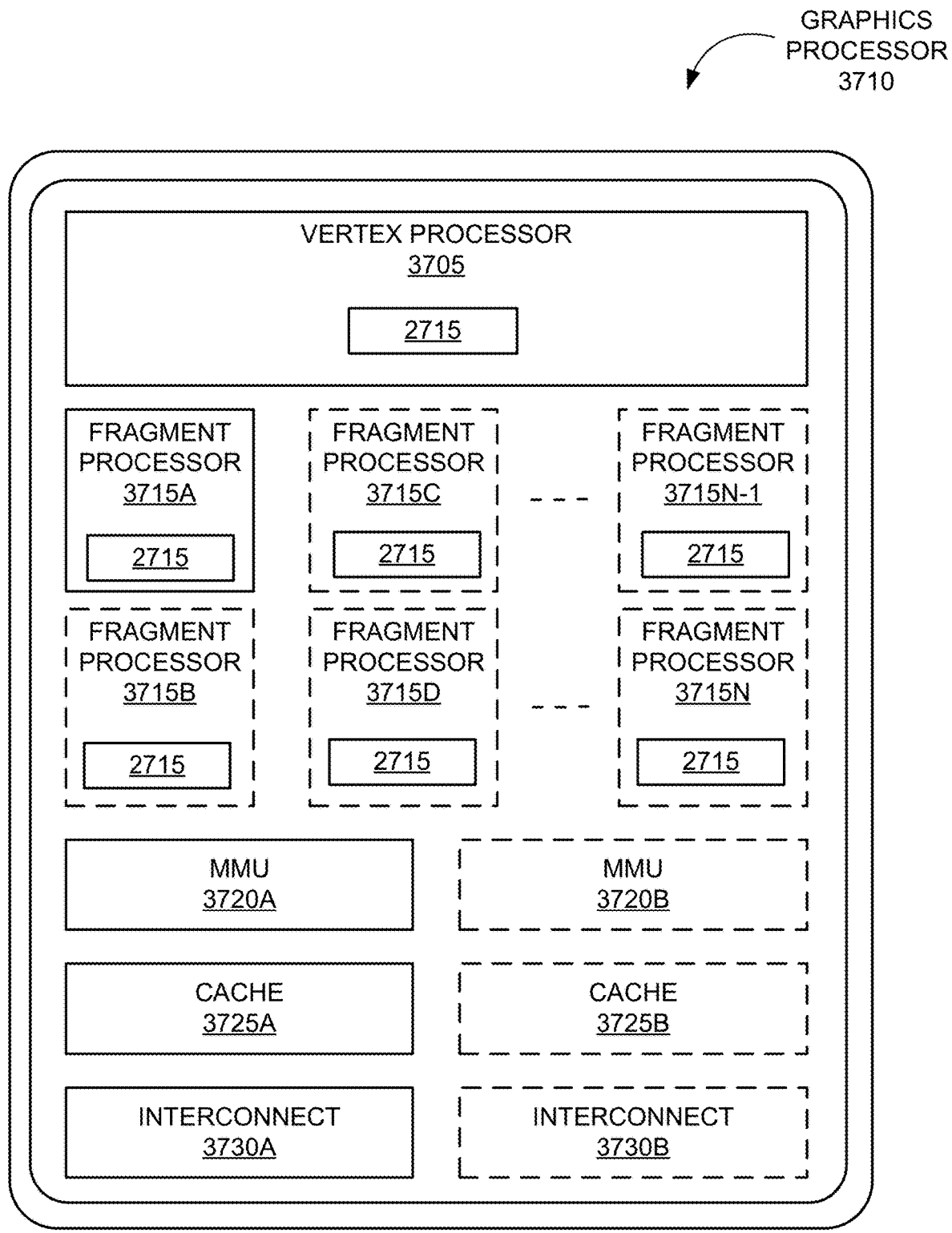
FIGS. 37A and 37B illustrate exemplary integrated circuits and associated graphics processors, according to at least one embodiment.
Figure 37B:
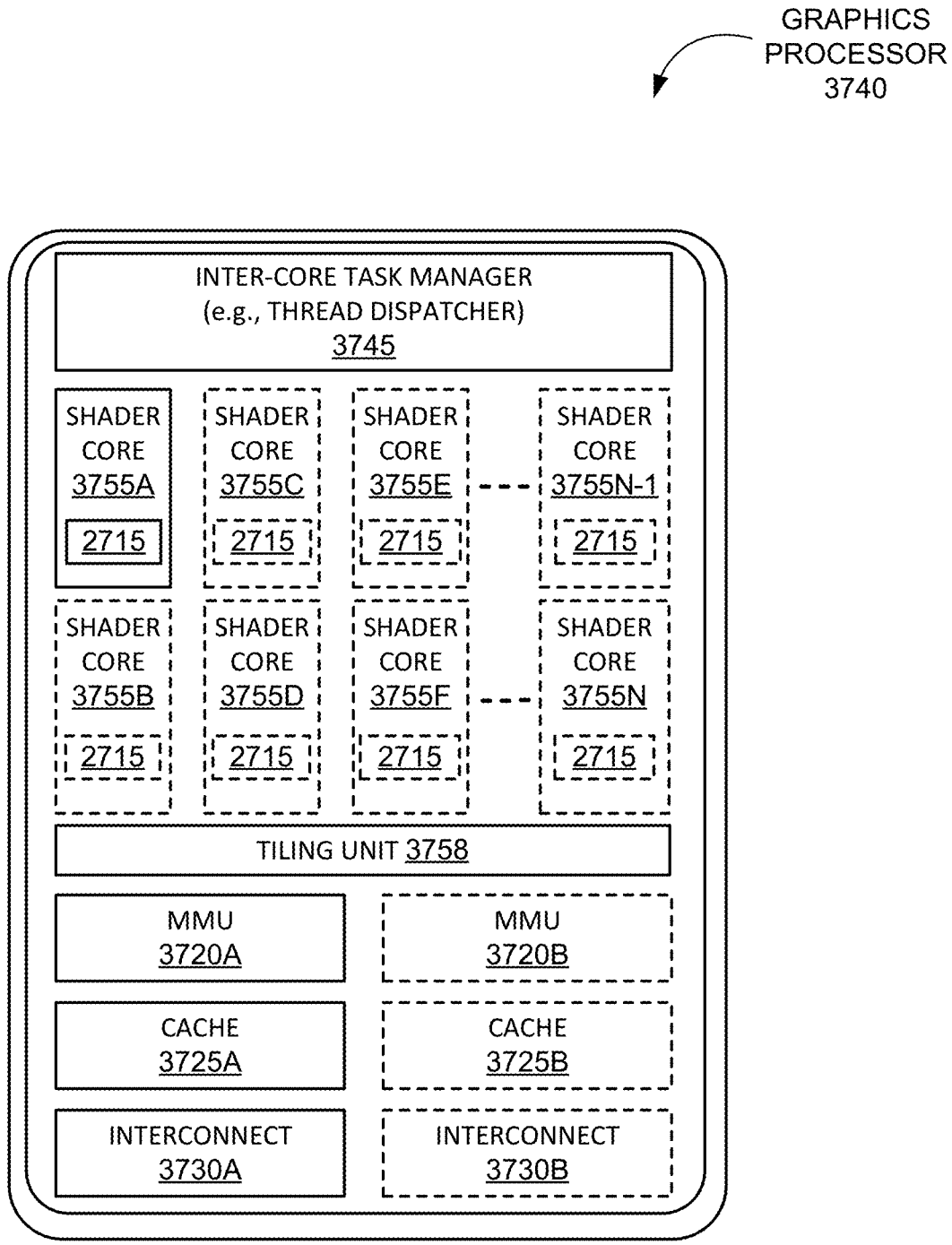

FIGS. 37A-37B illustrate exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIGS. 37A-37B are block diagrams illustrating exemplary graphics processors for use within an SoC, according to embodiments described herein. FIG. 37A illustrates an exemplary graphics processor 3710 of a system on a chip integrated circuit that may be fabricated using one or more IP cores, according to at least one embodiment. FIG. 37B illustrates an additional exemplary graphics processor 3740 of a system on a chip integrated circuit that may be fabricated using one or more IP cores, according to at least one embodiment. In at least one embodiment, graphics processor 3710 of FIG. 37A is a low power graphics processor core. In at least one embodiment, graphics processor 3740 of FIG. 37B is a higher performance graphics processor core. In at least one embodiment, each of graphics processors 3710, 3740 can be variants of graphics processor 3610 of FIG. 36.

In at least one embodiment, graphics processor 3710 includes a vertex processor 3705 and one or more fragment processor(s) 3715A-3715N (e.g., 3715A, 3715B, 3715C, 3715D, through 3715N-1, and 3715N). In at least one embodiment, graphics processor 3710 can execute different shader programs via separate logic, such that vertex processor 3705 is optimized to execute operations for vertex shader programs, while one or more fragment processor(s) 3715A-3715N execute fragment (e.g., pixel) shading operations for fragment or pixel shader programs. In at least one embodiment, vertex processor 3705 performs a vertex processing stage of a 3D graphics pipeline and generates primitives and vertex data. In at least one embodiment, fragment processor(s) 3715A-3715N use primitive and vertex data generated by vertex processor 3705 to produce a framebuffer that is displayed on a display device. In at least one embodiment, fragment processor(s) 3715A-3715N are optimized to execute fragment shader programs as provided for in an OpenGL API, which may be used to perform similar operations as a pixel shader program as provided for in a Direct 3D API.

In at least one embodiment, graphics processor 3710 additionally includes one or more memory management units (MMUs) 3720A-3720B, cache(s) 3725A-3725B, and circuit interconnect(s) 3730A-3730B. In at least one embodiment, one or more MMU(s) 3720A-3720B provide for virtual to physical address mapping for graphics processor 3710, including for vertex processor 3705 and/or fragment processor(s) 3715A-3715N, which may reference vertex or image/texture data stored in memory, in addition to vertex or image/texture data stored in one or more cache(s) 3725A-3725B. In at least one embodiment, one or more MMU(s) 3720A-3720B may be synchronized with other MMUs within a system, including one or more MMUs associated with one or more application processor(s) 3605, image processors 3615, and/or video processors 3620 of FIG. 36, such that each processor 3605-3620 can participate in a shared or unified virtual memory system. In at least one embodiment, one or more circuit interconnect(s) 3730A-3730B enable graphics processor 3710 to interface with other IP cores within SoC, either via an internal bus of SoC or via a direct connection.

In at least one embodiment, graphics processor 3740 includes one or more shader core(s) 3755A-3755N (e.g., 3755A, 3755B, 3755C, 3755D, 3755E, 3755F, through 3755N-1, and 3755N) as shown in FIG. 37B, which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 3740 includes an inter-core task manager 3745, which acts as a thread dispatcher to dispatch execution threads to one or more shader cores 3755A-3755N and a tiling unit 3758 to accelerate tiling operations for tile-based rendering, in which rendering operations for a scene are subdivided in image space, for example to exploit local spatial coherence within a scene or to optimize use of internal caches.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in integrated circuit 37A and/or 37B for inferencing or predicting operations based, at least in part, on weight parameters calculated using neural network training operations, neural network functions and/or architectures, or neural network use cases described herein.

Figure 38A:
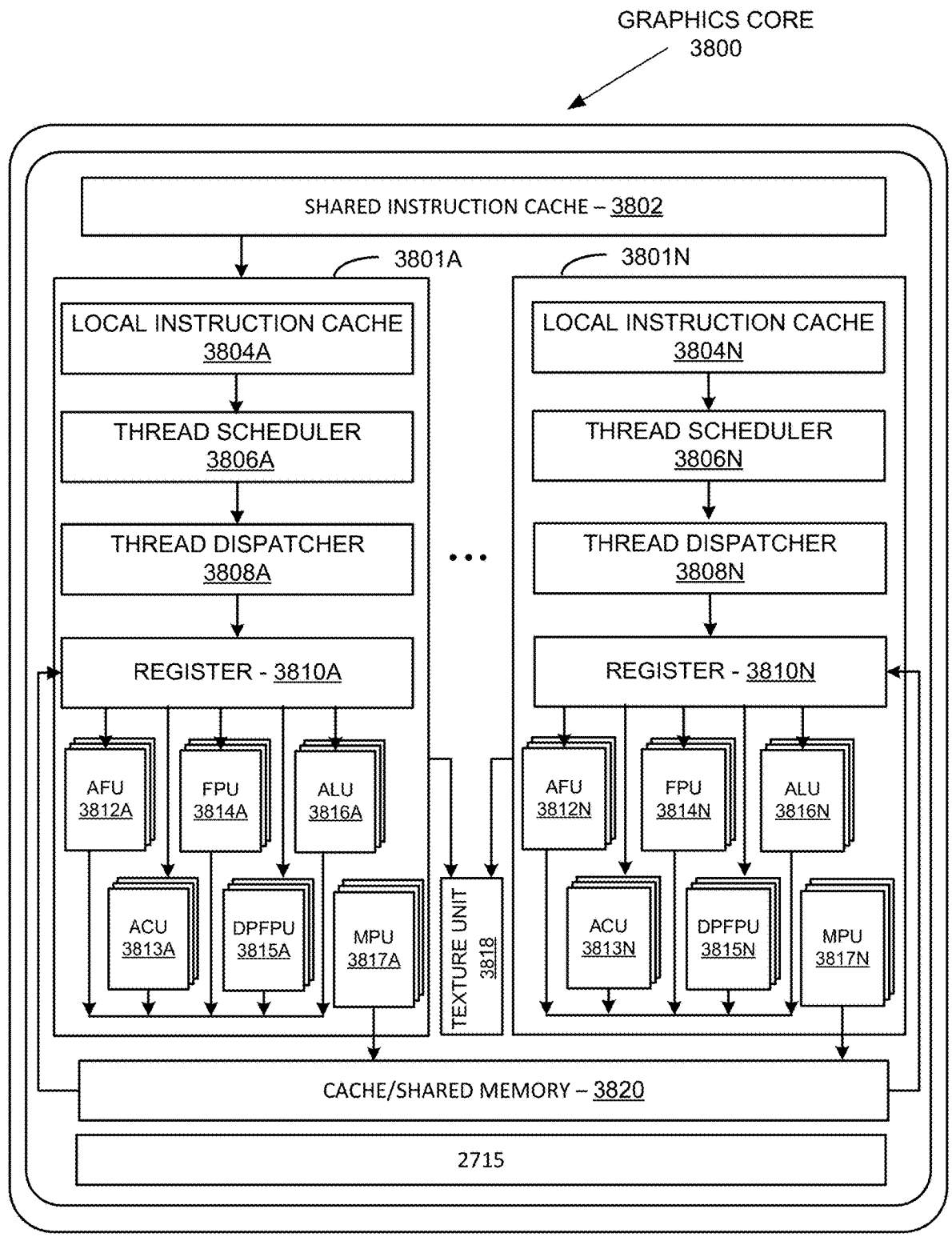
FIGS. 38A and 38B illustrate additional exemplary graphics processor logic according to at least one embodiment.
Figure 38B:
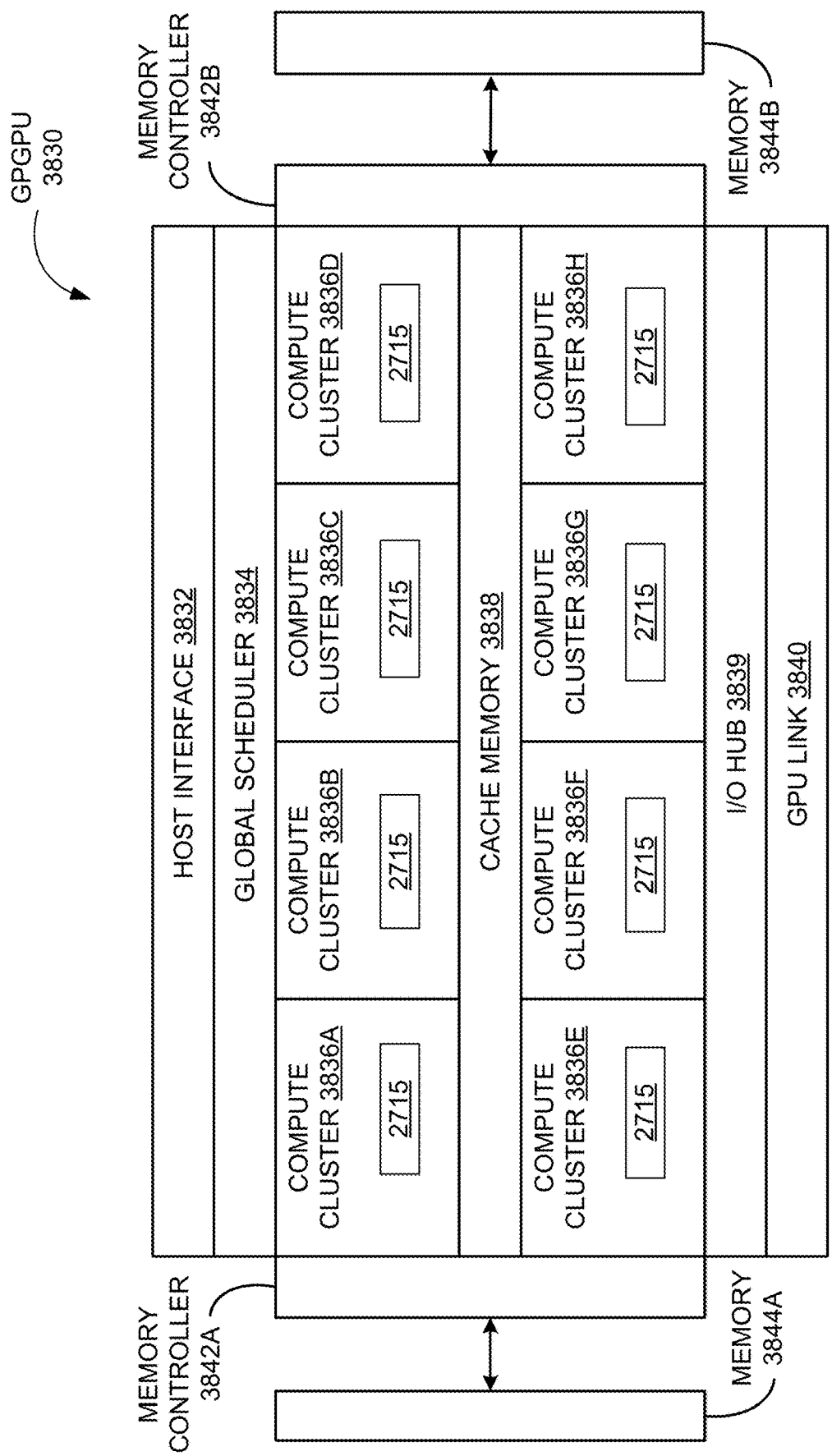

FIGS. 38A-38B illustrate additional exemplary graphics processor logic according to embodiments described herein. FIG. 38A illustrates a graphics core 3800 that may be included within graphics processor 3610 of FIG. 36, in at least one embodiment, and may be a unified shader core 3755A-3755N as in FIG. 37B in at least one embodiment. FIG. 38B illustrates a highly-parallel general-purpose graphics processing unit ("GPGPU") 3830 suitable for deployment on a multi-chip module in at least one embodiment.

In at least one embodiment, graphics core 3800 includes a shared instruction cache 3802, a texture unit 3818, and a cache/shared memory 3820 that are common to execution resources within graphics core 3800. In at least one embodiment, graphics core 3800 can include multiple slices 3801A-3801N or a partition for each core, and a graphics processor can include multiple instances of graphics core 3800. In at least one embodiment, slices 3801A-3801N can include support logic including a local instruction cache 3804A-3804N, a thread scheduler 3806A-3806N, a thread dispatcher 3808A-3808N, and a set of registers 3810A-3810N. In at least one embodiment, slices 3801A-3801N can include a set of additional function units (AFUs 3812A-3812N), floating-point units (FPUs 3814A-3814N), integer arithmetic logic units (ALUs 3816A-3816N), address computational units (ACUs 3813A-3813N), double-precision floating-point units (DPFPUs 3815A-3815N), and matrix processing units (MPUs 3817A-3817N).

In at least one embodiment, FPUs 3814A-3814N can perform single-precision (32-bit) and half-precision (16-bit) floating point operations, while DPFPUs 3815A-3815N perform double precision (64-bit) floating point operations. In at least one embodiment, ALUs 3816A-3816N can perform variable precision integer operations at 8-bit, 16-bit, and 32-bit precision, and can be configured for mixed precision operations. In at least one embodiment, MPUs 3817A-3817N can also be configured for mixed precision matrix operations, including half-precision floating point and 8-bit integer operations. In at least one embodiment, MPUs 3817-3817N can perform a variety of matrix operations to accelerate machine learning application frameworks, including enabling support for accelerated general matrix to matrix multiplication (GEMM). In at least one embodiment, AFUs 3812A-3812N can perform additional logic operations not supported by floating-point or integer units, including trigonometric operations (e.g., sine, cosine, etc.).

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in graphics core 3800 for inferencing or predicting operations based, at least in part, on weight parameters calculated using neural network training operations, neural network functions and/or architectures, or neural network use cases described herein.

FIG. 38B illustrates a general-purpose processing unit (GPGPU) 3830 that can be configured to enable highly-parallel compute operations to be performed by an array of graphics processing units, in at least one embodiment. In at least one embodiment, GPGPU 3830 can be linked directly to other instances of GPGPU 3830 to create a multi-GPU cluster to improve training speed for deep neural networks. In at least one embodiment, GPGPU 3830 includes a host interface 3832 to enable a connection with a host processor. In at least one embodiment, host interface 3832 is a PCI Express interface. In at least one embodiment, host interface 3832 can be a vendor-specific communications interface or communications fabric. In at least one embodiment, GPGPU 3830 receives commands from a host processor and uses a global scheduler 3834 to distribute execution threads associated with those commands to a set of compute clusters 3836A-3836H. In at least one embodiment, compute clusters 3836A-3836H share a cache memory 3838. In at least one embodiment, cache memory 3838 can serve as a higher-level cache for cache memories within compute clusters 3836A-3836H.

In at least one embodiment, GPGPU 3830 includes memory 3844A-3844B coupled with compute clusters 3836A-3836H via a set of memory controllers 3842A-3842B. In at least one embodiment, memory 3844A-3844B can include various types of memory devices including dynamic random access memory (DRAM) or graphics random access memory, such as synchronous graphics random access memory (SGRAM), including graphics double data rate (GDDR) memory.

In at least one embodiment, compute clusters 3836A-3836H each include a set of graphics cores, such as graphics core 3800 of FIG. 38A, which can include multiple types of integer and floating point logic units that can perform computational operations at a range of precisions including suited for machine learning computations. For example, in at least one embodiment, at least a subset of floating point units in each of compute clusters 3836A-3836H can be configured to perform 16-bit or 32-bit floating point operations, while a different subset of floating point units can be configured to perform 64-bit floating point operations.

In at least one embodiment, multiple instances of GPGPU 3830 can be configured to operate as a compute cluster. In at least one embodiment, communication used by compute clusters 3836A-3836H for synchronization and data exchange varies across embodiments. In at least one embodiment, multiple instances of GPGPU 3830 communicate over host interface 3832. In at least one embodiment, GPGPU 3830 includes an I/O hub 3839 that couples GPGPU 3830 with a GPU link 3840 that enables a direct connection to other instances of GPGPU 3830. In at least one embodiment, GPU link 3840 is coupled to a dedicated GPU-to-GPU bridge that enables communication and synchronization between multiple instances of GPGPU 3830. In at least one embodiment, GPU link 3840 couples with a high-speed interconnect to transmit and receive data to other GPGPUs or parallel processors. In at least one embodiment, multiple instances of GPGPU 3830 are located in separate data processing systems and communicate via a network device that is accessible via host interface 3832. In at least one embodiment GPU link 3840 can be configured to enable a connection to a host processor in addition to or as an alternative to host interface 3832.

In at least one embodiment, GPGPU 3830 can be configured to train neural networks. In at least one embodiment, GPGPU 3830 can be used within an inferencing platform. In at least one embodiment, in which GPGPU 3830 is used for inferencing, GPGPU 3830 may include fewer compute clusters 3836A-3836H relative to when GPGPU 3830 is used for training a neural network. In at least one embodiment, memory technology associated with memory 3844A-3844B may differ between inferencing and training configurations, with higher bandwidth memory technologies devoted to training configurations. In at least one embodiment, an inferencing configuration of GPGPU 3830 can support inferencing specific instructions. For example, in at least one embodiment, an inferencing configuration can provide support for one or more 8-bit integer dot product instructions, which may be used during inferencing operations for deployed neural networks.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in GPGPU 3830 for inferencing or predicting operations based, at least in part, on weight parameters calculated using neural network training operations, neural network functions and/or architectures, or neural network use cases described herein.

Figure 39:
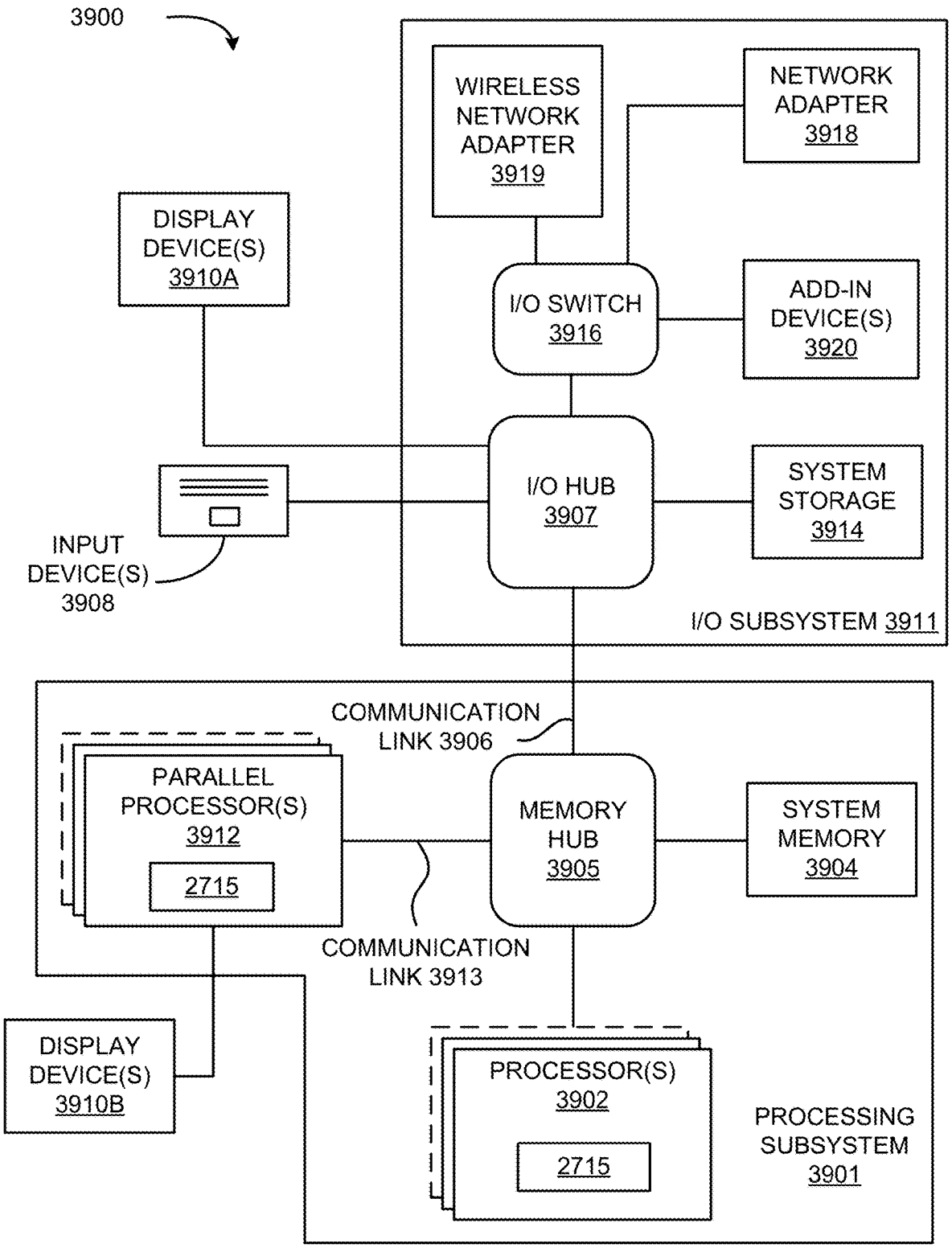
FIG. 39 illustrates a computer system, according to at least one embodiment.

FIG. 39 is a block diagram illustrating a computing system 3900 according to at least one embodiment. In at least one embodiment, computing system 3900 includes a processing subsystem 3901 having one or more processor(s) 3902 and a system memory 3904 communicating via an interconnection path that may include a memory hub 3905. In at least one embodiment, memory hub 3905 may be a separate component within a chipset component or may be integrated within one or more processor(s) 3902. In at least one embodiment, memory hub 3905 couples with an I/O subsystem 3911 via a communication link 3906. In at least one embodiment, I/O subsystem 3911 includes an I/O hub 3907 that can enable computing system 3900 to receive input from one or more input device(s) 3908. In at least one embodiment, I/O hub 3907 can enable a display controller, which may be included in one or more processor(s) 3902, to provide outputs to one or more display device(s) 3910A. In at least one embodiment, one or more display device(s) 3910A coupled with I/O hub 3907 can include a local, internal, or embedded display device.

In at least one embodiment, processing subsystem 3901 includes one or more parallel processor(s) 3912 coupled to memory hub 3905 via a bus or other communication link 3913. In at least one embodiment, communication link 3913 may use one of any number of standards based communication link technologies or protocols, such as, but not limited to PCI Express, or may be a vendor-specific communications interface or communications fabric. In at least one embodiment, one or more parallel processor(s) 3912 form a computationally focused parallel or vector processing system that can include a large number of processing cores and/or processing clusters, such as a many-integrated core (MIC) processor. In at least one embodiment, some or all of parallel processor(s) 3912 form a graphics processing subsystem that can output pixels to one of one or more display device(s) 3910A coupled via I/O Hub 3907. In at least one embodiment, parallel processor(s) 3912 can also include a display controller and display interface (not shown) to enable a direct connection to one or more display device(s) 3910B.

In at least one embodiment, a system storage unit 3914 can connect to I/O hub 3907 to provide a storage mechanism for computing system 3900. In at least one embodiment, an I/O switch 3916 can be used to provide an interface mechanism to enable connections between I/O hub 3907 and other components, such as a network adapter 3918 and/or a wireless network adapter 3919 that may be integrated into platform, and various other devices that can be added via one or more add-in device(s) 3920. In at least one embodiment, network adapter 3918 can be an Ethernet adapter or another wired network adapter. In at least one embodiment, wireless network adapter 3919 can include one or more of a Wi-Fi, Bluetooth, near field communication (NFC), or other network device that includes one or more wireless radios.

In at least one embodiment, computing system 3900 can include other components not explicitly shown, including USB or other port connections, optical storage drives, video capture devices, and like, may also be connected to I/O hub 3907. In at least one embodiment, communication paths interconnecting various components in FIG. 39 may be implemented using any suitable protocols, such as PCI (Peripheral Component Interconnect) based protocols (e.g., PCI-Express), or other bus or point-to-point communication interfaces and/or protocol(s), such as NV-Link high-speed interconnect, or interconnect protocols.

In at least one embodiment, parallel processor(s) 3912 incorporate circuitry optimized for graphics and video processing, including, for example, video output circuitry, and constitutes a graphics processing unit (GPU). In at least one embodiment, parallel processor(s) 3912 incorporate circuitry optimized for general purpose processing. In at least embodiment, components of computing system 3900 may be integrated with one or more other system elements on a single integrated circuit. For example, in at least one embodiment, parallel processor(s) 3912, memory hub 3905, processor(s) 3902, and I/O hub 3907 can be integrated into a system on chip (SoC) integrated circuit. In at least one embodiment, components of computing system 3900 can be integrated into a single package to form a system in package (SIP) configuration. In at least one embodiment, at least a portion of components of computing system 3900 can be integrated into a multi-chip module (MCM), which can be interconnected with other multi-chip modules into a modular computing system.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in system FIG. 3900 for inferencing or predicting operations based, at least in part, on weight parameters calculated using neural network training operations, neural network functions and/or architectures, or neural network use cases described herein.

Processors

FIG. 40A illustrates a parallel processor 4000 according to at least one embodiment. In at least one embodiment, various components of parallel processor 4000 may be implemented using one or more integrated circuit devices, such as programmable processors, application specific integrated circuits (ASICs), or field programmable gate arrays (FPGA). In at least one embodiment, illustrated parallel processor 4000 is a variant of one or more parallel processor(s) 3912 shown in FIG. 39 according to an exemplary embodiment.

In at least one embodiment, parallel processor 4000 includes a parallel processing unit 4002. In at least one embodiment, parallel processing unit 4002 includes an I/O unit 4004 that enables communication with other devices, including other instances of parallel processing unit 4002. In at least one embodiment, I/O unit 4004 may be directly connected to other devices. In at least one embodiment, I/O unit 4004 connects with other devices via use of a hub or switch interface, such as a memory hub 4005. In at least one embodiment, connections between memory hub 4005 and I/O unit 4004 form a communication link 4013. In at least one embodiment, I/O unit 4004 connects with a host interface 4006 and a memory crossbar 4016, where host interface 4006 receives commands directed to performing processing operations and memory crossbar 4016 receives commands directed to performing memory operations.

In at least one embodiment, when host interface 4006 receives a command buffer via I/O unit 4004, host interface 4006 can direct work operations to perform those commands to a front end 4008. In at least one embodiment, front end 4008 couples with a scheduler 4010, which is configured to distribute commands or other work items to a processing cluster array 4012. In at least one embodiment, scheduler 4010 ensures that processing cluster array 4012 is properly configured and in a valid state before tasks are distributed to a cluster of processing cluster array 4012. In at least one embodiment, scheduler 4010 is implemented via firmware logic executing on a microcontroller. In at least one embodiment, microcontroller implemented scheduler 4010 is configurable to perform complex scheduling and work distribution operations at coarse and fine granularity, enabling rapid preemption and context switching of threads executing on processing array 4012. In at least one embodiment, host software can prove workloads for scheduling on processing cluster array 4012 via one of multiple graphics processing paths. In at least one embodiment, workloads can then be automatically distributed across processing array cluster 4012 by scheduler 4010 logic within a microcontroller including scheduler 4010.

In at least one embodiment, processing cluster array 4012 can include up to "N" processing clusters (e.g., cluster 4014A, cluster 4014B, through cluster 4014N), where "N" represents a positive integer (which may be a different integer "N" than used in other figures). In at least one embodiment, each cluster 4014A-4014N of processing cluster array 4012 can execute a large number of concurrent threads. In at least one embodiment, scheduler 4010 can allocate work to clusters 4014A-4014N of processing cluster array 4012 using various scheduling and/or work distribution algorithms, which may vary depending on workload arising for each type of program or computation. In at least one embodiment, scheduling can be handled dynamically by scheduler 4010, or can be assisted in part by compiler logic during compilation of program logic configured for execution by processing cluster array 4012. In at least one embodiment, different clusters 4014A-4014N of processing cluster array 4012 can be allocated for processing different types of programs or for performing different types of computations.

In at least one embodiment, processing cluster array 4012 can be configured to perform various types of parallel processing operations. In at least one embodiment, processing cluster array 4012 is configured to perform general-purpose parallel compute operations. For example, in at least one embodiment, processing cluster array 4012 can include logic to execute processing tasks including filtering of video and/or audio data, performing modeling operations, including physics operations, and performing data transformations.

In at least one embodiment, processing cluster array 4012 is configured to perform parallel graphics processing operations. In at least one embodiment, processing cluster array 4012 can include additional logic to support execution of such graphics processing operations, including but not limited to, texture sampling logic to perform texture operations, as well as tessellation logic and other vertex processing logic. In at least one embodiment, processing cluster array 4012 can be configured to execute graphics processing related shader programs such as, but not limited to, vertex shaders, tessellation shaders, geometry shaders, and pixel shaders. In at least one embodiment, parallel processing unit 4002 can transfer data from system memory via I/O unit 4004 for processing. In at least one embodiment, during processing, transferred data can be stored to on-chip memory (e.g., parallel processor memory 4022) during processing, then written back to system memory.

In at least one embodiment, when parallel processing unit 4002 is used to perform graphics processing, scheduler 4010 can be configured to divide a processing workload into approximately equal sized tasks, to better enable distribution of graphics processing operations to multiple clusters 4014A-4014N of processing cluster array 4012. In at least one embodiment, portions of processing cluster array 4012 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 4014A-4014N may be stored in buffers to allow intermediate data to be transmitted between clusters 4014A-4014N for further processing.

In at least one embodiment, processing cluster array 4012 can receive processing tasks to be executed via scheduler 4010, which receives commands defining processing tasks from front end 4008. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 4010 may be configured to fetch indices corresponding to tasks or may receive indices from front end 4008. In at least one embodiment, front end 4008 can be configured to ensure processing cluster array 4012 is configured to a valid state before a workload specified by incoming command buffers (e.g., batch-buffers, push buffers, etc.) is initiated.

In at least one embodiment, each of one or more instances of parallel processing unit 4002 can couple with a parallel processor memory 4022. In at least one embodiment, parallel processor memory 4022 can be accessed via memory crossbar 4016, which can receive memory requests from processing cluster array 4012 as well as I/O unit 4004. In at least one embodiment, memory crossbar 4016 can access parallel processor memory 4022 via a memory interface 4018. In at least one embodiment, memory interface 4018 can include multiple partition units (e.g., partition unit 4020A, partition unit 4020B, through partition unit 4020N) that can each couple to a portion (e.g., memory unit) of parallel processor memory 4022. In at least one embodiment, a number of partition units 4020A-4020N is configured to be equal to a number of memory units, such that a first partition unit 4020A has a corresponding first memory unit 4024A, a second partition unit 4020B has a corresponding memory unit 4024B, and an N-th partition unit 4020N has a corresponding N-th memory unit 4024N. In at least one embodiment, a number of partition units 4020A-4020N may not be equal to a number of memory units.

In at least one embodiment, memory units 4024A-4024N can include various types of memory devices, including dynamic random access memory (DRAM) or graphics random access memory, such as synchronous graphics random access memory (SGRAM), including graphics double data rate (GDDR) memory. In at least one embodiment, memory units 4024A-4024N may also include 3D stacked memory, including but not limited to high bandwidth memory (HBM). In at least one embodiment, render targets, such as frame buffers or texture maps may be stored across memory units 4024A-4024N, allowing partition units 4020A-4020N to write portions of each render target in parallel to efficiently use available bandwidth of parallel processor memory 4022. In at least one embodiment, a local instance of parallel processor memory 4022 may be excluded in favor of a unified memory design that utilizes system memory in conjunction with local cache memory.

In at least one embodiment, any one of clusters 4014A-4014N of processing cluster array 4012 can process data that will be written to any of memory units 4024A-4024N within parallel processor memory 4022. In at least one embodiment, memory crossbar 4016 can be configured to transfer an output of each cluster 4014A-4014N to any partition unit 4020A-4020N or to another cluster 4014A-4014N, which can perform additional processing operations on an output. In at least one embodiment, each cluster 4014A-4014N can communicate with memory interface 4018 through memory crossbar 4016 to read from or write to various external memory devices. In at least one embodiment, memory crossbar 4016 has a connection to memory interface 4018 to communicate with I/O unit 4004, as well as a connection to a local instance of parallel processor memory 4022, enabling processing units within different processing clusters 4014A-4014N to communicate with system memory or other memory that is not local to parallel processing unit 4002. In at least one embodiment, memory crossbar 4016 can use virtual channels to separate traffic streams between clusters 4014A-4014N and partition units 4020A-4020N.

In at least one embodiment, multiple instances of parallel processing unit 4002 can be provided on a single add-in card, or multiple add-in cards can be interconnected. In at least one embodiment, different instances of parallel processing unit 4002 can be configured to interoperate even if different instances have different numbers of processing cores, different amounts of local parallel processor memory, and/or other configuration differences. For example, in at least one embodiment, some instances of parallel processing unit 4002 can include higher precision floating point units relative to other instances. In at least one embodiment, systems incorporating one or more instances of parallel processing unit 4002 or parallel processor 4000 can be implemented in a variety of configurations and form factors, including but not limited to desktop, laptop, or handheld personal computers, servers, workstations, game consoles, and/or embedded systems.

Figure 40:
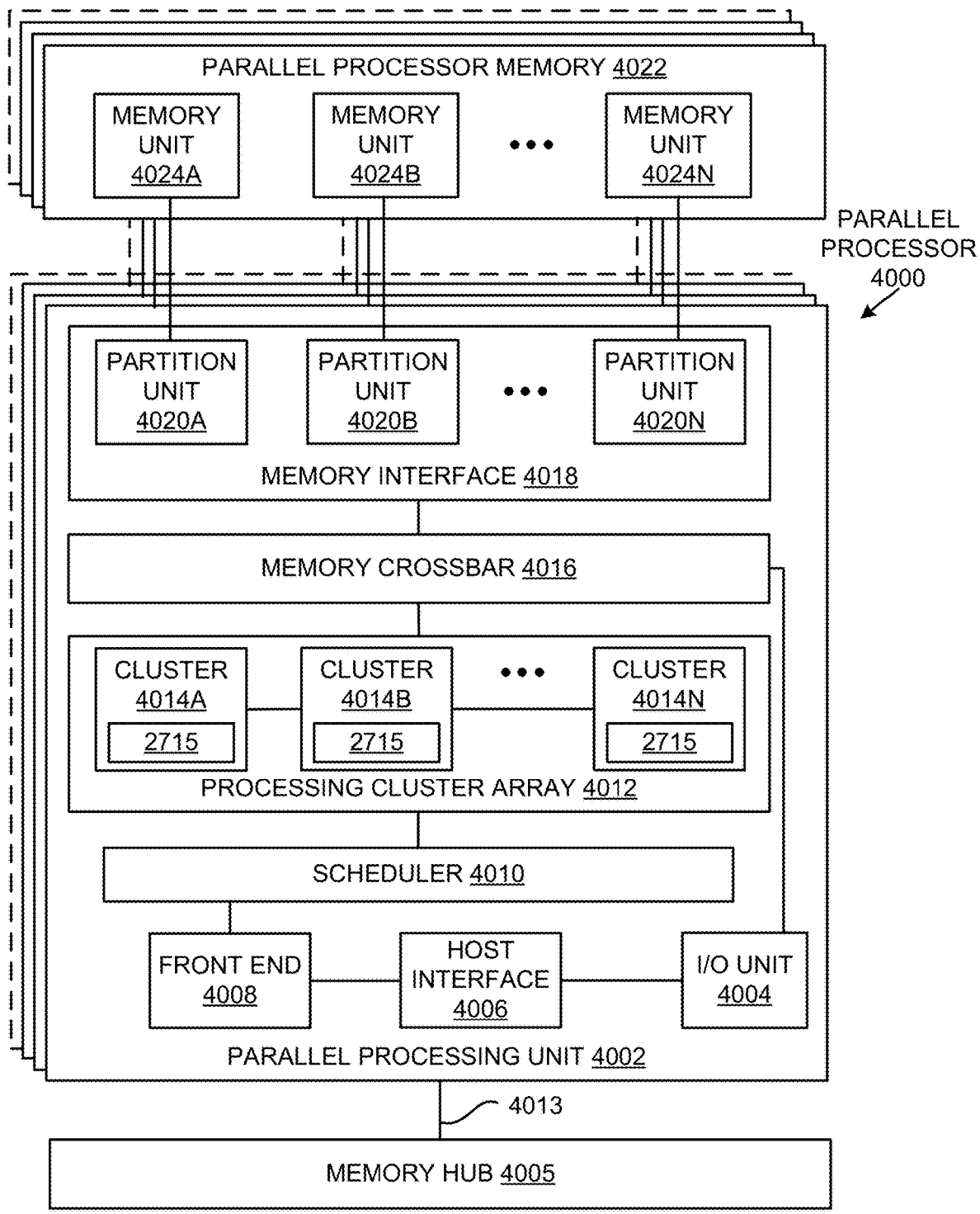
FIG. 40A illustrates a parallel processor, according to at least one embodiment.
FIG. 40B illustrates a partition unit, according to at least one embodiment.
FIG. 40C illustrates a processing cluster, according to at least one embodiment.
FIG. 40D illustrates a graphics multiprocessor, according to at least one embodiment.
Figure 40:
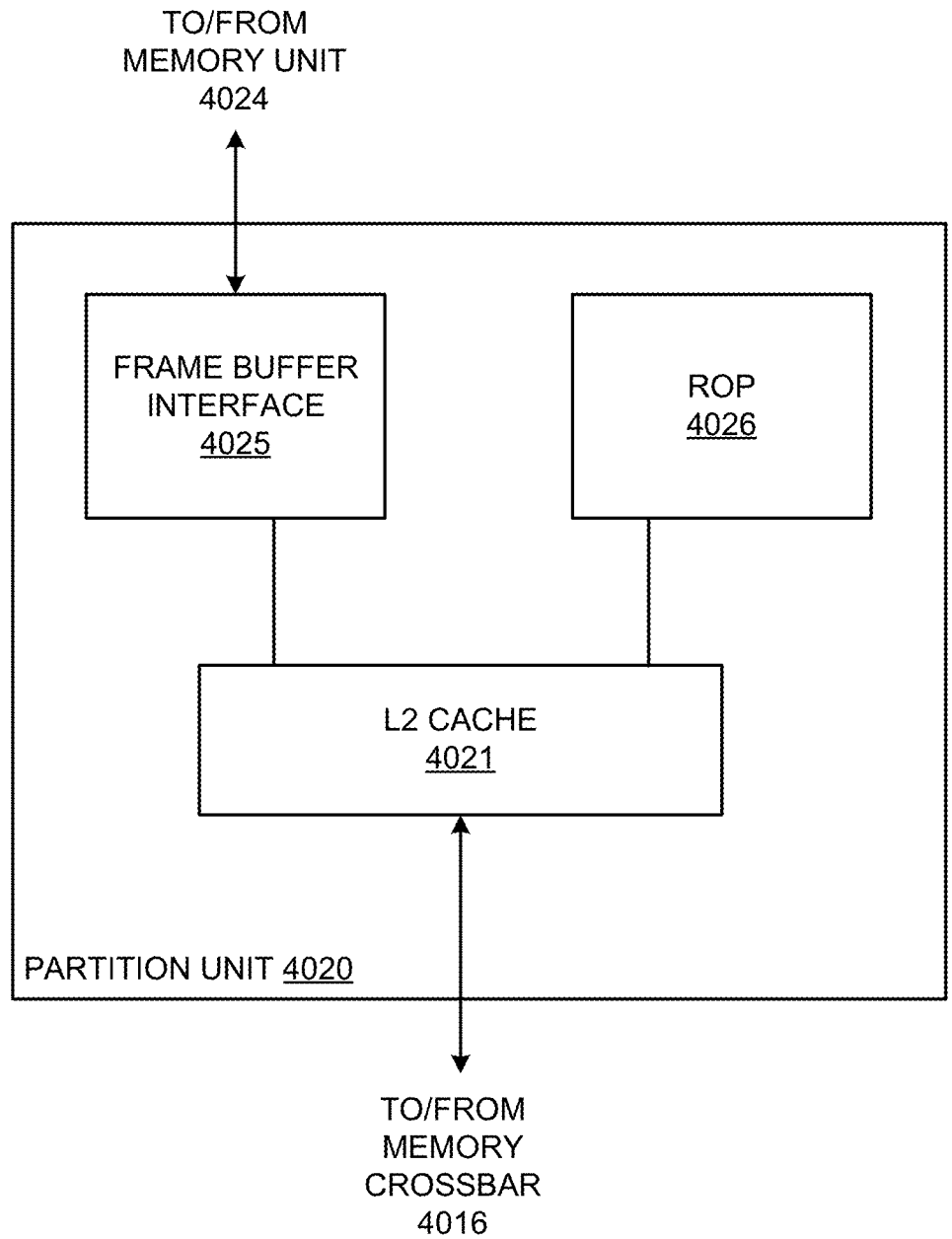
Figure 40:
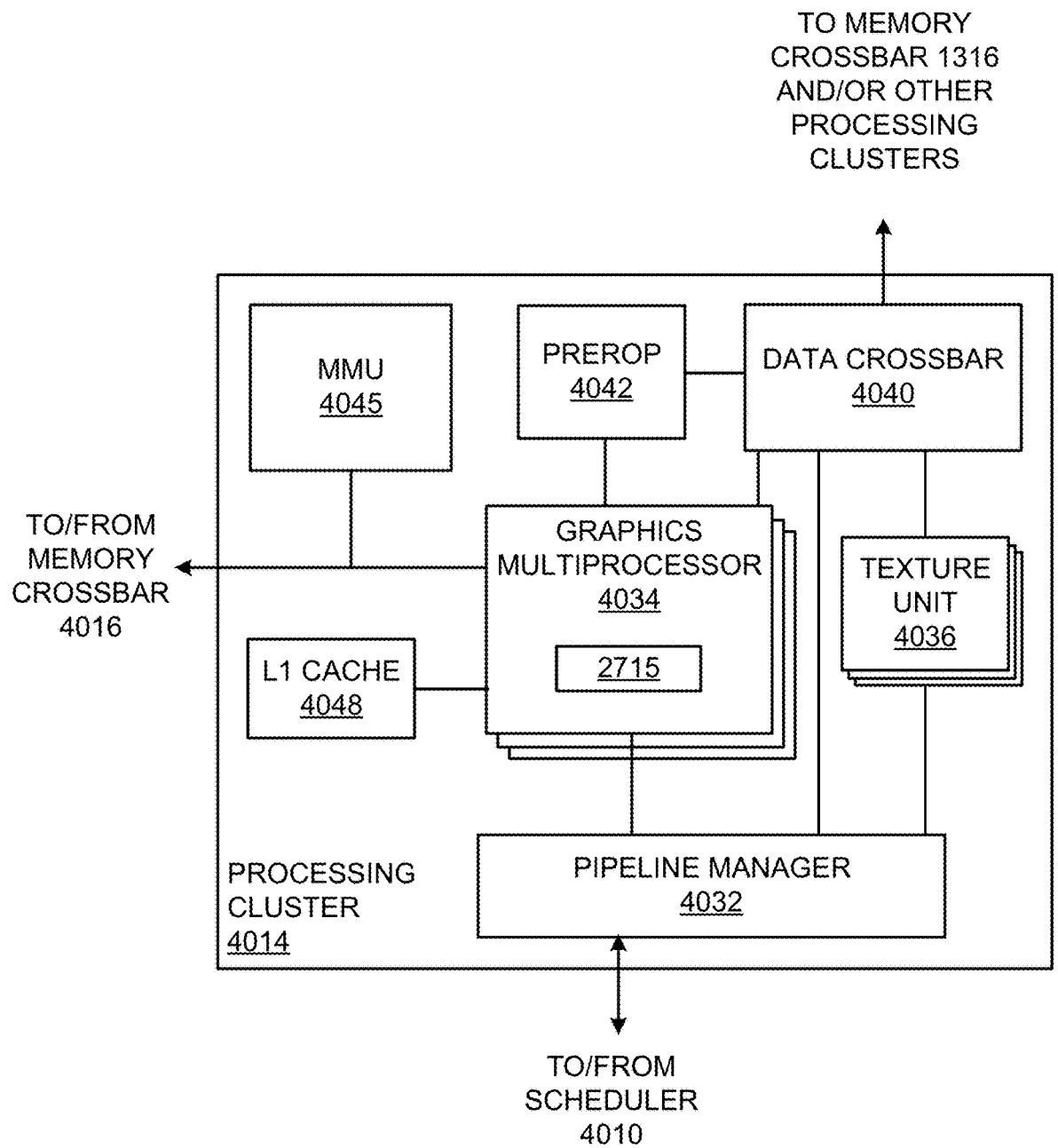
Figure 40:
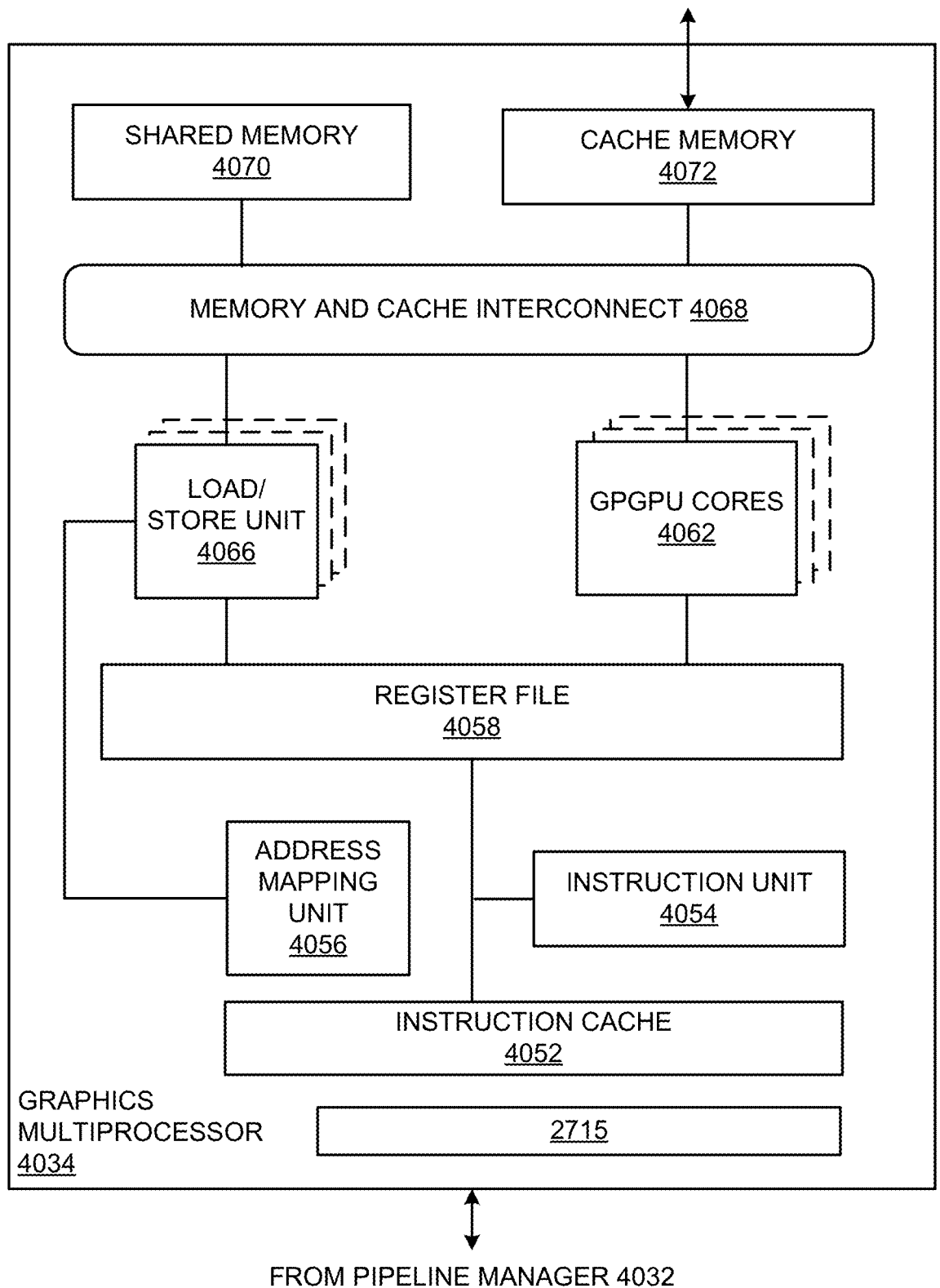

FIG. 40B is a block diagram of a partition unit 4020 according to at least one embodiment. In at least one embodiment, partition unit 4020 is an instance of one of partition units 4020A-4020N of FIG. 40A. In at least one embodiment, partition unit 4020 includes an L2 cache 4021, a frame buffer interface 4025, and a ROP 4026 (raster operations unit). In at least one embodiment, L2 cache 4021 is a read/write cache that is configured to perform load and store operations received from memory crossbar 4016 and ROP 4026. In at least one embodiment, read misses and urgent write-back requests are output by L2 cache 4021 to frame buffer interface 4025 for processing. In at least one embodiment, updates can also be sent to a frame buffer via frame buffer interface 4025 for processing. In at least one embodiment, frame buffer interface 4025 interfaces with one of memory units in parallel processor memory, such as memory units 4024A-4024N of FIG. 40 (e.g., within parallel processor memory 4022).

In at least one embodiment, ROP 4026 is a processing unit that performs raster operations such as stencil, z test, blending, etc. In at least one embodiment, ROP 4026 then outputs processed graphics data that is stored in graphics memory. In at least one embodiment, ROP 4026 includes compression logic to compress depth or color data that is written to memory and decompress depth or color data that is read from memory. In at least one embodiment, compression logic can be lossless compression logic that makes use of one or more of multiple compression algorithms. In at least one embodiment, a type of compression that is performed by ROP 4026 can vary based on statistical characteristics of data to be compressed. For example, in at least one embodiment, delta color compression is performed on depth and color data on a per-tile basis.

In at least one embodiment, ROP 4026 is included within each processing cluster (e.g., cluster 4014A-4014N of FIG. 40A) instead of within partition unit 4020. In at least one embodiment, read and write requests for pixel data are transmitted over memory crossbar 4016 instead of pixel fragment data. In at least one embodiment, processed graphics data may be displayed on a display device, such as one of one or more display device(s) 3910 of FIG. 39, routed for further processing by processor(s) 3902, or routed for further processing by one of processing entities within parallel processor 4000 of FIG. 40A.

FIG. 40C is a block diagram of a processing cluster 4014 within a parallel processing unit according to at least one embodiment. In at least one embodiment, a processing cluster is an instance of one of processing clusters 4014A-4014N of FIG. 40A. In at least one embodiment, processing cluster 4014 can be configured to execute many threads in parallel, where "thread" refers to an instance of a particular program executing on a particular set of input data. In at least one embodiment, single-instruction, multiple-data (SIMD) instruction issue techniques are used to support parallel execution of a large number of threads without providing multiple independent instruction units. In at least one embodiment, single-instruction, multiple-thread (SIMT) techniques are used to support parallel execution of a large number of generally synchronized threads, using a common instruction unit configured to issue instructions to a set of processing engines within each one of processing clusters.

In at least one embodiment, operation of processing cluster 4014 can be controlled via a pipeline manager 4032 that distributes processing tasks to SIMT parallel processors. In at least one embodiment, pipeline manager 4032 receives instructions from scheduler 4010 of FIG. 40A and manages execution of those instructions via a graphics multiprocessor 4034 and/or a texture unit 4036. In at least one embodiment, graphics multiprocessor 4034 is an exemplary instance of a SIMT parallel processor. However, in at least one embodiment, various types of SIMT parallel processors of differing architectures may be included within processing cluster 4014. In at least one embodiment, one or more instances of graphics multiprocessor 4034 can be included within a processing cluster 4014. In at least one embodiment, graphics multiprocessor 4034 can process data and a data crossbar 4040 can be used to distribute processed data to one of multiple possible destinations, including other shader units. In at least one embodiment, pipeline manager 4032 can facilitate distribution of processed data by specifying destinations for processed data to be distributed via data crossbar 4040.

In at least one embodiment, each graphics multiprocessor 4034 within processing cluster 4014 can include an identical set of functional execution logic (e.g., arithmetic logic units, load-store units, etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 4014 constitute a thread. In at least one embodiment, a set of threads executing across a set of parallel processing engines is a thread group. In at least one embodiment, a thread group executes a common program on different input data. In at least one embodiment, each thread within a thread group can be assigned to a different processing engine within a graphics multiprocessor 4034. In at least one embodiment, a thread group may include fewer threads than a number of processing engines within graphics multiprocessor 4034. In at least one embodiment, when a thread group includes fewer threads than a number of processing engines, one or more of processing engines may be idle during cycles in which that thread group is being processed. In at least one embodiment, a thread group may also include more threads than a number of processing engines within graphics multiprocessor 4034. In at least one embodiment, when a thread group includes more threads than number of processing engines within graphics multiprocessor 4034, processing can be performed over consecutive clock cycles. In at least one embodiment, multiple thread groups can be executed concurrently on a graphics multiprocessor 4034.

In at least one embodiment, graphics multiprocessor 4034 includes an internal cache memory to perform load and store operations. In at least one embodiment, graphics multiprocessor 4034 can forego an internal cache and use a cache memory (e.g., L1 cache 4048) within processing cluster 4014. In at least one embodiment, each graphics multiprocessor 4034 also has access to L2 caches within partition units (e.g., partition units 4020A-4020N of FIG. 40A) that are shared among all processing clusters 4014 and may be used to transfer data between threads. In at least one embodiment, graphics multiprocessor 4034 may also access off-chip global memory, which can include one or more of local parallel processor memory and/or system memory. In at least one embodiment, any memory external to parallel processing unit 4002 may be used as global memory. In at least one embodiment, processing cluster 4014 includes multiple instances of graphics multiprocessor 4034 and can share common instructions and data, which may be stored in L1 cache 4048.

In at least one embodiment, each processing cluster 4014 may include an MMU 4045 (memory management unit) that is configured to map virtual addresses into physical addresses. In at least one embodiment, one or more instances of MMU 4045 may reside within memory interface 4018 of FIG. 40A. In at least one embodiment, MMU 4045 includes a set of page table entries (PTEs) used to map a virtual address to a physical address of a tile and optionally a cache line index. In at least one embodiment, MMU 4045 may include address translation lookaside buffers (TLB) or caches that may reside within graphics multiprocessor 4034 or L1 4048 cache or processing cluster 4014. In at least one embodiment, a physical address is processed to distribute surface data access locally to allow for efficient request interleaving among partition units. In at least one embodiment, a cache line index may be used to determine whether a request for a cache line is a hit or miss.

In at least one embodiment, a processing cluster 4014 may be configured such that each graphics multiprocessor 4034 is coupled to a texture unit 4036 for performing texture mapping operations, e.g., determining texture sample positions, reading texture data, and filtering texture data. In at least one embodiment, texture data is read from an internal texture L1 cache (not shown) or from an L1 cache within graphics multiprocessor 4034 and is fetched from an L2 cache, local parallel processor memory, or system memory, as needed. In at least one embodiment, each graphics multiprocessor 4034 outputs processed tasks to data crossbar 4040 to provide processed task to another processing cluster 4014 for further processing or to store processed task in an L2 cache, local parallel processor memory, or system memory via memory crossbar 4016. In at least one embodiment, a preROP 4042 (pre-raster operations unit) is configured to receive data from graphics multiprocessor 4034, and direct data to ROP units, which may be located with partition units as described herein (e.g., partition units 4020A-4020N of FIG. 40A). In at least one embodiment, preROP 4042 unit can perform optimizations for color blending, organizing pixel color data, and performing address translations.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in graphics processing cluster 4014 for inferencing or predicting operations based, at least in part, on weight parameters calculated using neural network training operations, neural network functions and/or architectures, or neural network use cases described herein.

FIG. 40D shows a graphics multiprocessor 4034 according to at least one embodiment. In at least one embodiment, graphics multiprocessor 4034 couples with pipeline manager 4032 of processing cluster 4014. In at least one embodiment, graphics multiprocessor 4034 has an execution pipeline including but not limited to an instruction cache 4052, an instruction unit 4054, an address mapping unit 4056, a register file 4058, one or more general purpose graphics processing unit (GPGPU) cores 4062, and one or more load/store units 4066. In at least one embodiment, GPGPU cores 4062 and load/store units 4066 are coupled with cache memory 4072 and shared memory 4070 via a memory and cache interconnect 4068.

In at least one embodiment, instruction cache 4052 receives a stream of instructions to execute from pipeline manager 4032. In at least one embodiment, instructions are cached in instruction cache 4052 and dispatched for execution by an instruction unit 4054. In at least one embodiment, instruction unit 4054 can dispatch instructions as thread groups (e.g., warps), with each thread of thread group assigned to a different execution unit within GPGPU cores 4062. In at least one embodiment, an instruction can access any of a local, shared, or global address space by specifying an address within a unified address space. In at least one embodiment, address mapping unit 4056 can be used to translate addresses in a unified address space into a distinct memory address that can be accessed by load/store units 4066.

In at least one embodiment, register file 4058 provides a set of registers for functional units of graphics multiprocessor 4034. In at least one embodiment, register file 4058 provides temporary storage for operands connected to data paths of functional units (e.g., GPGPU cores 4062, load/store units 4066) of graphics multiprocessor 4034. In at least one embodiment, register file 4058 is divided between each of functional units such that each functional unit is allocated a dedicated portion of register file 4058. In at least one embodiment, register file 4058 is divided between different warps being executed by graphics multiprocessor 4034.

In at least one embodiment, GPGPU cores 4062 can each include floating point units (FPUs) and/or integer arithmetic logic units (ALUs) that are used to execute instructions of graphics multiprocessor 4034. In at least one embodiment, GPGPU cores 4062 can be similar in architecture or can differ in architecture. In at least one embodiment, a first portion of GPGPU cores 4062 include a single precision FPU and an integer ALU while a second portion of GPGPU cores include a double precision FPU. In at least one embodiment, FPUs can implement IEEE 754-2008 standard floating point arithmetic or enable variable precision floating point arithmetic. In at least one embodiment, graphics multiprocessor 4034 can additionally include one or more fixed function or special function units to perform specific functions such as copy rectangle or pixel blending operations. In at least one embodiment, one or more of GPGPU cores 4062 can also include fixed or special function logic.

In at least one embodiment, GPGPU cores 4062 include SIMD logic capable of performing a single instruction on multiple sets of data. In at least one embodiment, GPGPU cores 4062 can physically execute SIMD4, SIMD8, and SIMD16 instructions and logically execute SIMD1, SIMD2, and SIMD32 instructions. In at least one embodiment, SIMD instructions for GPGPU cores can be generated at compile time by a shader compiler or automatically generated when executing programs written and compiled for single program multiple data (SPMD) or SIMT architectures. In at least one embodiment, multiple threads of a program configured for an SIMT execution model can executed via a single SIMD instruction. For example, in at least one embodiment, eight SIMT threads that perform same or similar operations can be executed in parallel via a single SIMD8 logic unit.

In at least one embodiment, memory and cache interconnect 4068 is an interconnect network that connects each functional unit of graphics multiprocessor 4034 to register file 4058 and to shared memory 4070. In at least one embodiment, memory and cache interconnect 4068 is a crossbar interconnect that allows load/store unit 4066 to implement load and store operations between shared memory 4070 and register file 4058. In at least one embodiment, register file 4058 can operate at a same frequency as GPGPU cores 4062, thus data transfer between GPGPU cores 4062 and register file 4058 can have very low latency. In at least one embodiment, shared memory 4070 can be used to enable communication between threads that execute on functional units within graphics multiprocessor 4034. In at least one embodiment, cache memory 4072 can be used as a data cache for example, to cache texture data communicated between functional units and texture unit 4036. In at least one embodiment, shared memory 4070 can also be used as a program managed cache. In at least one embodiment, threads executing on GPGPU cores 4062 can programmatically store data within shared memory in addition to automatically cached data that is stored within cache memory 4072.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, a GPU may be communicatively coupled to host processor/cores over a bus or other interconnect (e.g., a high-speed interconnect such as PCIe or NVLink). In at least one embodiment, a GPU may be integrated on a package or chip as cores and communicatively coupled to cores over an internal processor bus/interconnect internal to a package or chip. In at least one embodiment, regardless a manner in which a GPU is connected, processor cores may allocate work to such GPU in a form of sequences of commands/instructions contained in a work descriptor. In at least one embodiment, that GPU then uses dedicated circuitry/logic for efficiently processing these commands/instructions.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in graphics multiprocessor 4034 for inferencing or predicting operations based, at least in part, on weight parameters calculated using neural network training operations, neural network functions and/or architectures, or neural network use cases described herein.

Figure 41:
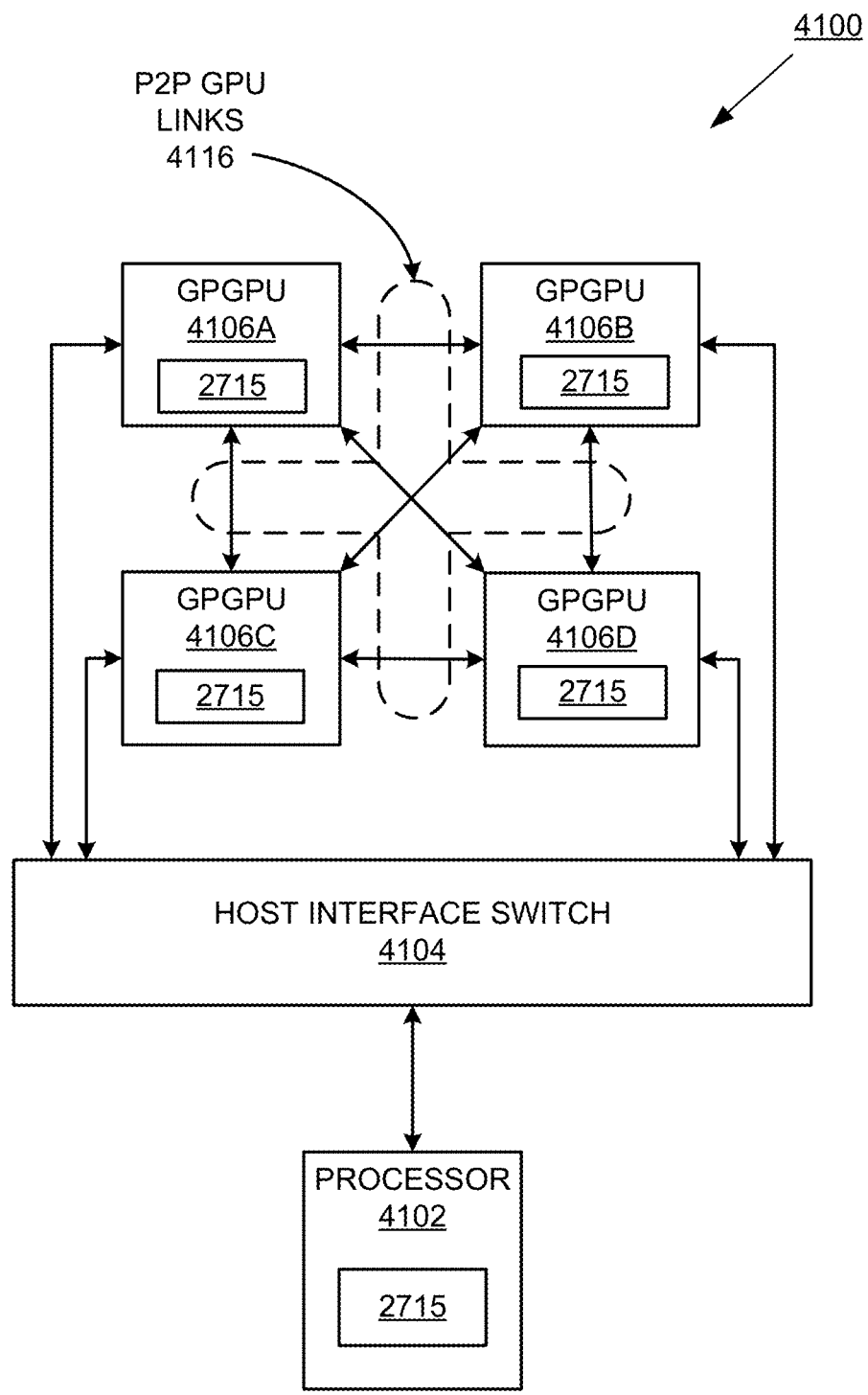
FIG. 41 illustrates a multi-graphics processing unit (GPU) system, according to at least one embodiment.

FIG. 41 illustrates a multi-GPU computing system 4100, according to at least one embodiment. In at least one embodiment, multi-GPU computing system 4100 can include a processor 4102 coupled to multiple general purpose graphics processing units (GPGPUs) 4106A-D via a host interface switch 4104. In at least one embodiment, host interface switch 4104 is a PCI express switch device that couples processor 4102 to a PCI express bus over which processor 4102 can communicate with GPGPUs 4106A-D. In at least one embodiment, GPGPUs 4106A-D can interconnect via a set of high-speed point-to-point GPU-to-GPU links 4116. In at least one embodiment, GPU-to-GPU links 4116 connect to each of GPGPUs 4106A-D via a dedicated GPU link. In at least one embodiment, P2P GPU links 4116 enable direct communication between each of GPGPUs 4106A-D without requiring communication over host interface bus 4104 to which processor 4102 is connected. In at least one embodiment, with GPU-to-GPU traffic directed to P2P GPU links 4116, host interface bus 4104 remains available for system memory access or to communicate with other instances of multi-GPU computing system 4100, for example, via one or more network devices. While in at least one embodiment GPGPUs 4106A-D connect to processor 4102 via host interface switch 4104, in at least one embodiment processor 4102 includes direct support for P2P GPU links 4116 and can connect directly to GPGPUs 4106A-D.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in multi-GPU computing system 4100 for inferencing or predicting operations based, at least in part, on weight parameters calculated using neural network training operations, neural network functions and/or architectures, or neural network use cases described herein.

Figure 42:
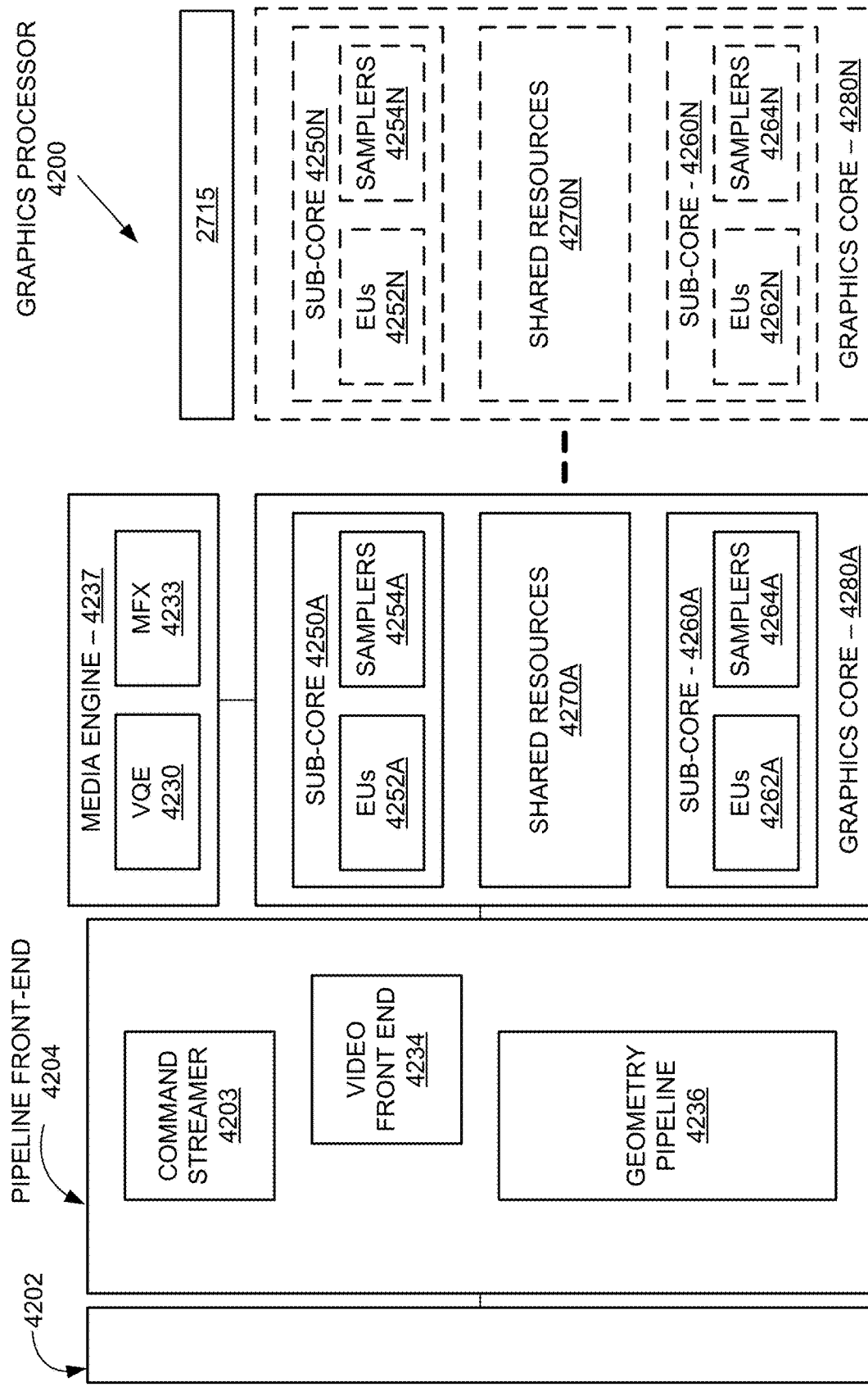
FIG. 42 illustrates a graphics processor, according to at least one embodiment.

FIG. 42 is a block diagram of a graphics processor 4200, according to at least one embodiment. In at least one embodiment, graphics processor 4200 includes a ring interconnect 4202, a pipeline front-end 4204, a media engine 4237, and graphics cores 4280A-4280N. In at least one embodiment, ring interconnect 4202 couples graphics processor 4200 to other processing units, including other graphics processors or one or more general-purpose processor cores. In at least one embodiment, graphics processor 4200 is one of many processors integrated within a multi-core processing system.

In at least one embodiment, graphics processor 4200 receives batches of commands via ring interconnect 4202. In at least one embodiment, incoming commands are interpreted by a command streamer 4203 in pipeline front-end 4204. In at least one embodiment, graphics processor 4200 includes scalable execution logic to perform 3D geometry processing and media processing via graphics core(s) 4280A-4280N. In at least one embodiment, for 3D geometry processing commands, command streamer 4203 supplies commands to geometry pipeline 4236. In at least one embodiment, for at least some media processing commands, command streamer 4203 supplies commands to a video front end 4234, which couples with media engine 4237. In at least one embodiment, media engine 4237 includes a Video Quality Engine (VQE) 4230 for video and image post-processing and a multi-format encode/decode (MFX) 4233 engine to provide hardware-accelerated media data encoding and decoding. In at least one embodiment, geometry pipeline 4236 and media engine 4237 each generate execution threads for thread execution resources provided by at least one graphics core 4280.

In at least one embodiment, graphics processor 4200 includes scalable thread execution resources featuring graphics cores 4280A-4280N (which can be modular and are sometimes referred to as core slices), each having multiple sub-cores 4250A-50N, 4260A-4260N (sometimes referred to as core sub-slices). In at least one embodiment, graphics processor 4200 can have any number of graphics cores 4280A. In at least one embodiment, graphics processor 4200 includes a graphics core 4280A having at least a first sub-core 4250A and a second sub-core 4260A. In at least one embodiment, graphics processor 4200 is a low power processor with a single sub-core (e.g., 4250A). In at least one embodiment, graphics processor 4200 includes multiple graphics cores 4280A-4280N, each including a set of first sub-cores 4250A-4250N and a set of second sub-cores 4260A-4260N. In at least one embodiment, each sub-core in first sub-cores 4250A-4250N includes at least a first set of execution units 4252A-4252N and media/texture samplers 4254A-4254N. In at least one embodiment, each sub-core in second sub-cores 4260A-4260N includes at least a second set of execution units 4262A-4262N and samplers 4264A-4264N. In at least one embodiment, each sub-core 4250A-4250N, 4260A-4260N shares a set of shared resources 4270A-4270N. In at least one embodiment, shared resources include shared cache memory and pixel operation logic.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, inference and/or training logic 2715 may be used in graphics processor 4200 for inferencing or predicting operations based, at least in part, on weight parameters calculated using neural network training operations, neural network functions and/or architectures, or neural network use cases described herein.

Figure 43:
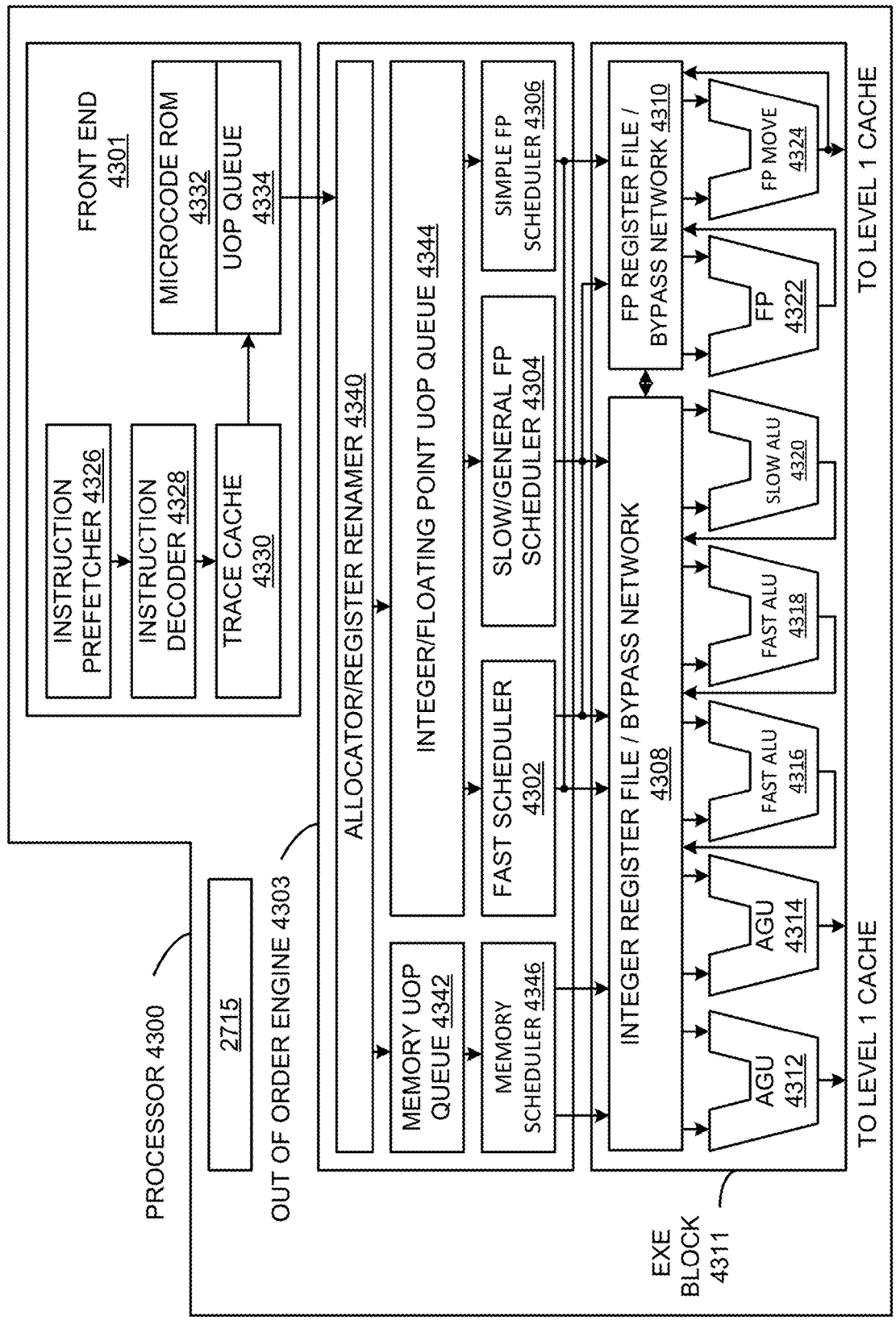
FIG. 43 is a block diagram illustrating a processor microarchitecture for a processor, according to at least one embodiment.

FIG. 43 is a block diagram illustrating micro-architecture for a processor 4300 that may include logic circuits to perform instructions, according to at least one embodiment. In at least one embodiment, processor 4300 may perform instructions, including x86 instructions, ARM instructions, specialized instructions for application-specific integrated circuits (ASICs), etc. In at least one embodiment, processor 4300 may include registers to store packed data, such as 64-bit wide MMX™ registers in microprocessors enabled with MMX technology from Intel Corporation of Santa Clara, Calif. In at least one embodiment, MMX registers, available in both integer and floating point forms, may operate with packed data elements that accompany single instruction, multiple data ("SIMD") and streaming SIMD extensions ("SSE") instructions. In at least one embodiment, 128-bit wide XMM registers relating to SSE2, SSE3, SSE4, AVX, or beyond (referred to generically as "SSEx") technology may hold such packed data operands. In at least one embodiment, processor 4300 may perform instructions to accelerate machine learning or deep learning algorithms, training, or inferencing.

In at least one embodiment, processor 4300 includes an in-order front end ("front end") 4301 to fetch instructions to be executed and prepare instructions to be used later in a processor pipeline. In at least one embodiment, front end 4301 may include several units. In at least one embodiment, an instruction prefetcher 4326 fetches instructions from memory and feeds instructions to an instruction decoder 4328 which in turn decodes or interprets instructions. For example, in at least one embodiment, instruction decoder 4328 decodes a received instruction into one or more operations called "micro-instructions" or "micro-operations" (also called "micro ops" or "uops") that a machine may execute. In at least one embodiment, instruction decoder 4328 parses an instruction into an opcode and corresponding data and control fields that may be used by micro-architecture to perform operations in accordance with at least one embodiment. In at least one embodiment, a trace cache 4330 may assemble decoded uops into program ordered sequences or traces in a uop queue 4334 for execution. In at least one embodiment, when trace cache 4330 encounters a complex instruction, a microcode ROM 4332 provides uops needed to complete an operation.

In at least one embodiment, some instructions may be converted into a single micro-op, whereas others need several micro-ops to complete full operation. In at least one embodiment, if more than four micro-ops are needed to complete an instruction, instruction decoder 4328 may access microcode ROM 4332 to perform that instruction. In at least one embodiment, an instruction may be decoded into a small number of micro-ops for processing at instruction decoder 4328. In at least one embodiment, an instruction may be stored within microcode ROM 4332 should a number of micro-ops be needed to accomplish such operation. In at least one embodiment, trace cache 4330 refers to an entry point programmable logic array ("PLA") to determine a correct micro-instruction pointer for reading microcode sequences to complete one or more instructions from microcode ROM 4332 in accordance with at least one embodiment. In at least one embodiment, after microcode ROM 4332 finishes sequencing micro-ops for an instruction, front end 4301 of a machine may resume fetching micro-ops from trace cache 4330.

In at least one embodiment, out-of-order execution engine ("out of order engine") 4303 may prepare instructions for execution. In at least one embodiment, out-of-order execution logic has a number of buffers to smooth out and re-order flow of instructions to optimize performance as they go down a pipeline and get scheduled for execution. In at least one embodiment, out-of-order execution engine 4303 includes, without limitation, an allocator/register renamer 4340, a memory uop queue 4342, an integer/floating point uop queue 4344, a memory scheduler 4346, a fast scheduler 4302, a slow/general floating point scheduler ("slow/general FP scheduler") 4304, and a simple floating point scheduler ("simple FP scheduler") 4306. In at least one embodiment, fast schedule 4302, slow/general floating point scheduler 4304, and simple floating point scheduler 4306 are also collectively referred to herein as "uop schedulers 4302, 4304, 4306." In at least one embodiment, allocator/register renamer 4340 allocates machine buffers and resources that each uop needs in order to execute. In at least one embodiment, allocator/register renamer 4340 renames logic registers onto entries in a register file. In at least one embodiment, allocator/register renamer 4340 also allocates an entry for each uop in one of two uop queues, memory uop queue 4342 for memory operations and integer/floating point uop queue 4344 for non-memory operations, in front of memory scheduler 4346 and uop schedulers 4302, 4304, 4306. In at least one embodiment, uop schedulers 4302, 4304, 4306, determine when a uop is ready to execute based on readiness of their dependent input register operand sources and availability of execution resources uops need to complete their operation. In at least one embodiment, fast scheduler 4302 may schedule on each half of a main clock cycle while slow/general floating point scheduler 4304 and simple floating point scheduler 4306 may schedule once per main processor clock cycle. In at least one embodiment, uop schedulers 4302, 4304, 4306 arbitrate for dispatch ports to schedule uops for execution.

In at least one embodiment, execution block 4311 includes, without limitation, an integer register file/bypass network 4308, a floating point register file/bypass network ("FP register file/bypass network") 4310, address generation units ("AGUs") 4312 and 4314, fast Arithmetic Logic Units (ALUs) ("fast ALUs") 4316 and 4318, a slow Arithmetic Logic Unit ("slow ALU") 4320, a floating point ALU ("FP") 4322, and a floating point move unit ("FP move") 4324. In at least one embodiment, integer register file/bypass network 4308 and floating point register file/bypass network 4310 are also referred to herein as "register files 4308, 4310." In at least one embodiment, AGUSs 4312 and 4314, fast ALUs 4316 and 4318, slow ALU 4320, floating point ALU 4322, and floating point move unit 4324 are also referred to herein as "execution units 4312, 4314, 4316, 4318, 4320, 4322, and 4324." In at least one embodiment, execution block 4311 may include, without limitation, any number (including zero) and type of register files, bypass networks, address generation units, and execution units, in any combination.

In at least one embodiment, register networks 4308, 4310 may be arranged between uop schedulers 4302, 4304, 4306, and execution units 4312, 4314, 4316, 4318, 4320, 4322, and 4324. In at least one embodiment, integer register file/bypass network 4308 performs integer operations. In at least one embodiment, floating point register file/bypass network 4310 performs floating point operations. In at least one embodiment, each of register networks 4308, 4310 may include, without limitation, a bypass network that may bypass or forward just completed results that have not yet been written into a register file to new dependent uops. In at least one embodiment, register networks 4308, 4310 may communicate data with each other. In at least one embodiment, integer register file/bypass network 4308 may include, without limitation, two separate register files, one register file for a low-order thirty-two bits of data and a second register file for a high order thirty-two bits of data. In at least one embodiment, floating point register file/bypass network 4310 may include, without limitation, 128-bit wide entries because floating point instructions typically have operands from 64 to 128 bits in width.

In at least one embodiment, execution units 4312, 4314, 4316, 4318, 4320, 4322, 4324 may execute instructions. In at least one embodiment, register networks 4308, 4310 store integer and floating point data operand values that micro-instructions need to execute. In at least one embodiment, processor 4300 may include, without limitation, any number and combination of execution units 4312, 4314, 4316, 4318, 4320, 4322, 4324. In at least one embodiment, floating point ALU 4322 and floating point move unit 4324, may execute floating point, MMX, SIMD, AVX and SSE, or other operations, including specialized machine learning instructions. In at least one embodiment, floating point ALU 4322 may include, without limitation, a 64-bit by 64-bit floating point divider to execute divide, square root, and remainder micro ops. In at least one embodiment, instructions involving a floating point value may be handled with floating point hardware. In at least one embodiment, ALU operations may be passed to fast ALUs 4316, 4318. In at least one embodiment, fast ALUS 4316, 4318 may execute fast operations with an effective latency of half a clock cycle. In at least one embodiment, most complex integer operations go to slow ALU 4320 as slow ALU 4320 may include, without limitation, integer execution hardware for long-latency type of operations, such as a multiplier, shifts, flag logic, and branch processing. In at least one embodiment, memory load/store operations may be executed by AGUs 4312, 4314. In at least one embodiment, fast ALU 4316, fast ALU 4318, and slow ALU 4320 may perform integer operations on 64-bit data operands. In at least one embodiment, fast ALU 4316, fast ALU 4318, and slow ALU 4320 may be implemented to support a variety of data bit sizes including sixteen, thirty-two, 128, 256, etc. In at least one embodiment, floating point ALU 4322 and floating point move unit 4324 may be implemented to support a range of operands having bits of various widths, such as 128-bit wide packed data operands in conjunction with SIMD and multimedia instructions.

In at least one embodiment, uop schedulers 4302, 4304, 4306 dispatch dependent operations before a parent load has finished executing. In at least one embodiment, as uops may be speculatively scheduled and executed in processor 4300, processor 4300 may also include logic to handle memory misses. In at least one embodiment, if a data load misses in a data cache, there may be dependent operations in flight in a pipeline that have left a scheduler with temporarily incorrect data. In at least one embodiment, a replay mechanism tracks and re-executes instructions that use incorrect data. In at least one embodiment, dependent operations might need to be replayed and independent ones may be allowed to complete. In at least one embodiment, schedulers and a replay mechanism of at least one embodiment of a processor may also be designed to catch instruction sequences for text string comparison operations.

In at least one embodiment, "registers" may refer to on-board processor storage locations that may be used as part of instructions to identify operands. In at least one embodiment, registers may be those that may be usable from outside of a processor (from a programmer's perspective). In at least one embodiment, registers might not be limited to a particular type of circuit. Rather, in at least one embodiment, a register may store data, provide data, and perform functions described herein. In at least one embodiment, registers described herein may be implemented by circuitry within a processor using any number of different techniques, such as dedicated physical registers, dynamically allocated physical registers using register renaming, combinations of dedicated and dynamically allocated physical registers, etc. In at least one embodiment, integer registers store 32-bit integer data. A register file of at least one embodiment also contains eight multimedia SIMD registers for packed data.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment portions or all of inference and/or training logic 2715 may be incorporated into execution block 4311 and other memory or registers shown or not shown. For example, in at least one embodiment, training and/or inferencing techniques described herein may use one or more of ALUs illustrated in execution block 4311. Moreover, weight parameters may be stored in on-chip or off-chip memory and/or registers (shown or not shown) that configure ALUs of execution block 4311 to perform one or more machine learning algorithms, neural network architectures, use cases, or training techniques described herein.

Figure 44:
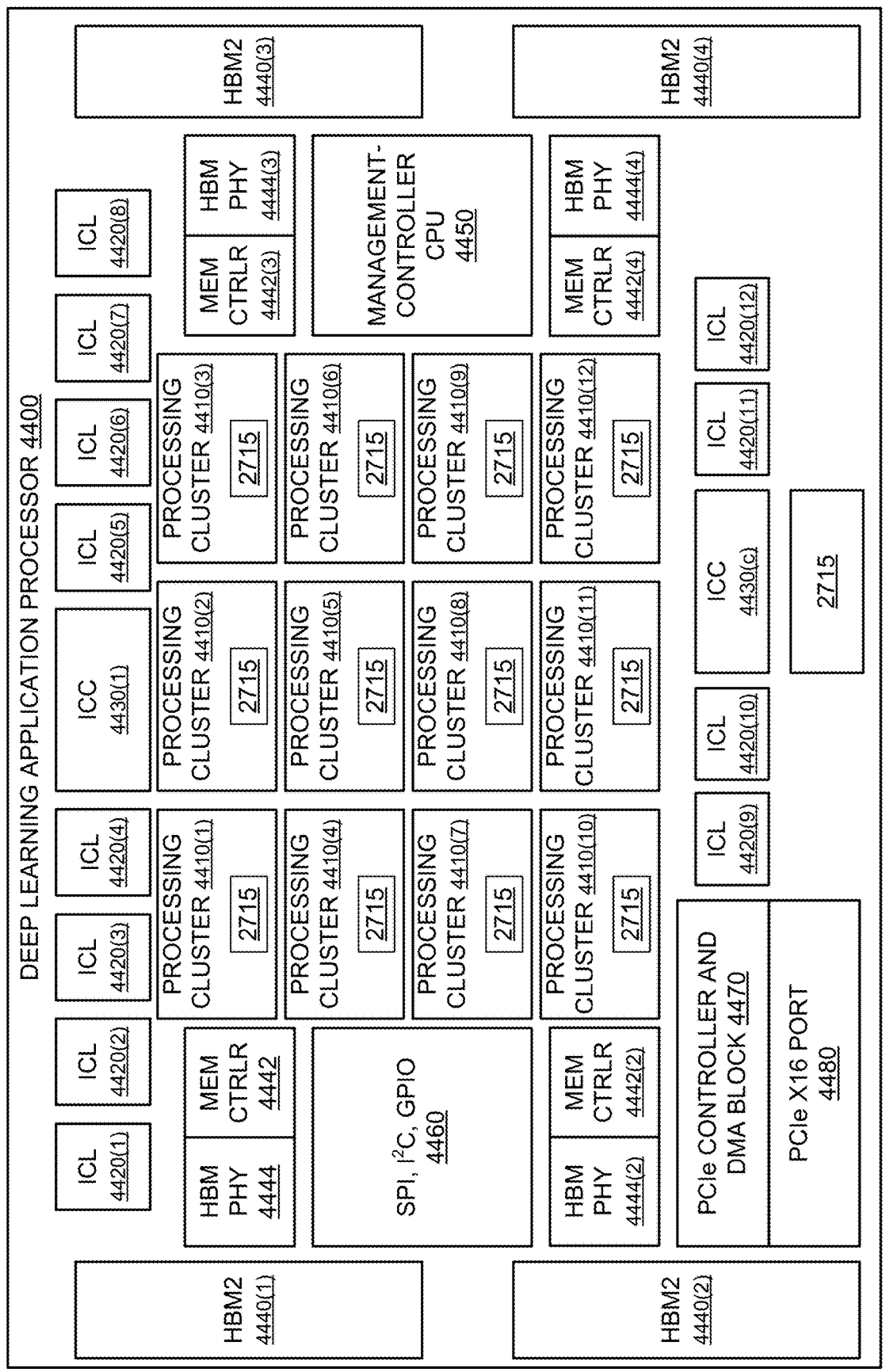
FIG. 44 illustrates a deep learning application processor, according to at least one embodiment.

FIG. 44 illustrates a deep learning application processor 4400, according to at least one embodiment. In at least one embodiment, deep learning application processor 4400 uses instructions that, if executed by deep learning application processor 4400, cause deep learning application processor 4400 to perform some or all of processes and techniques described throughout this disclosure. In at least one embodiment, deep learning application processor 4400 is an application-specific integrated circuit (ASIC). In at least one embodiment, application processor 4400 performs matrix multiply operations either "hard-wired" into hardware as a result of performing one or more instructions or both. In at least one embodiment, deep learning application processor 4400 includes, without limitation, processing clusters 4410(1)-4410(12), Inter-Chip Links ("ICLs") 4420(1)-4420(12), Inter-Chip Controllers ("ICCs") 4430(1)-4430(2), high-bandwidth memory second generation ("HBM2") 4440(1)-4440(4), memory controllers ("Mem Ctrlrs") 4442(1)-4442(4), high bandwidth memory physical layer ("HBM PHY") 4444(1)-4444(4), a management-controller central processing unit ("management-controller CPU") 4450, a Serial Peripheral Interface, Inter-Integrated Circuit, and General Purpose Input/Output block ("SPI, I$^2$C, GPIO") 4460, a peripheral component interconnect express controller and direct memory access block ("PCIe Controller and DMA") 4470, and a sixteen-lane peripheral component interconnect express port ("PCI Express×16") 4480.

In at least one embodiment, processing clusters 4410 may perform deep learning operations, including inference or prediction operations based on weight parameters calculated one or more training techniques, including those described herein. In at least one embodiment, each processing cluster 4410 may include, without limitation, any number and type of processors. In at least one embodiment, deep learning application processor 4400 may include any number and type of processing clusters 4400. In at least one embodiment, Inter-Chip Links 4420 are bi-directional. In at least one embodiment, Inter-Chip Links 4420 and Inter-Chip Controllers 4430 enable multiple deep learning application processors 4400 to exchange information, including activation information resulting from performing one or more machine learning algorithms embodied in one or more neural networks. In at least one embodiment, deep learning application processor 4400 may include any number (including zero) and type of ICLs 4420 and ICCs 4430.

In at least one embodiment, HBM2s 4440 provide a total of 32 Gigabytes (GB) of memory. In at least one embodiment, HBM2 4440(i) is associated with both memory controller 4442(i) and HBM PHY 4444(i) where "i" is an arbitrary integer. In at least one embodiment, any number of HBM2s 4440 may provide any type and total amount of high bandwidth memory and may be associated with any number (including zero) and type of memory controllers 4442 and HBM PHYs 4444. In at least one embodiment, SPI, I²C, GPIO 4460, PCIe Controller and DMA 4470, and/or PCIe 4480 may be replaced with any number and type of blocks that enable any number and type of communication standards in any technically feasible fashion.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, deep learning application processor is used to train a machine learning model, such as a neural network, to predict or infer information provided to deep learning application processor 4400. In at least one embodiment, deep learning application processor 4400 is used to infer or predict information based on a trained machine learning model (e.g., neural network) that has been trained by another processor or system or by deep learning application processor 4400. In at least one embodiment, processor 4400 may be used to perform one or more neural network use cases described herein.

Figure 45:
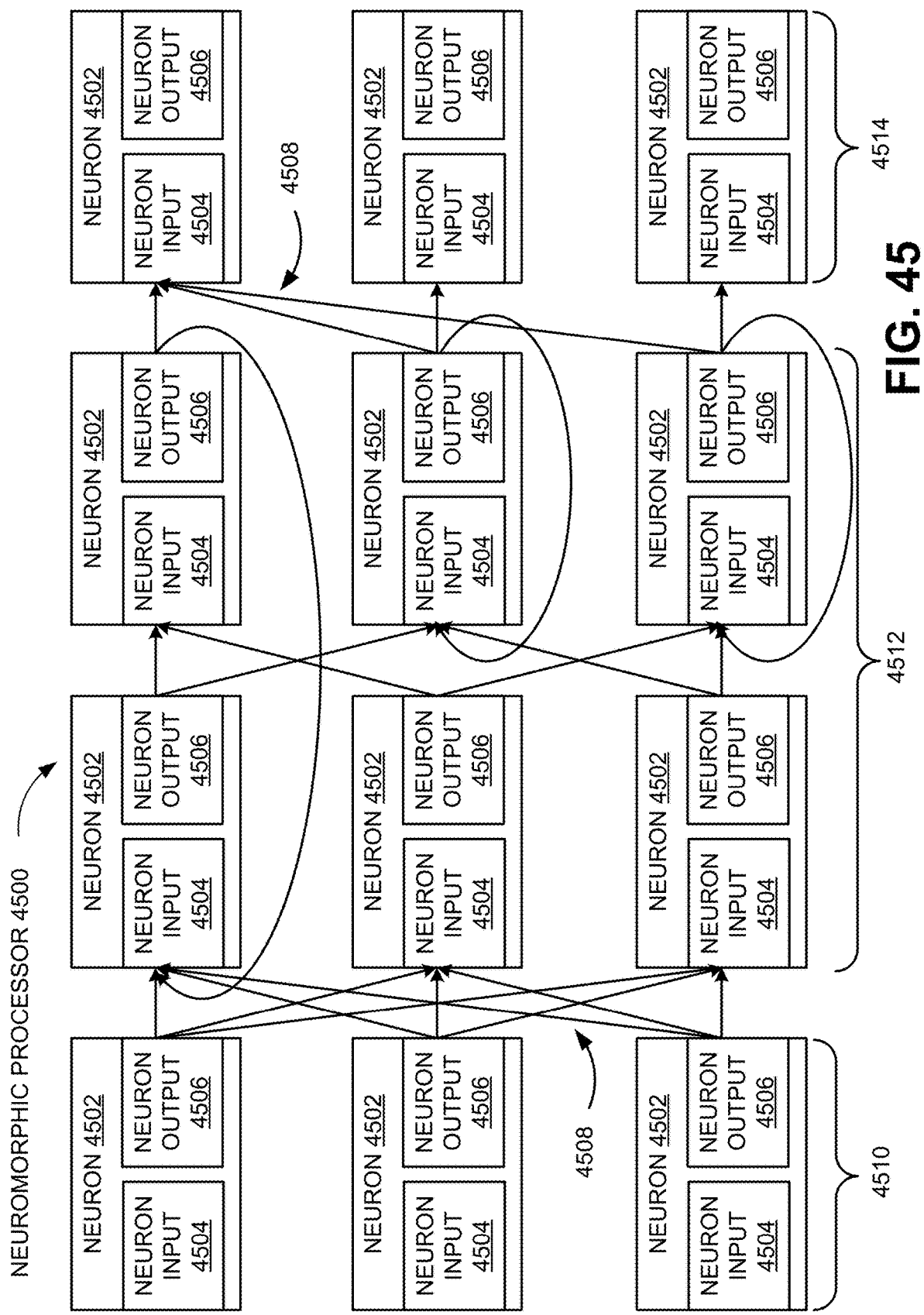
FIG. 45 is a block diagram illustrating an example neuromorphic processor, according to at least one embodiment.

FIG. 45 is a block diagram of a neuromorphic processor 4500, according to at least one embodiment. In at least one embodiment, neuromorphic processor 4500 may receive one or more inputs from sources external to neuromorphic processor 4500. In at least one embodiment, these inputs may be transmitted to one or more neurons 4502 within neuromorphic processor 4500. In at least one embodiment, neurons 4502 and components thereof may be implemented using circuitry or logic, including one or more arithmetic logic units (ALUs). In at least one embodiment, neuromorphic processor 4500 may include, without limitation, thousands or millions of instances of neurons 4502, but any suitable number of neurons 4502 may be used. In at least one embodiment, each instance of neuron 4502 may include a neuron input 4504 and a neuron output 4506. In at least one embodiment, neurons 4502 may generate outputs that may be transmitted to inputs of other instances of neurons 4502. For example, in at least one embodiment, neuron inputs 4504 and neuron outputs 4506 may be interconnected via synapses 4508.

In at least one embodiment, neurons 4502 and synapses 4508 may be interconnected such that neuromorphic processor 4500 operates to process or analyze information received by neuromorphic processor 4500. In at least one embodiment, neurons 4502 may transmit an output pulse (or "fire" or "spike") when inputs received through neuron input 4504 exceed a threshold. In at least one embodiment, neurons 4502 may sum or integrate signals received at neuron inputs 4504. For example, in at least one embodiment, neurons 4502 may be implemented as leaky integrate-and-fire neurons, wherein if a sum (referred to as a "membrane potential") exceeds a threshold value, neuron 4502 may generate an output (or "fire") using a transfer function such as a sigmoid or threshold function. In at least one embodiment, a leaky integrate-and-fire neuron may sum signals received at neuron inputs 4504 into a membrane potential and may also apply a decay factor (or leak) to reduce a membrane potential. In at least one embodiment, a leaky integrate-and-fire neuron may fire if multiple input signals are received at neuron inputs 4504 rapidly enough to exceed a threshold value (such as before a membrane potential decays too low to fire). In at least one embodiment, neurons 4502 may be implemented using circuits or logic that receive inputs, integrate inputs into a membrane potential, and decay a membrane potential. In at least one embodiment, inputs may be averaged, or any other suitable transfer function may be used. Furthermore, in at least one embodiment, neurons 4502 may include, without limitation, comparator circuits or logic that generate an output spike at neuron output 4506 when result of applying a transfer function to neuron input 4504 exceeds a threshold. In at least one embodiment, once neuron 4502 fires, it may disregard previously received input information by, for example, resetting a membrane potential to 0 or another suitable default value. In at least one embodiment, once membrane potential is reset to 0, neuron 4502 may resume normal operation after a suitable period of time (or refractory period).

In at least one embodiment, neurons 4502 may be interconnected through synapses 4508. In at least one embodiment, synapses 4508 may operate to transmit signals from an output of a first neuron 4502 to an input of a second neuron 4502. In at least one embodiment, neurons 4502 may transmit information over more than one instance of synapse 4508. In at least one embodiment, one or more instances of neuron output 4506 may be connected, via an instance of synapse 4508, to an instance of neuron input 4504 in same neuron 4502. In at least one embodiment, an instance of neuron 4502 generating an output to be transmitted over an instance of synapse 4508 may be referred to as a "pre-synaptic neuron" with respect to that instance of synapse 4508. In at least one embodiment, an instance of neuron 4502 receiving an input transmitted over an instance of synapse 4508 may be referred to as a "post-synaptic neuron" with respect to that instance of synapse 4508. Because an instance of neuron 4502 may receive inputs from one or more instances of synapse 4508, and may also transmit outputs over one or more instances of synapse 4508, a single instance of neuron 4502 may therefore be both a "pre-synaptic neuron" and "post-synaptic neuron," with respect to various instances of synapses 4508, in at least one embodiment.

In at least one embodiment, neurons 4502 may be organized into one or more layers. In at least one embodiment, each instance of neuron 4502 may have one neuron output 4506 that may fan out through one or more synapses 4508 to one or more neuron inputs 4504. In at least one embodiment, neuron outputs 4506 of neurons 4502 in a first layer 4510 may be connected to neuron inputs 4504 of neurons 4502 in a second layer 4512. In at least one embodiment, layer 4510 may be referred to as a "feed-forward layer." In at least one embodiment, each instance of neuron 4502 in an instance of first layer 4510 may fan out to each instance of neuron 4502 in second layer 4512. In at least one embodiment, first layer 4510 may be referred to as a "fully connected feed-forward layer." In at least one embodiment, each instance of neuron 4502 in an instance of second layer 4512 may fan out to fewer than all instances of neuron 4502 in a third layer 4514. In at least one embodiment, second layer 4512 may be referred to as a "sparsely connected feed-forward layer." In at least one embodiment, neurons 4502 in second layer 4512 may fan out to neurons 4502 in multiple other layers, including to neurons 4502 also in second layer 4512. In at least one embodiment, second layer 4512 may be referred to as a "recurrent layer." In at least one embodiment, neuromorphic processor 4500 may include, without limitation, any suitable combination of recurrent layers and feed-forward layers, including, without limitation, both sparsely connected feed-forward layers and fully connected feed-forward layers.

In at least one embodiment, neuromorphic processor 4500 may include, without limitation, a reconfigurable interconnect architecture or dedicated hard-wired interconnects to connect synapse 4508 to neurons 4502. In at least one embodiment, neuromorphic processor 4500 may include, without limitation, circuitry or logic that allows synapses to be allocated to different neurons 4502 as needed based on neural network topology and neuron fan-in/out. For example, in at least one embodiment, synapses 4508 may be connected to neurons 4502 using an interconnect fabric, such as network-on-chip, or with dedicated connections. In at least one embodiment, synapse interconnections and components thereof may be implemented using circuitry or logic.

Figure 46:
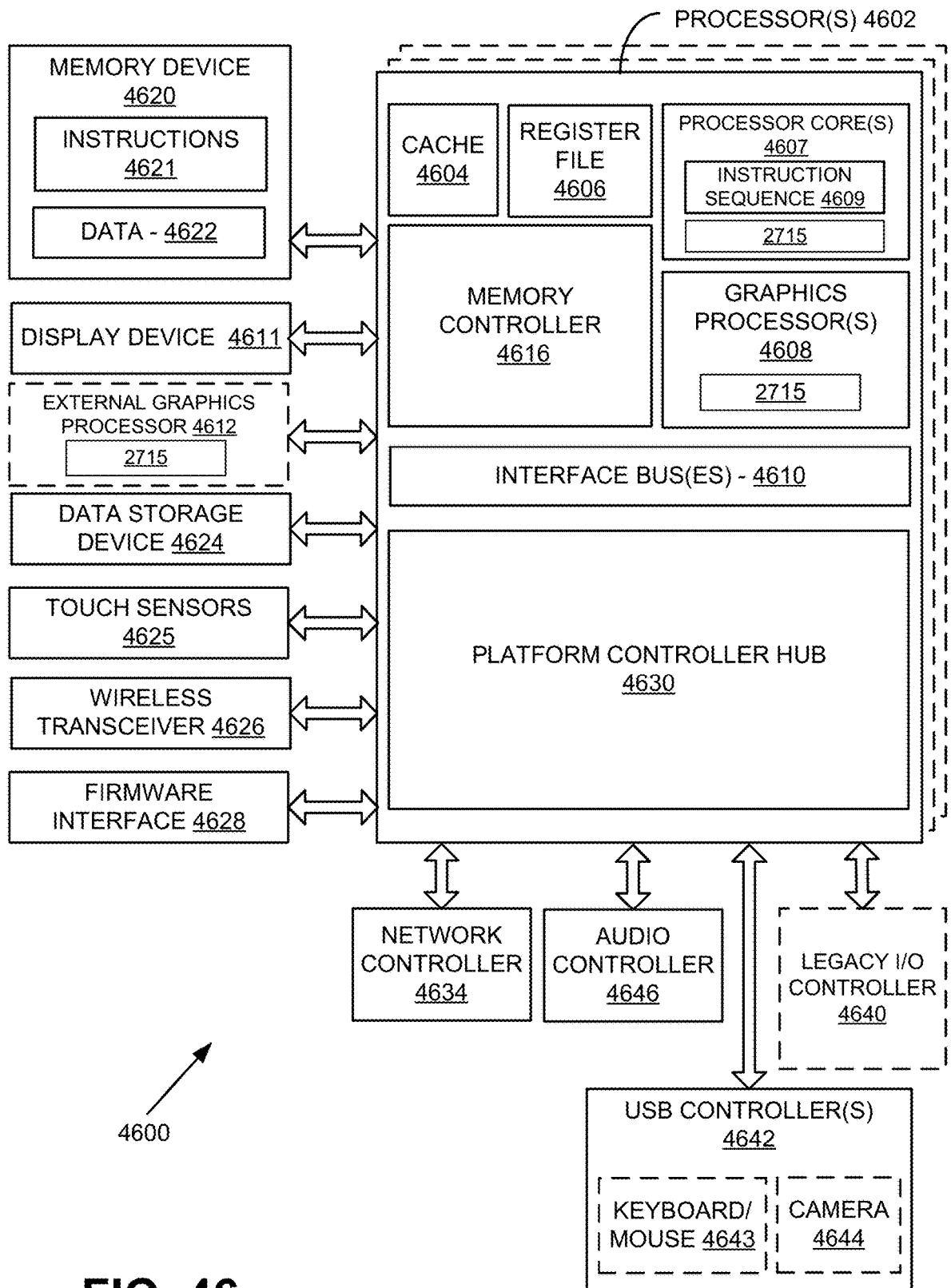
FIG. 46 illustrates at least portions of a graphics processor, according to one or more embodiments.

FIG. 46 is a block diagram of a processing system, according to at least one embodiment. In at least one embodiment, system 4600 includes one or more processors 4602 and one or more graphics processors 4608, and may be a single processor desktop system, a multiprocessor workstation system, or a server system having a large number of processors 4602 or processor cores 4607. In at least one embodiment, system 4600 is a processing platform incorporated within a system-on-a-chip (SoC) integrated circuit for use in mobile, handheld, or embedded devices.

In at least one embodiment, system 4600 can include, or be incorporated within a server-based gaming platform, a game console, including a game and media console, a mobile gaming console, a handheld game console, or an online game console. In at least one embodiment, system 4600 is a mobile phone, a smart phone, a tablet computing device or a mobile Internet device. In at least one embodiment, processing system 4600 can also include, couple with, or be integrated within a wearable device, such as a smart watch wearable device, a smart eyewear device, an augmented reality device, or a virtual reality device. In at least one embodiment, processing system 4600 is a television or set top box device having one or more processors 4602 and a graphical interface generated by one or more graphics processors 4608.

In at least one embodiment, one or more processors 4602 each include one or more processor cores 4607 to process instructions which, when executed, perform operations for system and user software. In at least one embodiment, each of one or more processor cores 4607 is configured to process a specific instruction sequence 4609. In at least one embodiment, instruction sequence 4609 may facilitate Complex Instruction Set Computing (CISC), Reduced Instruction Set Computing (RISC), or computing via a Very Long Instruction Word (VLIW). In at least one embodiment, processor cores 4607 may each process a different instruction sequence 4609, which may include instructions to facilitate emulation of other instruction sequences. In at least one embodiment, processor core 4607 may also include other processing devices, such a Digital Signal Processor (DSP).

In at least one embodiment, processor 4602 includes a cache memory 4604. In at least one embodiment, processor 4602 can have a single internal cache or multiple levels of internal cache. In at least one embodiment, cache memory is shared among various components of processor 4602. In at least one embodiment, processor 4602 also uses an external cache (e.g., a Level-3 (L3) cache or Last Level Cache (LLC)) (not shown), which may be shared among processor cores 4607 using known cache coherency techniques. In at least one embodiment, a register file 4606 is additionally included in processor 4602, which may include different types of registers for storing different types of data (e.g., integer registers, floating point registers, status registers, and an instruction pointer register). In at least one embodiment, register file 4606 may include general-purpose registers or other registers.

In at least one embodiment, one or more processor(s) 4602 are coupled with one or more interface bus(es) 4610 to transmit communication signals such as address, data, or control signals between processor 4602 and other components in system 4600. In at least one embodiment, interface bus 4610 can be a processor bus, such as a version of a Direct Media Interface (DMI) bus. In at least one embodiment, interface bus 4610 is not limited to a DMI bus, and may include one or more Peripheral Component Interconnect buses (e.g., PCI, PCI Express), memory busses, or other types of interface busses. In at least one embodiment processor(s) 4602 include an integrated memory controller 4616 and a platform controller hub 4630. In at least one embodiment, memory controller 4616 facilitates communication between a memory device and other components of system 4600, while platform controller hub (PCH) 4630 provides connections to I/O devices via a local I/O bus.

In at least one embodiment, a memory device 4620 can be a dynamic random access memory (DRAM) device, a static random access memory (SRAM) device, flash memory device, phase-change memory device, or some other memory device having suitable performance to serve as process memory. In at least one embodiment, memory device 4620 can operate as system memory for system 4600, to store data 4622 and instructions 4621 for use when one or more processors 4602 executes an application or process. In at least one embodiment, memory controller 4616 also couples with an optional external graphics processor 4612, which may communicate with one or more graphics processors 4608 in processors 4602 to perform graphics and media operations. In at least one embodiment, a display device 4611 can connect to processor(s) 4602. In at least one embodiment, display device 4611 can include one or more of an internal display device, as in a mobile electronic device or a laptop device, or an external display device attached via a display interface (e.g., DisplayPort, etc.). In at least one embodiment, display device 4611 can include a head mounted display (HMD) such as a stereoscopic display device for use in virtual reality (VR) applications or augmented reality (AR) applications.

In at least one embodiment, platform controller hub 4630 enables peripherals to connect to memory device 4620 and processor 4602 via a high-speed I/O bus. In at least one embodiment, I/O peripherals include, but are not limited to, an audio controller 4646, a network controller 4634, a firmware interface 4628, a wireless transceiver 4626, touch sensors 4625, a data storage device 4624 (e.g., hard disk drive, flash memory, etc.). In at least one embodiment, data storage device 4624 can connect via a storage interface (e.g., SATA) or via a peripheral bus, such as a Peripheral Component Interconnect bus (e.g., PCI, PCI Express). In at least one embodiment, touch sensors 4625 can include touch screen sensors, pressure sensors, or fingerprint sensors. In at least one embodiment, wireless transceiver 4626 can be a Wi-Fi transceiver, a Bluetooth transceiver, or a mobile network transceiver such as a 3G, 4G, or Long Term Evolution (LTE) transceiver. In at least one embodiment, firmware interface 4628 enables communication with system firmware, and can be, for example, a unified extensible firmware interface (UEFI). In at least one embodiment, network controller 4634 can enable a network connection to a wired network. In at least one embodiment, a high-performance network controller (not shown) couples with interface bus 4610. In at least one embodiment, audio controller 4646 is a multi-channel high definition audio controller. In at least one embodiment, system 4600 includes an optional legacy I/O controller 4640 for coupling legacy (e.g., Personal System 2 (PS/2)) devices to system 4600. In at least one embodiment, platform controller hub 4630 can also connect to one or more Universal Serial Bus (USB) controllers 4642 connect input devices, such as keyboard and mouse 4643 combinations, a camera 4644, or other USB input devices.

In at least one embodiment, an instance of memory controller 4616 and platform controller hub 4630 may be integrated into a discreet external graphics processor, such as external graphics processor 4612. In at least one embodiment, platform controller hub 4630 and/or memory controller 4616 may be external to one or more processor(s) 4602. For example, in at least one embodiment, system 4600 can include an external memory controller 4616 and platform controller hub 4630, which may be configured as a memory controller hub and peripheral controller hub within a system chipset that is in communication with processor(s) 4602.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment portions or all of inference and/or training logic 2715 may be incorporated into graphics processor 4600. For example, in at least one embodiment, training and/or inferencing techniques described herein may use one or more of ALUs embodied in a 3D pipeline. Moreover, in at least one embodiment, inferencing and/or training operations described herein may be done using logic other than logic illustrated in FIG. 27A or 27B. In at least one embodiment, weight parameters may be stored in on-chip or off-chip memory and/or registers (shown or not shown) that configure ALUs of graphics processor 4600 to perform one or more machine learning algorithms, neural network architectures, use cases, or training techniques described herein.

Figure 47:
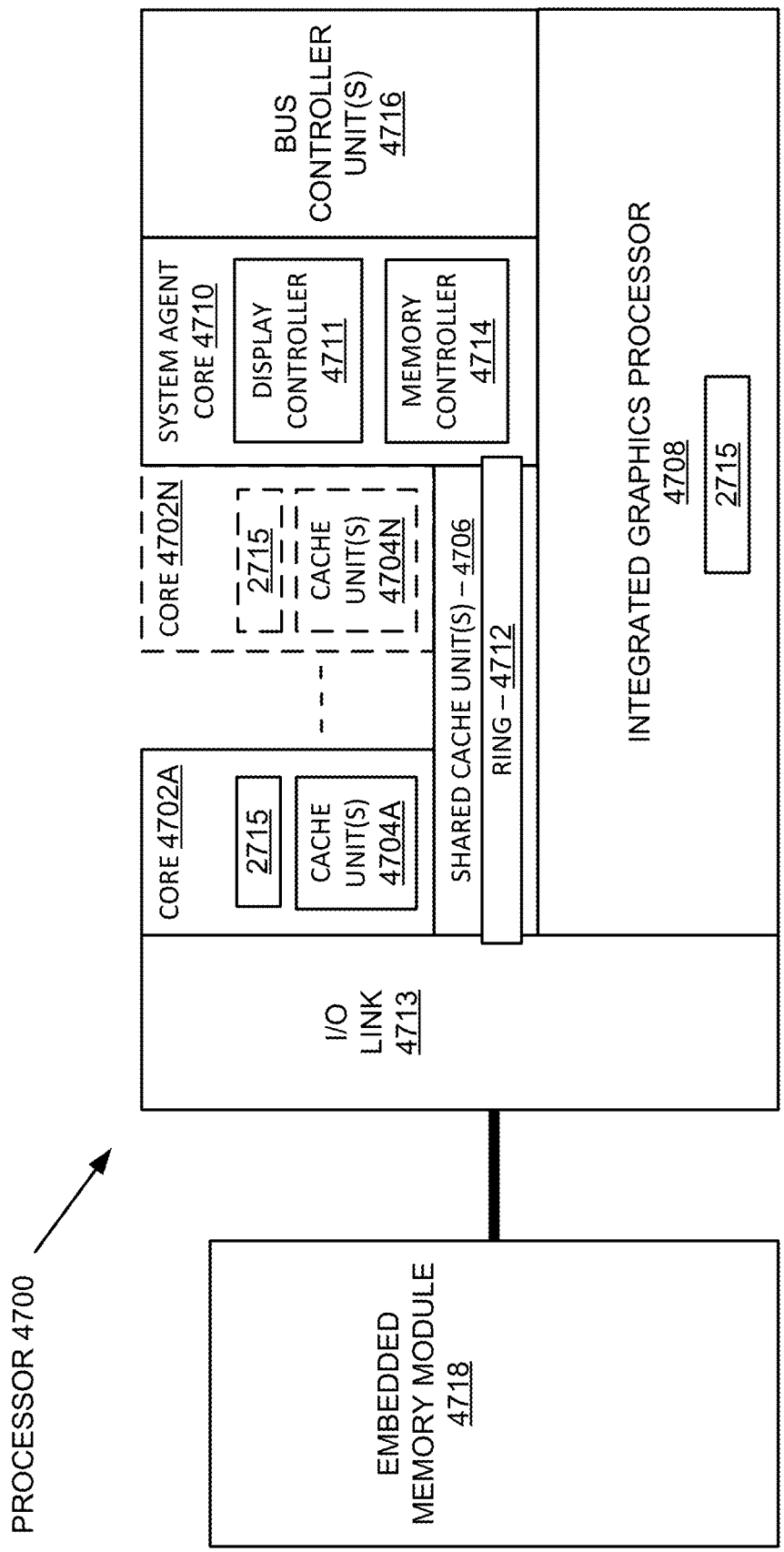
FIG. 47 illustrates at least portions of a graphics processor, according to one or more embodiments.

FIG. 47 is a block diagram of a processor 4700 having one or more processor cores 4702A-4702N, an integrated memory controller 4714, and an integrated graphics processor 4708, according to at least one embodiment. In at least one embodiment, processor 4700 can include additional cores up to and including additional core 4702N represented by dashed lined boxes. In at least one embodiment, each of processor cores 4702A-4702N includes one or more internal cache units 4704A-4704N. In at least one embodiment, each processor core also has access to one or more shared cached units 4706.

In at least one embodiment, internal cache units 4704A-4704N and shared cache units 4706 represent a cache memory hierarchy within processor 4700. In at least one embodiment, cache memory units 4704A-4704N may include at least one level of instruction and data cache within each processor core and one or more levels of shared mid-level cache, such as a Level 2 (L2), Level 3 (L3), Level 4 (L4), or other levels of cache, where a highest level of cache before external memory is classified as an LLC. In at least one embodiment, cache coherency logic maintains coherency between various cache units 4706 and 4704A-4704N.

In at least one embodiment, processor 4700 may also include a set of one or more bus controller units 4716 and a system agent core 4710. In at least one embodiment, bus controller units 4716 manage a set of peripheral buses, such as one or more PCI or PCI express busses. In at least one embodiment, system agent core 4710 provides management functionality for various processor components. In at least one embodiment, system agent core 4710 includes one or more integrated memory controllers 4714 to manage access to various external memory devices (not shown).

In at least one embodiment, one or more of processor cores 4702A-4702N include support for simultaneous multithreading. In at least one embodiment, system agent core 4710 includes components for coordinating and operating cores 4702A-4702N during multi-threaded processing. In at least one embodiment, system agent core 4710 may additionally include a power control unit (PCU), which includes logic and components to regulate one or more power states of processor cores 4702A-4702N and graphics processor 4708.

In at least one embodiment, processor 4700 additionally includes graphics processor 4708 to execute graphics processing operations. In at least one embodiment, graphics processor 4708 couples with shared cache units 4706, and system agent core 4710, including one or more integrated memory controllers 4714. In at least one embodiment, system agent core 4710 also includes a display controller 4711 to drive graphics processor output to one or more coupled displays. In at least one embodiment, display controller 4711 may also be a separate module coupled with graphics processor 4708 via at least one interconnect, or may be integrated within graphics processor 4708.

In at least one embodiment, a ring-based interconnect unit 4712 is used to couple internal components of processor 4700. In at least one embodiment, an alternative interconnect unit may be used, such as a point-to-point interconnect, a switched interconnect, or other techniques. In at least one embodiment, graphics processor 4708 couples with ring interconnect 4712 via an I/O link 4713.

In at least one embodiment, I/O link 4713 represents at least one of multiple varieties of I/O interconnects, including an on package I/O interconnect which facilitates communication between various processor components and a high-performance embedded memory module 4718, such as an eDRAM module. In at least one embodiment, each of processor cores 4702A-4702N and graphics processor 4708 use embedded memory module 4718 as a shared Last Level Cache.

In at least one embodiment, processor cores 4702A-4702N are homogeneous cores executing a common instruction set architecture. In at least one embodiment, processor cores 4702A-4702N are heterogeneous in terms of instruction set architecture (ISA), where one or more of processor cores 4702A-4702N execute a common instruction set, while one or more other cores of processor cores 4702A-4702N executes a subset of a common instruction set or a different instruction set. In at least one embodiment, processor cores 4702A-4702N are heterogeneous in terms of microarchitecture, where one or more cores having a relatively higher power consumption couple with one or more power cores having a lower power consumption. In at least one embodiment, processor 4700 can be implemented on one or more chips or as an SoC integrated circuit.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment portions or all of inference and/or training logic 2715 may be incorporated into graphics processor 4710. For example, in at least one embodiment, training and/or inferencing techniques described herein may use one or more of ALUs embodied in a 3D pipeline, graphics core(s) 4702, shared function logic, or other logic in FIG. 47. Moreover, in at least one embodiment, inferencing and/or training operations described herein may be done using logic other than logic illustrated in FIG. 27A or 27B. In at least one embodiment, weight parameters may be stored in on-chip or off-chip memory and/or registers (shown or not shown) that configure ALUs of processor 4700 to perform one or more machine learning algorithms, neural network architectures, use cases, or training techniques described herein.

Figure 48:
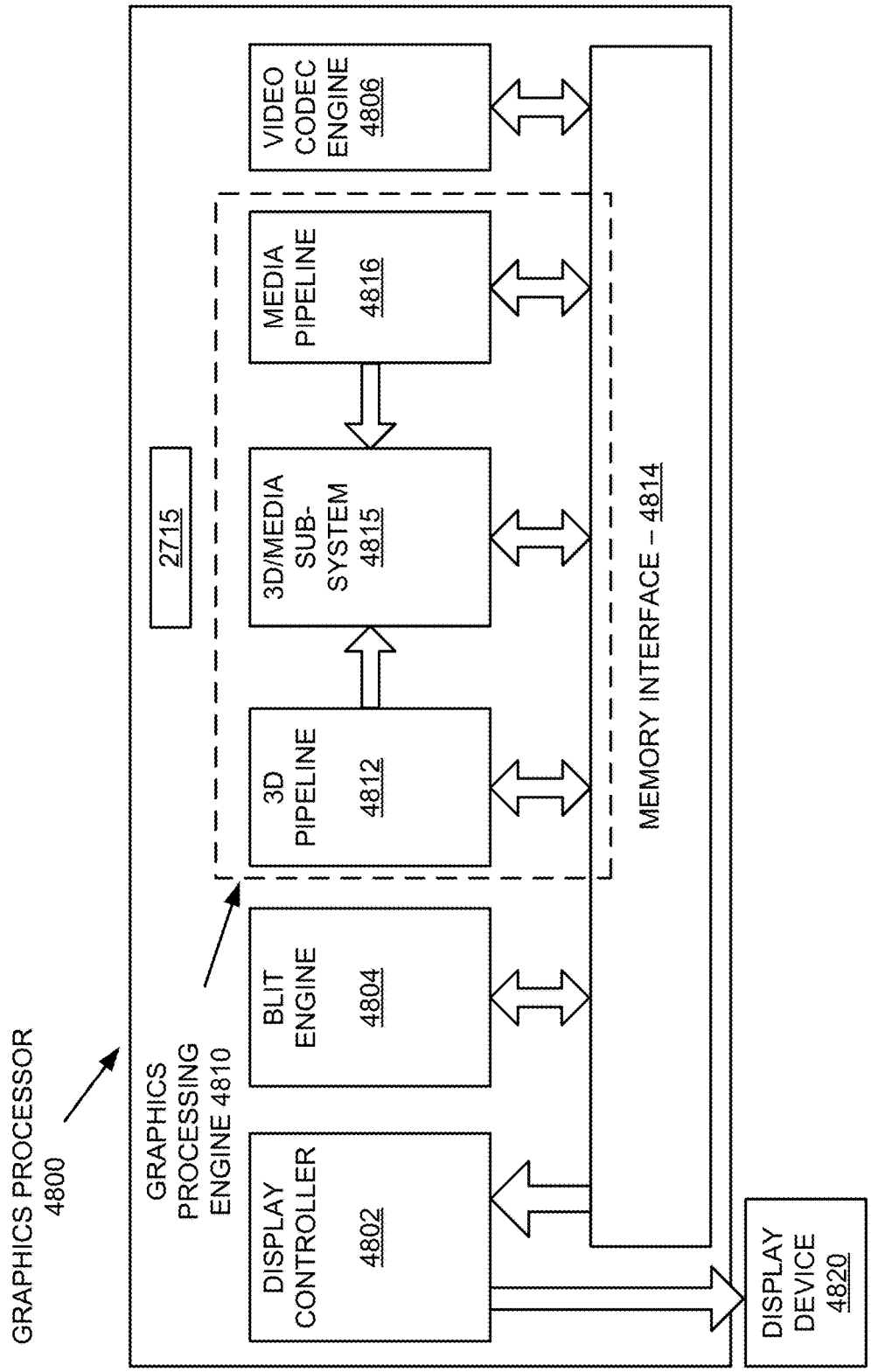
FIG. 48 illustrates at least portions of a graphics processor, according to one or more embodiments.

FIG. 48 is a block diagram of a graphics processor 4800, which may be a discrete graphics processing unit, or may be a graphics processor integrated with a plurality of processing cores. In at least one embodiment, graphics processor 4800 communicates via a memory mapped I/O interface to registers on graphics processor 4800 and with commands placed into memory. In at least one embodiment, graphics processor 4800 includes a memory interface 4814 to access memory. In at least one embodiment, memory interface 4814 is an interface to local memory, one or more internal caches, one or more shared external caches, and/or to system memory.

In at least one embodiment, graphics processor 4800 also includes a display controller 4802 to drive display output data to a display device 4820. In at least one embodiment, display controller 4802 includes hardware for one or more overlay planes for display device 4820 and composition of multiple layers of video or user interface elements. In at least one embodiment, display device 4820 can be an internal or external display device. In at least one embodiment, display device 4820 is a head mounted display device, such as a virtual reality (VR) display device or an augmented reality (AR) display device. In at least one embodiment, graphics processor 4800 includes a video codec engine 4806 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In at least one embodiment, graphics processor 4800 includes a block image transfer (BLIT) engine 4804 to perform two-dimensional (2D) rasterizer operations including, for example, bit-boundary block transfers. However, in at least one embodiment, 2D graphics operations are performed using one or more components of a graphics processing engine (GPE) 4810. In at least one embodiment, GPE 4810 is a compute engine for performing graphics operations, including three-dimensional (3D) graphics operations and media operations.

In at least one embodiment, GPE 4810 includes a 3D pipeline 4812 for performing 3D operations, such as rendering three-dimensional images and scenes using processing functions that act upon 3D primitive shapes (e.g., rectangle, triangle, etc.). In at least one embodiment, 3D pipeline 4812 includes programmable and fixed function elements that perform various tasks and/or spawn execution threads to a 3D/Media sub-system 4815. While 3D pipeline 4812 can be used to perform media operations, in at least one embodiment, GPE 4810 also includes a media pipeline 4816 that is used to perform media operations, such as video post-processing and image enhancement.

In at least one embodiment, media pipeline 4816 includes fixed function or programmable logic units to perform one or more specialized media operations, such as video decode acceleration, video de-interlacing, and video encode acceleration in place of, or on behalf of, video codec engine 4806. In at least one embodiment, media pipeline 4816 additionally includes a thread spawning unit to spawn threads for execution on 3D/Media sub-system 4815. In at least one embodiment, spawned threads perform computations for media operations on one or more graphics execution units included in 3D/Media sub-system 4815.

In at least one embodiment, 3D/Media subsystem 4815 includes logic for executing threads spawned by 3D pipeline 4812 and media pipeline 4816. In at least one embodiment, 3D pipeline 4812 and media pipeline 4816 send thread execution requests to 3D/Media subsystem 4815, which includes thread dispatch logic for arbitrating and dispatching various requests to available thread execution resources. In at least one embodiment, execution resources include an array of graphics execution units to process 3D and media threads. In at least one embodiment, 3D/Media subsystem 4815 includes one or more internal caches for thread instructions and data. In at least one embodiment, subsystem 4815 also includes shared memory, including registers and addressable memory, to share data between threads and to store output data.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment portions or all of inference and/or training logic 2715 may be incorporated into graphics processor 4800. For example, in at least one embodiment, training and/or inferencing techniques described herein may use one or more of ALUs embodied in 3D pipeline 4812. Moreover, in at least one embodiment, inferencing and/or training operations described herein may be done using logic other than logic illustrated in FIG. 27A or 27B. In at least one embodiment, weight parameters may be stored in on-chip or off-chip memory and/or registers (shown or not shown) that configure ALUs of graphics processor 4800 to perform one or more machine learning algorithms, neural network architectures, use cases, or training techniques described herein.

Figure 49:
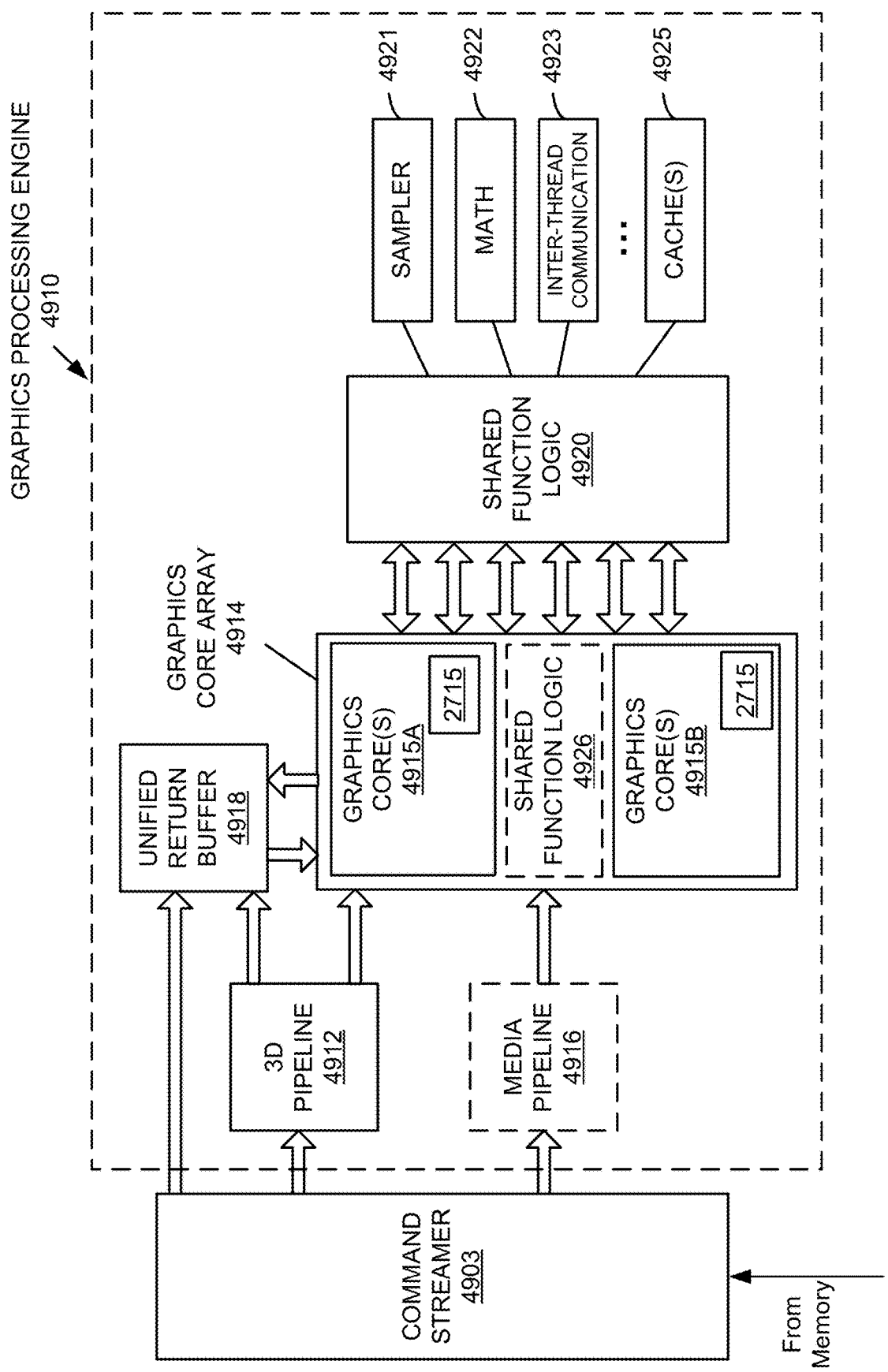
FIG. 49 is a block diagram of a graphics processing engine of a graphics processor in accordance with at least one embodiment.

FIG. 49 is a block diagram of a graphics processing engine 4910 of a graphics processor in accordance with at least one embodiment. In at least one embodiment, graphics processing engine (GPE) 4910 is a version of GPE 4810 shown in FIG. 48. In at least one embodiment, a media pipeline 4916 is optional and may not be explicitly included within GPE 4910. In at least one embodiment, a separate media and/or image processor is coupled to GPE 4910.

In at least one embodiment, GPE 4910 is coupled to or includes a command streamer 4903, which provides a command stream to a 3D pipeline 4912 and/or media pipeline 4916. In at least one embodiment, command streamer 4903 is coupled to memory, which can be system memory, or one or more of internal cache memory and shared cache memory. In at least one embodiment, command streamer 4903 receives commands from memory and sends commands to 3D pipeline 4912 and/or media pipeline 4916. In at least one embodiment, commands are instructions, primitives, or micro-operations fetched from a ring buffer, which stores commands for 3D pipeline 4912 and media pipeline 4916. In at least one embodiment, a ring buffer can additionally include batch command buffers storing batches of multiple commands. In at least one embodiment, commands for 3D pipeline 4912 can also include references to data stored in memory, such as, but not limited to, vertex and geometry data for 3D pipeline 4912 and/or image data and memory objects for media pipeline 4916. In at least one embodiment, 3D pipeline 4912 and media pipeline 4916 process commands and data by performing operations or by dispatching one or more execution threads to a graphics core array 4914. In at least one embodiment, graphics core array 4914 includes one or more blocks of graphics cores (e.g., graphics core(s) 4915A, graphics core(s) 4915B), each block including one or more graphics cores. In at least one embodiment, each graphics core includes a set of graphics execution resources that includes general-purpose and graphics specific execution logic to perform graphics and compute operations, as well as fixed function texture processing and/or machine learning and artificial intelligence acceleration logic, including inference and/or training logic 2715 in FIG. 27A and FIG. 27B.

In at least one embodiment, 3D pipeline 4912 includes fixed function and programmable logic to process one or more shader programs, such as vertex shaders, geometry shaders, pixel shaders, fragment shaders, compute shaders, or other shader programs, by processing instructions and dispatching execution threads to graphics core array 4914. In at least one embodiment, graphics core array 4914 provides a unified block of execution resources for use in processing shader programs. In at least one embodiment, a multi-purpose execution logic (e.g., execution units) within graphics core(s) 4915A-4915B of graphic core array 4914 includes support for various 3D API shader languages and can execute multiple simultaneous execution threads associated with multiple shaders.

In at least one embodiment, graphics core array 4914 also includes execution logic to perform media functions, such as video and/or image processing. In at least one embodiment, execution units additionally include general-purpose logic that is programmable to perform parallel general-purpose computational operations, in addition to graphics processing operations.

In at least one embodiment, output data generated by threads executing on graphics core array 4914 can output data to memory in a unified return buffer (URB) 4918. In at least one embodiment, URB 4918 can store data for multiple threads. In at least one embodiment, URB 4918 may be used to send data between different threads executing on graphics core array 4914. In at least one embodiment, URB 4918 may additionally be used for synchronization between threads on graphics core array 4914 and fixed function logic within shared function logic 4920.

In at least one embodiment, graphics core array 4914 is scalable, such that graphics core array 4914 includes a variable number of graphics cores, each having a variable number of execution units based on a target power and performance level of GPE 4910. In at least one embodiment, execution resources are dynamically scalable, such that execution resources may be enabled or disabled as needed.

In at least one embodiment, graphics core array 4914 is coupled to shared function logic 4920 that includes multiple resources that are shared between graphics cores in graphics core array 4914. In at least one embodiment, shared functions performed by shared function logic 4920 are embodied in hardware logic units that provide specialized supplemental functionality to graphics core array 4914. In at least one embodiment, shared function logic 4920 includes but is not limited to a sampler unit 4921, a math unit 4922, and inter-thread communication (ITC) logic 4923. In at least one embodiment, one or more cache(s) 4925 are included in, or coupled to, shared function logic 4920.

In at least one embodiment, a shared function is used if demand for a specialized function is insufficient for inclusion within graphics core array 4914. In at least one embodiment, a single instantiation of a specialized function is used in shared function logic 4920 and shared among other execution resources within graphics core array 4914. In at least one embodiment, specific shared functions within shared function logic 4920 that are used extensively by graphics core array 4914 may be included within shared function logic 5216 within graphics core array 4914. In at least one embodiment, shared function logic 5216 within graphics core array 4914 can include some or all logic within shared function logic 4920. In at least one embodiment, all logic elements within shared function logic 4920 may be duplicated within shared function logic 4926 of graphics core array 4914. In at least one embodiment, shared function logic 4920 is excluded in favor of shared function logic 4926 within graphics core array 4914.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment portions or all of inference and/or training logic 2715 may be incorporated into graphics processor 4910. For example, in at least one embodiment, training and/or inferencing techniques described herein may use one or more of ALUs embodied in 3D pipeline 4912, graphics core(s) 4915, shared function logic 4926, shared function logic 4920, or other logic in FIG. 49. Moreover, in at least one embodiment, inferencing and/or training operations described herein may be done using logic other than logic illustrated in FIG. 27A or 27B. In at least one embodiment, weight parameters may be stored in on-chip or off-chip memory and/or registers (shown or not shown) that configure ALUs of graphics processor 4910 to perform one or more machine learning algorithms, neural network architectures, use cases, or training techniques described herein.

Figure 50:
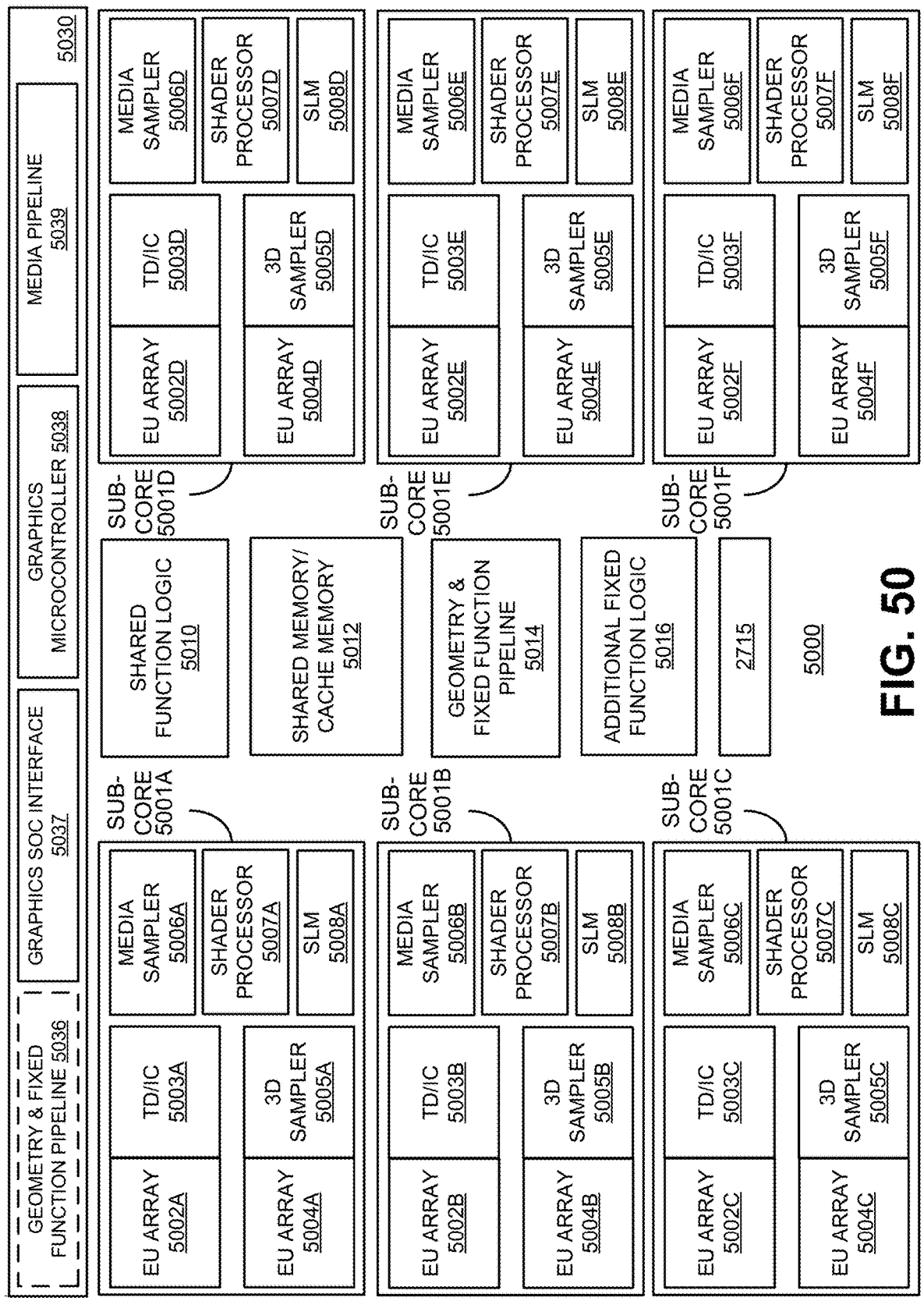
FIG. 50 is a block diagram of at least portions of a graphics processor core, according to at least one embodiment.
Figure 51:
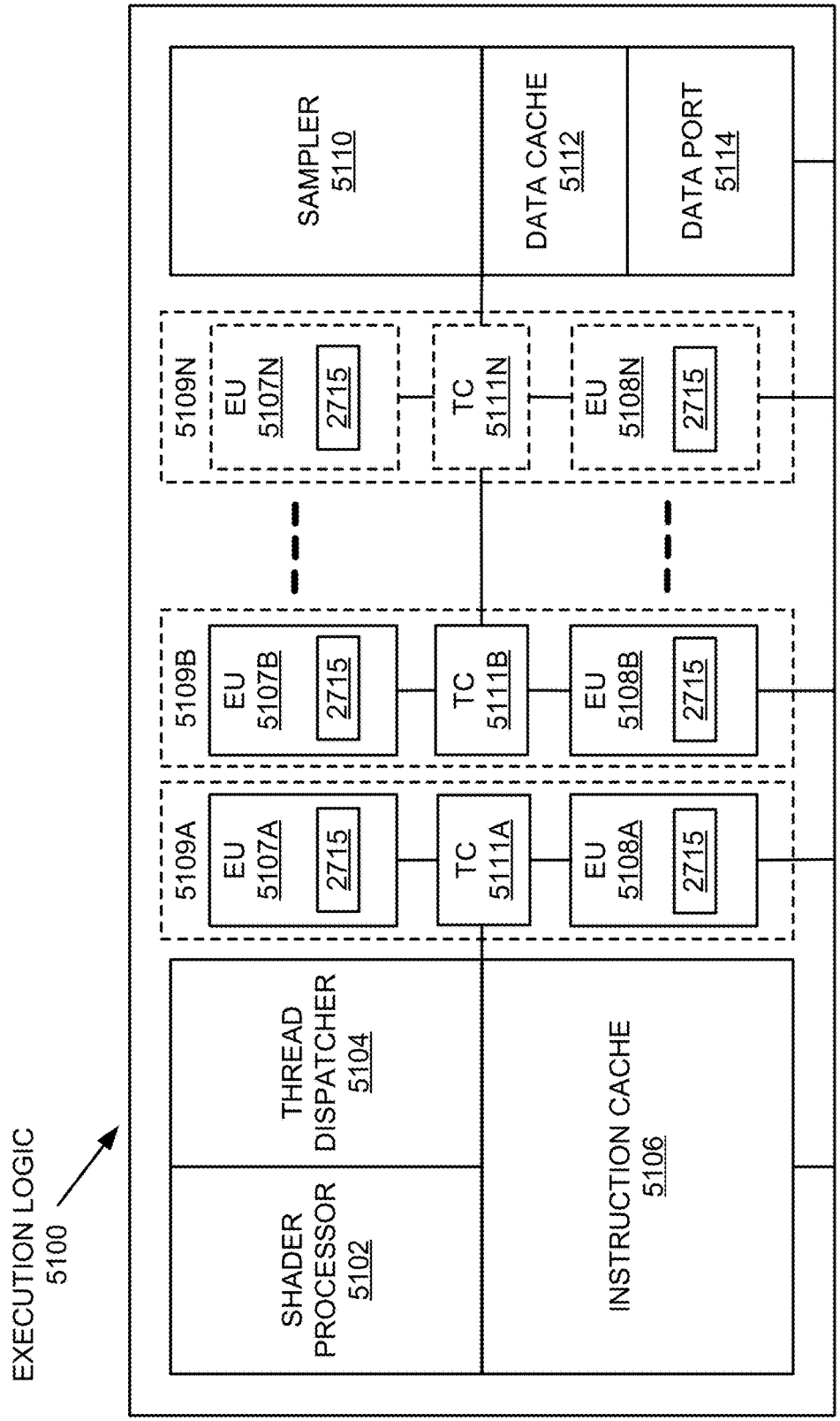
FIGS. 51A and 51B illustrate thread execution logic including an array of processing elements of a graphics processor core according to at least one embodiment.
Figure 51:
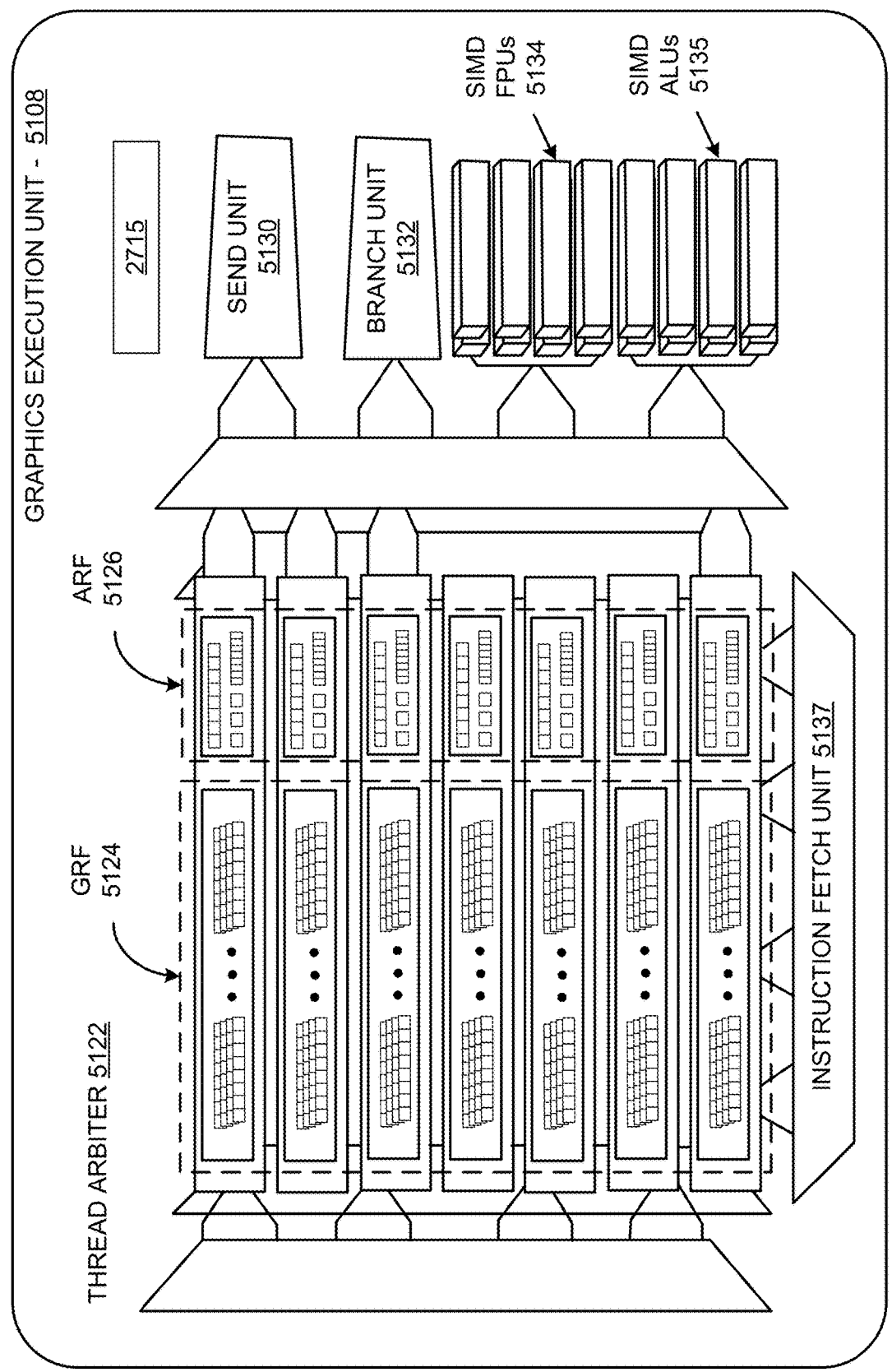

FIG. 50 is a block diagram of hardware logic of a graphics processor core 5000, according to at least one embodiment described herein. In at least one embodiment, graphics processor core 5000 is included within a graphics core array. In at least one embodiment, graphics processor core 5000, sometimes referred to as a core slice, can be one or multiple graphics cores within a modular graphics processor. In at least one embodiment, graphics processor core 5000 is exemplary of one graphics core slice, and a graphics processor as described herein may include multiple graphics core slices based on target power and performance envelopes. In at least one embodiment, each graphics core 5000 can include a fixed function block 5030 coupled with multiple sub-cores 5001A-5001F, also referred to as sub-slices, that include modular blocks of general-purpose and fixed function logic.

In at least one embodiment, fixed function block 5030 includes a geometry and fixed function pipeline 5036 that can be shared by all sub-cores in graphics processor 5000, for example, in lower performance and/or lower power graphics processor implementations. In at least one embodiment, geometry and fixed function pipeline 5036 includes a 3D fixed function pipeline, a video front-end unit, a thread spawner and thread dispatcher, and a unified return buffer manager, which manages unified return buffers.

In at least one embodiment, fixed function block 5030 also includes a graphics SoC interface 5037, a graphics microcontroller 5038, and a media pipeline 5039. In at least one embodiment, graphics SoC interface 5037 provides an interface between graphics core 5000 and other processor cores within a system on a chip integrated circuit. In at least one embodiment, graphics microcontroller 5038 is a programmable sub-processor that is configurable to manage various functions of graphics processor 5000, including thread dispatch, scheduling, and preemption. In at least one embodiment, media pipeline 5039 includes logic to facilitate decoding, encoding, pre-processing, and/or post-processing of multimedia data, including image and video data. In at least one embodiment, media pipeline 5039 implements media operations via requests to compute or sampling logic within sub-cores 5001A-5001F.

In at least one embodiment, SoC interface 5037 enables graphics core 5000 to communicate with general-purpose application processor cores (e.g., CPUs) and/or other components within an SoC, including memory hierarchy elements such as a shared last level cache memory, system RAM, and/or embedded on-chip or on-package DRAM. In at least one embodiment, SoC interface 5037 can also enable communication with fixed function devices within an SoC, such as camera imaging pipelines, and enables use of and/or implements global memory atomics that may be shared between graphics core 5000 and CPUs within an SoC. In at least one embodiment, graphics SoC interface 5037 can also implement power management controls for graphics processor core 5000 and enable an interface between a clock domain of graphics processor core 5000 and other clock domains within an SoC. In at least one embodiment, SoC interface 5037 enables receipt of command buffers from a command streamer and global thread dispatcher that are configured to provide commands and instructions to each of one or more graphics cores within a graphics processor. In at least one embodiment, commands and instructions can be dispatched to media pipeline 5039, when media operations are to be performed, or a geometry and fixed function pipeline (e.g., geometry and fixed function pipeline 5036, and/or a geometry and fixed function pipeline 5014) when graphics processing operations are to be performed.

In at least one embodiment, graphics microcontroller 5038 can be configured to perform various scheduling and management tasks for graphics core 5000. In at least one embodiment, graphics microcontroller 5038 can perform graphics and/or compute workload scheduling on various graphics parallel engines within execution unit (EU) arrays 5002A-5002F, 5004A-5004F within sub-cores 5001A-5001F. In at least one embodiment, host software executing on a CPU core of an SoC including graphics core 5000 can submit workloads to one of multiple graphic processor paths, which invokes a scheduling operation on an appropriate graphics engine. In at least one embodiment, scheduling operations include determining which workload to run next, submitting a workload to a command streamer, preempting existing workloads running on an engine, monitoring progress of a workload, and notifying host software when a workload is complete. In at least one embodiment, graphics microcontroller 5038 can also facilitate low-power or idle states for graphics core 5000, providing graphics core 5000 with an ability to save and restore registers within graphics core 5000 across low-power state transitions independently from an operating system and/or graphics driver software on a system.

In at least one embodiment, graphics core 5000 may have greater than or fewer than illustrated sub-cores 5001A-5001F, up to N modular sub-cores. For each set of N sub-cores, in at least one embodiment, graphics core 5000 can also include shared function logic 5010, shared and/or cache memory 5012, geometry/fixed function pipeline 5014, as well as additional fixed function logic 5016 to accelerate various graphics and compute processing operations. In at least one embodiment, shared function logic 5010 can include logic units (e.g., sampler, math, and/or inter-thread communication logic) that can be shared by each N sub-cores within graphics core 5000. In at least one embodiment, shared and/or cache memory 5012 can be a last-level cache for N sub-cores 5001A-5001F within graphics core 5000 and can also serve as shared memory that is accessible by multiple sub-cores. In at least one embodiment, geometry/fixed function pipeline 5014 can be included instead of geometry/fixed function pipeline 5036 within fixed function block 5030 and can include similar logic units.

In at least one embodiment, graphics core 5000 includes additional fixed function logic 5016 that can include various fixed function acceleration logic for use by graphics core 5000. In at least one embodiment, additional fixed function logic 5016 includes an additional geometry pipeline for use in position-only shading. In position-only shading, at least two geometry pipelines exist, whereas in a full geometry pipeline within geometry and fixed function pipelines 5014, 5036, and a cull pipeline, which is an additional geometry pipeline that may be included within additional fixed function logic 5016. In at least one embodiment, a cull pipeline is a trimmed down version of a full geometry pipeline. In at least one embodiment, a full pipeline and a cull pipeline can execute different instances of an application, each instance having a separate context. In at least one embodiment, position only shading can hide long cull runs of discarded triangles, enabling shading to be completed earlier in some instances. For example, in at least one embodiment, cull pipeline logic within additional fixed function logic 5016 can execute position shaders in parallel with a main application and generally generates critical results faster than a full pipeline, as a cull pipeline fetches and shades position attributes of vertices, without performing rasterization and rendering of pixels to a frame buffer. In at least one embodiment, a cull pipeline can use generated critical results to compute visibility information for all triangles without regard to whether those triangles are culled. In at least one embodiment, a full pipeline (which in this instance may be referred to as a replay pipeline) can consume visibility information to skip culled triangles to shade only visible triangles that are finally passed to a rasterization phase.

In at least one embodiment, additional fixed function logic 5016 can also include machine-learning acceleration logic, such as fixed function matrix multiplication logic, for implementations including optimizations for machine learning training or inferencing.

In at least one embodiment, within each graphics sub-core 5001A-5001F includes a set of execution resources that may be used to perform graphics, media, and compute operations in response to requests by graphics pipeline, media pipeline, or shader programs. In at least one embodiment, graphics sub-cores 5001A-5001F include multiple EU arrays 5002A-5002F, 5004A-5004F, thread dispatch and inter-thread communication (TD/IC) logic 5003A-5003F, a 3D (e.g., texture) sampler 5005A-5005F, a media sampler 5006A-5006F, a shader processor 5007A-5007F, and shared local memory (SLM) 5008A-5008F. In at least one embodiment, EU arrays 5002A-5002F, 5004A-5004F each include multiple execution units, which are general-purpose graphics processing units capable of performing floating-point and integer/fixed-point logic operations in service of a graphics, media, or compute operation, including graphics, media, or compute shader programs. In at least one embodiment, TD/IC logic 5003A-5003F performs local thread dispatch and thread control operations for execution units within a sub-core and facilitates communication between threads executing on execution units of a sub-core. In at least one embodiment, 3D samplers 5005A-5005F can read texture or other 3D graphics related data into memory. In at least one embodiment, 3D samplers can read texture data differently based on a configured sample state and texture format associated with a given texture. In at least one embodiment, media samplers 5006A-5006F can perform similar read operations based on a type and format associated with media data. In at least one embodiment, each graphics sub-core 5001A-5001F can alternately include a unified 3D and media sampler. In at least one embodiment, threads executing on execution units within each of sub-cores 5001A-5001F can make use of shared local memory 5008A-5008F within each sub-core, to enable threads executing within a thread group to execute using a common pool of on-chip memory.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, portions or all of inference and/or training logic 2715 may be incorporated into graphics processor 5010. For example, in at least one embodiment, training and/or inferencing techniques described herein may use one or more of ALUs embodied in a 3D pipeline, graphics microcontroller 5038, geometry and fixed function pipeline 5014 and 5036, or other logic in FIG. 50. Moreover, in at least one embodiment, inferencing and/or training operations described herein may be done using logic other than logic illustrated in FIG. 27A or 27B. In at least one embodiment, weight parameters may be stored in on-chip or off-chip memory and/or registers (shown or not shown) that configure ALUs of graphics processor 5000 to perform one or more machine learning algorithms, neural network architectures, use cases, or training techniques described herein.

FIGS. 51A-51B illustrate thread execution logic 5100 including an array of processing elements of a graphics processor core according to at least one embodiment. FIG. 51A illustrates at least one embodiment, in which thread execution logic 5100 is used. FIG. 51B illustrates exemplary internal details of a graphics execution unit 5108, according to at least one embodiment.

As illustrated in FIG. 51A, in at least one embodiment, thread execution logic 5100 includes a shader processor 5102, a thread dispatcher 5104, an instruction cache 5106, a scalable execution unit array including a plurality of execution units 5107A-5107N and 5108A-5108N, a sampler 5110, a data cache 5112, and a data port 5114. In at least one embodiment, a scalable execution unit array can dynamically scale by enabling or disabling one or more execution units (e.g., any of execution unit 5108A-N or 5107A-N) based on computational requirements of a workload, for example. In at least one embodiment, scalable execution units are interconnected via an interconnect fabric that links to each execution unit. In at least one embodiment, thread execution logic 5100 includes one or more connections to memory, such as system memory or cache memory, through one or more of instruction cache 5106, data port 5114, sampler 5110, and execution units 5107 or 5108. In at least one embodiment, each execution unit (e.g., 5107A) is a stand-alone programmable general-purpose computational unit that is capable of executing multiple simultaneous hardware threads while processing multiple data elements in parallel for each thread. In at least one embodiment, array of execution units 5107 and/or 5108 is scalable to include any number individual execution units.

In at least one embodiment, execution units 5107 and/or 5108 are primarily used to execute shader programs. In at least one embodiment, shader processor 5102 can process various shader programs and dispatch execution threads associated with shader programs via a thread dispatcher 5104. In at least one embodiment, thread dispatcher 5104 includes logic to arbitrate thread initiation requests from graphics and media pipelines and instantiate requested threads on one or more execution units in execution units 5107 and/or 5108. For example, in at least one embodiment, a geometry pipeline can dispatch vertex, tessellation, or geometry shaders to thread execution logic for processing. In at least one embodiment, thread dispatcher 5104 can also process runtime thread spawning requests from executing shader programs.

In at least one embodiment, execution units 5107 and/or 5108 support an instruction set that includes native support for many standard 3D graphics shader instructions, such that shader programs from graphics libraries (e.g., Direct 3D and OpenGL) are executed with a minimal translation. In at least one embodiment, execution units support vertex and geometry processing (e.g., vertex programs, geometry programs, and/or vertex shaders), pixel processing (e.g., pixel shaders, fragment shaders) and general-purpose processing (e.g., compute and media shaders). In at least one embodiment, each of execution units 5107 and/or 5108, which include one or more arithmetic logic units (ALUs), is capable of multi-issue single instruction multiple data (SIMD) execution and multi-threaded operation enables an efficient execution environment despite higher latency memory accesses. In at least one embodiment, each hardware thread within each execution unit has a dedicated high-bandwidth register file and associated independent thread-state. In at least one embodiment, execution is multi-issue per clock to pipelines capable of integer, single and double precision floating point operations, SIMD branch capability, logical operations, transcendental operations, and other miscellaneous operations. In at least one embodiment, while waiting for data from memory or one of shared functions, dependency logic within execution units 5107 and/or 5108 causes a waiting thread to sleep until requested data has been returned. In at least one embodiment, while an awaiting thread is sleeping, hardware resources may be devoted to processing other threads. For example, in at least one embodiment, during a delay associated with a vertex shader operation, an execution unit can perform operations for a pixel shader, fragment shader, or another type of shader program, including a different vertex shader.

In at least one embodiment, each execution unit in execution units 5107 and/or 5108 operates on arrays of data elements. In at least one embodiment, a number of data elements is an "execution size," or number of channels for an instruction. In at least one embodiment, an execution channel is a logical unit of execution for data element access, masking, and flow control within instructions. In at least one embodiment, a number of channels may be independent of a number of physical arithmetic logic units (ALUs) or floating point units (FPUs) for a particular graphics processor. In at least one embodiment, execution units 5107 and/or 5108 support integer and floating-point data types.

In at least one embodiment, an execution unit instruction set includes SIMD instructions. In at least one embodiment, various data elements can be stored as a packed data type in a register and execution unit will process various elements based on data size of elements. For example, in at least one embodiment, when operating on a 256-bit wide vector, 256 bits of a vector are stored in a register and an execution unit operates on a vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, in at least one embodiment, different vector widths and register sizes are possible.

In at least one embodiment, one or more execution units can be combined into a fused execution unit 5109A-5109N having thread control logic (5111A-5111N) that is common to fused EUs such as execution unit 5107A fused with execution unit 5108A into fused execution unit 5109A. In at least one embodiment, multiple EUs can be fused into an EU group. In at least one embodiment, each EU in a fused EU group can be configured to execute a separate SIMD hardware thread, with a number of EUs in a fused EU group possibly varying according to various embodiments. In at least one embodiment, various SIMD widths can be performed per-EU, including but not limited to SIMD8, SIMD16, and SIMD32. In at least one embodiment, each fused graphics execution unit 5109A-5109N includes at least two execution units. For example, in at least one embodiment, fused execution unit 5109A includes a first EU 5107A, second EU 5108A, and thread control logic 5111A that is common to first EU 5107A and second EU 5108A. In at least one embodiment, thread control logic 5111A controls threads executed on fused graphics execution unit 5109A, allowing each EU within fused execution units 5109A-109N to execute using a common instruction pointer register.

In at least one embodiment, one or more internal instruction caches (e.g., 5106) are included in thread execution logic 5100 to cache thread instructions for execution units. In at least one embodiment, one or more data caches (e.g., 5112) are included to cache thread data during thread execution. In at least one embodiment, sampler 5110 is included to provide texture sampling for 3D operations and media sampling for media operations. In at least one embodiment, sampler 5110 includes specialized texture or media sampling functionality to process texture or media data during sampling process before providing sampled data to an execution unit.

During execution, in at least one embodiment, graphics and media pipelines send thread initiation requests to thread execution logic 5100 via thread spawning and dispatch logic. In at least one embodiment, once a group of geometric objects has been processed and rasterized into pixel data, pixel processor logic (e.g., pixel shader logic, fragment shader logic, etc.) within shader processor 5102 is invoked to further compute output information and cause results to be written to output surfaces (e.g., color buffers, depth buffers, stencil buffers, etc.). In at least one embodiment, a pixel shader or a fragment shader calculates values of various vertex attributes that are to be interpolated across a rasterized object. In at least one embodiment, pixel processor logic within shader processor 5102 then executes an application programming interface (API)-supplied pixel or fragment shader program. In at least one embodiment, to execute a shader program, shader processor 5102 dispatches threads to an execution unit (e.g., 5108A) via thread dispatcher 5104. In at least one embodiment, shader processor 5102 uses texture sampling logic in sampler 5110 to access texture data in texture maps stored in memory. In at least one embodiment, arithmetic operations on texture data and input geometry data compute pixel color data for each geometric fragment, or discards one or more pixels from further processing.

In at least one embodiment, data port 5114 provides a memory access mechanism for thread execution logic 5100 to output processed data to memory for further processing on a graphics processor output pipeline. In at least one embodiment, data port 5114 includes or couples to one or more cache memories (e.g., data cache 5112) to cache data for memory access via a data port.

As illustrated in FIG. 51B, in at least one embodiment, a graphics execution unit 5108 can include an instruction fetch unit 5137, a general register file array (GRF) 5124, an architectural register file array (ARF) 5126, a thread arbiter 5122, a send unit 5130, a branch unit 5132, a set of SIMD floating point units (FPUs) 5134, and a set of dedicated integer SIMD ALUs 5135. In at least one embodiment, GRF 5124 and ARF 5126 includes a set of general register files and architecture register files associated with each simultaneous hardware thread that may be active in graphics execution unit 5108. In at least one embodiment, per thread architectural state is maintained in ARF 5126, while data used during thread execution is stored in GRF 5124. In at least one embodiment, execution state of each thread, including instruction pointers for each thread, can be held in thread-specific registers in ARF 5126.

In at least one embodiment, graphics execution unit 5108 has an architecture that is a combination of Simultaneous Multi-Threading (SMT) and fine-grained Interleaved Multi-Threading (IMT). In at least one embodiment, architecture has a modular configuration that can be fine-tuned at design time based on a target number of simultaneous threads and number of registers per execution unit, where execution unit resources are divided across logic used to execute multiple simultaneous threads.

In at least one embodiment, graphics execution unit 5108 can co-issue multiple instructions, which may each be different instructions. In at least one embodiment, thread arbiter 5122 of graphics execution unit thread 5108 can dispatch instructions to one of send unit 5130, branch unit 5132, or SIMD FPU(s) 5134 for execution. In at least one embodiment, each execution thread can access 128 general-purpose registers within GRF 5124, where each register can store 32 bytes, accessible as a SIMD 8-element vector of 32-bit data elements. In at least one embodiment, each execution unit thread has access to 4 kilobytes within GRF 5124, although embodiments are not so limited, and greater or fewer register resources may be provided in other embodiments. In at least one embodiment, up to seven threads can execute simultaneously, although a number of threads per execution unit can also vary according to embodiments. In at least one embodiment, in which seven threads may access 4 kilobytes, GRF 5124 can store a total of 28 kilobytes. In at least one embodiment, flexible addressing modes can permit registers to be addressed together to build effectively wider registers or to represent strided rectangular block data structures.

In at least one embodiment, memory operations, sampler operations, and other longer-latency system communications are dispatched via "send" instructions that are executed by message passing to send unit 5130. In at least one embodiment, branch instructions are dispatched to branch unit 5132 to facilitate SIMD divergence and eventual convergence.

In at least one embodiment, graphics execution unit 5108 includes one or more SIMD floating point units (FPU(s)) 5134 to perform floating-point operations. In at least one embodiment, FPU(s) 5134 also support integer computation. In at least one embodiment, FPU(s) 5134 can SIMD execute up to M number of 32-bit floating-point (or integer) operations, or SIMD execute up to 2M 16-bit integer or 16-bit floating-point operations. In at least one embodiment, at least one FPU provides extended math capability to support high-throughput transcendental math functions and double precision 64-bit floating-point. In at least one embodiment, a set of 8-bit integer SIMD ALUs 5135 are also present, and may be specifically optimized to perform operations associated with machine learning computations.

In at least one embodiment, arrays of multiple instances of graphics execution unit 5108 can be instantiated in a graphics sub-core grouping (e.g., a sub-slice). In at least one embodiment, execution unit 5108 can execute instructions across a plurality of execution channels. In at least one embodiment, each thread executed on graphics execution unit 5108 is executed on a different channel.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, portions or all of inference and/or training logic 2715 may be incorporated into thread execution logic 5100. Moreover, in at least one embodiment, inferencing and/or training operations described herein may be done using logic other than logic illustrated in FIG. 27A or 27B. In at least one embodiment, weight parameters may be stored in on-chip or off-chip memory and/or registers (shown or not shown) that configure ALUs thread of execution logic 5100 to perform one or more machine learning algorithms, neural network architectures, use cases, or training techniques described herein.

Figure 52:
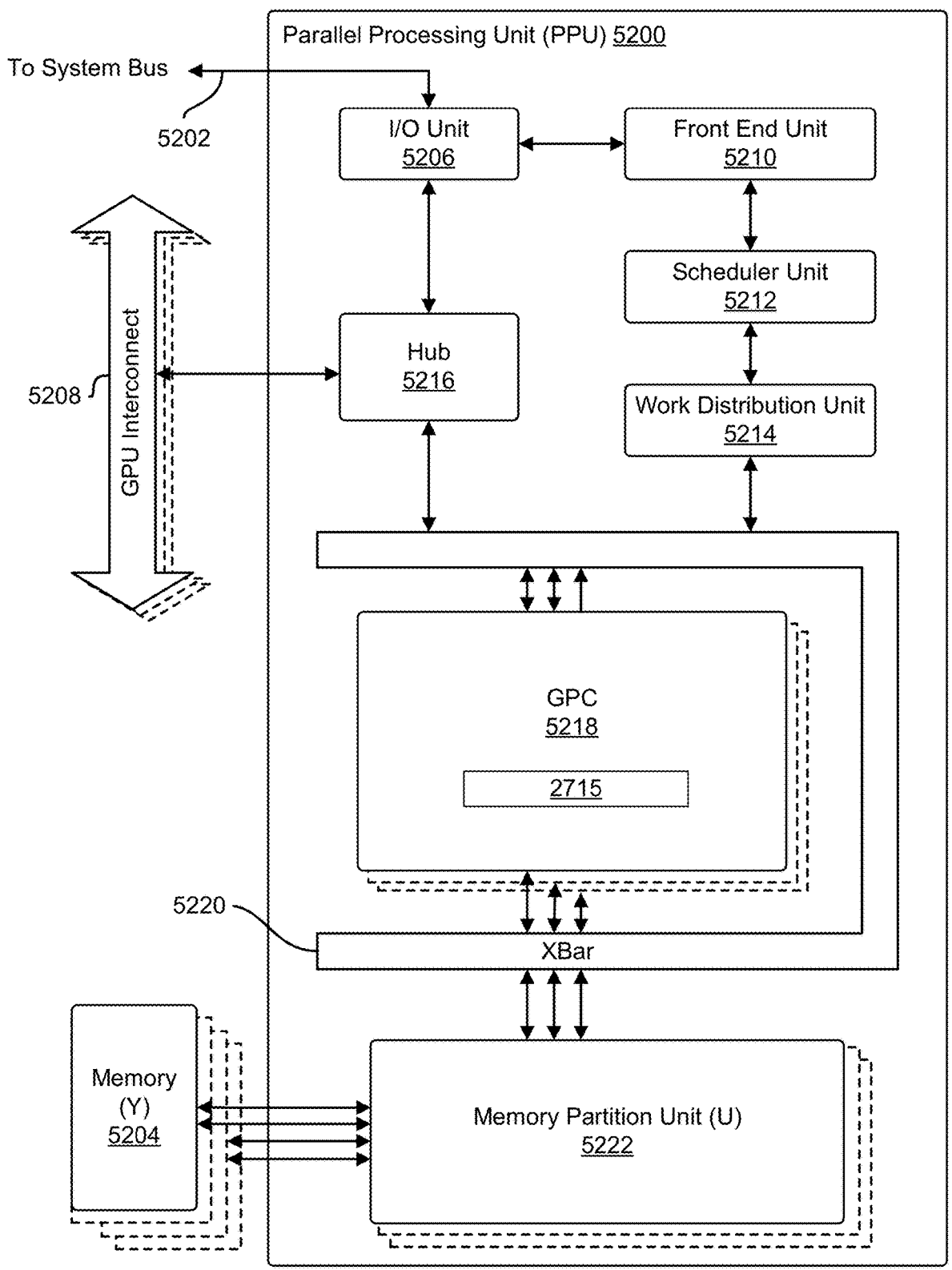
FIG. 52 illustrates a parallel processing unit ("PPU"), according to at least one embodiment.

FIG. 52 illustrates a parallel processing unit ("PPU") 5200, according to at least one embodiment. In at least one embodiment, PPU 5200 is configured with machine-readable code that, if executed by PPU 5200, causes PPU 5200 to perform some or all of processes and techniques described throughout this disclosure. In at least one embodiment, PPU 5200 is a multi-threaded processor that is implemented on one or more integrated circuit devices and that utilizes multithreading as a latency-hiding technique designed to process computer-readable instructions (also referred to as machine-readable instructions or simply instructions) on multiple threads in parallel. In at least one embodiment, a thread refers to a thread of execution and is an instantiation of a set of instructions configured to be executed by PPU 5200. In at least one embodiment, PPU 5200 is a graphics processing unit ("GPU") configured to implement a graphics rendering pipeline for processing three-dimensional ("3D") graphics data in order to generate two-dimensional ("2D") image data for display on a display device such as a liquid crystal display ("LCD") device. In at least one embodiment, PPU 5200 is utilized to perform computations such as linear algebra operations and machine-learning operations. FIG. 52 illustrates an example parallel processor for illustrative purposes only and should be construed as a non-limiting example of processor architectures contemplated within scope of this disclosure and that any suitable processor may be employed to supplement and/or substitute for same.

In at least one embodiment, one or more PPUs 5200 are configured to accelerate High Performance Computing ("HPC"), data center, and machine learning applications. In at least one embodiment, PPU 5200 is configured to accelerate deep learning systems and applications including following non-limiting examples: autonomous vehicle platforms, deep learning, high-accuracy speech, image, text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and more.

In at least one embodiment, PPU 5200 includes, without limitation, an Input/Output ("I/O") unit 5206, a front-end unit 5210, a scheduler unit 5212, a work distribution unit 5214, a hub 5216, a crossbar ("XBar") 5220, one or more general processing clusters ("GPCs") 5218, and one or more partition units ("memory partition units") 5222. In at least one embodiment, PPU 5200 is connected to a host processor or other PPUs 5200 via one or more high-speed GPU interconnects ("GPU interconnects") 5208. In at least one embodiment, PPU 5200 is connected to a host processor or other peripheral devices via a system bus 5202. In at least one embodiment, PPU 5200 is connected to a local memory comprising one or more memory devices ("memory") 5204. In at least one embodiment, memory devices 5204 include, without limitation, one or more dynamic random access memory ("DRAM") devices. In at least one embodiment, one or more DRAM devices are configured and/or configurable as high-bandwidth memory ("HBM") subsystems, with multiple DRAM dies stacked within each device.

In at least one embodiment, high-speed GPU interconnect 5208 may refer to a wire-based multi-lane communications link that is used by systems to scale and include one or more PPUs 5200 combined with one or more central processing units ("CPUs"), supports cache coherence between PPUs 5200 and CPUs, and CPU mastering. In at least one embodiment, data and/or commands are transmitted by high-speed GPU interconnect 5208 through hub 5216 to/from other units of PPU 5200 such as one or more copy engines, video encoders, video decoders, power management units, and other components which may not be explicitly illustrated in FIG. 52.

In at least one embodiment, I/O unit 5206 is configured to transmit and receive communications (e.g., commands, data) from a host processor (not illustrated in FIG. 52) over system bus 5202. In at least one embodiment, I/O unit 5206 communicates with host processor directly via system bus 5202 or through one or more intermediate devices such as a memory bridge. In at least one embodiment, I/O unit 5206 may communicate with one or more other processors, such as one or more of PPUs 5200 via system bus 5202. In at least one embodiment, I/O unit 5206 implements a Peripheral Component Interconnect Express ("PCIe") interface for communications over a PCIe bus. In at least one embodiment, I/O unit 5206 implements interfaces for communicating with external devices.

In at least one embodiment, I/O unit 5206 decodes packets received via system bus 5202. In at least one embodiment, at least some packets represent commands configured to cause PPU 5200 to perform various operations. In at least one embodiment, I/O unit 5206 transmits decoded commands to various other units of PPU 5200 as specified by commands. In at least one embodiment, commands are transmitted to front-end unit 5210 and/or transmitted to hub 5216 or other units of PPU 5200 such as one or more copy engines, a video encoder, a video decoder, a power management unit, etc. (not explicitly illustrated in FIG. 52). In at least one embodiment, I/O unit 5206 is configured to route communications between and among various logical units of PPU 5200.

In at least one embodiment, a program executed by host processor encodes a command stream in a buffer that provides workloads to PPU 5200 for processing. In at least one embodiment, a workload comprises instructions and data to be processed by those instructions. In at least one embodiment, a buffer is a region in a memory that is accessible (e.g., read/write) by both a host processor and PPU 5200—a host interface unit may be configured to access that buffer in a system memory connected to system bus 5202 via memory requests transmitted over system bus 5202 by I/O unit 5206. In at least one embodiment, a host processor writes a command stream to a buffer and then transmits a pointer to a start of a command stream to PPU 5200 such that front-end unit 5210 receives pointers to one or more command streams and manages one or more command streams, reading commands from command streams and forwarding commands to various units of PPU 5200.

In at least one embodiment, front-end unit 5210 is coupled to scheduler unit 5212 that configures various GPCs 5218 to process tasks defined by one or more command streams. In at least one embodiment, scheduler unit 5212 is configured to track state information related to various tasks managed by scheduler unit 5212 where state information may indicate which of GPCs 5218 a task is assigned to, whether task is active or inactive, a priority level associated with task, and so forth. In at least one embodiment, scheduler unit 5212 manages execution of a plurality of tasks on one or more of GPCs 5218.

In at least one embodiment, scheduler unit 5212 is coupled to work distribution unit 5214 that is configured to dispatch tasks for execution on GPCs 5218. In at least one embodiment, work distribution unit 5214 tracks a number of scheduled tasks received from scheduler unit 5212 and work distribution unit 5214 manages a pending task pool and an active task pool for each of GPCs 5218. In at least one embodiment, pending task pool comprises a number of slots (e.g., 32 slots) that contain tasks assigned to be processed by a particular GPC 5218; an active task pool may comprise a number of slots (e.g., 4 slots) for tasks that are actively being processed by GPCs 5218 such that as one of GPCs 5218 completes execution of a task, that task is evicted from that active task pool for GPC 5218 and another task from a pending task pool is selected and scheduled for execution on GPC 5218. In at least one embodiment, if an active task is idle on GPC 5218, such as while waiting for a data dependency to be resolved, then that active task is evicted from GPC 5218 and returned to that pending task pool while another task in that pending task pool is selected and scheduled for execution on GPC 5218.

In at least one embodiment, work distribution unit 5214 communicates with one or more GPCs 5218 via XBar 5220. In at least one embodiment, XBar 5220 is an interconnect network that couples many of units of PPU 5200 to other units of PPU 5200 and can be configured to couple work distribution unit 5214 to a particular GPC 5218. In at least one embodiment, one or more other units of PPU 5200 may also be connected to XBar 5220 via hub 5216.

In at least one embodiment, tasks are managed by scheduler unit 5212 and dispatched to one of GPCs 5218 by work distribution unit 5214. In at least one embodiment, GPC 5218 is configured to process task and generate results. In at least one embodiment, results may be consumed by other tasks within GPC 5218, routed to a different GPC 5218 via XBar 5220, or stored in memory 5204. In at least one embodiment, results can be written to memory 5204 via partition units 5222, which implement a memory interface for reading and writing data to/from memory 5204. In at least one embodiment, results can be transmitted to another PPU 5204 or CPU via high-speed GPU interconnect 5208. In at least one embodiment, PPU 5200 includes, without limitation, a number U of partition units 5222 that is equal to a number of separate and distinct memory devices 5204 coupled to PPU 5200, as described in more detail herein in conjunction with FIG. 54.

In at least one embodiment, a host processor executes a driver kernel that implements an application programming interface ("API") that enables one or more applications executing on a host processor to schedule operations for execution on PPU 5200. In at least one embodiment, multiple compute applications are simultaneously executed by PPU 5200 and PPU 5200 provides isolation, quality of service ("QoS"), and independent address spaces for multiple compute applications. In at least one embodiment, an application generates instructions (e.g., in form of API calls) that cause a driver kernel to generate one or more tasks for execution by PPU 5200 and that driver kernel outputs tasks to one or more streams being processed by PPU 5200. In at least one embodiment, each task comprises one or more groups of related threads, which may be referred to as a warp. In at least one embodiment, a warp comprises a plurality of related threads (e.g., 32 threads) that can be executed in parallel. In at least one embodiment, cooperating threads can refer to a plurality of threads including instructions to perform task and that exchange data through shared memory. In at least one embodiment, threads and cooperating threads are described in more detail in conjunction with FIG. 54.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, deep learning application processor is used to train a machine learning model, such as a neural network, to predict or infer information provided to PPU 5200. In at least one embodiment, deep learning application processor 5200 is used to infer or predict information based on a trained machine learning model (e.g., neural network) that has been trained by another processor or system or by PPU 5200. In at least one embodiment, PPU 5200 may be used to perform one or more neural network use cases described herein.

Figure 53:
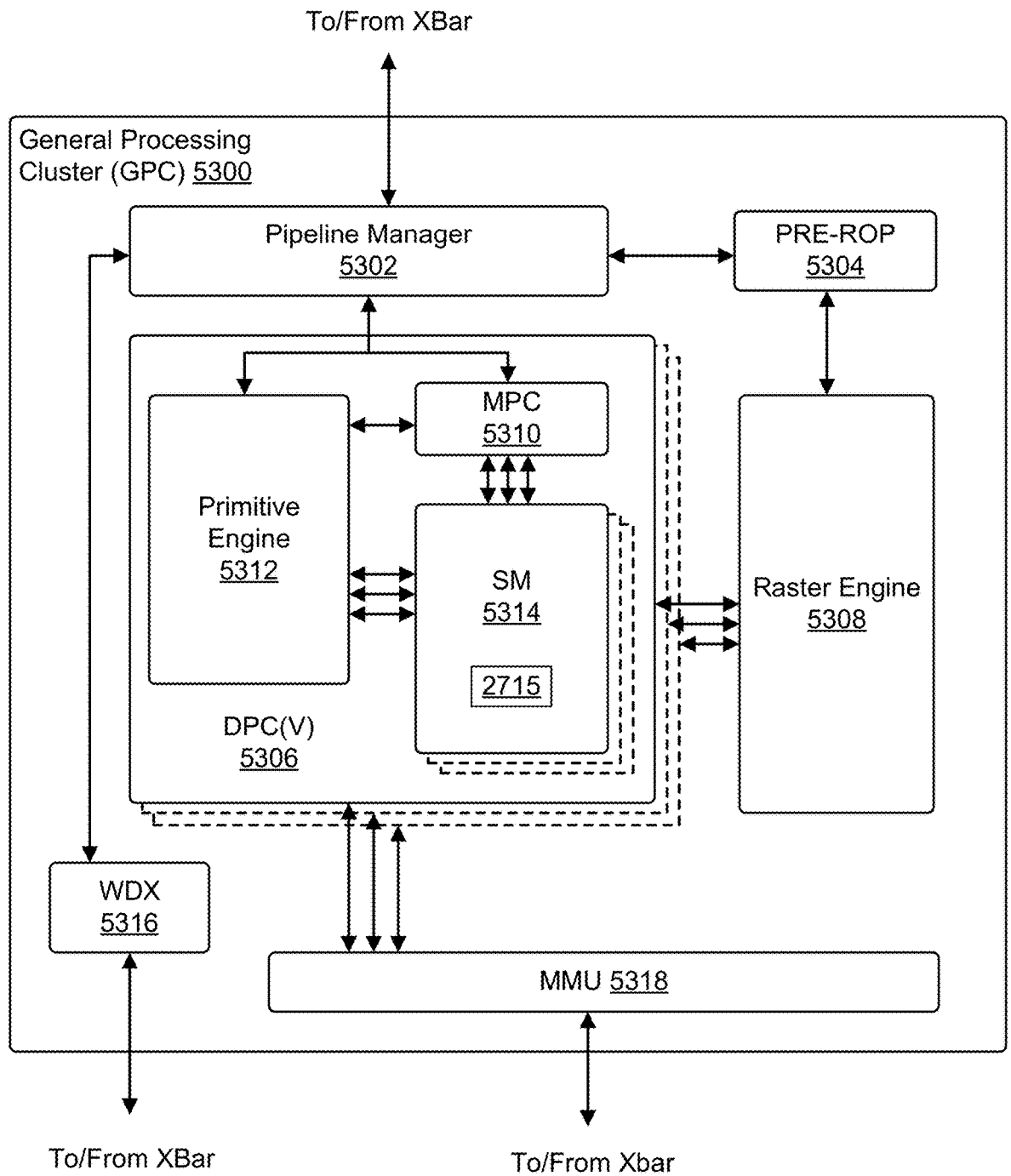
FIG. 53 illustrates a general processing cluster ("GPC"), according to at least one embodiment.

FIG. 53 illustrates a general processing cluster ("GPC") 5300, according to at least one embodiment. In at least one embodiment, GPC 5300 is GPC 5218 of FIG. 52. In at least one embodiment, each GPC 5300 includes, without limitation, a number of hardware units for processing tasks and each GPC 5300 includes, without limitation, a pipeline manager 5302, a pre-raster operations unit ("preROP") 5304, a raster engine 5308, a work distribution crossbar ("WDX") 5316, a memory management unit ("MMU") 5318, one or more Data Processing Clusters ("DPCs") 5306, and any suitable combination of parts.

In at least one embodiment, operation of GPC 5300 is controlled by pipeline manager 5302. In at least one embodiment, pipeline manager 5302 manages configuration of one or more DPCs 5306 for processing tasks allocated to GPC 5300. In at least one embodiment, pipeline manager 5302 configures at least one of one or more DPCs 5306 to implement at least a portion of a graphics rendering pipeline. In at least one embodiment, DPC 5306 is configured to execute a vertex shader program on a programmable streaming multi-processor ("SM") 5314. In at least one embodiment, pipeline manager 5302 is configured to route packets received from a work distribution unit to appropriate logical units within GPC 5300, in at least one embodiment, and some packets may be routed to fixed function hardware units in preROP 5304 and/or raster engine 5308 while other packets may be routed to DPCs 5306 for processing by a primitive engine 5312 or SM 5314. In at least one embodiment, pipeline manager 5302 configures at least one of DPCs 5306 to implement a neural network model and/or a computing pipeline.

In at least one embodiment, preROP unit 5304 is configured, in at least one embodiment, to route data generated by raster engine 5308 and DPCs 5306 to a Raster Operations ("ROP") unit in partition unit 5222, described in more detail above in conjunction with FIG. 52. In at least one embodiment, preROP unit 5304 is configured to perform optimizations for color blending, organize pixel data, perform address translations, and more. In at least one embodiment, raster engine 5308 includes, without limitation, a number of fixed function hardware units configured to perform various raster operations, in at least one embodiment, and raster engine 5308 includes, without limitation, a setup engine, a coarse raster engine, a culling engine, a clipping engine, a fine raster engine, a tile coalescing engine, and any suitable combination thereof. In at least one embodiment, setup engine receives transformed vertices and generates plane equations associated with geometric primitive defined by vertices; plane equations are transmitted to a coarse raster engine to generate coverage information (e.g., an x, y coverage mask for a tile) for primitive; output of a coarse raster engine is transmitted to a culling engine where fragments associated with a primitive that fail a z-test are culled, and transmitted to a clipping engine where fragments lying outside a viewing frustum are clipped. In at least one embodiment, fragments that survive clipping and culling are passed to a fine raster engine to generate attributes for pixel fragments based on plane equations generated by a setup engine. In at least one embodiment, an output of raster engine 5308 comprises fragments to be processed by any suitable entity, such as by a fragment shader implemented within DPC 5306.

In at least one embodiment, each DPC 5306 included in GPC 5300 comprises, without limitation, an M-Pipe Controller ("MPC") 5310; primitive engine 5312; one or more SMs 5314; and any suitable combination thereof. In at least one embodiment, MPC 5310 controls operation of DPC 5306, routing packets received from pipeline manager 5302 to appropriate units in DPC 5306. In at least one embodiment, packets associated with a vertex are routed to primitive engine 5312, which is configured to fetch vertex attributes associated with a vertex from memory; in contrast, packets associated with a shader program may be transmitted to SM 5314.

In at least one embodiment, SM 5314 comprises, without limitation, a programmable streaming processor that is configured to process tasks represented by a number of threads. In at least one embodiment, SM 5314 is multi-threaded and configured to execute a plurality of threads (e.g., 32 threads) from a particular group of threads concurrently and implements a Single-Instruction, Multiple-Data ("SIMD") architecture where each thread in a group of threads (e.g., a warp) is configured to process a different set of data based on same set of instructions. In at least one embodiment, all threads in group of threads execute a common set of instructions. In at least one embodiment, SM 5314 implements a Single-Instruction, Multiple Thread ("SIMT") architecture wherein each thread in a group of threads is configured to process a different set of data based on that common set of instructions, but where individual threads in a group of threads are allowed to diverge during execution. In at least one embodiment, a program counter, call stack, and execution state is maintained for each warp, enabling concurrency between warps and serial execution within warps when threads within a warp diverge. In another embodiment, a program counter, call stack, and execution state is maintained for each individual thread, enabling equal concurrency between all threads, within and between warps. In at least one embodiment, execution state is maintained for each individual thread and threads executing common instructions may be converged and executed in parallel for better efficiency. At least one embodiment of SM 5314 is described in more detail herein.

In at least one embodiment, MMU 5318 provides an interface between GPC 5300 and a memory partition unit (e.g., partition unit 5222 of FIG. 52) and MMU 5318 provides translation of virtual addresses into physical addresses, memory protection, and arbitration of memory requests. In at least one embodiment, MMU 5318 provides one or more translation lookaside buffers ("TLBs") for performing translation of virtual addresses into physical addresses in memory.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, deep learning application processor is used to train a machine learning model, such as a neural network, to predict or infer information provided to GPC 5300. In at least one embodiment, GPC 5300 is used to infer or predict information based on a trained machine learning model (e.g., neural network) that has been trained by another processor or system or by GPC 5300. In at least one embodiment, GPC 5300 may be used to perform one or more neural network use cases described herein.

Figure 54:
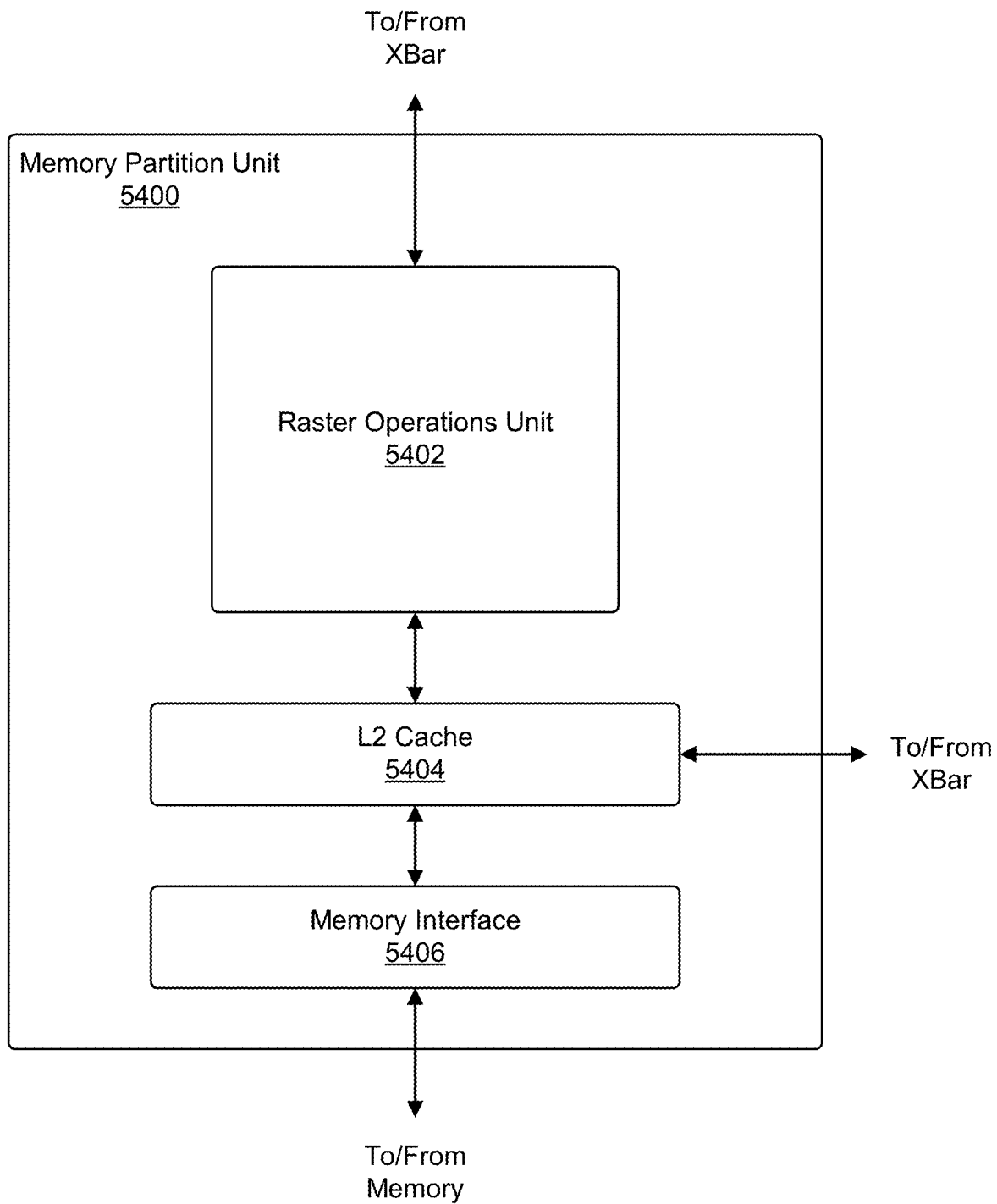
FIG. 54 illustrates a memory partition unit of a parallel processing unit ("PPU"), according to at least one embodiment.

FIG. 54 illustrates a memory partition unit 5400 of a parallel processing unit ("PPU"), in accordance with at least one embodiment. In at least one embodiment, memory partition unit 5400 includes, without limitation, a Raster Operations ("ROP") unit 5402, a level two ("L2") cache 5404, a memory interface 5406, and any suitable combination thereof. In at least one embodiment, memory interface 5406 is coupled to memory. In at least one embodiment, memory interface 5406 may implement 32, 64, 128, 1024-bit data buses, or like, for high-speed data transfer. In at least one embodiment, PPU incorporates U memory interfaces 5406 where U is a positive integer, with one memory interface 5406 per pair of partition units 5400, where each pair of partition units 5400 is connected to a corresponding memory device. For example, in at least one embodiment, PPU may be connected to up to Y memory devices, such as high bandwidth memory stacks or graphics double-data-rate, version 5, synchronous dynamic random access memory ("GDDR5 SDRAM").

In at least one embodiment, memory interface 5406 implements a high bandwidth memory second generation ("HBM2") memory interface and Y equals half of U. In at least one embodiment, HBM2 memory stacks are located on a physical package with a PPU, providing substantial power and area savings compared with conventional GDDR5 SDRAM systems. In at least one embodiment, each HBM2 stack includes, without limitation, four memory dies with Y=4, with each HBM2 stack including two 128-bit channels per die for a total of 8 channels and a data bus width of 1024 bits. In at least one embodiment, that memory supports Single-Error Correcting Double-Error Detecting ("SECDED") Error Correction Code ("ECC") to protect data. In at least one embodiment, ECC can provide higher reliability for compute applications that are sensitive to data corruption.

In at least one embodiment, PPU implements a multi-level memory hierarchy. In at least one embodiment, memory partition unit 5400 supports a unified memory to provide a single unified virtual address space for central processing unit ("CPU") and PPU memory, enabling data sharing between virtual memory systems. In at least one embodiment frequency of accesses by a PPU to a memory located on other processors is traced to ensure that memory pages are moved to physical memory of PPU that is accessing pages more frequently. In at least one embodiment, high-speed GPU interconnect 5208 supports address translation services allowing PPU to directly access a CPU's page tables and providing full access to CPU memory by a PPU.

In at least one embodiment, copy engines transfer data between multiple PPUs or between PPUs and CPUs. In at least one embodiment, copy engines can generate page faults for addresses that are not mapped into page tables and memory partition unit 5400 then services page faults, mapping addresses into page table, after which copy engine performs a transfer. In at least one embodiment, memory is pinned or non-pageable for multiple copy engine operations between multiple processors, substantially reducing available memory. In at least one embodiment, with hardware page faulting, addresses can be passed to copy engines without regard as to whether memory pages are resident, and a copy process is transparent.

Data from memory 5204 of FIG. 52 or other system memory is fetched by memory partition unit 5400 and stored in L2 cache 5404, which is located on-chip and is shared between various GPCs, in accordance with at least one embodiment. Each memory partition unit 5400, in at least one embodiment, includes, without limitation, at least a portion of L2 cache associated with a corresponding memory device. In at least one embodiment, lower level caches are implemented in various units within GPCs. In at least one embodiment, each of SMs 5314 in FIG. 53 may implement a Level 1 ("L1") cache wherein that L1 cache is private memory that is dedicated to a particular SM 5314 and data from L2 cache 5404 is fetched and stored in each L1 cache for processing in functional units of SMs 5314. In at least one embodiment, L2 cache 5404 is coupled to memory interface 5406 and XBar 5220 shown in FIG. 52.

ROP unit 5402 performs graphics raster operations related to pixel color, such as color compression, pixel blending, and more, in at least one embodiment. ROP unit 5402, in at least one embodiment, implements depth testing in conjunction with raster engine 5308, receiving a depth for a sample location associated with a pixel fragment from a culling engine of raster engine 5308. In at least one embodiment, depth is tested against a corresponding depth in a depth buffer for a sample location associated with a fragment. In at least one embodiment, if that fragment passes that depth test for that sample location, then ROP unit 5402 updates depth buffer and transmits a result of that depth test to raster engine 5308. It will be appreciated that a number of partition units 5400 may be different than a number of GPCs and, therefore, each ROP unit 5402 can, in at least one embodiment, be coupled to each GPC. In at least one embodiment, ROP unit 5402 tracks packets received from different GPCs and determines whether a result generated by ROP unit 5402 is to be routed to through XBar 5220.

Figure 55:
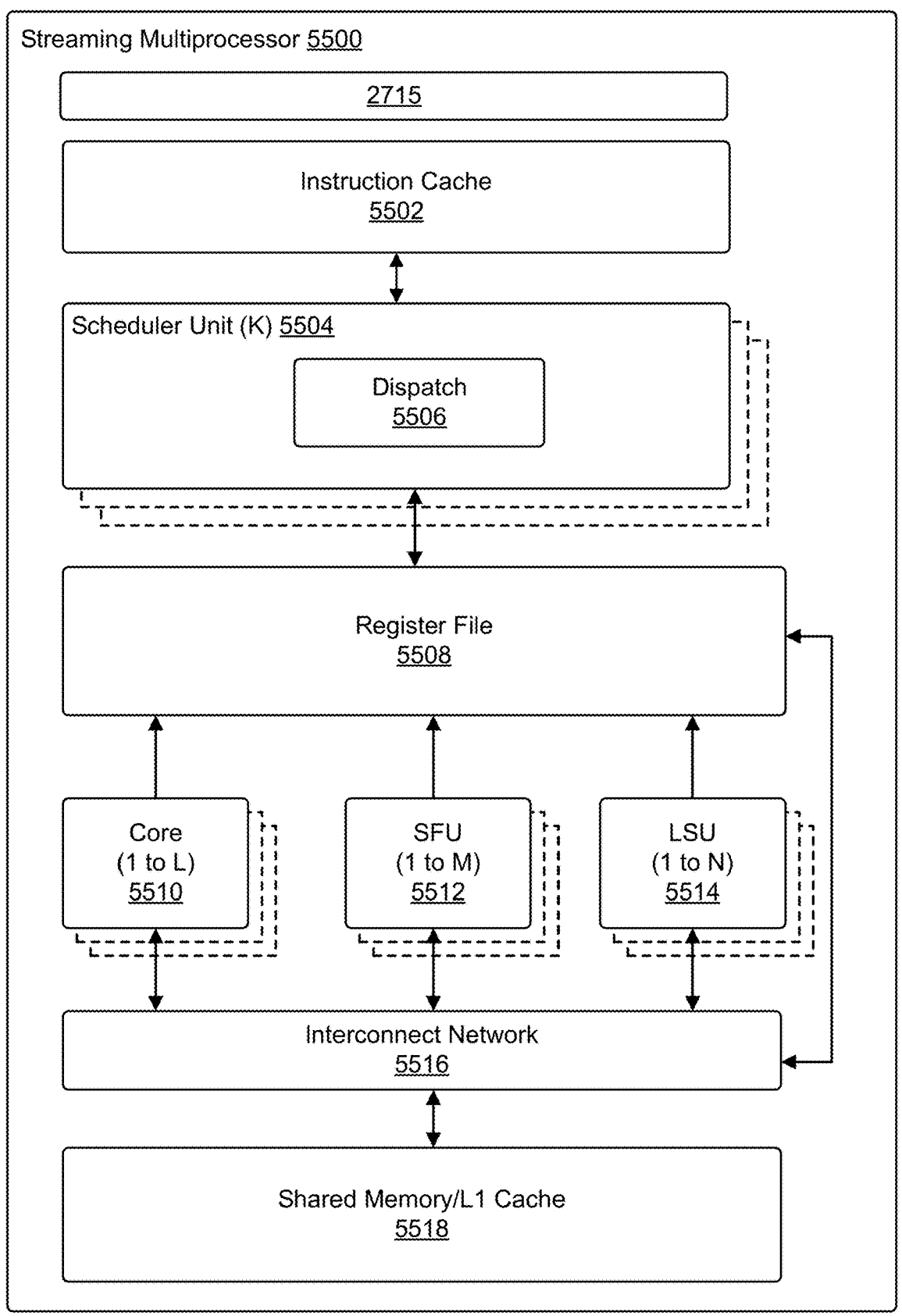
FIG. 55 illustrates a streaming multi-processor, according to at least one embodiment.

FIG. 55 illustrates a streaming multi-processor ("SM") 5500, according to at least one embodiment. In at least one embodiment, SM 5500 is SM of FIG. 53. In at least one embodiment, SM 5500 includes, without limitation, an instruction cache 5502, one or more scheduler units 5504, a register file 5508, one or more processing cores ("cores") 5510, one or more special function units ("SFUs") 5512, one or more load/store units ("LSUs") 5514, an interconnect network 5516, a shared memory/level one ("L1") cache 5518, and/or any suitable combination thereof.

In at least one embodiment, a work distribution unit dispatches tasks for execution on general processing clusters ("GPCs") of parallel processing units ("PPUs") and each task is allocated to a particular Data Processing Cluster ("DPC") within a GPC and, if a task is associated with a shader program, that task is allocated to one of SMs 5500. In at least one embodiment, scheduler unit 5504 receives tasks from a work distribution unit and manages instruction scheduling for one or more thread blocks assigned to SM 5500. In at least one embodiment, scheduler unit 5504 schedules thread blocks for execution as warps of parallel threads, wherein each thread block is allocated at least one warp. In at least one embodiment, each warp executes threads. In at least one embodiment, scheduler unit 5504 manages a plurality of different thread blocks, allocating warps to different thread blocks and then dispatching instructions from plurality of different cooperative groups to various functional units (e.g., processing cores 5510, SFUs 5512, and LSUs 5514) during each clock cycle.

In at least one embodiment, Cooperative Groups may refer to a programming model for organizing groups of communicating threads that allows developers to express granularity at which threads are communicating, enabling expression of richer, more efficient parallel decompositions. In at least one embodiment, cooperative launch APIs support synchronization amongst thread blocks for execution of parallel algorithms. In at least one embodiment, applications of conventional programming models provide a single, simple construct for synchronizing cooperating threads: a barrier across all threads of a thread block (e.g., syncthreads ( ) function). However, in at least one embodiment, programmers may define groups of threads at smaller than thread block granularities and synchronize within defined groups to enable greater performance, design flexibility, and software reuse in form of collective group-wide function interfaces. In at least one embodiment, Cooperative Groups enables programmers to define groups of threads explicitly at sub-block (perhaps as small as a single thread) and multi-block granularities, and to perform collective operations such as synchronization on threads in a cooperative group. In at least one embodiment, that programming model supports clean composition across software boundaries, so that libraries and utility functions can synchronize safely within their local context without having to make assumptions about convergence. In at least one embodiment, Cooperative Groups primitives enable new patterns of cooperative parallelism, including, without limitation, producer-consumer parallelism, opportunistic parallelism, and global synchronization across an entire grid of thread blocks.

In at least one embodiment, a dispatch unit 5506 is configured to transmit instructions to one or more functional units and scheduler unit 5504 and includes, without limitation, two dispatch units 5506 that enable two different instructions from a common warp to be dispatched during each clock cycle. In at least one embodiment, each scheduler unit 5504 includes a single dispatch unit 5506 or additional dispatch units 5506.

In at least one embodiment, each SM 5500, in at least one embodiment, includes, without limitation, register file 5508 that provides a set of registers for functional units of SM 5500. In at least one embodiment, register file 5508 is divided between each functional unit such that each functional unit is allocated a dedicated portion of register file 5508. In at least one embodiment, register file 5508 is divided between different warps being executed by SM 5500 and register file 5508 provides temporary storage for operands connected to data paths of functional units. In at least one embodiment, each SM 5500 comprises, without limitation, a plurality of L processing cores 5510, where L is a positive integer. In at least one embodiment, SM 5500 includes, without limitation, a large number (e.g., 128 or more) of distinct processing cores 5510. In at least one embodiment, each processing core 5510 includes, without limitation, a fully-pipelined, single-precision, double-precision, and/or mixed precision processing unit that includes, without limitation, a floating point arithmetic logic unit and an integer arithmetic logic unit. In at least one embodiment, floating point arithmetic logic units implement IEEE 754-2008 standard for floating point arithmetic. In at least one embodiment, processing cores 5510 include, without limitation, 64 single-precision (32-bit) floating point cores, 64 integer cores, 32 double-precision (64-bit) floating point cores, and 8 tensor cores.

Tensor cores are configured to perform matrix operations in accordance with at least one embodiment. In at least one embodiment, one or more tensor cores are included in processing cores 5510. In at least one embodiment, tensor cores are configured to perform deep learning matrix arithmetic, such as convolution operations for neural network training and inferencing. In at least one embodiment, each tensor core operates on a 4×4 matrix and performs a matrix multiply and accumulate operation, D=A×B+C, where A, B, C, and D are 4×4 matrices.

In at least one embodiment, matrix multiply inputs A and B are 16-bit floating point matrices and accumulation matrices C and D are 16-bit floating point or 32-bit floating point matrices. In at least one embodiment, tensor cores operate on 16-bit floating point input data with 32-bit floating point accumulation. In at least one embodiment, 16-bit floating point multiply uses 64 operations and results in a full precision product that is then accumulated using 32-bit floating point addition with other intermediate products for a 4×4×4 matrix multiply. Tensor cores are used to perform much larger two-dimensional or higher dimensional matrix operations, built up from these smaller elements, in at least one embodiment. In at least one embodiment, an API, such as a CUDA 9 C++ API, exposes specialized matrix load, matrix multiply and accumulate, and matrix store operations to efficiently use tensor cores from a CUDA-C++ program. In at least one embodiment, at a CUDA level, a warp-level interface assumes 16×16 size matrices spanning all 32 threads of warp.

In at least one embodiment, each SM 5500 comprises, without limitation, M SFUs 5512 that perform special functions (e.g., attribute evaluation, reciprocal square root, and like). In at least one embodiment, SFUs 5512 include, without limitation, a tree traversal unit configured to traverse a hierarchical tree data structure. In at least one embodiment, SFUs 5512 include, without limitation, a texture unit configured to perform texture map filtering operations. In at least one embodiment, texture units are configured to load texture maps (e.g., a 2D array of texels) from memory and sample texture maps to produce sampled texture values for use in shader programs executed by SM 5500. In at least one embodiment, texture maps are stored in shared memory/L1 cache 5518. In at least one embodiment, texture units implement texture operations such as filtering operations using mip-maps (e.g., texture maps of varying levels of detail), in accordance with at least one embodiment. In at least one embodiment, each SM 5500 includes, without limitation, two texture units.

Each SM 5500 comprises, without limitation, N LSUs 5514 that implement load and store operations between shared memory/L1 cache 5518 and register file 5508, in at least one embodiment. Interconnect network 5516 connects each functional unit to register file 5508 and LSU 5514 to register file 5508 and shared memory/L1 cache 5518 in at least one embodiment. In at least one embodiment, interconnect network 5516 is a crossbar that can be configured to connect any functional units to any registers in register file 5508 and connect LSUs 5514 to register file 5508 and memory locations in shared memory/L1 cache 5518.

In at least one embodiment, shared memory/L1 cache 5518 is an array of on-chip memory that allows for data storage and communication between SM 5500 and primitive engine and between threads in SM 5500, in at least one embodiment. In at least one embodiment, shared memory/L1 cache 5518 comprises, without limitation, 128 KB of storage capacity and is in a path from SM 5500 to a partition unit. In at least one embodiment, shared memory/L1 cache 5518, in at least one embodiment, is used to cache reads and writes. In at least one embodiment, one or more of shared memory/L1 cache 5518, L2 cache, and memory are backing stores.

Combining data cache and shared memory functionality into a single memory block provides improved performance for both types of memory accesses, in at least one embodiment. In at least one embodiment, capacity is used or is usable as a cache by programs that do not use shared memory, such as if shared memory is configured to use half of a capacity, and texture and load/store operations can use remaining capacity. Integration within shared memory/L1 cache 5518 enables shared memory/L1 cache 5518 to function as a high-throughput conduit for streaming data while simultaneously providing high-bandwidth and low-latency access to frequently reused data, in accordance with at least one embodiment. In at least one embodiment, when configured for general purpose parallel computation, a simpler configuration can be used compared with graphics processing. In at least one embodiment, fixed function graphics processing units are bypassed, creating a much simpler programming model. In a general purpose parallel computation configuration, a work distribution unit assigns and distributes blocks of threads directly to DPCs, in at least one embodiment. In at least one embodiment, threads in a block execute a common program, using a unique thread ID in calculation to ensure each thread generates unique results, using SM 5500 to execute program and perform calculations, shared memory/L1 cache 5518 to communicate between threads, and LSU 5514 to read and write global memory through shared memory/L1 cache 5518 and memory partition unit. In at least one embodiment, when configured for general purpose parallel computation, SM 5500 writes commands that scheduler unit 5504 can use to launch new work on DPCs.

In at least one embodiment, a PPU is included in or coupled to a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, and more. In at least one embodiment, a PPU is embodied on a single semiconductor substrate. In at least one embodiment, a PPU is included in a system-on-a-chip ("SoC") along with one or more other devices such as additional PPUs, memory, a reduced instruction set computer ("RISC") CPU, a memory management unit ("MMU"), a digital-to-analog converter ("DAC"), and like.

In at least one embodiment, a PPU may be included on a graphics card that includes one or more memory devices. In at least one embodiment, that graphics card may be configured to interface with a PCIe slot on a motherboard of a desktop computer. In at least one embodiment, that PPU may be an integrated graphics processing unit ("iGPU") included in chipset of a motherboard.

Inference and/or training logic 2715 are used to perform inferencing and/or training operations associated with one or more embodiments. Details regarding inference and/or training logic 2715 are provided herein in conjunction with FIGS. 27A and/or 27B. In at least one embodiment, deep learning application processor is used to train a machine learning model, such as a neural network, to predict or infer information provided to SM 5500. In at least one embodiment, SM 5500 is used to infer or predict information based on a trained machine learning model (e.g., neural network) that has been trained by another processor or system or by SM 5500. In at least one embodiment, SM 5500 may be used to perform one or more neural network use cases described herein.

Embodiments are disclosed related a virtualized computing platform for advanced computing, such as image inferencing and image processing in medical applications. Without limitation, embodiments may include radiography, magnetic resonance imaging (MM), nuclear medicine, ultrasound, sonography, elastography, photoacoustic imaging, tomography, echocardiography, functional near-infrared spectroscopy, and magnetic particle imaging, or a combination thereof. In at least one embodiment, a virtualized computing platform and associated processes described herein may additionally or alternatively be used, without limitation, in forensic science analysis, sub-surface detection and imaging (e.g., oil exploration, archaeology, paleontology, etc.), topography, oceanography, geology, osteology, meteorology, intelligent area or object tracking and monitoring, sensor data processing (e.g., RADAR, SONAR, LIDAR, etc.), and/or genomics and gene sequencing.

Figure 56:
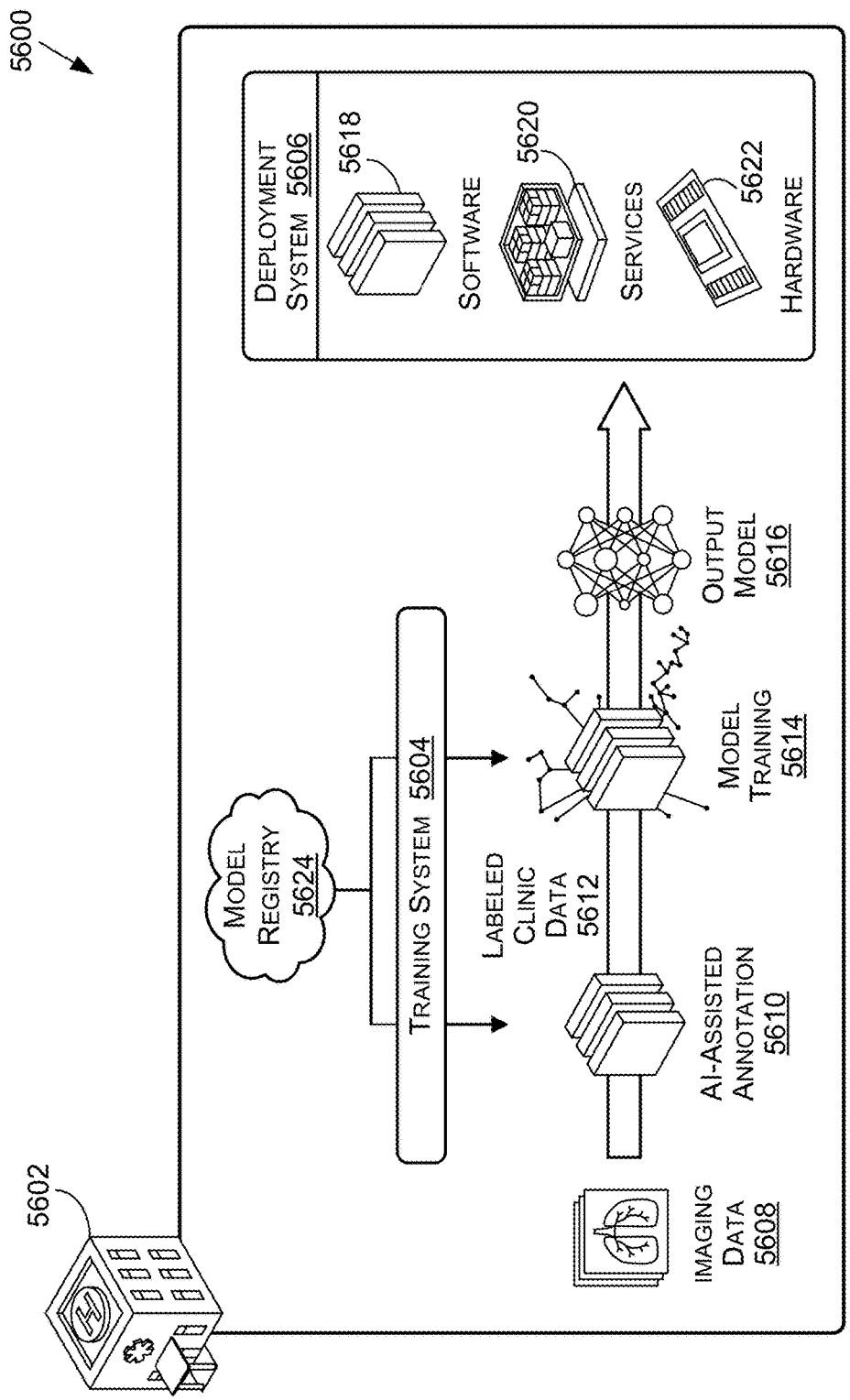
FIG. 56 is an example data flow diagram for an advanced computing pipeline, in accordance with at least one embodiment.

With reference to FIG. 56, FIG. 56 is an example data flow diagram for a process 5600 of generating and deploying an image processing and inferencing pipeline, in accordance with at least one embodiment. In at least one embodiment, process 5600 may be deployed for use with imaging devices, processing devices, genomics devices, gene sequencing devices, radiology devices, and/or other device types at one or more facilities 5602, such as medical facilities, hospitals, healthcare institutes, clinics, research or diagnostic labs, etc. In at least one embodiment, process 5600 may be deployed to perform genomics analysis and inferencing on sequencing data. Examples of genomic analyses that may be performed using systems and processes described herein include, without limitation, variant calling, mutation detection, and gene expression quantification.

In at least one embodiment, process 5600 may be executed within a training system 5604 and/or a deployment system 5606. In at least one embodiment, training system 5604 may be used to perform training, deployment, and implementation of machine learning models (e.g., neural networks, object detection algorithms, computer vision algorithms, etc.) for use in deployment system 5606. In at least one embodiment, deployment system 5606 may be configured to offload processing and compute resources among a distributed computing environment to reduce infrastructure requirements at facility 5602. In at least one embodiment, deployment system 5606 may provide a streamlined platform for selecting, customizing, and implementing virtual instruments for use with imaging devices (e.g., Mill, CT Scan, X-Ray, Ultrasound, etc.) or sequencing devices at facility 5602. In at least one embodiment, virtual instruments may include software-defined applications for performing one or more processing operations with respect to imaging data generated by imaging devices, sequencing devices, radiology devices, and/or other device types. In at least one embodiment, one or more applications in a pipeline may use or call upon services (e.g., inference, visualization, compute, AI, etc.) of deployment system 5606 during execution of applications.

In at least one embodiment, some of applications used in advanced processing and inferencing pipelines may use machine learning models or other AI to perform one or more processing steps. In at least one embodiment, machine learning models may be trained at facility 5602 using data 5608 (such as imaging data) generated at facility 5602 (and stored on one or more picture archiving and communication system (PACS) servers at facility 5602), may be trained using imaging or sequencing data 5608 from another facility or facilities (e.g., a different hospital, lab, clinic, etc.), or a combination thereof. In at least one embodiment, training system 5604 may be used to provide applications, services, and/or other resources for generating working, deployable machine learning models for deployment system 5606.

In at least one embodiment, a model registry 5624 may be backed by object storage that may support versioning and object metadata. In at least one embodiment, object storage may be accessible through, for example, a cloud storage (e.g., a cloud 5726 of FIG. 57) compatible application programming interface (API) from within a cloud platform. In at least one embodiment, machine learning models within model registry 5624 may uploaded, listed, modified, or deleted by developers or partners of a system interacting with an API. In at least one embodiment, an API may provide access to methods that allow users with appropriate credentials to associate models with applications, such that models may be executed as part of execution of containerized instantiations of applications.

In at least one embodiment, a training pipeline 5704 (FIG. 57) may include a scenario where facility 5602 is training their own machine learning model, or has an existing machine learning model that needs to be optimized or updated. In at least one embodiment, imaging data 5608 generated by imaging device(s), sequencing devices, and/or other device types may be received. In at least one embodiment, once imaging data 5608 is received, AI-assisted annotation 5610 may be used to aid in generating annotations corresponding to imaging data 5608 to be used as ground truth data for a machine learning model. In at least one embodiment, AI-assisted annotation 5610 may include one or more machine learning models (e.g., convolutional neural networks (CNNs)) that may be trained to generate annotations corresponding to certain types of imaging data 5608 (e.g., from certain devices) and/or certain types of anomalies in imaging data 5608. In at least one embodiment, AI-assisted annotations 5610 may then be used directly, or may be adjusted or fine-tuned using an annotation tool (e.g., by a researcher, a clinician, a doctor, a scientist, etc.), to generate ground truth data. In at least one embodiment, in some examples, labeled clinic data 5612 (e.g., annotations provided by a clinician, doctor, scientist, technician, etc.) may be used as ground truth data for training a machine learning model. In at least one embodiment, AI-assisted annotations 5610, labeled clinic data 5612, or a combination thereof may be used as ground truth data for training a machine learning model. In at least one embodiment, a trained machine learning model may be referred to as an output model 5616, and may be used by deployment system 5606, as described herein.

In at least one embodiment, training pipeline 5704 (FIG. 57) may include a scenario where facility 5602 needs a machine learning model for use in performing one or more processing tasks for one or more applications in deployment system 5606, but facility 5602 may not currently have such a machine learning model (or may not have a model that is optimized, efficient, or effective for such purposes). In at least one embodiment, an existing machine learning model may be selected from model registry 5624. In at least one embodiment, model registry 5624 may include machine learning models trained to perform a variety of different inference tasks on imaging data. In at least one embodiment, machine learning models in model registry 5624 may have been trained on imaging data from different facilities than facility 5602 (e.g., facilities remotely located). In at least one embodiment, machine learning models may have been trained on imaging data from one location, two locations, or any number of locations. In at least one embodiment, when being trained on imaging data from a specific location, training may take place at that location, or at least in a manner that protects confidentiality of imaging data or restricts imaging data from being transferred off-premises (e.g., to comply with HIPAA regulations, privacy regulations, etc.). In at least one embodiment, once a model is trained—or partially trained—at one location, a machine learning model may be added to model registry 5624. In at least one embodiment, a machine learning model may then be retrained, or updated, at any number of other facilities, and a retrained or updated model may be made available in model registry 5624. In at least one embodiment, a machine learning model may then be selected from model registry 5624—and referred to as output model 5616—and may be used in deployment system 5606 to perform one or more processing tasks for one or more applications of a deployment system.

In at least one embodiment, training pipeline 5704 (FIG. 57) may be used in a scenario that includes facility 5602 requiring a machine learning model for use in performing one or more processing tasks for one or more applications in deployment system 5606, but facility 5602 may not currently have such a machine learning model (or may not have a model that is optimized, efficient, or effective for such purposes). In at least one embodiment, a machine learning model selected from model registry 5624 might not be fine-tuned or optimized for imaging data 5608 generated at facility 5602 because of differences in populations, genetic variations, robustness of training data used to train a machine learning model, diversity in anomalies of training data, and/or other issues with training data. In at least one embodiment, AI-assisted annotation 5610 may be used to aid in generating annotations corresponding to imaging data 5608 to be used as ground truth data for retraining or updating a machine learning model. In at least one embodiment, labeled clinic data 5612 (e.g., annotations provided by a clinician, doctor, scientist, etc.) may be used as ground truth data for training a machine learning model. In at least one embodiment, retraining or updating a machine learning model may be referred to as model training 5614. In at least one embodiment, model training 5614—e.g., AI-assisted annotations 5610, labeled clinic data 5612, or a combination thereof—may be used as ground truth data for retraining or updating a machine learning model.

In at least one embodiment, deployment system 5606 may include software 5618, services 5620, hardware 5622, and/or other components, features, and functionality. In at least one embodiment, deployment system 5606 may include a software "stack," such that software 5618 may be built on top of services 5620 and may use services 5620 to perform some or all of processing tasks, and services 5620 and software 5618 may be built on top of hardware 5622 and use hardware 5622 to execute processing, storage, and/or other compute tasks of deployment system 5606.

In at least one embodiment, software 5618 may include any number of different containers, where each container may execute an instantiation of an application. In at least one embodiment, each application may perform one or more processing tasks in an advanced processing and inferencing pipeline (e.g., inferencing, object detection, feature detection, segmentation, image enhancement, calibration, etc.). In at least one embodiment, for each type of imaging device (e.g., CT, MM, X-Ray, ultrasound, sonography, echocardiography, etc.), sequencing device, radiology device, genomics device, etc., there may be any number of containers that may perform a data processing task with respect to imaging data 5608 (or other data types, such as those described herein) generated by a device. In at least one embodiment, an advanced processing and inferencing pipeline may be defined based on selections of different containers that are desired or required for processing imaging data 5608, in addition to containers that receive and configure imaging data for use by each container and/or for use by facility 5602 after processing through a pipeline (e.g., to convert outputs back to a usable data type, such as digital imaging and communications in medicine (DICOM) data, radiology information system (RIS) data, clinical information system (CIS) data, remote procedure call (RPC) data, data substantially compliant with a representation state transfer (REST) interface, data substantially compliant with a file-based interface, and/or raw data, for storage and display at facility 5602). In at least one embodiment, a combination of containers within software 5618 (e.g., that make up a pipeline) may be referred to as a virtual instrument (as described in more detail herein), and a virtual instrument may leverage services 5620 and hardware 5622 to execute some or all processing tasks of applications instantiated in containers.

In at least one embodiment, a data processing pipeline may receive input data (e.g., imaging data 5608) in a DICOM, RIS, CIS, REST compliant, RPC, raw, and/or other format in response to an inference request (e.g., a request from a user of deployment system 5606, such as a clinician, a doctor, a radiologist, etc.). In at least one embodiment, input data may be representative of one or more images, video, and/or other data representations generated by one or more imaging devices, sequencing devices, radiology devices, genomics devices, and/or other device types. In at least one embodiment, data may undergo pre-processing as part of data processing pipeline to prepare data for processing by one or more applications. In at least one embodiment, post-processing may be performed on an output of one or more inferencing tasks or other processing tasks of a pipeline to prepare an output data for a next application and/or to prepare output data for transmission and/or use by a user (e.g., as a response to an inference request). In at least one embodiment, inferencing tasks may be performed by one or more machine learning models, such as trained or deployed neural networks, which may include output models 5616 of training system 5604.

In at least one embodiment, tasks of data processing pipeline may be encapsulated in a container(s) that each represent a discrete, fully functional instantiation of an application and virtualized computing environment that is able to reference machine learning models. In at least one embodiment, containers or applications may be published into a private (e.g., limited access) area of a container registry (described in more detail herein), and trained or deployed models may be stored in model registry 5624 and associated with one or more applications. In at least one embodiment, images of applications (e.g., container images) may be available in a container registry, and once selected by a user from a container registry for deployment in a pipeline, an image may be used to generate a container for an instantiation of an application for use by a user's system.

In at least one embodiment, developers (e.g., software developers, clinicians, doctors, etc.) may develop, publish, and store applications (e.g., as containers) for performing image processing and/or inferencing on supplied data. In at least one embodiment, development, publishing, and/or storing may be performed using a software development kit (SDK) associated with a system (e.g., to ensure that an application and/or container developed is compliant with or compatible with a system). In at least one embodiment, an application that is developed may be tested locally (e.g., at a first facility, on data from a first facility) with an SDK which may support at least some of services 5620 as a system (e.g., system 5700 of FIG. 57). In at least one embodiment, because DICOM objects may contain anywhere from one to hundreds of images or other data types, and due to a variation in data, a developer may be responsible for managing (e.g., setting constructs for, building pre-processing into an application, etc.) extraction and preparation of incoming DICOM data. In at least one embodiment, once validated by system 5700 (e.g., for accuracy, safety, patient privacy, etc.), an application may be available in a container registry for selection and/or implementation by a user (e.g., a hospital, clinic, lab, healthcare provider, etc.) to perform one or more processing tasks with respect to data at a facility (e.g., a second facility) of a user.

Figure 57:
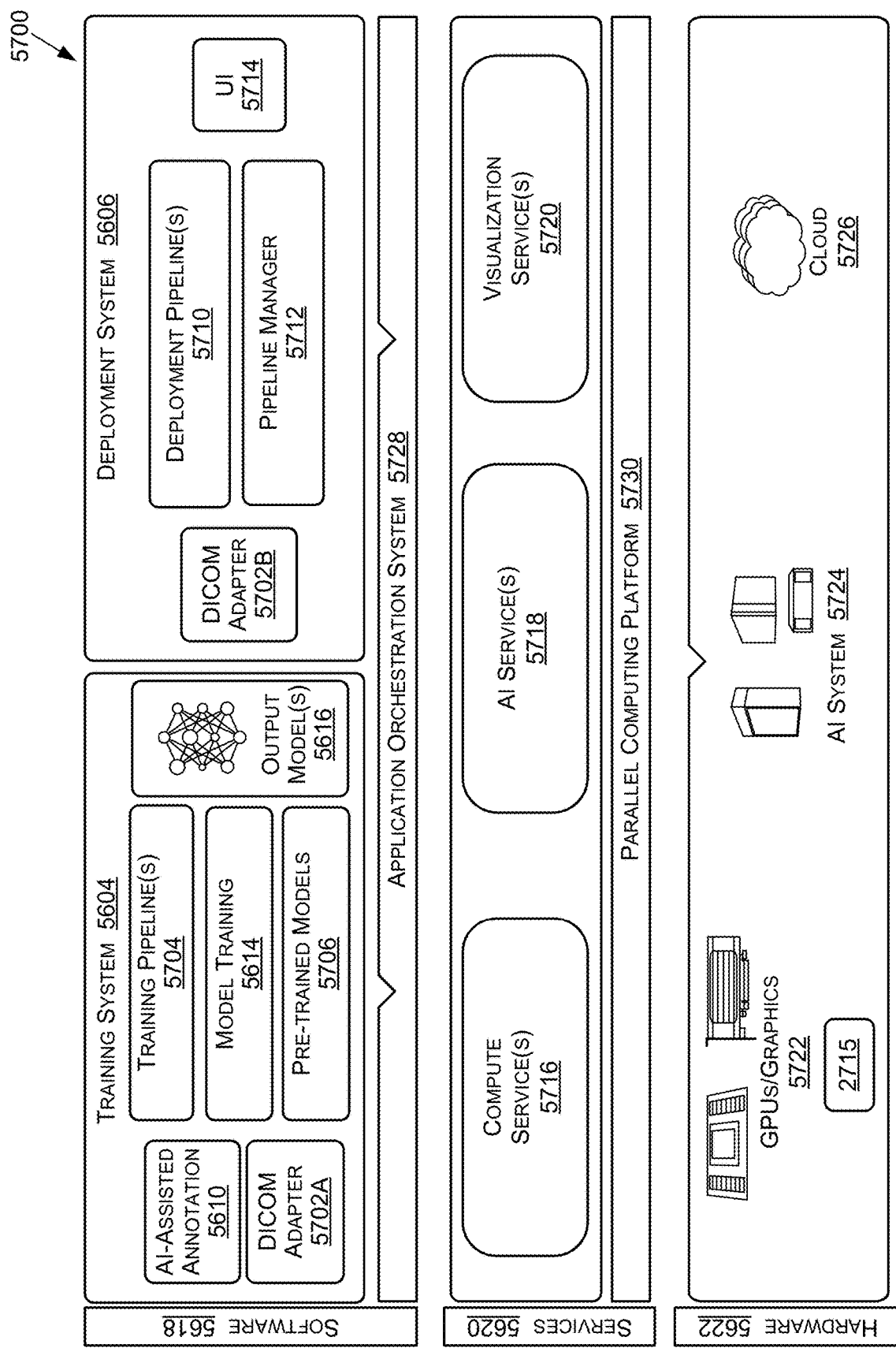
FIG. 57 is a system diagram for an example system for training, adapting, instantiating and deploying machine learning models in an advanced computing pipeline, in accordance with at least one embodiment.

In at least one embodiment, developers may then share applications or containers through a network for access and use by users of a system (e.g., system 5700 of FIG. 57). In at least one embodiment, completed and validated applications or containers may be stored in a container registry and associated machine learning models may be stored in model registry 5624. In at least one embodiment, a requesting entity (e.g., a user at a medical facility)—who provides an inference or image processing request—may browse a container registry and/or model registry 5624 for an application, container, dataset, machine learning model, etc., select a desired combination of elements for inclusion in data processing pipeline, and submit an imaging processing request. In at least one embodiment, a request may include input data (and associated patient data, in some examples) that is necessary to perform a request, and/or may include a selection of application(s) and/or machine learning models to be executed in processing a request. In at least one embodiment, a request may then be passed to one or more components of deployment system 5606 (e.g., a cloud) to perform processing of data processing pipeline. In at least one embodiment, processing by deployment system 5606 may include referencing selected elements (e.g., applications, containers, models, etc.) from a container registry and/or model registry 5624. In at least one embodiment, once results are generated by a pipeline, results may be returned to a user for reference (e.g., for viewing in a viewing application suite executing on a local, on-premises workstation or terminal). In at least one embodiment, a radiologist may receive results from an data processing pipeline including any number of application and/or containers, where results may include anomaly detection in X-rays, CT scans, MRIs, etc.

In at least one embodiment, to aid in processing or execution of applications or containers in pipelines, services 5620 may be leveraged. In at least one embodiment, services 5620 may include compute services, artificial intelligence (AI) services, visualization services, and/or other service types. In at least one embodiment, services 5620 may provide functionality that is common to one or more applications in software 5618, so functionality may be abstracted to a service that may be called upon or leveraged by applications. In at least one embodiment, functionality provided by services 5620 may run dynamically and more efficiently, while also scaling well by allowing applications to process data in parallel (e.g., using a parallel computing platform 5730 (FIG. 57)). In at least one embodiment, rather than each application that shares a same functionality offered by a service 5620 being required to have a respective instance of service 5620, service 5620 may be shared between and among various applications. In at least one embodiment, services may include an inference server or engine that may be used for executing detection or segmentation tasks, as non-limiting examples. In at least one embodiment, a model training service may be included that may provide machine learning model training and/or retraining capabilities. In at least one embodiment, a data augmentation service may further be included that may provide GPU accelerated data (e.g., DICOM, RIS, CIS, REST compliant, RPC, raw, etc.) extraction, resizing, scaling, and/or other augmentation. In at least one embodiment, a visualization service may be used that may add image rendering effects—such as ray-tracing, rasterization, denoising, sharpening, etc.—to add realism to two-dimensional (2D) and/or three-dimensional (3D) models. In at least one embodiment, virtual instrument services may be included that provide for beam-forming, segmentation, inferencing, imaging, and/or support for other applications within pipelines of virtual instruments.

In at least one embodiment, where a service 5620 includes an AI service (e.g., an inference service), one or more machine learning models associated with an application for anomaly detection (e.g., tumors, growth abnormalities, scarring, etc.) may be executed by calling upon (e.g., as an API call) an inference service (e.g., an inference server) to execute machine learning model(s), or processing thereof, as part of application execution. In at least one embodiment, where another application includes one or more machine learning models for segmentation tasks, an application may call upon an inference service to execute machine learning models for performing one or more of processing operations associated with segmentation tasks. In at least one embodiment, software 5618 implementing advanced processing and inferencing pipeline that includes segmentation application and anomaly detection application may be streamlined because each application may call upon a same inference service to perform one or more inferencing tasks.

In at least one embodiment, hardware 5622 may include GPUs, CPUs, graphics cards, an AI/deep learning system (e.g., an AI supercomputer, such as NVIDIA's DGX supercomputer system), a cloud platform, or a combination thereof. In at least one embodiment, different types of hardware 5622 may be used to provide efficient, purpose-built support for software 5618 and services 5620 in deployment system 5606. In at least one embodiment, use of GPU processing may be implemented for processing locally (e.g., at facility 5602), within an AI/deep learning system, in a cloud system, and/or in other processing components of deployment system 5606 to improve efficiency, accuracy, and efficacy of image processing, image reconstruction, segmentation, MM exams, stroke or heart attack detection (e.g., in real-time), image quality in rendering, etc. In at least one embodiment, a facility may include imaging devices, genomics devices, sequencing devices, and/or other device types on-premises that may leverage GPUs to generate imaging data representative of a subject's anatomy.

In at least one embodiment, software 5618 and/or services 5620 may be optimized for GPU processing with respect to deep learning, machine learning, and/or high-performance computing, as non-limiting examples. In at least one embodiment, at least some of computing environment of deployment system 5606 and/or training system 5604 may be executed in a datacenter one or more supercomputers or high performance computing systems, with GPU optimized software (e.g., hardware and software combination of NVIDIA's DGX system). In at least one embodiment, datacenters may be compliant with provisions of HIPAA, such that receipt, processing, and transmission of imaging data and/or other patient data is securely handled with respect to privacy of patient data. In at least one embodiment, hardware 5622 may include any number of GPUs that may be called upon to perform processing of data in parallel, as described herein. In at least one embodiment, cloud platform may further include GPU processing for GPU-optimized execution of deep learning tasks, machine learning tasks, or other computing tasks. In at least one embodiment, cloud platform (e.g., NVIDIA's NGC) may be executed using an AI/deep learning supercomputer(s) and/or GPU-optimized software (e.g., as provided on NVIDIA's DGX systems) as a hardware abstraction and scaling platform. In at least one embodiment, cloud platform may integrate an application container clustering system or orchestration system (e.g., KUBERNETES) on multiple GPUs to enable seamless scaling and load balancing.

FIG. 57 is a system diagram for an example system 5700 for generating and deploying an imaging deployment pipeline, in accordance with at least one embodiment. In at least one embodiment, system 5700 may be used to implement process 5600 of FIG. 56 and/or other processes including advanced processing and inferencing pipelines. In at least one embodiment, system 5700 may include training system 5604 and deployment system 5606. In at least one embodiment, training system 5604 and deployment system 5606 may be implemented using software 5618, services 5620, and/or hardware 5622, as described herein.

In at least one embodiment, system 5700 (e.g., training system 5604 and/or deployment system 5606) may implemented in a cloud computing environment (e.g., using cloud 5726). In at least one embodiment, system 5700 may be implemented locally with respect to a healthcare services facility, or as a combination of both cloud and local computing resources. In at least one embodiment, in embodiments where cloud computing is implemented, patient data may be separated from, or unprocessed by, by one or more components of system 5700 that would render processing non-compliant with HIPAA and/or other data handling and privacy regulations or laws. In at least one embodiment, access to APIs in cloud 5726 may be restricted to authorized users through enacted security measures or protocols. In at least one embodiment, a security protocol may include web tokens that may be signed by an authentication (e.g., AuthN, AuthZ, Gluecon, etc.) service and may carry appropriate authorization. In at least one embodiment, APIs of virtual instruments (described herein), or other instantiations of system 5700, may be restricted to a set of public IPs that have been vetted or authorized for interaction.

In at least one embodiment, various components of system 5700 may communicate between and among one another using any of a variety of different network types, including but not limited to local area networks (LANs) and/or wide area networks (WANs) via wired and/or wireless communication protocols. In at least one embodiment, communication between facilities and components of system 5700 (e.g., for transmitting inference requests, for receiving results of inference requests, etc.) may be communicated over a data bus or data busses, wireless data protocols (Wi-Fi), wired data protocols (e.g., Ethernet), etc.

In at least one embodiment, training system 5604 may execute training pipelines 5704, similar to those described herein with respect to FIG. 56. In at least one embodiment, where one or more machine learning models are to be used in deployment pipelines 5710 by deployment system 5606, training pipelines 5704 may be used to train or retrain one or more (e.g., pre-trained) models, and/or implement one or more of pre-trained models 5706 (e.g., without a need for retraining or updating). In at least one embodiment, as a result of training pipelines 5704, output model(s) 5616 may be generated. In at least one embodiment, training pipelines 5704 may include any number of processing steps, such as but not limited to imaging data (or other input data) conversion or adaption (e.g., using DICOM adapter 5702A to convert DICOM images to another format suitable for processing by respective machine learning models, such as Neuroimaging Informatics Technology Initiative (NIfTI) format), AI-assisted annotation 5610, labeling or annotating of imaging data 5608 to generate labeled clinic data 5612, model selection from a model registry, model training 5614, training, retraining, or updating models, and/or other processing steps. In at least one embodiment, for different machine learning models used by deployment system 5606, different training pipelines 5704 may be used. In at least one embodiment, training pipeline 5704 similar to a first example described with respect to FIG. 56 may be used for a first machine learning model, training pipeline 5704 similar to a second example described with respect to FIG. 56 may be used for a second machine learning model, and training pipeline 5704 similar to a third example described with respect to FIG. 56 may be used for a third machine learning model. In at least one embodiment, any combination of tasks within training system 5604 may be used depending on what is required for each respective machine learning model. In at least one embodiment, one or more of machine learning models may already be trained and ready for deployment so machine learning models may not undergo any processing by training system 5604, and may be implemented by deployment system 5606.

In at least one embodiment, output model(s) 5616 and/or pre-trained model(s) 5706 may include any types of machine learning models depending on implementation or embodiment. In at least one embodiment, and without limitation, machine learning models used by system 5700 may include machine learning model(s) using linear regression, logistic regression, decision trees, support vector machines (SVM), Naïve Bayes, k-nearest neighbor (Knn), K means clustering, random forest, dimensionality reduction algorithms, gradient boosting algorithms, neural networks (e.g., auto-encoders, convolutional, recurrent, perceptrons, Long/Short Term Memory (LSTM), Hopfield, Boltzmann, deep belief, deconvolutional, generative adversarial, liquid state machine, etc.), and/or other types of machine learning models.

Figure 60A:
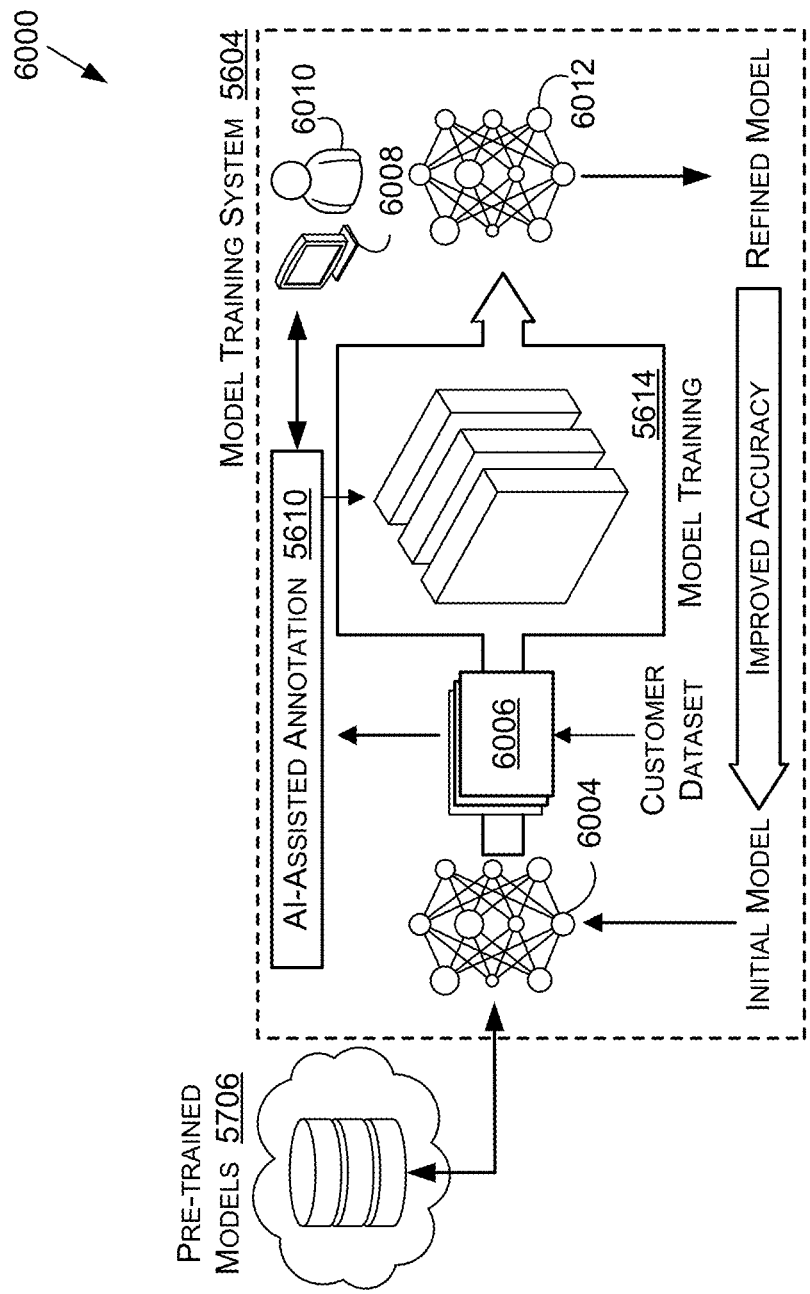
FIG. 60A illustrates a data flow diagram for a process to train a machine learning model, in accordance with at least one embodiment.
Figure 60B:
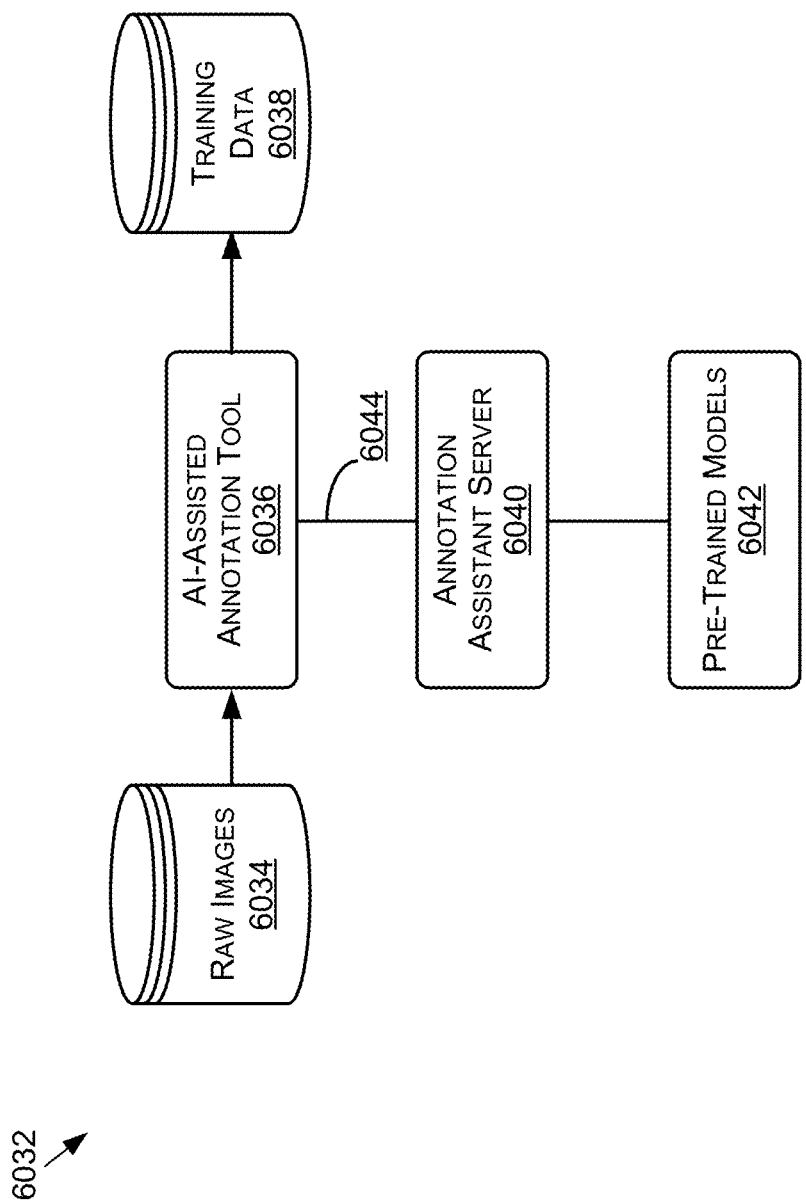
FIG. 60B is an example illustration of a client-server architecture to enhance annotation tools with pre-trained annotation models, in accordance with at least one embodiment.

In at least one embodiment, training pipelines 5704 may include AI-assisted annotation, as described in more detail herein with respect to at least FIG. 60B. In at least one embodiment, labeled clinic data 5612 (e.g., traditional annotation) may be generated by any number of techniques. In at least one embodiment, labels or other annotations may be generated within a drawing program (e.g., an annotation program), a computer aided design (CAD) program, a labeling program, another type of program suitable for generating annotations or labels for ground truth, and/or may be hand drawn, in some examples. In at least one embodiment, ground truth data may be synthetically produced (e.g., generated from computer models or renderings), real produced (e.g., designed and produced from real-world data), machine-automated (e.g., using feature analysis and learning to extract features from data and then generate labels), human annotated (e.g., labeler, or annotation expert, defines location of labels), and/or a combination thereof. In at least one embodiment, for each instance of imaging data 5608 (or other data type used by machine learning models), there may be corresponding ground truth data generated by training system 5604. In at least one embodiment, AI-assisted annotation may be performed as part of deployment pipelines 5710; either in addition to, or in lieu of AI-assisted annotation included in training pipelines 5704. In at least one embodiment, system 5700 may include a multi-layer platform that may include a software layer (e.g., software 5618) of diagnostic applications (or other application types) that may perform one or more medical imaging and diagnostic functions. In at least one embodiment, system 5700 may be communicatively coupled to (e.g., via encrypted links) PACS server networks of one or more facilities. In at least one embodiment, system 5700 may be configured to access and referenced data (e.g., DICOM data, RIS data, raw data, CIS data, REST compliant data, RPC data, raw data, etc.) from PACS servers (e.g., via a DICOM adapter 5702, or another data type adapter such as RIS, CIS, REST compliant, RPC, raw, etc.) to perform operations, such as training machine learning models, deploying machine learning models, image processing, inferencing, and/or other operations.

In at least one embodiment, a software layer may be implemented as a secure, encrypted, and/or authenticated API through which applications or containers may be invoked (e.g., called) from an external environment(s) (e.g., facility 5602). In at least one embodiment, applications may then call or execute one or more services 5620 for performing compute, AI, or visualization tasks associated with respective applications, and software 5618 and/or services 5620 may leverage hardware 5622 to perform processing tasks in an effective and efficient manner.

In at least one embodiment, deployment system 5606 may execute deployment pipelines 5710. In at least one embodiment, deployment pipelines 5710 may include any number of applications that may be sequentially, non-sequentially, or otherwise applied to imaging data (and/or other data types) generated by imaging devices, sequencing devices, genomics devices, etc.—including AI-assisted annotation, as described above. In at least one embodiment, as described herein, a deployment pipeline 5710 for an individual device may be referred to as a virtual instrument for a device (e.g., a virtual ultrasound instrument, a virtual CT scan instrument, a virtual sequencing instrument, etc.). In at least one embodiment, for a single device, there may be more than one deployment pipeline 5710 depending on information desired from data generated by a device. In at least one embodiment, where detections of anomalies are desired from an MM machine, there may be a first deployment pipeline 5710, and where image enhancement is desired from output of an Mill machine, there may be a second deployment pipeline 5710.

In at least one embodiment, applications available for deployment pipelines 5710 may include any application that may be used for performing processing tasks on imaging data or other data from devices. In at least one embodiment, different applications may be responsible for image enhancement, segmentation, reconstruction, anomaly detection, object detection, feature detection, treatment planning, dosimetry, beam planning (or other radiation treatment procedures), and/or other analysis, image processing, or inferencing tasks. In at least one embodiment, deployment system 5606 may define constructs for each of applications, such that users of deployment system 5606 (e.g., medical facilities, labs, clinics, etc.) may understand constructs and adapt applications for implementation within their respective facility. In at least one embodiment, an application for image reconstruction may be selected for inclusion in deployment pipeline 5710, but data type generated by an imaging device may be different from a data type used within an application. In at least one embodiment, DICOM adapter 5702B (and/or a DICOM reader) or another data type adapter or reader (e.g., RIS, CIS, REST compliant, RPC, raw, etc.) may be used within deployment pipeline 5710 to convert data to a form useable by an application within deployment system 5606. In at least one embodiment, access to DICOM, RIS, CIS, REST compliant, RPC, raw, and/or other data type libraries may be accumulated and pre-processed, including decoding, extracting, and/or performing any convolutions, color corrections, sharpness, gamma, and/or other augmentations to data. In at least one embodiment, DICOM, RIS, CIS, REST compliant, RPC, and/or raw data may be unordered and a pre-pass may be executed to organize or sort collected data. In at least one embodiment, because various applications may share common image operations, in some embodiments, a data augmentation library (e.g., as one of services 5620) may be used to accelerate these operations. In at least one embodiment, to avoid bottlenecks of conventional processing approaches that rely on CPU processing, parallel computing platform 5730 may be used for GPU acceleration of these processing tasks.

In at least one embodiment, an image reconstruction application may include a processing task that includes use of a machine learning model. In at least one embodiment, a user may desire to use their own machine learning model, or to select a machine learning model from model registry 5624. In at least one embodiment, a user may implement their own machine learning model or select a machine learning model for inclusion in an application for performing a processing task. In at least one embodiment, applications may be selectable and customizable, and by defining constructs of applications, deployment and implementation of applications for a particular user are presented as a more seamless user experience. In at least one embodiment, by leveraging other features of system 5700—such as services 5620 and hardware 5622—deployment pipelines 5710 may be even more user friendly, provide for easier integration, and produce more accurate, efficient, and timely results.

In at least one embodiment, deployment system 5606 may include a user interface 5714 (e.g., a graphical user interface, a web interface, etc.) that may be used to select applications for inclusion in deployment pipeline(s) 5710, arrange applications, modify or change applications or parameters or constructs thereof, use and interact with deployment pipeline(s) 5710 during set-up and/or deployment, and/or to otherwise interact with deployment system 5606. In at least one embodiment, although not illustrated with respect to training system 5604, user interface 5714 (or a different user interface) may be used for selecting models for use in deployment system 5606, for selecting models for training, or retraining, in training system 5604, and/or for otherwise interacting with training system 5604.

Figure 58:
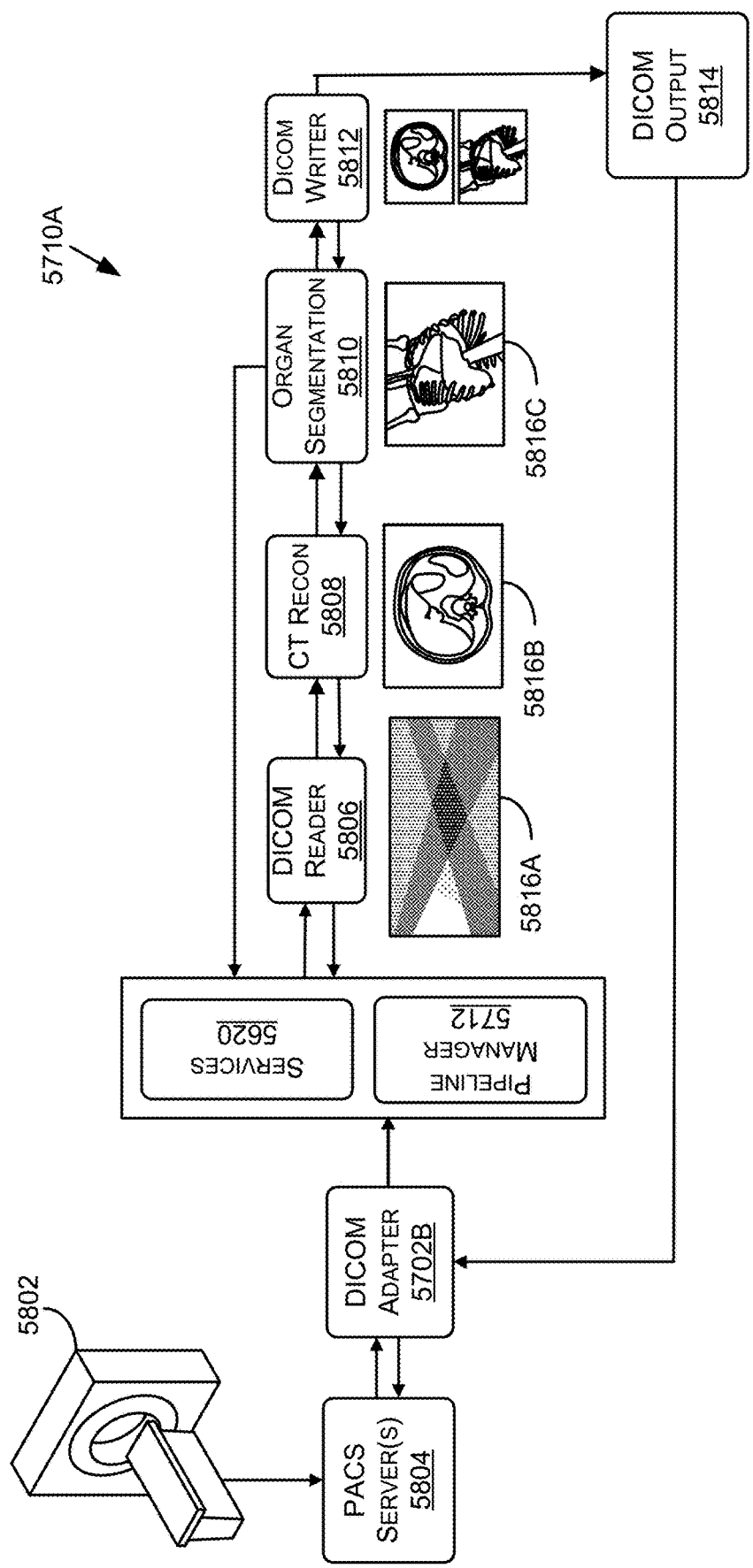
FIG. 58 includes an example illustration of an advanced computing pipeline 5710A for processing imaging data, in accordance with at least one embodiment.

In at least one embodiment, pipeline manager 5712 may be used, in addition to an application orchestration system 5728, to manage interaction between applications or containers of deployment pipeline(s) 5710 and services 5620 and/or hardware 5622. In at least one embodiment, pipeline manager 5712 may be configured to facilitate interactions from application to application, from application to service 5620, and/or from application or service to hardware 5622. In at least one embodiment, although illustrated as included in software 5618, this is not intended to be limiting, and in some examples (e.g., as illustrated in FIG. 58) pipeline manager 5712 may be included in services 5620. In at least one embodiment, application orchestration system 5728 (e.g., Kubernetes, DOCKER, etc.) may include a container orchestration system that may group applications into containers as logical units for coordination, management, scaling, and deployment. In at least one embodiment, by associating applications from deployment pipeline(s) 5710 (e.g., a reconstruction application, a segmentation application, etc.) with individual containers, each application may execute in a self-contained environment (e.g., at a kernel level) to increase speed and efficiency.

In at least one embodiment, each application and/or container (or image thereof) may be individually developed, modified, and deployed (e.g., a first user or developer may develop, modify, and deploy a first application and a second user or developer may develop, modify, and deploy a second application separate from a first user or developer), which may allow for focus on, and attention to, a task of a single application and/or container(s) without being hindered by tasks of another application(s) or container(s). In at least one embodiment, communication, and cooperation between different containers or applications may be aided by pipeline manager 5712 and application orchestration system 5728. In at least one embodiment, so long as an expected input and/or output of each container or application is known by a system (e.g., based on constructs of applications or containers), application orchestration system 5728 and/or pipeline manager 5712 may facilitate communication among and between, and sharing of resources among and between, each of applications or containers. In at least one embodiment, because one or more of applications or containers in deployment pipeline(s) 5710 may share same services and resources, application orchestration system 5728 may orchestrate, load balance, and determine sharing of services or resources between and among various applications or containers. In at least one embodiment, a scheduler may be used to track resource requirements of applications or containers, current usage or planned usage of these resources, and resource availability. In at least one embodiment, a scheduler may thus allocate resources to different applications and distribute resources between and among applications in view of requirements and availability of a system. In some examples, a scheduler (and/or other component of application orchestration system 5728) may determine resource availability and distribution based on constraints imposed on a system (e.g., user constraints), such as quality of service (QoS), urgency of need for data outputs (e.g., to determine whether to execute real-time processing or delayed processing), etc.

In at least one embodiment, services 5620 leveraged by and shared by applications or containers in deployment system 5606 may include compute services 5716, AI services 5718, visualization services 5720, and/or other service types. In at least one embodiment, applications may call (e.g., execute) one or more of services 5620 to perform processing operations for an application. In at least one embodiment, compute services 5716 may be leveraged by applications to perform super-computing or other high-performance computing (HPC) tasks. In at least one embodiment, compute service(s) 5716 may be leveraged to perform parallel processing (e.g., using a parallel computing platform 5730) for processing data through one or more of applications and/or one or more tasks of a single application, substantially simultaneously. In at least one embodiment, parallel computing platform 5730 (e.g., NVIDIA's CUDA) may enable general purpose computing on GPUs (GPGPU) (e.g., GPUs 5722). In at least one embodiment, a software layer of parallel computing platform 5730 may provide access to virtual instruction sets and parallel computational elements of GPUs, for execution of compute kernels. In at least one embodiment, parallel computing platform 5730 may include memory and, in some embodiments, a memory may be shared between and among multiple containers, and/or between and among different processing tasks within a single container. In at least one embodiment, inter-process communication (IPC) calls may be generated for multiple containers and/or for multiple processes within a container to use same data from a shared segment of memory of parallel computing platform 5730 (e.g., where multiple different stages of an application or multiple applications are processing same information). In at least one embodiment, rather than making a copy of data and moving data to different locations in memory (e.g., a read/write operation), same data in same location of a memory may be used for any number of processing tasks (e.g., at a same time, at different times, etc.). In at least one embodiment, as data is used to generate new data as a result of processing, this information of a new location of data may be stored and shared between various applications. In at least one embodiment, location of data and a location of updated or modified data may be part of a definition of how a payload is understood within containers.

In at least one embodiment, AI services 5718 may be leveraged to perform inferencing services for executing machine learning model(s) associated with applications (e.g., tasked with performing one or more processing tasks of an application). In at least one embodiment, AI services 5718 may leverage AI system 5724 to execute machine learning model(s) (e.g., neural networks, such as CNNs) for segmentation, reconstruction, object detection, feature detection, classification, and/or other inferencing tasks. In at least one embodiment, applications of deployment pipeline(s) 5710 may use one or more of output models 5616 from training system 5604 and/or other models of applications to perform inference on imaging data (e.g., DICOM data, RIS data, CIS data, REST compliant data, RPC data, raw data, etc.). In at least one embodiment, two or more examples of inferencing using application orchestration system 5728 (e.g., a scheduler) may be available. In at least one embodiment, a first category may include a high priority/low latency path that may achieve higher service level agreements, such as for performing inference on urgent requests during an emergency, or for a radiologist during diagnosis.

In at least one embodiment, a second category may include a standard priority path that may be used for requests that may be non-urgent or where analysis may be performed at a later time. In at least one embodiment, application orchestration system 5728 may distribute resources (e.g., services 5620 and/or hardware 5622) based on priority paths for different inferencing tasks of AI services 5718.

In at least one embodiment, shared storage may be mounted to AI services 5718 within system 5700. In at least one embodiment, shared storage may operate as a cache (or other storage device type) and may be used to process inference requests from applications. In at least one embodiment, when an inference request is submitted, a request may be received by a set of API instances of deployment system 5606, and one or more instances may be selected (e.g., for best fit, for load balancing, etc.) to process a request. In at least one embodiment, to process a request, a request may be entered into a database, a machine learning model may be located from model registry 5624 if not already in a cache, a validation step may ensure appropriate machine learning model is loaded into a cache (e.g., shared storage), and/or a copy of a model may be saved to a cache. In at least one embodiment, a scheduler (e.g., of pipeline manager 5712) may be used to launch an application that is referenced in a request if an application is not already running or if there are not enough instances of an application. In at least one embodiment, if an inference server is not already launched to execute a model, an inference server may be launched. In at least one embodiment, any number of inference servers may be launched per model. In at least one embodiment, in a pull model, in which inference servers are clustered, models may be cached whenever load balancing is advantageous. In at least one embodiment, inference servers may be statically loaded in corresponding, distributed servers.

In at least one embodiment, inferencing may be performed using an inference server that runs in a container. In at least one embodiment, an instance of an inference server may be associated with a model (and optionally a plurality of versions of a model). In at least one embodiment, if an instance of an inference server does not exist when a request to perform inference on a model is received, a new instance may be loaded. In at least one embodiment, when starting an inference server, a model may be passed to an inference server such that a same container may be used to serve different models so long as inference server is running as a different instance.

In at least one embodiment, during application execution, an inference request for a given application may be received, and a container (e.g., hosting an instance of an inference server) may be loaded (if not already), and a start procedure may be called. In at least one embodiment, pre-processing logic in a container may load, decode, and/or perform any additional pre-processing on incoming data (e.g., using a CPU(s) and/or GPU(s)). In at least one embodiment, once data is prepared for inference, a container may perform inference as necessary on data. In at least one embodiment, this may include a single inference call on one image (e.g., a hand X-ray), or may require inference on hundreds of images (e.g., a chest CT). In at least one embodiment, an application may summarize results before completing, which may include, without limitation, a single confidence score, pixel level-segmentation, voxel-level segmentation, generating a visualization, or generating text to summarize findings. In at least one embodiment, different models or applications may be assigned different priorities. For example, some models may have a real-time (TAT less than one minute) priority while others may have lower priority (e.g., TAT less than 10 minutes). In at least one embodiment, model execution times may be measured from requesting institution or entity and may include partner network traversal time, as well as execution on an inference service.

In at least one embodiment, transfer of requests between services 5620 and inference applications may be hidden behind a software development kit (SDK), and robust transport may be provide through a queue. In at least one embodiment, a request will be placed in a queue via an API for an individual application/tenant ID combination and an SDK will pull a request from a queue and give a request to an application. In at least one embodiment, a name of a queue may be provided in an environment from where an SDK will pick it up. In at least one embodiment, asynchronous communication through a queue may be useful as it may allow any instance of an application to pick up work as it becomes available. In at least one embodiment, results may be transferred back through a queue, to ensure no data is lost. In at least one embodiment, queues may also provide an ability to segment work, as highest priority work may go to a queue with most instances of an application connected to it, while lowest priority work may go to a queue with a single instance connected to it that processes tasks in an order received. In at least one embodiment, an application may run on a GPU-accelerated instance generated in cloud 5726, and an inference service may perform inferencing on a GPU.

In at least one embodiment, visualization services 5720 may be leveraged to generate visualizations for viewing outputs of applications and/or deployment pipeline(s) 5710. In at least one embodiment, GPUs 5722 may be leveraged by visualization services 5720 to generate visualizations. In at least one embodiment, rendering effects, such as ray-tracing, may be implemented by visualization services 5720 to generate higher quality visualizations. In at least one embodiment, visualizations may include, without limitation, 2D image renderings, 3D volume renderings, 3D volume reconstruction, 2D tomographic slices, virtual reality displays, augmented reality displays, etc. In at least one embodiment, virtualized environments may be used to generate a virtual interactive display or environment (e.g., a virtual environment) for interaction by users of a system (e.g., doctors, nurses, radiologists, etc.). In at least one embodiment, visualization services 5720 may include an internal visualizer, cinematics, and/or other rendering or image processing capabilities or functionality (e.g., ray tracing, rasterization, internal optics, etc.).

In at least one embodiment, hardware 5622 may include GPUs 5722, AI system 5724, cloud 5726, and/or any other hardware used for executing training system 5604 and/or deployment system 5606. In at least one embodiment, GPUs 5722 (e.g., NVIDIA's TESLA and/or QUADRO GPUs) may include any number of GPUs that may be used for executing processing tasks of compute services 5716, AI services 5718, visualization services 5720, other services, and/or any of features or functionality of software 5618. For example, with respect to AI services 5718, GPUs 5722 may be used to perform pre-processing on imaging data (or other data types used by machine learning models), post-processing on outputs of machine learning models, and/or to perform inferencing (e.g., to execute machine learning models). In at least one embodiment, cloud 5726, AI system 5724, and/or other components of system 5700 may use GPUs 5722. In at least one embodiment, cloud 5726 may include a GPU-optimized platform for deep learning tasks. In at least one embodiment, AI system 5724 may use GPUs, and cloud 5726—or at least a portion tasked with deep learning or inferencing—may be executed using one or more AI systems 5724. As such, although hardware 5622 is illustrated as discrete components, this is not intended to be limiting, and any components of hardware 5622 may be combined with, or leveraged by, any other components of hardware 5622.

In at least one embodiment, AI system 5724 may include a purpose-built computing system (e.g., a super-computer or an HPC) configured for inferencing, deep learning, machine learning, and/or other artificial intelligence tasks. In at least one embodiment, AI system 5724 (e.g., NVIDIA's DGX) may include GPU-optimized software (e.g., a software stack) that may be executed using a plurality of GPUs 5722, in addition to CPUs, RAM, storage, and/or other components, features, or functionality. In at least one embodiment, one or more AI systems 5724 may be implemented in cloud 5726 (e.g., in a data center) for performing some or all of AI-based processing tasks of system 5700.

In at least one embodiment, cloud 5726 may include a GPU-accelerated infrastructure (e.g., NVIDIA's NGC) that may provide a GPU-optimized platform for executing processing tasks of system 5700. In at least one embodiment, cloud 5726 may include an AI system(s) 5724 for performing one or more of AI-based tasks of system 5700 (e.g., as a hardware abstraction and scaling platform). In at least one embodiment, cloud 5726 may integrate with application orchestration system 5728 leveraging multiple GPUs to enable seamless scaling and load balancing between and among applications and services 5620. In at least one embodiment, cloud 5726 may tasked with executing at least some of services 5620 of system 5700, including compute services 5716, AI services 5718, and/or visualization services 5720, as described herein. In at least one embodiment, cloud 5726 may perform small and large batch inference (e.g., executing NVIDIA's TENSOR RT), provide an accelerated parallel computing API and platform 5730 (e.g., NVIDIA's CUDA), execute application orchestration system 5728 (e.g., KUBERNETES), provide a graphics rendering API and platform (e.g., for ray-tracing, 2D graphics, 3D graphics, and/or other rendering techniques to produce higher quality cinematics), and/or may provide other functionality for system 5700.

In at least one embodiment, in an effort to preserve patient confidentiality (e.g., where patient data or records are to be used off-premises), cloud 5726 may include a registry—such as a deep learning container registry. In at least one embodiment, a registry may store containers for instantiations of applications that may perform pre-processing, post-processing, or other processing tasks on patient data. In at least one embodiment, cloud 5726 may receive data that includes patient data as well as sensor data in containers, perform requested processing for just sensor data in those containers, and then forward a resultant output and/or visualizations to appropriate parties and/or devices (e.g., on-premises medical devices used for visualization or diagnoses), all without having to extract, store, or otherwise access patient data. In at least one embodiment, confidentiality of patient data is preserved in compliance with HIPAA and/or other data regulations.

FIG. 58 includes an example illustration of a deployment pipeline 5710A for processing imaging data, in accordance with at least one embodiment. In at least one embodiment, system 5700—and specifically deployment system 5606—may be used to customize, update, and/or integrate deployment pipeline(s) 5710A into one or more production environments. In at least one embodiment, deployment pipeline 5710A of FIG. 58 includes a non-limiting example of a deployment pipeline 5710A that may be custom defined by a particular user (or team of users) at a facility (e.g., at a hospital, clinic, lab, research environment, etc.). In at least one embodiment, to define deployment pipelines 5710A for a CT scanner 5802, a user may select—from a container registry, for example—one or more applications that perform specific functions or tasks with respect to imaging data generated by CT scanner 5802. In at least one embodiment, applications may be applied to deployment pipeline 5710A as containers that may leverage services 5620 and/or hardware 5622 of system 5700. In addition, deployment pipeline 5710A may include additional processing tasks or applications that may be implemented to prepare data for use by applications (e.g., DICOM adapter 5702B and DICOM reader 5806 may be used in deployment pipeline 5710A to prepare data for use by CT reconstruction 5808, organ segmentation 5810, etc.). In at least one embodiment, deployment pipeline 5710A may be customized or selected for consistent deployment, one time use, or for another frequency or interval. In at least one embodiment, a user may desire to have CT reconstruction 5808 and organ segmentation 5810 for several subjects over a specific interval, and thus may deploy pipeline 5710A for that period of time. In at least one embodiment, a user may select, for each request from system 5700, applications that a user wants to perform processing on that data for that request. In at least one embodiment, deployment pipeline 5710A may be adjusted at any interval and, because of adaptability and scalability of a container structure within system 5700, this may be a seamless process.

In at least one embodiment, deployment pipeline 5710A of FIG. 58 may include CT scanner 5802 generating imaging data of a patient or subject. In at least one embodiment, imaging data from CT scanner 5802 may be stored on a PACS server(s) 5804 associated with a facility housing CT scanner 5802. In at least one embodiment, PACS server(s) 5804 may include software and/or hardware components that may directly interface with imaging modalities (e.g., CT scanner 5802) at a facility. In at least one embodiment, DICOM adapter 5702B may enable sending and receipt of DICOM objects using DICOM protocols. In at least one embodiment, DICOM adapter 5702B may aid in preparation or configuration of DICOM data from PACS server(s) 5804 for use by deployment pipeline 5710A. In at least one embodiment, once DICOM data is processed through DICOM adapter 5702B, pipeline manager 5712 may route data through to deployment pipeline 5710A. In at least one embodiment, DICOM reader 5806 may extract image files and any associated metadata from DICOM data (e.g., raw sinogram data, as illustrated in visualization 5816A). In at least one embodiment, working files that are extracted may be stored in a cache for faster processing by other applications in deployment pipeline 5710A. In at least one embodiment, once DICOM reader 5806 has finished extracting and/or storing data, a signal of completion may be communicated to pipeline manager 5712. In at least one embodiment, pipeline manager 5712 may then initiate or call upon one or more other applications or containers in deployment pipeline 5710A.

In at least one embodiment, CT reconstruction 5808 application and/or container may be executed once data (e.g., raw sinogram data) is available for processing by CT reconstruction 5808 application. In at least one embodiment, CT reconstruction 5808 may read raw sinogram data from a cache, reconstruct an image file out of raw sinogram data (e.g., as illustrated in visualization 5816B), and store resulting image file in a cache. In at least one embodiment, at completion of reconstruction, pipeline manager 5712 may be signaled that reconstruction task is complete. In at least one embodiment, once reconstruction is complete, and a reconstructed image file may be stored in a cache (or other storage device), organ segmentation 5810 application and/or container may be triggered by pipeline manager 5712. In at least one embodiment, organ segmentation 5810 application and/or container may read an image file from a cache, normalize or convert an image file to format suitable for inference (e.g., convert an image file to an input resolution of a machine learning model), and run inference against a normalized image. In at least one embodiment, to run inference on a normalized image, organ segmentation 5810 application and/or container may rely on services 5620, and pipeline manager 5712 and/or application orchestration system 5728 may facilitate use of services 5620 by organ segmentation 5810 application and/or container. In at least one embodiment, for example, organ segmentation 5810 application and/or container may leverage AI services 5718 to perform inference on a normalized image, and AI services 5718 may leverage hardware 5622 (e.g., AI system 5724) to execute AI services 5718. In at least one embodiment, a result of an inference may be a mask file (e.g., as illustrated in visualization 5816C) that may be stored in a cache (or other storage device).

In at least one embodiment, once applications that process DICOM data and/or data extracted from DICOM data have completed processing, a signal may be generated for pipeline manager 5712. In at least one embodiment, pipeline manager 5712 may then execute DICOM writer 5812 to read results from a cache (or other storage device), package results into a DICOM format (e.g., as DICOM output 5814) for use by users at a facility who generated a request. In at least one embodiment, DICOM output 5814 may then be transmitted to DICOM adapter 5702B to prepare DICOM output 5814 for storage on PACS server(s) 5804 (e.g., for viewing by a DICOM viewer at a facility). In at least one embodiment, in response to a request for reconstruction and segmentation, visualizations 5816B and 5816C may be generated and available to a user for diagnoses, research, and/or for other purposes.

Although illustrated as consecutive application in deployment pipeline 5710A, CT reconstruction 5808 and organ segmentation 5810 applications may be processed in parallel in at least one embodiment. In at least one embodiment, where applications do not have dependencies on one another, and data is available for each application (e.g., after DICOM reader 5806 extracts data), applications may be executed at a same time, substantially at a same time, or with some overlap. In at least one embodiment, where two or more applications require similar services 5620, a scheduler of system 5700 may be used to load balance and distribute compute or processing resources between and among various applications. In at least one embodiment, in some embodiments, parallel computing platform 5730 may be used to perform parallel processing for applications to decrease run-time of deployment pipeline 5710A to provide real-time results.

Figure 59A:
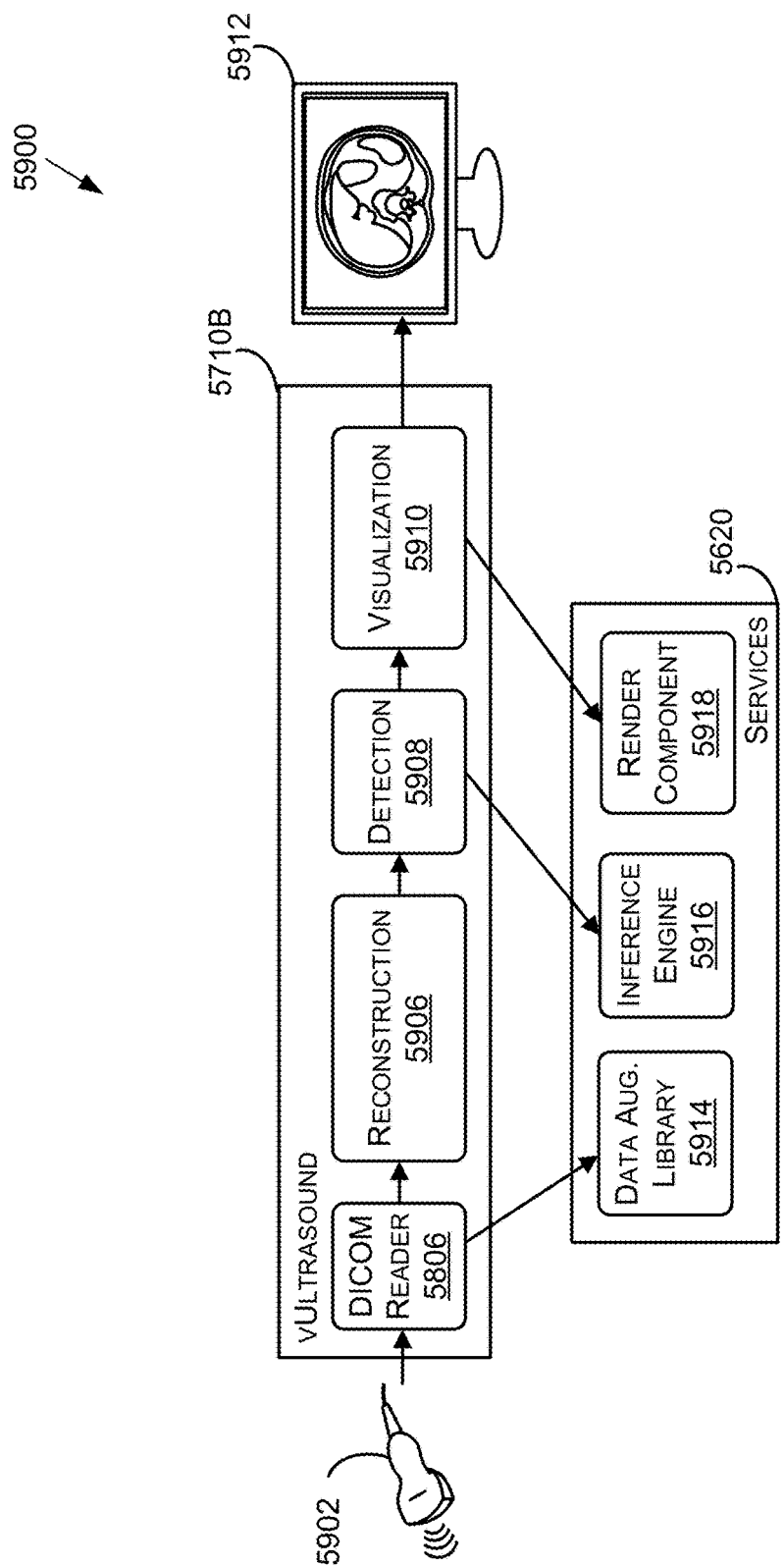
FIG. 59A includes an example data flow diagram of a virtual instrument supporting an ultrasound device, in accordance with at least one embodiment.
Figure 59B:
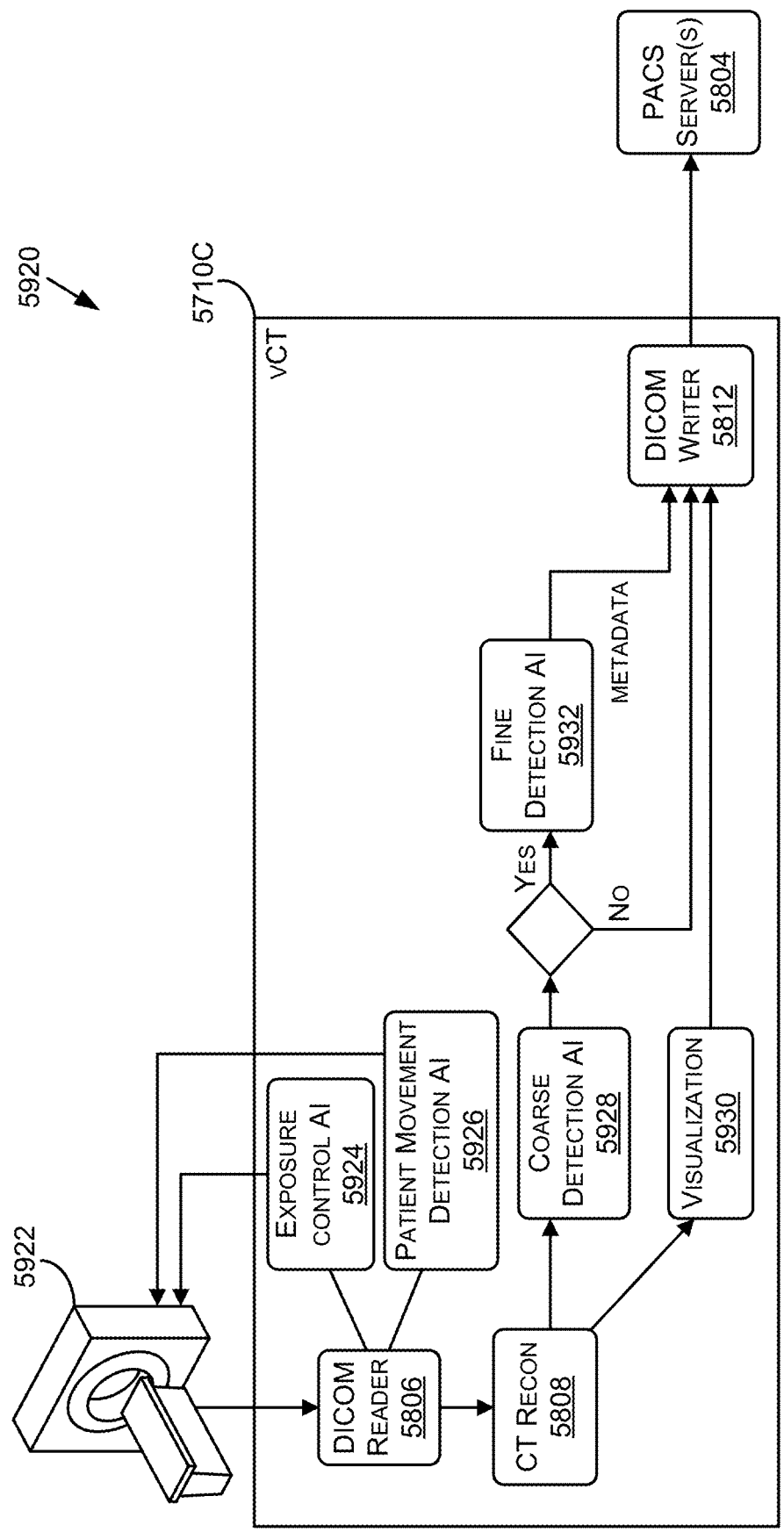
FIG. 59B includes an example data flow diagram of a virtual instrument supporting an CT scanner, in accordance with at least one embodiment.

In at least one embodiment, and with reference to FIGS. 59A-59B, deployment system 5606 may be implemented as one or more virtual instruments to perform different functionalities—such as image processing, segmentation, enhancement, AI, visualization, and inferencing—with imaging devices (e.g., CT scanners, X-ray machines, Mill machines, etc.), sequencing devices, genomics devices, and/or other device types. In at least one embodiment, system 5700 may allow for creation and provision of virtual instruments that may include a software-defined deployment pipeline 5710 that may receive raw/unprocessed input data generated by a device(s) and output processed/reconstructed data. In at least one embodiment, deployment pipelines 5710 (e.g., 5710A and 5710B) that represent virtual instruments may implement intelligence into a pipeline, such as by leveraging machine learning models, to provide containerized inference support to a system. In at least one embodiment, virtual instruments may execute any number of containers each including instantiations of applications. In at least one embodiment, such as where real-time processing is desired, deployment pipelines 5710 representing virtual instruments may be static (e.g., containers and/or applications may be set), while in other examples, container and/or applications for virtual instruments may be selected (e.g., on a per-request basis) from a pool of applications or resources (e.g., within a container registry).

In at least one embodiment, system 5700 may be instantiated or executed as one or more virtual instruments on-premise at a facility in, for example, a computing system deployed next to or otherwise in communication with a radiology machine, an imaging device, and/or another device type at a facility. In at least one embodiment, however, an on-premise installation may be instantiated or executed within a computing system of a device itself (e.g., a computing system integral to an imaging device), in a local datacenter (e.g., a datacenter on-premise), and/or in a cloud-environment (e.g., in cloud 5726). In at least one embodiment, deployment system 5606, operating as a virtual instrument, may be instantiated by a supercomputer or other HPC system in some examples. In at least one embodiment, on-premise installation may allow for high-bandwidth uses (via, for example, higher throughput local communication interfaces, such as RF over Ethernet) for real-time processing. In at least one embodiment, real-time or near real-time processing may be particularly useful where a virtual instrument supports an ultrasound device or other imaging modality where immediate visualizations are expected or required for accurate diagnoses and analyses. In at least one embodiment, a cloud-computing architecture may be capable of dynamic bursting to a cloud computing service provider, or other compute cluster, when local demand exceeds on-premise capacity or capability. In at least one embodiment, a cloud architecture, when implemented, may be tuned for training neural networks or other machine learning models, as described herein with respect to training system 5604. In at least one embodiment, with training pipelines in place, machine learning models may be continuously learn and improve as they process additional data from devices they support. In at least one embodiment, virtual instruments may be continually improved using additional data, new data, existing machine learning models, and/or new or updated machine learning models.

In at least one embodiment, a computing system may include some or all of hardware 5622 described herein, and hardware 5622 may be distributed in any of a number of ways including within a device, as part of a computing device coupled to and located proximate a device, in a local datacenter at a facility, and/or in cloud 5726. In at least one embodiment, because deployment system 5606 and associated applications or containers are created in software (e.g., as discrete containerized instantiations of applications), behavior, operation, and configuration of virtual instruments, as well as outputs generated by virtual instruments, may be modified or customized as desired, without having to change or alter raw output of a device that a virtual instrument supports.

FIG. 59A includes an example data flow diagram of a virtual instrument supporting an ultrasound device, in accordance with at least one embodiment. In at least one embodiment, deployment pipeline 5710B may leverage one or more of services 5620 of system 5700. In at least one embodiment, deployment pipeline 5710B and services 5620 may leverage hardware 5622 of a system either locally or in cloud 5726. In at least one embodiment, although not illustrated, process 5900 may be facilitated by pipeline manager 5712, application orchestration system 5728, and/or parallel computing platform 5730.

In at least one embodiment, process 5900 may include receipt of imaging data from an ultrasound device 5902. In at least one embodiment, imaging data may be stored on PACS server(s) in a DICOM format (or other format, such as RIS, CIS, REST compliant, RPC, raw, etc.), and may be received by system 5700 for processing through deployment pipeline 5710 selected or customized as a virtual instrument (e.g., a virtual ultrasound) for ultrasound device 5902. In at least one embodiment, imaging data may be received directly from an imaging device (e.g., ultrasound device 5902) and processed by a virtual instrument. In at least one embodiment, a transducer or other signal converter communicatively coupled between an imaging device and a virtual instrument may convert signal data generated by an imaging device to image data that may be processed by a virtual instrument. In at least one embodiment, raw data and/or image data may be applied to DICOM reader 5806 to extract data for use by applications or containers of deployment pipeline 5710B. In at least one embodiment, DICOM reader 5806 may leverage data augmentation library 5914 (e.g., NVIDIA's DALI) as a service 5620 (e.g., as one of compute service(s) 5716) for extracting, resizing, rescaling, and/or otherwise preparing data for use by applications or containers.

In at least one embodiment, once data is prepared, a reconstruction 5906 application and/or container may be executed to reconstruct data from ultrasound device 5902 into an image file. In at least one embodiment, after reconstruction 5906, or at a same time as reconstruction 5906, a detection 5908 application and/or container may be executed for anomaly detection, object detection, feature detection, and/or other detection tasks related to data. In at least one embodiment, an image file generated during reconstruction 5906 may be used during detection 5908 to identify anomalies, objects, features, etc. In at least one embodiment, detection 5908 application may leverage an inference engine 5916 (e.g., as one of AI service(s) 5718) to perform inference on data to generate detections. In at least one embodiment, one or more machine learning models (e.g., from training system 5604) may be executed or called by detection 5908 application.

In at least one embodiment, once reconstruction 5906 and/or detection 5908 is/are complete, data output from these application and/or containers may be used to generate visualizations 5910, such as visualization 5912 (e.g., a grayscale output) displayed on a workstation or display terminal. In at least one embodiment, visualization may allow a technician or other user to visualize results of deployment pipeline 5710B with respect to ultrasound device 5902. In at least one embodiment, visualization 5910 may be executed by leveraging a render component 5918 of system 5700 (e.g., one of visualization service(s) 5720). In at least one embodiment, render component 5918 may execute a 2D, OpenGL, or ray-tracing service to generate visualization 5912.

FIG. 59B includes an example data flow diagram of a virtual instrument supporting a CT scanner, in accordance with at least one embodiment. In at least one embodiment, deployment pipeline 5710C may leverage one or more of services 5620 of system 5700. In at least one embodiment, deployment pipeline 5710C and services 5620 may leverage hardware 5622 of a system either locally or in cloud 5726. In at least one embodiment, although not illustrated, process 5920 may be facilitated by pipeline manager 5712, application orchestration system 5728, and/or parallel computing platform 5730.

In at least one embodiment, process 5920 may include CT scanner 5922 generating raw data that may be received by DICOM reader 5806 (e.g., directly, via a PACS server 5804, after processing, etc.). In at least one embodiment, a Virtual CT (instantiated by deployment pipeline 5710C) may include a first, real-time pipeline for monitoring a patient (e.g., patient movement detection AI 5926) and/or for adjusting or optimizing exposure of CT scanner 5922 (e.g., using exposure control AI 5924). In at least one embodiment, one or more of applications (e.g., 5924 and 5926) may leverage a service 5620, such as AI service(s) 5718. In at least one embodiment, outputs of exposure control AI 5924 application (or container) and/or patient movement detection AI 5926 application (or container) may be used as feedback to CT scanner 5922 and/or a technician for adjusting exposure (or other settings of CT scanner 5922) and/or informing a patient to move less.

In at least one embodiment, deployment pipeline 5710C may include a non-real-time pipeline for analyzing data generated by CT scanner 5922. In at least one embodiment, a second pipeline may include CT reconstruction 5808 application and/or container, a coarse detection AI 5928 application and/or container, a fine detection AI 5932 application and/or container (e.g., where certain results are detected by coarse detection AI 5928), a visualization 5930 application and/or container, and a DICOM writer 5812 (and/or other data type writer, such as RIS, CIS, REST compliant, RPC, raw, etc.) application and/or container. In at least one embodiment, raw data generated by CT scanner 5922 may be passed through pipelines of deployment pipeline 5710C (instantiated as a virtual CT instrument) to generate results. In at least one embodiment, results from DICOM writer 5812 may be transmitted for display and/or may be stored on PACS server(s) 5804 for later retrieval, analysis, or display by a technician, practitioner, or other user.

FIG. 60A illustrates a data flow diagram for a process 6000 to train, retrain, or update a machine learning model, in accordance with at least one embodiment. In at least one embodiment, process 6000 may be executed using, as a non-limiting example, system 5700 of FIG. 57. In at least one embodiment, process 6000 may leverage services 5620 and/or hardware 5622 of system 5700, as described herein. In at least one embodiment, refined models 6012 generated by process 6000 may be executed by deployment system 5606 for one or more containerized applications in deployment pipelines 5710.

In at least one embodiment, model training 5614 may include retraining or updating an initial model 6004 (e.g., a pre-trained model) using new training data (e.g., new input data, such as customer dataset 6006, and/or new ground truth data associated with input data). In at least one embodiment, to retrain, or update, initial model 6004, output or loss layer(s) of initial model 6004 may be reset, or deleted, and/or replaced with an updated or new output or loss layer(s). In at least one embodiment, initial model 6004 may have previously fine-tuned parameters (e.g., weights and/or biases) that remain from prior training, so training or retraining 5614 may not take as long or require as much processing as training a model from scratch. In at least one embodiment, during model training 5614, by having reset or replaced output or loss layer(s) of initial model 6004, parameters may be updated and re-tuned for a new data set based on loss calculations associated with accuracy of output or loss layer(s) at generating predictions on new, customer dataset 6006 (e.g., image data 5608 of FIG. 56).

In at least one embodiment, pre-trained models 5706 may be stored in a data store, or registry (e.g., model registry 5624 of FIG. 56). In at least one embodiment, pre-trained models 5706 may have been trained, at least in part, at one or more facilities other than a facility executing process 6000. In at least one embodiment, to protect privacy and rights of patients, subjects, or clients of different facilities, pre-trained models 5706 may have been trained, on-premise, using customer or patient data generated on-premise. In at least one embodiment, pre-trained models 5706 may be trained using cloud 5726 and/or other hardware 5622, but confidential, privacy protected patient data may not be transferred to, used by, or accessible to any components of cloud 5726 (or other off premise hardware). In at least one embodiment, where a pre-trained model 5706 is trained at using patient data from more than one facility, pre-trained model 5706 may have been individually trained for each facility prior to being trained on patient or customer data from another facility. In at least one embodiment, such as where a customer or patient data has been released of privacy concerns (e.g., by waiver, for experimental use, etc.), or where a customer or patient data is included in a public data set, a customer or patient data from any number of facilities may be used to train pre-trained model 5706 on-premise and/or off premise, such as in a datacenter or other cloud computing infrastructure.

In at least one embodiment, when selecting applications for use in deployment pipelines 5710, a user may also select machine learning models to be used for specific applications. In at least one embodiment, a user may not have a model for use, so a user may select a pre-trained model 5706 to use with an application. In at least one embodiment, pre-trained model 5706 may not be optimized for generating accurate results on customer dataset 6006 of a facility of a user (e.g., based on patient diversity, demographics, types of medical imaging devices used, etc.). In at least one embodiment, prior to deploying pre-trained model 5706 into deployment pipeline 5710 for use with an application(s), pre-trained model 5706 may be updated, retrained, and/or fine-tuned for use at a respective facility.

In at least one embodiment, a user may select pre-trained model 5706 that is to be updated, retrained, and/or fine-tuned, and pre-trained model 5706 may be referred to as initial model 6004 for training system 5604 within process 6000. In at least one embodiment, customer dataset 6006 (e.g., imaging data, genomics data, sequencing data, or other data types generated by devices at a facility) may be used to perform model training 5614 (which may include, without limitation, transfer learning) on initial model 6004 to generate refined model 6012. In at least one embodiment, ground truth data corresponding to customer dataset 6006 may be generated by training system 5604. In at least one embodiment, ground truth data may be generated, at least in part, by clinicians, scientists, doctors, practitioners, at a facility (e.g., as labeled clinic data 5612 of FIG. 56).

In at least one embodiment, AI-assisted annotation 5610 may be used in some examples to generate ground truth data.

In at least one embodiment, AI-assisted annotation 5610 (e.g., implemented using an AI-assisted annotation SDK) may leverage machine learning models (e.g., neural networks) to generate suggested or predicted ground truth data for a customer dataset. In at least one embodiment, user 6010 may use annotation tools within a user interface (a graphical user interface (GUI)) on computing device 6008.

In at least one embodiment, user 6010 may interact with a GUI via computing device 6008 to edit or fine-tune annotations or auto-annotations. In at least one embodiment, a polygon editing feature may be used to move vertices of a polygon to more accurate or fine-tuned locations.

In at least one embodiment, once customer dataset 6006 has associated ground truth data, ground truth data (e.g., from AI-assisted annotation, manual labeling, etc.) may be used by during model training 5614 to generate refined model 6012. In at least one embodiment, customer dataset 6006 may be applied to initial model 6004 any number of times, and ground truth data may be used to update parameters of initial model 6004 until an acceptable level of accuracy is attained for refined model 6012. In at least one embodiment, once refined model 6012 is generated, refined model 6012 may be deployed within one or more deployment pipelines 5710 at a facility for performing one or more processing tasks with respect to medical imaging data.

In at least one embodiment, refined model 6012 may be uploaded to pre-trained models 5706 in model registry 5624 to be selected by another facility. In at least one embodiment, his process may be completed at any number of facilities such that refined model 6012 may be further refined on new datasets any number of times to generate a more universal model.

FIG. 60B is an example illustration of a client-server architecture 6032 to enhance annotation tools with pre-trained annotation models, in accordance with at least one embodiment. In at least one embodiment, AI-assisted annotation tools 6036 may be instantiated based on a client-server architecture 6032. In at least one embodiment, annotation tools 6036 in imaging applications may aid radiologists, for example, identify organs and abnormalities. In at least one embodiment, imaging applications may include software tools that help user 6010 to identify, as a non-limiting example, a few extreme points on a particular organ of interest in raw images 6034 (e.g., in a 3D MM or CT scan) and receive auto-annotated results for all 2D slices of a particular organ. In at least one embodiment, results may be stored in a data store as training data 6038 and used as (for example and without limitation) ground truth data for training. In at least one embodiment, when computing device 6008 sends extreme points for AI-assisted annotation 5610, a deep learning model, for example, may receive this data as input and return inference results of a segmented organ or abnormality. In at least one embodiment, pre-instantiated annotation tools, such as AI-Assisted Annotation Tool 6036B in FIG. 60B, may be enhanced by making API calls (e.g., API Call 6044) to a server, such as an Annotation Assistant Server 6040 that may include a set of pre-trained models 6042 stored in an annotation model registry, for example. In at least one embodiment, an annotation model registry may store pre-trained models 6042 (e.g., machine learning models, such as deep learning models) that are pre-trained to perform AI-assisted annotation on a particular organ or abnormality. In at least one embodiment, these models may be further updated by using training pipelines 5704. In at least one embodiment, pre-installed annotation tools may be improved over time as new labeled clinic data 5612 is added.

Inference and/or training logic 2715 are used to perform inferencing and/or training operations associated with one or more embodiments. Details regarding inference and/or training logic 2715 are provided herein in conjunction with FIGS. 27A and/or 27B.

At least one embodiment of the disclosure can be described in view of the following clauses:

1. A method, using a processor comprising one or more arithmetic logic units (ALUs), of processing data, comprising obtaining at least one recorded observation of an aggregation of a granular material, deriving a derived set of summary statistics, corresponding to one or more features of the aggregation, applying the derived set of summary statistics to a likelihood-free inference engine to infer a first prior probability distribution corresponding to at least one physical characteristic of grains of the granular material, applying the first prior probability distribution to a simulation process that outputs a simulated set of summary statistics, comparing the derived set of summary statistics to the simulated set of summary statistics to determine a comparison, and using the comparison to determine a revised posterior probability distribution based on the first prior probability distribution, wherein the revised posterior probability distribution is over a space of possible physical characteristics of the grains of the granular material, wherein the revised posterior probability distribution is usable as a representative of the at least one physical characteristic of grains of the granular material.

2. The method of clause 1, wherein obtaining the at least one recorded observation comprises obtaining at least one depth image of the aggregation of the granular material.

3. The method of clause 1 or 2, wherein using the comparison comprises training a neural network on comparisons to derive the revised posterior probability distribution based on the first prior probability distribution.

4. The method of any of clauses 1 to 3, wherein the derived set of summary statistics comprises statistics of the aggregation including one or more of pile height, shape of a cross-section of a pile, average granular distance from a centroid, angle of repose of the aggregation, dispersion, shape or height distribution, and statistical dependence of grain locations imaged by a depth camera.

5. The method of any of clauses 1 to 4, wherein the derived set of summary statistics comprises statistics of the aggregation including one or more of a maximum height of the aggregation relative to a surface, a mean height, a standard deviation of heights, a maximum radius, a mean radius, a standard deviation of radii or direction, interquartile ranges of radii or direction, a kurtosis, and a distance correlation.

6. The method of any of clauses 1 to 5, wherein the derived set of summary statistics comprises statistics of the aggregation including one or more time-varying statistic.

7. The method of any of clauses 1 to 6, further comprising applying variable inputs of an aggregation process to the likelihood-free inference engine along with the derived set of summary statistics in inferring the first prior probability distribution.

8. The method of clause 7, wherein the variable inputs of the aggregation process include one or more of pour height and pour size and one or more feature varies over pour height.

9. The method of clause 1, wherein deriving the derived set of summary statistics comprises determining an initial prior probability distribution to represent estimates of real-world behavior of the granular material, obtaining experimental results of behaviors of the granular material, and determining an intermediate posterior probability distribution by inference from the initial prior probability distribution and/or the experimental results.

10. A system for training a simulator, comprising an image capture system, an image processor to derive a set of derived summary statistics, a likelihood-free inference engine that receives the set of derived summary statistics and outputs, to a simulator, a first prior probability distribution corresponding to possible physical characteristics of a material using the set of derived summary statistics, a comparator to compare the set of derived summary statistics and a set of simulation summary statistics received from the simulator and output a revised posterior probability distribution, and a feedback output for the simulator, for updating simulation functions of the simulator.

11. The system of clause 10, wherein the comparator is a neural network trained on sets of simulation summary statistics and corresponding sets of derived summary statistics.

12. The system of clause 10 or 11, wherein the material comprises grains of a granular material, wherein the possible physical characteristics of the material are parameters for a simulator, wherein the image capture system comprises a depth camera, and wherein the image processor includes processing to determine distances in an aggregation of the grains of the granular material.

13. The system of clause 12, wherein the set of derived summary statistics comprises statistics of the aggregation of the grains of the granular material including one or more of a maximum height of the aggregation relative to a surface, a mean height, a standard deviation of heights, a maximum radius, a mean radius, a standard deviation of radii or direction, interquartile ranges of radii or direction, a kurtosis, and a distance correlation.

14. The system of clause 12 or 13, the set of derived summary statistic comprises statistics of the aggregation of the grains of the granular material including one or more time-varying statistic.

15. The system of any of clauses 12 to 14, wherein the likelihood-free inference engine comprises an input for variable inputs related to an aggregation process.

16. The system of any of clauses 10 to 15, further comprising a converter to convert simulator output into robotic control instructions.

17. A method of testing a simulator, comprising obtaining a derived set of features of a granular material, comprising one or more features, generating a first simulated depth image using the simulator, with the derived set of features as an input to the simulator for the first simulated depth image, using a likelihood-free inference engine to infer, from the first simulated depth image, a first prior probability distribution corresponding to at least one physical characteristic of grains of the granular material, performing a forward simulation with the simulator, using the first prior probability distribution, to generate a second simulated depth image, comparing the first simulated depth image and the second simulated depth image to form a comparison, and determining an evaluation of the simulator based on the comparison.

18. The method of clause 17, wherein comparing the first simulated depth image and the second simulated depth image comprises computing an L2-norm error between the first simulated depth image and the second simulated depth image.

19. The method of clause 17 or 18, further comprising repeating performing, comparing, and determining, over a plurality of distinct derived sets of features of the granular material.

20. The method of clause 19, wherein the plurality of distinct derived sets of features of the granular material comprises a first sampling of a coefficient of sliding friction over a first range, a second sampling of a coefficient of rolling friction over a second range, and a third sampling of a coefficient of restitution over a third range, wherein the first sampling is sampled uniformly, the second sampling is sampled logarithmically, and the third sampling is sampled uniformly.

21. The method of clause 19 or 20, wherein the plurality of distinct derived sets of features of the granular material comprises varying grain shapes.

22. The method of any of clauses 17 to 21, further comprising:

training the simulator to simulate granular spilling to form a simulated granular spilling, measuring a physical granular spilling, and updating simulator input parameters based on differences between the simulated granular spilling and the physical granular spilling.

23. The method of clause 22, wherein the physical granular spilling and the simulated granular spilling comprise spilling for a plurality of pour heights.

24. A robotic pouring assembly comprising a hopper to receive granular material, computer memory for storing granular physical characteristics values determined from inferences from prior pourings of the granular material made by a likelihood-free inference engine operated on a derived set of features determined from the prior pourings, a pour opening, sized to allow the granular material to flow from the hopper, and a pour controller, coupled to the computer memory to read the granular physical characteristics values, wherein the pour controller controls a pouring through the pour opening based on the granular physical characteristics values.

25. The robotic pouring assembly of clause 24, wherein the pour controller further controls a pour height of the granular material based on the granular physical characteristics values.

26. The robotic pouring assembly of clause 24 or 25, wherein the pour controller controls the pour by controlling a pouring rate and/or a pouring height based on a target spilling allowance and the granular physical characteristics values.

27. The robotic pouring assembly of any of clauses 24 to 26, wherein the pour controller further comprises a neural network and a simulator for determining the derived set of features from the prior pourings.

28. The robotic pouring assembly of any of clauses 24 to 27, wherein the granular physical characteristics values comprise one or more of a shape, a coefficient of sliding friction, a coefficient of rolling friction, and a coefficient of restitution.

29. The robotic pouring assembly of any of clauses 24 to 28, wherein the derived set of features comprises statistics of an aggregation including one or more of pile height, shape of a cross-section of a pile, average granular distance from a centroid, angle of repose of the aggregation, dispersion, shape or height distribution, statistical dependence of grain locations imaged by a depth camera, a maximum height of the aggregation relative to a surface, a mean height, a standard deviation of heights, a maximum radius, a mean radius, a standard deviation of radii or direction, interquartile ranges of radii or direction, a kurtosis, and a distance correlation.

In at least one embodiment, a single semiconductor platform may refer to a sole unitary semiconductor-based integrated circuit or chip. In at least one embodiment, multi-chip modules may be used with increased connectivity which simulate on-chip operation, and make substantial improvements over utilizing a conventional central processing unit ("CPU") and bus implementation. In at least one embodiment, various modules may also be situated separately or in various combinations of semiconductor platforms per desires of user.

In at least one embodiment, referring back to FIG. 33, computer programs in form of machine-readable executable code or computer control logic algorithms are stored in main memory 3304 and/or secondary storage. Computer programs, if executed by one or more processors, enable system 3300 to perform various functions in accordance with at least one embodiment. In at least one embodiment, memory 3304, storage, and/or any other storage are possible examples of computer-readable media. In at least one embodiment, secondary storage may refer to any suitable storage device or system such as a hard disk drive and/or a removable storage drive, representing a floppy disk drive, a magnetic tape drive, a compact disk drive, digital versatile disk ("DVD") drive, recording device, universal serial bus ("USB") flash memory, etc. In at least one embodiment, architecture and/or functionality of various previous figures are implemented in context of CPU 3302, parallel processing system 3312, an integrated circuit capable of at least a portion of capabilities of both CPU 3302, parallel processing system 3312, a chipset (e.g., a group of integrated circuits designed to work and sold as a unit for performing related functions, etc.), and/or any suitable combination of integrated circuit(s).

In at least one embodiment, architecture and/or functionality of various previous figures are implemented in context of a general computer system, a circuit board system, a game console system dedicated for entertainment purposes, an application-specific system, and more. In at least one embodiment, computer system 3300 may take form of a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, a mobile phone device, a television, workstation, game consoles, embedded system, and/or any other type of logic.

In at least one embodiment, parallel processing system 3312 includes, without limitation, a plurality of parallel processing units ("PPUs") 3314 and associated memories 3316. In at least one embodiment, PPUs 3314 are connected to a host processor or other peripheral devices via an interconnect 3318 and a switch 3320 or multiplexer. In at least one embodiment, parallel processing system 3312 distributes computational tasks across PPUs 3314 which can be parallelizable—for example, as part of distribution of computational tasks across multiple graphics processing unit ("GPU") thread blocks. In at least one embodiment, memory is shared and accessible (e.g., for read and/or write access) across some or all of PPUs 3314, although such shared memory may incur performance penalties relative to use of local memory and registers resident to a PPU 3314. In at least one embodiment, operation of PPUs 3314 is synchronized through use of a command such as _syncthreads( ), wherein all threads in a block (e.g., executed across multiple PPUs 3314) to reach a certain point of execution of code before proceeding.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (such as a result of being executed) by one or more processors of a computer system, cause computer system to perform operations described herein. In at least one embodiment, set of non-transitory computer-readable storage media comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog or digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or interprocess communication mechanism.

Although descriptions herein set forth example implementations of described techniques, other architectures may be used to implement described functionality, and are intended to be within scope of this disclosure. Furthermore, although specific distributions of responsibilities may be defined above for purposes of description, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A method of simulating a granular material, using a processor comprising one or more arithmetic logic units (ALUs), the method comprising:
    deriving, from at least one recorded observation of an aggregation of the granular material, a derived set of summary statistics corresponding to motion of one or more grains of the granular material;
    providing the derived set of summary statistics to an inference engine implemented using the one or more ALUs, the inference engine to infer a first posterior probability distribution corresponding to at least one physical characteristic of the one or more grains of the granular material;
    applying the first posterior probability distribution to a simulation process that outputs a simulated set of summary statistics;
    comparing the derived set of summary statistics to the simulated set of summary statistics to determine a comparison;
    using the comparison to determine a revised posterior probability distribution based on the first posterior probability distribution, wherein the revised posterior probability distribution is over a space of possible physical characteristics of the one or more grains of the granular material; and
    simulating the motion of the one or more grains of the granular material with the at least one physical characteristic based at least on the revised posterior probability distribution.

2. The method of claim 1, wherein the at least one recorded observation comprises at least one depth image of the aggregation of the granular material.

3. The method of claim 1, wherein using the comparison comprises training a neural network on comparisons to derive the revised posterior probability distribution based on the first posterior probability distribution.

4. The method of claim 1, wherein the derived set of summary statistics comprises statistics of the aggregation including one or more of pile height, shape of a cross-section of a pile, average granular distance from a centroid, angle of repose of the aggregation, dispersion, shape or height distribution, and statistical dependence of grain locations imaged by a depth camera.

5. The method of claim 1, wherein the derived set of summary statistics comprises statistics of the aggregation including one or more of a maximum height of the aggregation relative to a surface, a mean height, a standard deviation of heights, a maximum radius, a mean radius, a standard deviation of radii or direction, interquartile ranges of radii or direction, a kurtosis, and a distance correlation.

6. The method of claim 1, wherein the derived set of summary statistics comprises statistics of the aggregation including one or more time-varying statistics.

7. The method of claim 1, further comprising:
    applying variable inputs of an aggregation process to the inference engine along with providing the derived set of summary statistics to the inference engine.

8. The method of claim 7, wherein the variable inputs of the aggregation process include one or more of pour height and pour size and wherein one or more features vary over pour height.

9. The method of claim 1, wherein deriving the derived set of summary statistics comprises:
    determining an initial prior probability distribution to represent estimates of real-world behavior of the granular material;
    obtaining experimental results of behaviors of the granular material; and determining an intermediate posterior probability distribution by inference from the initial prior probability distribution and/or the experimental results.

10. A processor, comprising:
    one or more arithmetic logic units (ALUs) to perform a method of simulating a granular material, comprising:
        deriving, from at least one recorded observation of an aggregation of the granular material, a derived set of summary statistics corresponding to motion of one or more grains of the granular material;

providing the derived set of summary statistics to an inference engine implemented using the one or more ALUs, the inference engine to infer a first posterior probability distribution corresponding to at least one physical characteristic of the one or more grains of the granular material;

applying the first posterior probability distribution to a simulation process that outputs a simulated set of summary statistics;

comparing the derived set of summary statistics to the simulated set of summary statistics to determine a comparison;

using the comparison to determine a revised posterior probability distribution based on the first posterior probability distribution, wherein the revised posterior probability distribution is over a space of possible physical characteristics of the one or more grains of the granular material; and simulating the motion of the one or more grains of the granular material with the at least one physical characteristic based at least on the revised posterior probability distribution.

11. The processor of claim 10, wherein the method further comprises obtaining the at least one recorded observation based at least in part on at least one depth image of the aggregation of the granular material.

12. The processor of claim 10, wherein using the comparison comprises training a neural network on comparisons to derive the revised posterior probability distribution based on the first posterior probability distribution.

13. The processor of claim 10, wherein the derived set of summary statistics comprises statistics of the aggregation including one or more of pile height, shape of a cross-section of a pile, average granular distance from a centroid, angle of repose of the aggregation, dispersion, shape or height distribution, and statistical dependence of grain locations imaged by a depth camera.

14. The processor of claim 10, wherein the derived set of summary statistics comprises statistics of the aggregation including one or more of a maximum height of the aggregation relative to a surface, a mean height, a standard deviation of heights, a maximum radius, a mean radius, a standard deviation of radii or direction, interquartile ranges of radii or direction, a kurtosis, and a distance correlation.

15. The processor of claim 10, wherein the derived set of summary statistics comprises statistics of the aggregation including one or more time-varying statistics.

16. The processor of claim 10, wherein the method further comprises providing variable inputs of an aggregation process to the inference engine along with the derived set of summary statistics.

17. The processor of claim 16, wherein the variable inputs of the aggregation process include one or more of pour height and pour size and wherein one or more features vary over pour height.

18. The processor of claim 10, wherein deriving the derived set of summary statistics comprises:
determining an initial prior probability distribution to represent estimates of real-world behavior of the granular material;
obtaining experimental results of behaviors of the granular material; and
determining an intermediate posterior probability distribution by inference from the initial prior probability distribution and/or the experimental results.

19. A system, comprising:
one or more processors to perform a method of simulating a granular material, comprising:
deriving, from at least one recorded observation of an aggregation of the granular material, a derived set of summary statistics corresponding to motion of one or more grains of the granular material;
providing the derived set of summary statistics to an inference engine, the inference engine to infer a first posterior probability distribution corresponding to at least one physical characteristic of the one or more grains of the granular material;
applying the first posterior probability distribution to a simulation process that outputs a simulated set of summary statistics;
comparing the derived set of summary statistics to the simulated set of summary statistics to determine a comparison;
using the comparison to determine a revised posterior probability distribution based on the first posterior probability distribution, wherein the revised posterior probability distribution is over a space of possible physical characteristics of the one or more grains of the granular material; and
simulating the motion of the one or more grains of the granular material with the at least one physical characteristic based at least on the revised posterior probability distribution.

20. The system of claim 19, wherein the at least one recorded observation comprises at least one depth image of the aggregation of the granular material.

21. The system of claim 19, wherein using the comparison comprises training a neural network on comparisons to derive the revised posterior probability distribution based on the first posterior probability distribution.

22. The system of claim 19, wherein the derived set of summary statistics comprises statistics of the aggregation including one or more of pile height, shape of a cross-section of a pile, average granular distance from a centroid, angle of repose of the aggregation, dispersion, shape or height distribution, and statistical dependence of grain locations imaged by a depth camera.

23. The system of claim 19, wherein the derived set of summary statistics comprises statistics of the aggregation including one or more of a maximum height of the aggregation relative to a surface, a mean height, a standard deviation of heights, a maximum radius, a mean radius, a standard deviation of radii or direction, interquartile ranges of radii or direction, a kurtosis, and a distance correlation.

24. The system of claim 19, wherein the derived set of summary statistics comprises statistics of the aggregation including one or more time-varying statistics.

25. The system of claim 19, wherein the method further comprises applying variable inputs of an aggregation process to the inference engine, the inference engine to infer the first posterior probability distribution based at least in part on the variable inputs and the derived set of summary statistics.

26. The system of claim 25, wherein the variable inputs of the aggregation process include one or more of pour height and pour size and wherein one or more features vary over pour height.

27. The system of claim 19, wherein deriving the derived set of summary statistics comprises:
- determining an initial prior probability distribution to represent estimates of real-world behavior of the granular material;
- obtaining experimental results of behaviors of the granular material; and determining an intermediate posterior probability distribution by inference from the initial prior probability distribution and/or the experimental results.

* * * * *